US012590246B2

(12) United States Patent
Han et al.

(10) Patent No.: US 12,590,246 B2
(45) Date of Patent: Mar. 31, 2026

(54) PRECURSOR CHEMISTRY FOR QUANTUM DOT SYNTHESIS ENABLING TEMPERATURE-INDEPENDENT MODULATION OF REACTIVITY

(71) Applicant: The Board of Trustees of The University of Illinois, Urbana, IL (US)

(72) Inventors: Hee-Sun Han, Urbana, IL (US); Joonhyuck Park, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 907 days.

(21) Appl. No.: 17/775,753

(22) PCT Filed: Nov. 13, 2020

(86) PCT No.: PCT/US2020/060428
§ 371 (c)(1),
(2) Date: May 10, 2022

(87) PCT Pub. No.: WO2021/097217
PCT Pub. Date: May 20, 2021

(65) Prior Publication Data
US 2023/0109627 A1      Apr. 6, 2023

Related U.S. Application Data

(60) Provisional application No. 63/059,462, filed on Jul. 31, 2020, provisional application No. 62/935,621, filed on Nov. 14, 2019.

(51) Int. Cl.
*C09K 11/88*        (2006.01)
*C09K 11/02*        (2006.01)
(Continued)

(52) U.S. Cl.
CPC .......... *C09K 11/883* (2013.01); *C09K 11/621* (2013.01); *H10K 50/115* (2023.02); *B82Y 30/00* (2013.01); *B82Y 40/00* (2013.01)

(58) Field of Classification Search
CPC ... C09K 11/883; C09K 11/621; C09K 11/565; C09K 11/661; C09K 11/02; H10K 50/115; B82Y 30/00; B82Y 40/00
See application file for complete search history.

(56) References Cited

U.S. PATENT DOCUMENTS

| | | | |
|---|---|---|---|
| 9,428,691 B2 | 8/2016 | Kurtin | |
| 2007/0202333 A1 | 8/2007 | O'Brien et al. | |

(Continued)

FOREIGN PATENT DOCUMENTS

| | | |
|---|---|---|
| CN | 103553001 A | 2/2014 |
| JP | 5019052 B2 | 9/2012 |

(Continued)

OTHER PUBLICATIONS

Hamachi et al., "Precursor reaction kinetics control compositional grading and size of CdSe1-xSx nanocrystal heterostructures", Jun. 2019, Chem. Sci.10, pp. 6539-6552, (Year: 2019).*

(Continued)

*Primary Examiner* — Matthew E. Hoban
*Assistant Examiner* — Lynne Edmondson
(74) *Attorney, Agent, or Firm* — Leydig, Voit & Mayer, Ltd.

(57) ABSTRACT

Provided herein are methods of making a high-quality quantum dot (QD), including by providing anion precursor chemistry that enables chemical modulation of precursor reactivity, thereby, allowing independent optimization of reaction temperature and precursor reactivity to systematically grow high quality QDs and by providing specially configured tunable precursors and related chemistry to (Continued)

facilitate separate reaction pathways for nucleation and growth, thereby accessing heat-up based synthesis of high-quality QD, including core-shell QDs. The methods may include providing a base-QD and a first anion or cation precursor having a composition comprising an anion or a cation element, respectively, and a modification agent. At least one add-layer is grown on the base-QD at a growth temperature, thereby making the high-quality QD comprising the base-QD and the at least one add-layer. At least one add-layer may have a composition comprising an add-layer cation element and an add-layer anion element.

22 Claims, 60 Drawing Sheets

(51) Int. Cl.

| | |
|---|---|
| *C09K 11/56* | (2006.01) |
| *C09K 11/62* | (2006.01) |
| *H10K 50/115* | (2023.01) |
| *B82Y 30/00* | (2011.01) |
| *B82Y 40/00* | (2011.01) |

(56) References Cited

U.S. PATENT DOCUMENTS

| | | |
|---|---|---|
| 2007/0295266 A1 | 12/2007 | Lee et al. |
| 2008/0160306 A1 | 7/2008 | Mushtaq et al. |
| 2008/0252209 A1 | 10/2008 | Jang et al. |
| 2010/0140641 A1 | 6/2010 | Kinomoto et al. |
| 2011/0227007 A1 | 9/2011 | Kang et al. |
| 2017/0369779 A1 | 12/2017 | Owen et al. |

FOREIGN PATENT DOCUMENTS

| | | |
|---|---|---|
| KR | 100657639 B1 | 12/2006 |
| WO | WO 2006/065054 A1 | 6/2006 |

OTHER PUBLICATIONS

Abe et al. (2012) Tuning the Postfocused Size of Colloidal Nanocrystals by the Reaction Rate: From Theory to Application. ACS Nano 6(1): 42-53.

Abe et al. (2013) Reaction Chemistry/Nanocrystal Property Relations in the Hot Injection Synthesis, the Role of the Solute Solubility. ACS Nano 7 (2), 943-949.

Aharonovich et al. (2016) Solid-state single-photon emitters. Nat. Photonics 10, 631-641.

Asano et al. (Jun. 2018) Colloidal Zn(Te,Se)/ZnS Core/Shell Quantum Dots Exhibiting Narrow-Band and Green Photoluminescence. ACS Omega 3 (6), 6703-6709.

Bailey et al. (2004) Quantum dots in biology and medicine, Physica E: Low-dimensional Systems and Nanostructures, 25, 1, 1-12. https://www.sciencedirect.com/science/article/pii/S1386947704003443.

Bao et al. (May 2020) ZnSe:Te/ZnSeS/ZnS nanocrystals: an access to cadmium-free pure-blue quantum-dot light-emitting diodes. Nanoscale 12 (21), 11556-11561.

Bernal Ramos et al. (2013) Precursor design and reaction mechanisms for the atomic layer deposition of metal films. Coord Chem Rev 257(23): 3271-3281.

Bischof et al. (2014) Measurement of Emission Lifetime Dynamics and Biexciton Emission Quantum Yield of Individual InAs Colloidal Nanocrystals. Nano Letters, 14 (12), 6787-6791.

Boldt et al. (2013) Synthesis of Highly Luminescent and Photo-Stable, Graded Shell CdSe/CdxZn1-xS Nanoparticles by In Situ Alloying. Chemistry of Materials, 25 (23), 4731-4738.

Boles et al. (2016) The surface science of nanocrystals. Nat Mater 15: 141-153.

Brown et al. (2014) Energy Level Modification in Lead Sulfide Quantum Dot Thin Films through Ligand Exchange. ACS Nano 8: 5863-5872.

Bruns et al. (2017) Next-generation in vivo optical imaging with short-wave infrared quantum dots. Nature Biomedical Engineering, 1 (4), 0056.

Campos et al. (2017) A Library of Selenourea Precursors to PbSe Nanocrystals with Size Distributions near the Homogeneous Limit. Journal of the American Chemical Society, 139 (6), 2296-2305.

Cao et al. (2004) One-Pot Synthesis of High-Quality Zinc-Blende CdS Nanocrystals. J. Am. Chem. Soc. 126, 14336-14337.

Chen et al. (2008) Synthesis of Metal-Selenide Nanocrystals Using Selenium Dioxide as the Selenium Precursor. Angew Chem Int Ed 47(45): 8638-8641.

Chen et al. (2012) 66.1: Distinguished Paper: A High-Efficiency Wide-Color-Gamut Solid-State Backlight System for LCDs Using Quantum Dot Enhancement Film. SID Symposium Digest of Technical Papers 43, 895-896.

Chen et al. (2013) Compact High-Quality CdSe—CdS Core-Shell Nanocrystals with Narrow Emission Linewidths and Suppressed Blinking. Nat. Mater. 12 (5), 445-451.

Chen et al. (Feb. 2020) Blue quantum dot-based electroluminescent light-emitting diodes. Materials Chemistry Frontiers, 4 (5), 1340-1365.

Chepic et al. (1990) Auger ionization of semiconductor quantum drops in a glass matrix. Journal of Luminescence, 47 (3), 113-127.

Chinnathambi et al. (Apr. 2019) Recent advances on fluorescent biomarkers of near-infrared quantum dots for in vitro and in vivo imaging. Science and Technology of Advanced Materials, 20 (1), 337-355.

Choi et al. (2009) Simple and Generalized Synthesis of Semiconducting Metal Sulfide Nanocrystals. Adv. Funct. Mater. 19, 1645-1649.

Choi et al. (2013) In Situ Repair of High-Performance, Flexible Nanocrystal Electronics for Large-Area Fabrication and Operation in Air. ACS Nano, 7 (9), 8275-8283.

Choi et al. (2016) Exploiting the colloidal nanocrystal library to construct electronic devices. Science, 352 (6282), 205.

Choi et al. (Apr. 2018) Flexible quantum dot light-emitting diodes for next-generation displays. Npj Flexible Electron. 2, 10.

Cossairt (2016) Shining Light on Indium Phosphide Quantum Dots: Understanding the Interplay among Precursor Conversion, Nucleation, and Growth. Chemistry of Materials, 28 (20), 7181-7189.

Cragg et al. (2010) Suppression of auger processes in confined structures. Nano Letters, 10, 313-317.

Csik et al. (2008) Density Functional Study of Surface Passivation of Nonpolar Wurtzite CdSe Surfaces. The Journal of Physical Chemistry C 2008, 112 (51), 20413-20417.

Cui et al. (2013) Direct probe of spectral inhomogeneity reveals synthetic tunability of single-nanocrystal spectral linewidths. Nature Chemistry, 5 (7), 602-606.

Dey et al. (2016) Effect of Gradient Alloying on Photoluminescence Blinking of Single $CdS_xSe_{1-x}$ Nanocrystals. J Phys Chem C 120(37): 20547-20554.

Dias et al. (2017) Heat-up synthesis of $Cu_2SnS_3$ quantum dots for near infrared photodetection. RSC Adv. 7, 23301-23308. https://pubs.rsc.org/en/content/articlehtml/2017/ra/c7ra02485a.

Efros (2008) Almost always bright. Nature Materials, 7, 612.

Efros et al. (2016) Origin and control of blinking in quantum dots. Nat. Nanotechnol. 11, 661-671.

Franke et al. (2016) Continuous injection synthesis of indium arsenide quantum dots emissive in the short-wavelength infrared. Nat Commun 7(1): 12749.

Frantsuzov et al. (2008) Universal emission intermittency in quantum dots, nanorods and nanowires. Nature Physics, 4, 519-522.

Galland et al. (2011) Two types of luminescence blinking revealed by spectroelectrochemistry of single quantum dots. Nature 479, 203.

García-Santamaría et al. (2011) Breakdown of Volume Scaling in Auger Recombination in CdSe/CdS Heteronanocrystals: The Role of the Core-Shell Interface. Nano Lett 11(2): 687-693.

(56) References Cited

OTHER PUBLICATIONS

Gardini et al. (Jul. 2018) Dissecting myosin-5B mechanosensitivity and calcium regulation at the single molecule level. Nature Communications, 9 (1), 2844.

Gary et al. (2014) Investigation of Indium Phosphide Quantum Dot Nucleation and Growth Utilizing Triarylsilylphosphine Precursors. Chem Mater 26(4): 1734-1744.

Ghosh et al. (2012) New Insights into the Complexities of Shell Growth and the Strong Influence of Particle Volume in Nonblinking "Giant" Core/Shell Nanocrystal Quantum Dots. Journal of the American Chemical Society, 134 (23), 9634-9643.

Gilmore et al. (Jul. 2019) Epitaxial Dimers and Auger-Assisted Detrapping in PbS Quantum Dot Solids. Matter, 1 (1), 250-265.

Grigel et al. (2016) InAs Colloidal Quantum Dots Synthesis via Aminopnictogen Precursor Chemistry. Journal of the American Chemical Society, 138 (41), 13485-13488.

Guidelli et al. (Nov. 2018) Mechanistic Insights and Controlled Synthesis of Radioluminescent ZnSe Quantum Dots Using a Microfluidic Reactor. Chemistry of Materials, 30 (23), 8562-8570.

Guo et al. (2013) Shape-Programmed Nanofabrication: Understanding the Reactivity of Dichalcogenide Precursors. ACS Nano, 7 (4), 3616-3626.

Guyot-Sionnest (2012) Electrical Transport in Colloidal Quantum Dot Films. J Phys Chem Lett 3(9): 1169-1175.

Hamachi et al. (Jun. 2019) Precursor reaction kinetics control compositional grading and size of $CdSe_{1-x}S_x$ nanocrystal heterostructures. Chem Sci 10(26): 6539-6552.

Han et al. (2010) Development of a Bioorthogonal and Highly Efficient Conjugation Method for Quantum Dots Using Tetrazine-Norbornene Cycloaddition. J. Am. Chem. Soc. 132, 7838-7839.

Han et al. (Apr. 2020) More Than 9% Efficient ZnSeTe Quantum Dot-Based Blue Electroluminescent Devices. ACS Energy Letters, 5 (5), 1568-1576.

Harris et al. (2012) Improved Precursor Chemistry for the Synthesis of III-V Quantum Dots. Journal of the American Chemical Society, 134 (50), 20211-20213.

Hendricks et al. (2012) The Importance of Nanocrystal Precursor Conversion Kinetics: Mechanism of the Reaction between Cadmium Carboxylate and Cadmium Bis(diphenyldithiophosphinate). ACS Nano 6, 10054-10062.

Hendricks et al. (2015) A Tunable library of substituted thiourea precursors to metal sulfide nanocrystals. Science 348, 1226-1230.

Henry et al. (1977) Nonradiative capture and recombination by multiphonon emission in GaAs and GaP. Physical Review B 1977, 15 (2), 989-1016.

Huang et al. (2017) Low cost and large scale synthesis of PbS quantum dots with hybrid surface passivation. CrystEngComm 19, 946-951.

Huang et al. (Sep. 2019) Synthesis of Colloidal Blue-Emitting InP/ZnS Core/Shell Quantum Dots with the Assistance of Copper Cations. The Journal of Physical Chemistry Letters, 10 (21), 6720-6726.

Hwang (1998) $(Ba,Sr)$ $TiO_3$ thin films for ultra large scale dynamic random access memory.: A review on the process integration. Mater Sci Eng: B, 56(2): 178-190.

International Search Report and Written Opinion dated Feb. 12, 2021, in International Application No. PCT/US2020/060428, from which the present application claims priority, 9 pp.

Ip et al. (2012) Hybrid passivated colloidal quantum dot solids. Nature Nanotechnology, 7, 577.

Ippen et al. (2014) ZnSe/ZnS quantum dots as emitting material in blue QD-LEDs with narrow emission peak and wavelength tunability. Organic Electronics, 15 (1), 126-131.

Jang et al. (Nov. 2019) Synthesis of Alloyed ZnSeTe Quantum Dots as Bright, Color-Pure Blue Emitters. ACS Applied Materials & Interfaces, 11 (49), 46062-46069.

Jara et al. (2014) Size-Dependent Photovoltaic Performance of $CuInS_2$ Quantum Dot-Sensitized Solar Cells. Chem Mater 26(24): 7221-7228.

Javaux et al. (2013) Thermal activation of non-radiative Auger recombination in charged colloidal nanocrystals. Nature Nanotechnology, 8, 206-212.

Ji et al. (2013) High color purity ZnSe/ZnS core/shell quantum dot based blue light emitting diodes with an inverted device structure. Applied Physics Letters, 103 (5), 053106.

Ji et al. (Jan. 2019) Strain-controlled shell morphology on quantum rods. Nature Communications, 10 (1), 2.

Ji et al. (Mar. 2020) ZnSe/ZnS Core/Shell Quantum Dots with Superior Optical Properties through Thermodynamic Shell Growth. Nano Letters, 20 (4), 2387-2395.

Jiang et al. (2015) Thiol-based non-injection synthesis of near-infrared $Ag_2S$/ZnS core/shell quantum dots. RSC Adv. 5, 56789-56793.

Jin et al. (2012) Semiconductor quantum dots for in vitro diagnostics and cellular imaging. Trends Biotechnol 30: 394-403.

Jo et al. (Jan. 2020) InP-Based Quantum Dots Having an InP Core, Composition-Gradient ZnSeS Inner Shell, and ZnS Outer Shell with Sharp, Bright Emissivity, and Blue Absorptivity for Display Devices. ACS Applied Nano Materials, 3 (2), 1972-1980.

Kamat (2012) Boosting the Efficiency of Quantum Dot Sensitized Solar Cells through Modulation of Interfacial Charge Transfer. Acc. Chem. Res. 45, 1906-1915.

Kango et al. (2014) Semiconductor-Polymer Hybrid Materials, pp. 283-311, In: Kalia, S., Haldorai, Y. (eds) Organic-Inorganic Hybrid Nanomaterials. Advances in Polymer Science, vol. 267. https://link. springer.com/chapter/10.1007/12_2014_295#Sec2.

Kappes et al. (2015) Metallic nanocrystals synthesized in solution: a brief review of crystal shape theory and crystallographic characterization. Cryst. Res. Technol. 50, 801-816.

Keitel et al. (2016) Near-Infrared Photoluminescence and Thermal Stability of PbS Nanocrystals at Elevated Temperatures. J Phys Chem C, 120(36): 20341-20349.

Kim et al. (2013) Bright and stable quantum dots and their applications in full-color displays. MRS Bulletin, 38 (9), 712-720.

Kim et al. (2017) Synthesis of highly efficient azure-to-blue-emitting Zn—Cu—Ga—S quantum dots. Chemical Communications, 53 (29), 4088-4091.

Kim et al. (May 2020) Efficient Blue-Light-Emitting Cd-Free Colloidal Quantum Well and Its Application in Electroluminescent Devices. Chemistry of Materials, 32 (12), 5200-5207.

Kirkwood et al. (Oct. 2018) Finding and Fixing Traps in II-VI and III-V Colloidal Quantum Dots: The Importance of Z-Type Ligand Passivation. J Am Chem Soc 140(46): 15712-15723.

Kloeffel et al. (2013) Prospects for Spin-Based Quantum Computing in Quantum Dots. Annu. Rev. Condens. Matter Phys. 4, 51-81.

Knowles et al. (2016) Luminescent Colloidal Semiconductor Nanocrystals Containing Copper: Synthesis, Photophysics, and Applications. Chem Rev 116(18): 10820-10851.

Köster et al. (1992) "1,5-Cyclooctanediylborylsulfides," In: Grimes RN (ed). Inorganic Syntheses, vol. 29. Wiley: New Jersey, US, pp. 60-69.

Kuno et al. (2000) Nonexponential "blinking" kinetics of single CdSe quantum dots: A universal power law behavior. J. Chem. Phys. 112 (7), 3117-3120.

Lane et al. (2014) Compact and blinking-suppressed quantum dots for single-particle tracking in live cells. Journal of Physical Chemistry B, 118, 14140-14147.

Langbein et al. (2010) Ultrafast gain dynamics in InP quantum-dot optical amplifiers. Applied Physics Letters, 97 (21), 211103.

Laurence et al. (2009) The BF3 Affinity Scale. Lewis Basicity and Affinity Scales. Wiley: New Jersey, US, pp. 85-109.

Leatherdale et al. (2002) On the Absorption Cross Section of CdSe Nanocrystal Quantum Dots. J. Phys. Chem. B, 106, 7619-7622.

Li et al. (2008) One-pot Synthesis of Highly Luminescent InP/ZnS Nanocrystals without Precursor Injection. J. Am. Chem. Soc. 130, 11588-11589.

Li et al. (2013) "Noncrystalline-to-Crystalline Transformations in Pt Nanoparticles" J. Am. Chem. Soc. 2013, 135, 35, 13062-13072.

Li et al. (2013) Blinking, Flickering, and Correlation in Fluorescence of Single Colloidal CdSe Quantum Dots with Different Shells under Different Excitations. The Journal of Physical Chemistry C, 117 (9), 4844-4851.

(56)             References Cited

OTHER PUBLICATIONS

Li et al. (Apr. 2019) Stoichiometry-Controlled InP-Based Quantum Dots: Synthesis, Photoluminescence, and Electroluminescence. Journal of the American Chemical Society, 141 (16), 6448-6452.
Lian et al. (Jan. 2018) "In Situ Tuning the Reactivity of Selenium Precursor To Synthesize Wide Range Size, Ultralarge-Scale, and Ultrastable PbSe Quantum Dots" Chem. Mater. 30, 3, 982-989.
Liao et al. (2016) Precursor dependent nucleation and growth of ruthenium films during chemical vapor deposition. Journal of Vacuum Science & Technology A, 34(4): 041514.
Lim et al. (2016) Quantum dot surface engineering: Toward inert fluorophores with compact size and bright, stable emission. Coordination Chemistry Reviews, 320-321, 216-237.
Liu et al. (2008) Compact Biocompatible Quantum Dots Functionalized for Cellular Imaging. J. Am. Chem. Soc. 130, 1274-1284.
Liu et al. (2009) Shape Control of CdSe Nanocrystals with Zinc Blende Structure. J Am Chem Soc, 131(45): 16423-16429.
Lounis et al. (2000) Single photons on demand from a single molecule at room temperature. Nature, 407 (6803), 491-493.
Luo et al. (Mar. 2018) Television's Quantum dots will be the next darling of TV manufacturers. IEEE Spectrum 55, 28-53.
Mahler et al. (2008) Towards non-blinking colloidal quantum dots. Nat. Mater. 7, 659-664.
Maity et al. (2015) Ultrafast charge carrier delocalization in CdSe/CdS quasi-type II and CdS/CdSe inverted type I core-shell: a structural analysis through carrier-quenching study. J. Phys. Chem. C 119, 26202-26211.
Manna et al. (2005) First-Principles Modeling of Unpassivated and Surfactant-Passivated Bulk Facets of Wurtzite CdSe: A Model System for Studying the Anisotropic Growth of CdSe Nanocrystals. J Phys Chem B 109(13): 6183-6192.
Margraf et al. (2013) Theoretical and Experimental Insights into the Surface Chemistry of Semiconductor Quantum Dots. Langmuir, 29 (49), 15450-15456.
McDonald et al. (2005) Solution-processed PbS quantum dot infrared photodetectors and photovoltaics. Nature Materials, 4 (2), 138-142.
Medintz et al. (2005) Quantum dot bioconjugates for imaging, labelling and sensing. Nature Materials, 4 (6), 435-446.
Methaapanon et al. (2012) The low temperature atomic layer deposition of ruthenium and the effect of oxygen exposure. J Mater Chem 22(48): 25154-25160.
Moerner (2004) Single-photon sources based on single molecules in solids. New Journal of Physics, 6, 88-88.
Moll et al. (1998) Influence of surface stress on the equilibrium shape of strained quantum dots. Physical Review B, 58 (8), 4566-4571.
Momeni et al. (2015) Interplay of donor-acceptor interactions in stabilizing boron nitride compounds: insights from theory. Phys Chem Chem Phys 17(25): 16525-16535.
Mora-Seró et al. (2009) Recombination in Quantum Dot Sensitized Solar Cells. Acc. Chem. Res. 42, 1848-1857.
Moreels et al. (2009) Size-Dependent Optical Properties of Colloidal PbS Quantum Dots. ACS Nano 3(10): 3023-3030.
Morris-Cohen et al. (2010) The Effect of a Common Purification Procedure on the Chemical Composition of the Surfaces of CdSe Quantum Dots Synthesized with Trioctylphosphine Oxide. J. Phys. Chem. C, 114, 897-906.
Murphy et al. (2015) Best Practices for the Reporting of Colloidal Inorganic Nanomaterials. Chem. Mater. 27, 4911-4913.
Murphy et al. (2004) Epitaxial growth and surface modeling of ZnO on c-plane $Al_2O_3$. Appl Phys Lett 85(26): 6338-6340.
Murray et al. (1993) Synthesis and characterization of nearly monodisperse CdE (E = sulfur, selenium, tellurium) semiconductor nanocrystallites. J. Am. Chem. Soc. 115, 8706-8715.
Nagaoka et al. (Sep. 2018) Superstructures generated from truncated tetrahedral quantum dots. Nature 561(7723): 378-382.
Nakonechnyi et al. (2017) Mechanistic Insights in Seeded Growth Synthesis of Colloidal Core/Shell Quantum Dots. Chem. Mater. 29, 4719-4727.

Nasilowski et al. (2015) Gradient CdSe/CdS Quantum Dots with Room Temperature Biexciton Unity Quantum Yield. Nano Lett. 15, 3953-3958.
Nirmal et al. (1996) Fluorescence intermittency in single cadmium selenide nanocrystals. Nature 383, 802-804.
Orfield et al. (2015) Correlation of Atomic Structure and Photoluminescence of the Same Quantum Dot: Pinpointing Surface and Internal Defects That Inhibit Photoluminescence. ACS Nano, 9 (1), 831-839.
Park et al. (2016) Highly luminescent InP/GaP/ZnS QDs emitting in the entire color range via heating up process. Sci. Rep. 6, 30094. https://www.nature.com/articles/srep30094.
Park et al. (Aug. 2020) "Nanocrystal Precursor Incorporating Separated Reaction Mechanisms for Nucleation and Growth to Unleash the Potential of Heat-up Synthesis," ACS Nano 14, 9, 11579-11593.
Park et al. (Jan. 2019) Asymmetrically strained quantum dots with non-fluctuating single-dot emission spectra and subthermal room-temperature linewidths. Nat. Mater. 18, 249-255.
Park et al. (Nov. 2020) "Controllable modulation of precursor reactivity using chemical additives for systematic synthesis of high-quality quantum dots" Nat Commun 11, 5748.
Park et al. (2014) Auger Recombination of Biexcitons and Negative and Positive Trions in Individual Quantum Dots. ACS Nano, 8, 7288-7296.
Peng (2003) Mechanisms for the Shape-Control and Shape-Evolution of Colloidal Semiconductor Nanocrystals. Adv Mater 15(5): 459-463.
Peng et al. (1997) Epitaxial Growth of Highly Luminescent CdSe/CdS Core/Shell Nanocrystals with Photostability and Electronic Accessibility. J. Am. Chem. Soc. 119 (30), 7019-7029.
Pietra et al. (2017) Ga for Zn Cation Exchange Allows for Highly Luminescent and Photostable InZnP-Based Quantum Dots. Chemistry of Materials, 29 (12), 5192-5199.
Pietryga et al. (2016) Spectroscopic and Device Aspects of Nanocrystal Quantum Dots. Chem. Rev. 116, 10513-10622.
Polovitsyn et al. (2017) "Synthesis of Air-Stable CdSe/ZnS Core-Shell Nanoplatelets with Tunable Emission Wavelength" Chem. Mater. 29, 13, 5671-5680.
Qin et al. (2014) Single-Dot Spectroscopy of Zinc-Blende CdSe/CdS Core/Shell Nanocrystals: Nonblinking and Correlation with Ensemble Measurements. J Am Chem Soc 136(1): 179-187.
Qin et al. (2014) Small Bright Charged Colloidal Quantum Dots. ACS Nano 8(1): 283-291.
Quinn et al. (2016) Surface Charge Control of Quantum Dot Blinking. The Journal of Physical Chemistry C, 120 (34), 19487-19491.
Rainò et al. (2011) Probing the Wave Function Delocalization in CdSe/CdS Dot-in-Rod Nanocrystals by Time- and Temperature-Resolved Spectroscopy. ACS Nano, 5 (5), 4031-4036.
Reiss et al. (2009) Core/Shell Semiconductor Nanocrystals. Small 5(2): 154-168.
Rempel et al. (2006) Density Functional Theory Study of Ligand Binding on CdSe (0001), (0001), and (1120) Single Crystal Relaxed and Reconstructed Surfaces: Implications for Nanocrystalline Growth. J Phys Chem B 110(36): 18007-18016.
Rossinelli et al. (2017) High-temperature growth of thick-shell CdSe/CdS core/shell nanoplatelets. Chem Commun 53(71): 9938-9941.
Rottman et al. (1984) Statistical mechanics of equilibrium crystal shapes: Interfacial phase diagrams and phase transitions. Physics Reports, 103 (1), 59-79.
Ruberu et al. (2012) Molecular Control of the Nanoscale: Effect of Phosphine-Chalcogenide Reactivity on CdS—CdSe Nanocrystal Composition and Morphology. ACS Nano 6(6): 5348-5359.
Sagar et al. (Mar. 2020) Single-Precursor Intermediate Shelling Enables Bright, Narrow Line Width InAs/InZnP-Based QD Emitters. Chemistry of Materials, 32 (7), 2919-2925.
Salas et al. (2012) Chapter 2—Synthesis of Inorganic Nanoparticles. In Frontiers of Nanoscience, de la Fuente, J. M.; Grazu, V., Eds. Elsevier vol. 4, pp. 35-79.
Shen et al. (2014) High-Efficient Deep-Blue Light-Emitting Diodes by Using High Quality $Zn_xCd_{1-x}S/ZnS$ Core/Shell Quantum Dots. Adv Funct Mater, 24(16): 2367-2373.

(56) References Cited

OTHER PUBLICATIONS

Shen et al. (2016) Gel permeation chromatography as a multifunctional processor for nanocrystal purification and on-column ligand exchange chemistry. Chem. Sci. 7, 5671-5679.

Shirasaki et al. (2013) Emergence of colloidal quantum-dot light-emitting technologies. Nat. Photonics 7, 13-23.

Smith et al. (2011) Tuning the Synthesis of Ternary Lead Chalcogenide Quantum Dots by Balancing Precursor Reactivity. ACS Nano 2011, 5, 1, 183-190.

Stinner et al. (2015) Flexible, High-Speed CdSe Nanocrystal Integrated Circuits. Nano Letters, 15 (10), 7155-7160.

Stringfellow (1982) Epitaxy. Rep. Prog. Phys. 45(5): 469-525.

Su et al. (2017) Controlling Surface Termination and Facet Orientation in Cu2O Nanoparticles for High Photocatalytic Activity: A Combined Experimental and Density Functional Theory Study. ACS Applied Materials & Interfaces, 9 (9), 8100-8106.

Talapin et al. (2005) PbSe Nanocrystal Solids for n- and p-Channel Thin Film Field-Effect Transistors. Science, 310 (5745), 86.

Teng et al. (2014) In Semiconductor single-photon emitters with tunable polarization output, 2014 Conference on Lasers and Electro-Optics (CLEO)—Laser Science to Photonic Applications, Jun. 8-13, 2014; pp. 1-2.

Tessier et al. (2016) Aminophosphines: A Double Role in the Synthesis of Colloidal Indium Phosphide Quantum Dots. Journal of the American Chemical Society, 138 (18), 5923-5929.

Thanh et al. (2014) Mechanisms of Nucleation and Growth of Nanoparticles in Solution. Chem. Rev. 114, 7610-7630.

Tietze et al. (Jul. 2018) Synthesis of NIR-Emitting InAs-Based Core/Shell Quantum Dots with the Use of Tripyrazolylarsane as Arsenic Precursor. Particle & Particle Systems Characterization, 35 (9), 1800175.

Tong et al. (Aug. 2018) Optoelectronic Properties in Near-Infrared Colloidal Heterostructured Pyramidal "Giant" Core/Shell Quantum Dots. Adv Sci 5(8): 1800656.

Turo et al. (2014) Crystal-Bound vs Surface-Bound Thiols on Nanocrystals. ACS Nano 8, 10205-10213.

Van Embden (2015) The Heat-Up Synthesis of Colloidal Nanocrystals. Chem. Mater. 27, 2246-2285.

Van Oversteeg et al. (Jan. 2019) Water-Dispersible Copper Sulfide Nanocrystals via Ligand Exchange of 1-Dodecanethiol. Chem. Mater. 31, 541-552.

Vaxenburg et al. (2016) Biexciton Auger Recombination in CdSe/CdS Core/Shell Semiconductor Nanocrystals. Nano Letters, 16 (4), 2503-2511.

Voznyy et al. (2014) Atomistic Model of Fluorescence Intermittency of Colloidal Quantum Dots. Phys Rev Lett 112(15): 157401.

Wei et al. (2010) Highly Reactive Se Precursor for the Phosphine-Free Synthesis of Metal Selenide Nanocrystals. Chem. Mater. 22, 20, 5672-5677. https://pubs.acs.org/doi/full/10.1021/cm101308f.

Weidman et al. (2014) Monodisperse, Air-Stable PbS Nanocrystals via Precursor Stoichiometry Control. ACS Nano 8: 6363-6371.

Won et al. (Nov. 2019) Highly efficient and stable InP/ZnSe/ZnS quantum dot light-emitting diodes. Nature 575, 634-638.

Xie et al. (2016) Characterization of Indium Phosphide Quantum Dot Growth Intermediates Using MALDI-TOF Mass Spectrometry. Journal of the American Chemical Society, 138 (41), 13469-13472.

Yang et al. (2005) Synthesis of CdSe and CdTe Nanocrystals without Precursor Injection. Angew. Chem. Int. Ed. 44, 6712-6715.

Yang et al. (May 2019) Design Rules for One-Step Seeded Growth of Nanocrystals: Threading the Needle between Secondary Nucleation and Ripening. Chem. Mater. 31, 4173-4183.

Yin et al. (2005) Colloidal nanocrystal synthesis and the organic-inorganic interface. Nature 437(7059): 664-670.

Yuan et al. (Mar. 2018) Two Mechanisms Determine Quantum Dot Blinking. ACS Nano, 12 (4), 3397-3405.

Zang et al. (2017) Thick-Shell CuInS₂/ZnS Quantum Dots with Suppressed "Blinking" and Narrow Single-Particle Emission Line Widths. Nano Lett 17(3): 1787-1795.

Zhang et al. (2000) Modelling for size-dependent and dimension-dependent melting of nanocrystals. J. Phys. D: Appl. Phys. 33, 2653-2656.

Zhang et al. (2012) A Generic Method for Rational Scalable Synthesis of Monodisperse Metal Sulfide Nanocrystals. Nano Lett. 12, 5856-5860.

Zhang et al. (2012) Scalable Single-Step Noninjection Synthesis of High-Quality Core/Shell Quantum Dots with Emission Tunable from Violet to Near Infrared. ACS Nano 6, 11066-11073.

Zhang et al. (2014) Diffusion-Controlled Synthesis of PbS and PbSe Quantum Dots with in Situ Halide Passivation for Quantum Dot Solar Cells. ACS Nano 8(1): 614-622.

Zhang et al. (2015) Non-blinking (Zn)CuInS/ZnS Quantum Dots Prepared by In Situ Interfacial Alloying Approach. Scientific Reports, 5 (1), 15227.

Zhang et al. (2017) Combination of Cation Exchange and Quantized Ostwald Ripening for Controlling Size Distribution of Lead Chalcogenide Quantum Dots. Chem. Mater. 29, 3615-3622.

Zhang et al. (Jan. 2020) High-Brightness Blue InP Quantum Dot-Based Electroluminescent Devices: The Role of Shell Thickness. The Journal of Physical Chemistry Letters, 11 (3), 960-967.

Zhang et al. (Sep. 2019) Identification of Facet-Dependent Coordination Structures of Carboxylate Ligands on CdSe Nanocrystals. Journal of the American Chemical Society, 141 (39), 15675-15683.

Zhao et al. (2010) Challenge to the Charging Model of Semiconductor-Nanocrystal Fluorescence Intermittency from Off-State Quantum Yields and Multiexciton Blinking. Phys Rev Lett 104(15): 157403.

Zhou et al. (2017) Ideal CdSe/CdS core/shell nanocrystals enabled by entropic ligands and their core size-, shell thickness-, and ligand-dependent photoluminescence properties. J. Am. Chem. Soc. 139, 16556-16567 (2017).

Zhou et al. (Jun. 2018) Harnessing the properties of colloidal quantum dots in luminescent solar concentrators. Chem. Soc. Rev. 47, 5866-5890.

* cited by examiner

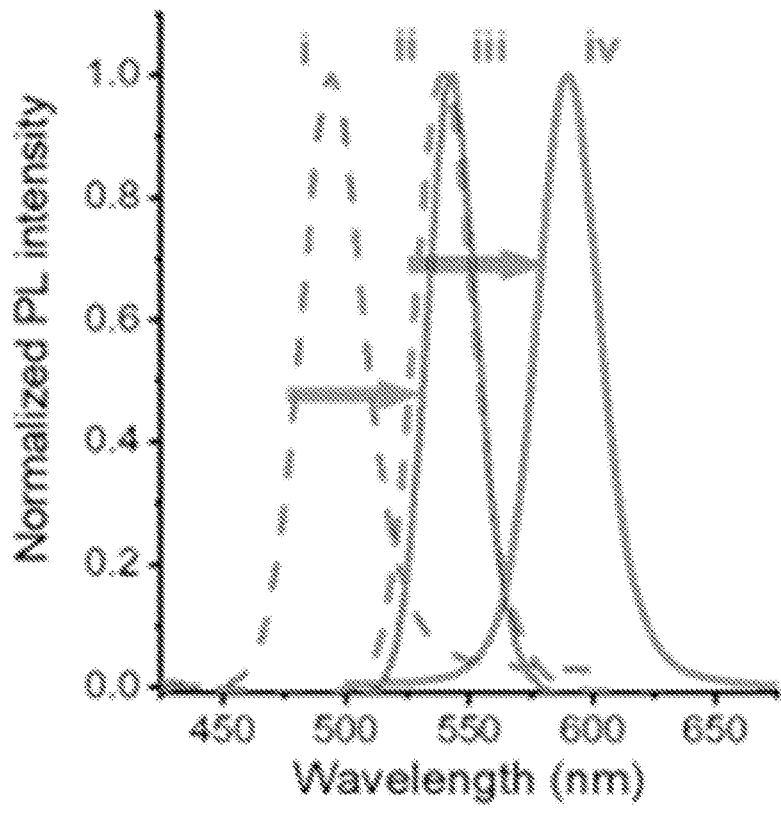
FIG. 6A
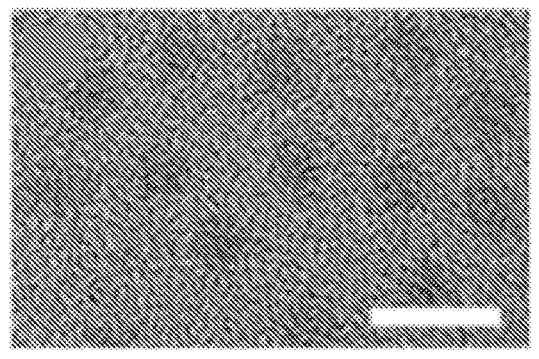
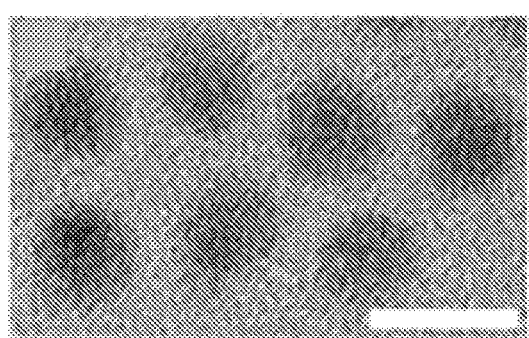
FIG. 6B                              FIG. 6C

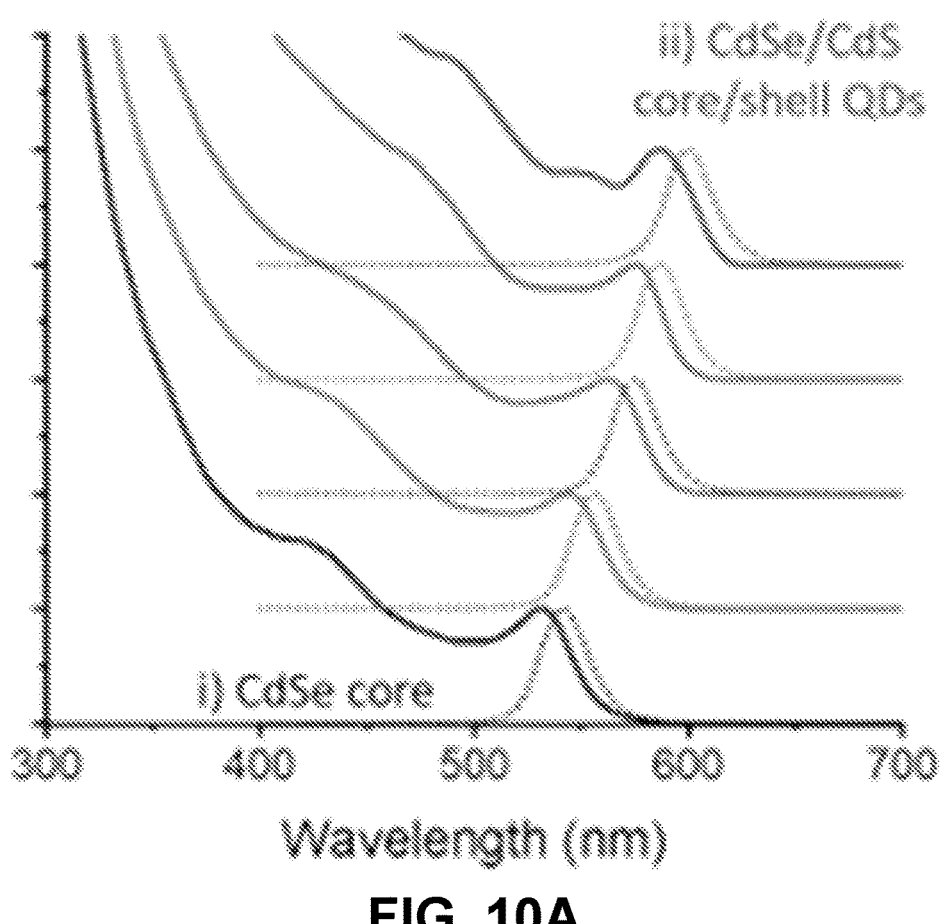
FIG. 10A
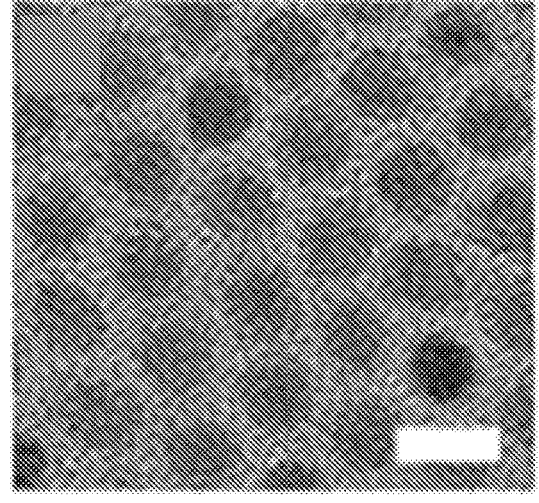
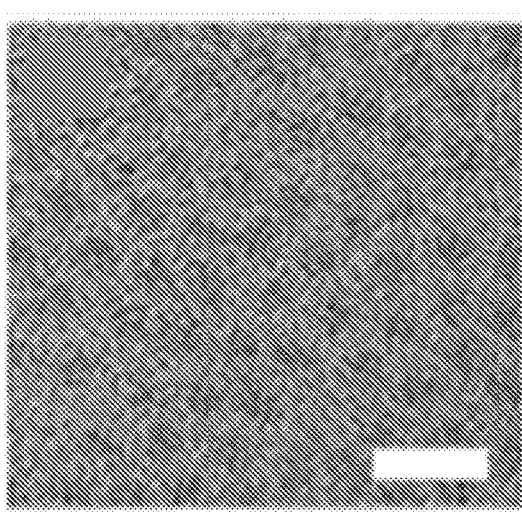
FIG. 10B                    FIG. 10C i: (sm)-CdSe, ii: (sm)-CdSe/CdS, iii: (bg)-CdSe, iv: (bg)-CdSe/CdS i: (sm)-CdSe, ii: (sm)-CdSe/CdS, iii: (bg)-CdSe, iv: (bg)-CdSe/CdS

| Reaction temperature | PL peak (nm) | FWHM (nm) | QY (%) | Crystallinity (%) |
|:---:|:---:|:---:|:---:|:---:|
| 100-130°C | 536 | 25 | 75 | 92 |
| 140-170°C | 541 | 27 | 47 | 67 |
| 170-200°C | 554 | 33 | 60 | 71 |

| Reaction temperature | PL peak (nm) | FWHM (nm) | QY (%) | Crystallinity (%) |
|---|---|---|---|---|
| 100-130°C | 595 | 32 | 52 | 42 |
| 170-200°C | 597 | 25 | 79 | 90 |

| Precursor types | FWHM (degree) | FWHM (rad, x 10⁻²) |
|---|---|---|
| Octanethiol | 1.64 | 2.87 |
| | 1.63 | 2.85 |
| [BBN-SH : DMAP] (mismatched pair) | 1.73 | 3.02 |

| Activation temperature | PL peak (nm) | # of deposited shell | FWHM (nm) | QY (%) | Crystallinity (%) |
|---|---|---|---|---|---|
| 140°C | 598 | 7 MLs | 32 | 68 | 72 |
| | 597 | 7 MLs | 25 | 79 | 90 |
| 190°C | 583 | 5 MLs | 27 | 70 | 53 |
FIG. 26G
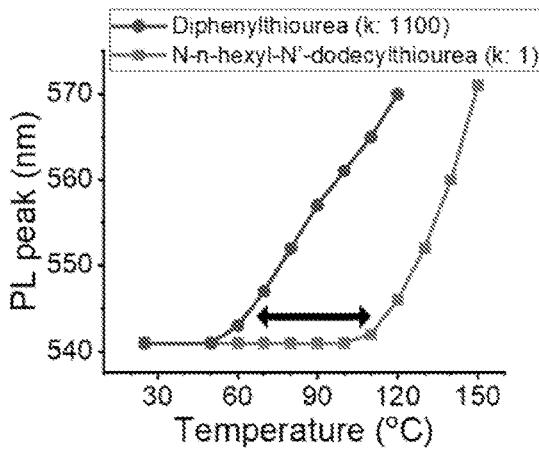
FIG. 27A
PL spectrum of resulted CdSe/CdS QDs
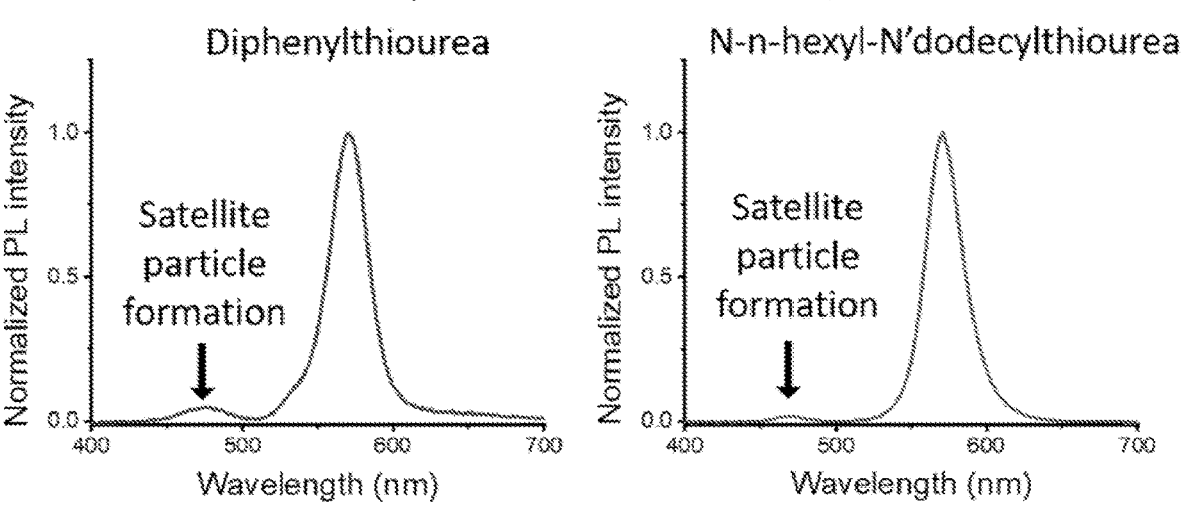
FIG. 27B

FIG. 37A          FIG. 37B

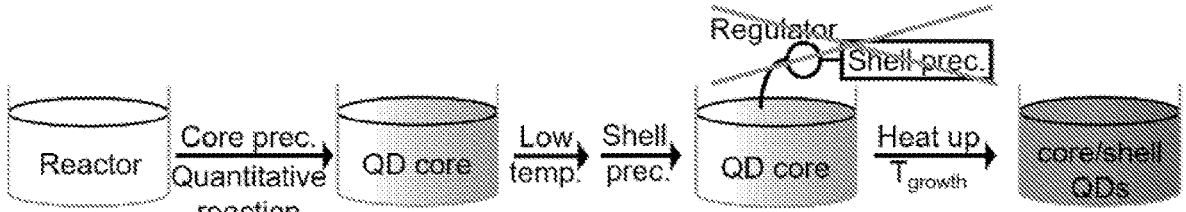
FIG. 40A
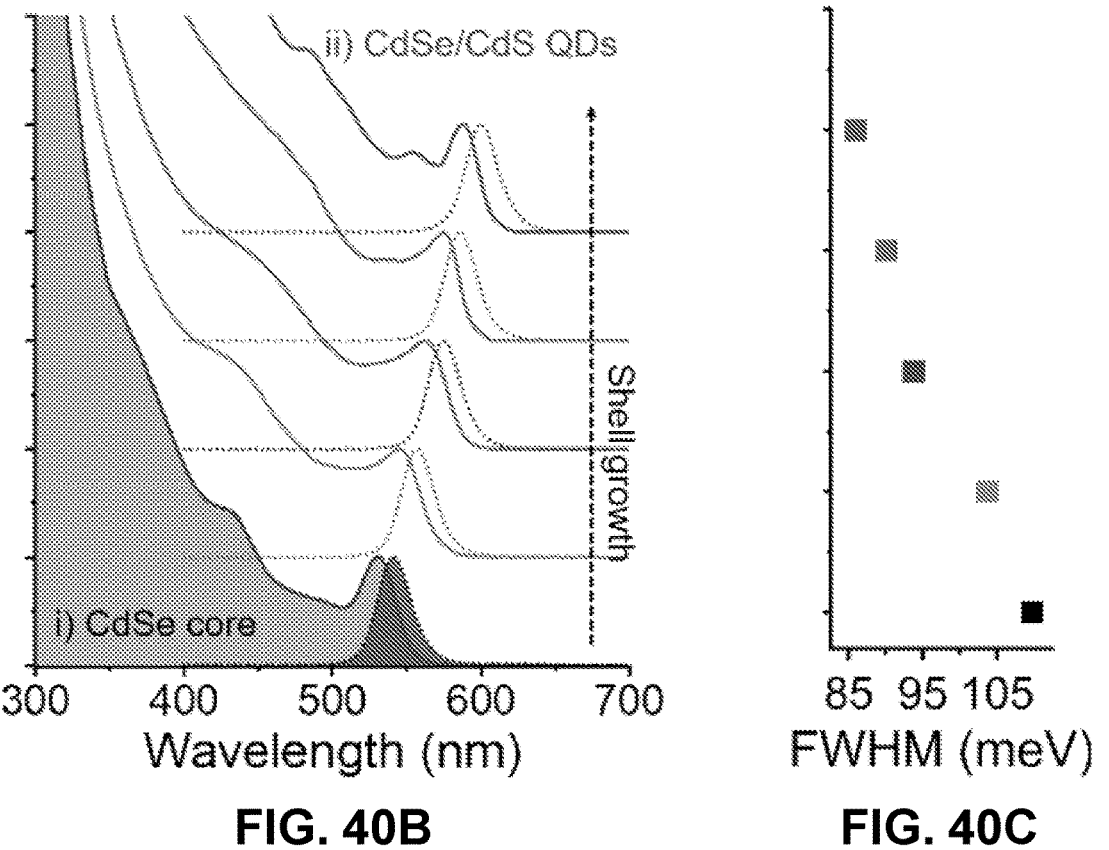
FIG. 40B  FIG. 40C

PRECURSOR CHEMISTRY FOR QUANTUM DOT SYNTHESIS ENABLING TEMPERATURE-INDEPENDENT MODULATION OF REACTIVITY

CROSS-REFERENCE TO RELATED APPLICATIONS

This application is a U.S. National Stage Application under 35 U.S.C. § 371 of International Application No. PCT/US2020/060428, filed Nov. 13, 2020, which claims the benefit of priority to U.S. Provisional Patent Application No. 63/059,462, filed Jul. 31, 2020, and to U.S. Provisional Patent Application No. 62/935,621, filed Nov. 14, 2019, each of which is hereby incorporated by reference in its entirety.

BACKGROUND OF INVENTION

Quantum dots (QDs), also known as semiconductor nanocrystals (NCs), are unique light-emitting materials whose optical, and electronic properties can be tuned by their size and composition. High-quality QDs are defined as defect-free semiconductor nanocrystals with narrow size distribution and high quantum yield (QY). Synthesis of high-quality QDs requires balance among these factors, for example: 1) surface instability of QDs while maintaining the narrow size distribution; 2) precursor reactivity for sufficient monomer supply while avoiding satellite particle formation; 3) surface reaction kinetics for defect-free growth. Balancing the precursor reactivity and the surface instability of QDs is crucial to optimize the surface reaction kinetics on QDs. The size and composition of QDs determines the reaction temperature for inducing optimal surface instability of QDs for growing. Because of this, precursor reactivity should be precisely tuned and matched to the surface instability of QDs. When the surface instability of QDs is too low, the precursor for growing cannot react efficiently at the surface of QDs. When the surface instability of QDs is too big, broad size distribution or complete dissociation of QDs is induced. On the precursor front, if the precursor reactivity is too high at a given reaction temperature, the defects at the surface of NCs formed easily during the growth process and cannot be annealed. As a result, the properties of resulted QDs would be poor, such as a low QY and broad size distribution. If the precursor reactivity is too low at a given reaction temperature, the growth of QDs would not be efficient. To simultaneously balance the surface instability of QDs and precursor reactivity, the reactivity of precursor should be independently controllable.

Unfortunately, the reactivity of conventional precursors is determined by their chemical structure. To get a precursor with different reactivity, researchers need to choose a different candidate from a limited set of commercially available precursors or design and synthesize precursors to match with their own QDs. Because the temperature-independent modulation of precursor is not possible, it is almost impossible to achieve an optimal combination of the surface instability of QD and the reactivity of conventional precursors. This problem occurs because both surface instability of QD and precursor reactivity are regulated by a temperature, which is a single factor that researchers can adjust so far.

SUMMARY OF THE INVENTION

Presented herein are new methods for making core-only as well as core/shell high-quality quantum dots (QDs), including semiconductor quantum dots. The methods rely, at least in part, on use of a new class of temperature-independent reactivity tunable precursors. In conventional approaches, temperature and precursor reactivity are inseparably intertwined leading to significant trade-offs among factors such as QD size, shell thickness, degree or absence of alloying between core and shell, structural quality (e.g., crystallinity and defect concentration), morphology (e.g., circularity or sphericity), and polydispersity, all of which also influence important characteristics such as emission quantum yield. Instead, presented herein are methods where reactivity of the anion precursor, for example, can be tuned by modification or activation with a modification agent, such as a halide or Lewis base molecule, to form a converted or modified anion precursor. The intentional or predetermined change in reactivity of the anion precursor (via modification to modified anion precursor) in turn also affects an activation temperature of the modified anion precursor. Thus, at least the temperature at which growth of the QD core and/or QD shell occurs (activation temperature) can be controlled. The activation temperature can, in turn, be tuned within a desired or predetermined temperature range with respect to a melting point of the QD core or base-QD upon which further growth occurs. This allows the growth to occur under conditions wherein the thermal energy is sufficient to allow growth, annealing of defects, and kinetic growth to promote sphericity while being sufficiently low to avoid an excessively labile surface during growth, which can cause particle dissolution or undesired alloying of the core and shell.

Central aspects of the methods provided herein include: (i) the ability to chemically modulate precursor reactivity (ii) in a manner that is predictable. Predictable modulation is important for systematic optimization. The methods provided herein illustrate that we can very well predict the relative degree of modulation by different modification agents.

Aspects provided herein include a method of making a high-quality quantum dot (QD), the method comprising the steps of: providing a base-QD; providing a first anion or cation precursor having a composition comprising an anion or a cation element, respectively; providing a modification agent; growing at least one add-layer on the base-QD at a growth temperature, thereby making the high-quality QD comprising the base-QD and the at least one add-layer; and independently controlling the activation temperature ($T_{act}$) and the growth temperature; wherein: the growth temperature is equal to or greater than an activation temperature ($T_{act}$) of the growth of the at least one add-layer; the at least one add-layer has a composition comprising an add-layer cation element and an add-layer anion element; and wherein the add-layer anion element or the add-layer anion element is identical to the anion element or the cation element, respectively, of the first anion precursor. Aspects of the invention include a method of making a high-quality quantum dot (QD), the method comprising the steps of: providing a base-QD; providing a first anion or cation precursor having a composition comprising an anion or a cation element, respectively; providing a modification agent; chemically modifying or reacting the first anion or cation precursor with the modification agent thereby inducing (a) a conversion of the first anion precursor to a modified anion precursor or (b) a decomposition of the first anion precursor; growing at least one add-layer on the base-QD at a growth temperature, thereby making the high-quality QD comprising the base-QD and the at least one add-layer; wherein: the growth temperature is equal to or greater than an activation temperature ($T_{act}$) of the growth of the at least one add-layer; the at least one add-layer has a composition comprising an add-layer cation element and an add-layer anion element; and wherein the add-layer anion element or the add-layer anion element is identical to the anion element or the cation element, respectively, of the first anion precursor. Preferably, any method disclosed herein comprises independently controlling the activation temperature $(T_{act})$ and the growth temperature. Optionally, in any embodiment, the at least one add-layer has a composition comprising two or more add-layer cation elements and/or two or more add-layer anion elements. Optionally, in any embodiment, the at least one add-layer has a composition comprising two or more add-layer cation elements. Optionally, in any embodiment, the at least one add-layer has a composition comprising two or more add-layer anion elements.

Aspects of the invention include a "first method" of making a high-quality quantum dot (QD) (such as, but not limited to, method of claim 1 and its dependent claim), the method comprising the steps of: providing a base-QD; providing a first anion precursor having a composition comprising an anion element; providing a modification agent; chemically modifying the first anion precursor by the modification agent thereby inducing a conversion of the first anion precursor to a modified anion precursor; wherein the modified anion precursor has a composition comprising the anion element; wherein the modified anion precursor comprises the modification agent coordinated to the first anion precursor; growing at least one add-layer on the base-QD at a growth temperature, thereby making the high-quality QD comprising the base-QD and the at least one add-layer; wherein: the growth temperature is equal to or greater than an activation temperature $(T_{act})$ of the growth of the at least one add-layer; the at least one add-layer has a composition comprising an add-layer cation element and an add-layer anion element; and wherein the add-layer anion element is identical to the anion element of the modified anion precursor. The steps of providing can be performed in any order. The steps of providing can be performed at any temperature, such as at any temperature of the solution to which the respect the material is provided. The step of chemically modifying includes the first anion precursor and the modification agent being in the presence of each other, preferably both being in each other's presence in a solution. Optionally, the chemically modifying step can be performed separately from the step of providing the base-QD. Optionally, the chemically modifying step can be performed in a separate vessel from the vessel in which the growing step occurs. Optionally, the chemically modifying step can be performed in a separate vessel from the vessel into which the base-QD is provided. Optionally, the modified anion precursor is formed (via the chemically modifying step) and then the base-QD is provided to the modified anion precursor. Optionally, the modified anion precursor is formed (via the chemically modifying step) and then the base-QD is provided to the modified anion precursor (or to the vessel or solution comprising the pre-made modified anion precursor). Optionally, the modified anion precursor is formed (via the chemically modifying step) and then the modified anion precursor (or, the solution comprising the pre-made modified anion precursor) is provided to the base-QD (or, to a vessel or solution already having the base-QD). This method can be performed as a heat-up synthesis. This method can be performed as a hot-injection synthesis, such as by providing the base-QD, the first anion precursor, the modification agent, and/or the modified anion precursor into a solution having a temperature equal to or greater than the activation temperature). Preferably, any method disclosed herein comprises independently controlling the activation temperature $(T_{act})$ and the growth temperature.

Preferably in any method comprising forming the modified anion precursor (via the step of chemically modifying) (e.g., any "first method"), the method further comprises the step of predictably modulating precursor reactivity. Preferably in any method comprising forming the modified anion precursor (via the step of chemically modifying) (e.g., any "first method"), the method comprises independently controlling the activation temperature $(T_{act})$ and the growth temperature; wherein controlling the activation temperature $(T_{act})$ comprises selecting the first anion precursor and/or the modification agent such that the modified anion precursor has a decomposition temperature equal to or within 15% (optionally within 10%, optionally within 5%, optionally within 1%) of the activation temperature $(T_{act})$. Of course, decomposition temperature is a difficult to define parameter. Quantum dot growth is, functionally, the only realistic observable output. Quantum dot growth involves many steps of chemical reaction: decomposition of anion precursor, (sometimes, forming anion-cation complex, cation decomposition), etc. For the first approach described herein, this explanation reflects that the decomposition of the anion precursor essentially requires the same processes for quantum dot growth. The second approach, in contrast, requires additional chemical reactions to achieve growth. Preferably in any method comprising forming the modified anion precursor (e.g., any "first method"), the method comprises heating the base-QD and the modified anion precursor together up to the growth temperature from a temperature below the activation temperature. Preferably in any method comprising forming the modified anion precursor (e.g., any "first method"), the activation temperature $(T_{act})$ is equal to or within 15% of a decomposition temperature of the modified anion precursor. Preferably in any method comprising forming the modified anion precursor (e.g., any "first method"), the provided base-QD and the modified anion are in the presence of each other in a growth solution during the step of growing. Preferably in any method comprising forming the modified anion precursor (e.g., any "first method"), nucleation of new QDs or new base-QDs (secondary nucleation) is suppressed. Preferably in any method comprising forming the modified anion precursor (e.g., any "first method"), undesired alloying between the base-QD and the at least one add-layer is suppressed. Preferably in any method comprising forming the modified anion precursor (e.g., any "first method"), nucleation of new QDs or new base-QDs is suppressed via inactivation or decrease in rate of a reaction pathway for forming a Cd—S complex. Preferably in any method comprising forming the modified anion precursor (e.g., any "first method"), a reaction pathway or mechanism for forming the at least one add-layer is different from a reaction pathway or mechanism for nucleation of a new QD. Preferably in any method comprising forming the modified anion precursor (e.g., any "first method"), a reaction pathway or mechanism for forming the at least one add-layer is different from a reaction pathway or mechanism for homogeneous nucleation of a new QD.

Preferably in any method comprising forming the modified anion precursor (e.g., any "first method"): the modified anion precursor has a greater reactivity for growth of the at least one add-layer or lower activation temperature than the first anion precursor as a result of chemically modifying the first anion precursor by the modification agent; and/or the reactivity of the modified anion precursor with respect to the first anion precursor is determined by the modification agent. Preferably in any method comprising forming the modified anion precursor (e.g., any "first method"), the modified anion precursor comprises the modification agent and the first anion precursor. Preferably in any method comprising forming the modified anion precursor (e.g., any "first method"), the modified anion precursor is a coordination complex. Preferably in any method comprising forming the modified anion precursor (e.g., any "first method"), the chemically modifying step comprises the modification agent forming a coordination bond with the first anion precursor the modification agent. Preferably in any method comprising forming the modified anion precursor (e.g., any "first method"), the first anion precursor is an organoboron-based anion precursor; and wherein the modified anion precursor comprises the modification agent coordinated to the boron atom of the organoboron-based anion precursor.

Preferably in any method comprising forming the modified anion precursor (e.g., any "first method"), the modified anion precursor comprises the modification agent coordinated to the first anion precursor. Preferably in any method comprising forming the modified anion precursor (e.g., any "first method"), the modification agent is a Lewis base (LB). Preferably in any method comprising forming the modified anion precursor (e.g., any "first method"), the chemically modifying step comprises the modification agent forming a coordination bond with the first anion precursor the modification agent; wherein: the first anion precursor is an organoboron-based anion precursor, the modification agent is a Lewis base (LB), and the LB has a desired affinity for the boron atom in the organoboron-based precursors to result in a desired activation temperature. Preferably in any method comprising forming the modified anion precursor (e.g., any "first method"), a reactivity of the modified anion precursor is dependent on a bond strength of a covalent bond between a boron atom and an anion atom; and wherein the step of chemically modifying comprises changing the bond strength of the boron-anion bond in the first anion precursor via the modification agent during formation of the modified anion precursor. Preferably in any method comprising forming the modified anion precursor (e.g., any "first method"), the method further comprises the step of adjusting $T_{act}$ by selecting the LB having a desired affinity for the boron atom in the organoboron-based anion precursor, with a higher affinity for the boron atom resulting in a lower $T_{act}$ and a correspondingly increased modified anion precursor reactivity. Preferably in any method comprising forming the modified anion precursor (e.g., any "first method"), the step of growing comprises decomposition of the modified anion precursor. Preferably in any method comprising forming the modified anion precursor (e.g., any "first method"), at least a portion of a decomposition product of the decomposition of the modified anion precursor forms at least a portion of the at least one add-layer. Preferably in any method comprising forming the modified anion precursor (e.g., any "first method"), the decomposition of the modified anion precursor is at least partially a surface-assisted reaction occurring at a surface of the base-QD.

Preferably in any method comprising forming the modified anion precursor (e.g., any "first method"), the LB comprises a nitrogen, an imidazole, a tertiary amine, a pyrollidine, a pyridine derivative, an ether, an aliphatic ketone, an ester, or any combination of these. Exemplary ethers useful herein include, but are not limited to, di-n-propyl ether and 1,2-dimethoxyethane. Exemplary ketones useful herein include, but are not limited to, di-tert-butyl ketone and isobutyl methyl ketone. Exemplary esters useful herein include, but are not limited to, methyl benzoate and dimethyl carbonate. Preferably in any method comprising forming the modified anion precursor (e.g., any "first method"), the LB is selected from the group consisting of dimethylaminopyridine (DMAP), picoline ((CH$_3$C$_5$H$_4$N), 3-chloropyridine (3-ClPy), 4-(trimethylfluoro)-pyridine (4-CF$_3$Py), and 4-cyanopyridine (4-CyPy). Preferably in any method comprising forming the modified anion precursor (e.g., any "first method"), the first anion precursor is characterized by formula FX1, FX2, FX3, or FX3.1:

$$R_1 \diagdown B\!-\!AH; \diagup R_2 \quad \text{(FX1)}$$

$$R_1 \diagdown B\!-\!YH_2; \diagup R_2 \quad \text{(FX2)}$$

$$\begin{array}{c} R_2 \quad R_1 \\ \diagdown / \\ B \\ R_3 \diagdown | \\ B\!-\!YH; \quad \text{or} \\ \diagup \\ R_4 \end{array} \quad \text{(FX3)}$$

$$\begin{array}{c} R_2 \quad R_1 \\ \diagdown / \\ B \\ R_3 \diagdown | \quad R_6 \\ B\!-\!Y\!-\!B \\ \diagup \quad R_5; \\ R_4 \end{array} \quad \text{(FX3.1)}$$

wherein: each A is independently S, Se, or Te; each Y is independently P, As, or Sb; and each $R_1$-$R_6$ is independently selected from the group consisting of: C$_1$-C$_{20}$ alkyl, C$_3$-C$_{10}$ cycloalkyl, C$_5$-C$_{20}$ aryl, C$_5$-C$_{10}$ heteroaryl, C$_1$-C$_{20}$ acyl, C$_1$-C$_{20}$ hydroxyl, C$_1$-C$_{20}$ alkoxy, C$_2$-C$_{20}$ alkenyl, C$_2$-C$_{20}$ alkynyl, C$_5$-C$_{20}$ alkylaryl, —CO$_2$R$^{10}$, —CONR$^{11}$R$^{12}$, —COR$^{13}$, —SOR$^{14}$, —OSR$^{15}$, —SO$_2$R$^{16}$, —OR$^{17}$, —SR$^{18}$, —NR$^{19}$R$^{20}$, —NR$^{21}$COR$^{22}$, C$_1$-C$_{20}$ alkyl halide, C$_2$-C$_{20}$ halocarbon chain, and any combination of these; each of R$^{10}$-R$^{22}$ is independently a hydrogen or a C$_1$-C$_{20}$ alkyl; or each R$_1$—B—R$_2$ and R$_3$—B—R$_4$ is independently selected from the group consisting of 3-methyl-1-boracyclopentane, 1-boracyclohexane, 9-borabicyclo[3.3.1] nonane, 9-borabicyclo[3.3.2]decane. Preferably, A in FX1 is S or Se. Preferably for some applications, A in FX1 is S. Preferably for some applications, A in FX1 is Se. Preferably in any method comprising forming the modified anion precursor (e.g., any "first method"), the first anion precursor is: BBN-SH (9-mercapto-9-borabicyclo[3.3.1]nonane) and/or BBN-SeH (9-borabicyclo[3.3.1]nonane-9-selenol). Preferably in any method comprising forming the modified anion precursor (e.g., any "first method"), the method further comprises the step of chemically tuning a reactivity of BBN-SH and/or BBN-SeH independent of growth temperature by addition of the LB. Preferably in any method comprising forming the modified anion precursor (e.g., any "first method"), the method further comprises the step of chemically tuning the activation temperature independent of growth temperature by addition of the LB. Preferably in any method comprising forming the modified anion precursor (e.g., any "first method"), the first anion precursor and the modification agent are provided at a 1:1 mole ratio.

Aspects of the invention include a "second method" of making a high-quality quantum dot (QD) (such as, but not limited to, method of claim 3 and its dependent claims), the method comprising the steps of: providing a base-QD, providing a first anion precursor having a composition comprising an anion element; providing a modification agent; growing at least one add-layer on the base-QD at a growth temperature, thereby making the high-quality QD comprising the base-QD and the at least one add-layer;

wherein: the step of growing comprises reacting the first anion precursor and the modification agent; the step of growing comprises decomposing the first anion precursor as a result of the reaction between the first anion precursor and the modification agent; the growth temperature is equal to or greater than an activation temperature ($T_{act}$) of the growth of the at least one add-layer; the at least one add-layer has a composition comprising an add-layer cation element and an add-layer anion element; and wherein the add-layer anion element is identical to the anion element of the second anion precursor. Preferably, but not necessarily, the second anion precursor is characterized by formula:

$$XH \qquad \text{(FX7A); or}$$

$$XH_2 \qquad \text{(FX7B);}$$

where X is the anion element of the second anion precursor. Preferably, but not necessarily, X is S, Se, Te, P, N, As, or Sb. The steps of providing can be performed in any order. Preferably, any method disclosed herein comprises independently controlling the activation temperature ($T_{act}$) and the growth temperature.

Preferably in any method comprising decomposing the first anion precursor (e.g., any "second method"), the method comprises independently controlling the activation temperature ($T_{act}$) and the growth temperature; wherein controlling the activation temperature ($T_{act}$) comprises selecting the first anion precursor and/or the modification agent such that the first anion precursor decomposes in the presence of the modification agent at a decomposition temperature equal to or within 15% (optionally within 10%, optionally within 5%, optionally within 1%) of the activation temperature ($T_{act}$). Preferably in any method comprising decomposing the first anion precursor (e.g., any "second method"), the method comprises independently controlling the activation temperature ($T_{act}$) and the growth temperature; wherein controlling the activation temperature ($T_{act}$) comprises selecting the modification agent such that the first anion precursor decomposes in the presence of the modification agent at a decomposition temperature equal to or within 15% (optionally within 10%, optionally within 5%, optionally within 1%) of the activation temperature ($T_{act}$). Preferably in any method comprising decomposing the first anion precursor (e.g., any "second method"), the method comprises heating the base-QD, the first anion precursor, and the modification agent up to the growth from a temperature below the activation temperature. Preferably in any method comprising decomposing the first anion precursor (e.g., any "second method"), the step of reacting the first anion precursor and the modification agent comprises forming a second anion precursor as a result of the reaction; wherein the second anion precursor has a composition comprising the anion element. Preferably in any method comprising decomposing the first anion precursor (e.g., any "second method"), the activation temperature ($T_{act}$) is equal to or within 15% (optionally within 10%, optionally within 5%, optionally within 1%)) of a decomposition temperature of the first anion precursor in the presence of the modification agent. Preferably in any method comprising decomposing the first anion precursor (e.g., any "second method"), the second anion precursor does not comprise the modification agent. Preferably in any method comprising decomposing the first anion precursor (e.g., any "second method"), at least a portion of a decomposition product of the decomposition of the first anion precursor forms at least a portion of the at least one add-layer.

Preferably in any method comprising decomposing the first anion precursor (e.g., any "second method"), the second anion precursor does not comprise the modification agent. Preferably in any method comprising decomposing the first anion precursor (e.g., any "second method"), forming the second anion precursor comprises decomposing the first anion precursor via the reaction between the first anion precursor and the modification agent. Preferably in any method comprising decomposing the first anion precursor (e.g., any "second method"), the activation temperature is a function of a nucleophilicity of the modification agent and a steric hindrance associated with the first anion precursor. Preferably in any method comprising decomposing the first anion precursor (e.g., any "second method"), the modification agent is a halide anion. Optionally in any method comprising decomposing the first anion precursor (e.g., any "second method"), the first anion precursor is a tri-hydrocarbon-silyl (e.g., trimethylsilyl, triethylsilyl, etc.) precursor and the modification agent is a halide anion. Preferably in any method comprising decomposing the first anion precursor (e.g., any "second method"), the first anion precursor is characterized by formula FX4B, FX5B, FX6B, FX6.1B, or FX6.2B:

$$\text{(FX4B)}$$

$$\text{(FX5B)}$$

$$\text{(FX6B)}$$

$$\text{(FX6.1B)}$$

$$\text{(FX6.2B)}$$

wherein: each A is independently a S, Se, or Te; each Y is independently P, As, or Sb; and each $R_7$-$R_9$ is independently selected from the group consisting of: $C_1$-$C_{20}$ alkyl, $C_3$-$C_{20}$ cycloalkyl, $C_5$-$C_{20}$ aryl, $C_5$-$C_{20}$ heteroaryl, $C_1$-$C_{20}$ acyl, $C_1$-$C_{20}$ hydroxyl, $C_1$-$C_{20}$ alkoxy, $C_2$-$C_{20}$ alkenyl, $C_2$-$C_{20}$ alkynyl, $C_5$-$C_{20}$ alkylaryl, and any combination of these.

Preferably in any method comprising decomposing the first anion precursor (e.g., any "second method"), the first anion precursor is: (tri-hydrocarbon-silyl)ethanethiol, (tri-hydrocarbon-silyl)ethaneselenol, (tri-hydrocarbon-silyl)ethanetellurol, or (tri-hydrocarbon-silyl)ethanephosphine. Preferably in any method comprising decomposing the first anion precursor (e.g., any "second method"), the first anion precursor is: (tri-hydrocarbon-silyl)ethanethiol, (tri-hydrocarbon-silyl)ethaneselenol, (tri-hydrocarbon-silyl)ethanetellurol, or (tri-hydrocarbon-silyl)ethanephosphine, any isomer of these, any substituted product of these, any derivative of these, or any combination of these. Preferably in any method comprising decomposing the first anion precursor (e.g., any "second method"), the first anion precursor is: (2-(trimethylsilyl)ethanethiol, 2-(trimethylsilyl)ethaneselenol, or 2-(trimethylsilyl)ethanetellurol). Preferably in any method comprising decomposing the first anion precursor (e.g., any "second method"), the second anion precursor is a hydride, hydro chalcogenide, or hydro pnictogenide ions. Preferably in any method comprising decomposing the first anion precursor (e.g., any "second method"), the modification agent is a fluoride ion, a chloride ion, a bromide ion, and/or an iodide ion. Optionally in any method comprising decomposing the first anion precursor (e.g., any "second method"), the first anion precursor is a Se-containing anion precursor. Optionally in any method comprising decomposing the first anion precursor (e.g., any "second method"), the modification agent is a secondary and/or tertiary amine.

Preferably in any method disclosed herein, the method comprises comprising the step of predictably modulating the activation temperature ($T_{act}$) or an activation energy (Ea) of QD growth. Preferably in any method disclosed herein, the method comprises independently controlling the activation temperature ($T_{act}$) and the growth temperature. Optionally in any method disclosed herein, the first anion precursor and the modification agent are provided separately or simultaneously. Optionally in any method disclosed herein, the first anion precursor and the modification agent are provided separately. Optionally in any method disclosed herein, the first anion precursor and the modification agent are provided simultaneously. Preferably in any method disclosed herein, the base-QD, the first anion precursor, and the modification agent are provided to a primary solvent or solution. Preferably in any method disclosed herein, the primary solvent or solution is at a different or same temperature when the first anion precursor is provided thereto compared to the temperature of the primary solvent or solution when the modification agent is provided thereto. Optionally in any method disclosed herein, the primary solvent or solution is at a different when the first anion precursor is provided thereto compared to the temperature of the primary solvent or solution when the modification agent is provided thereto. Optionally in any method disclosed herein, the primary solvent or solution is at a same temperature when the first anion precursor is provided thereto compared to the temperature of the primary solvent or solution when the modification agent is provided thereto. Preferably in any method disclosed herein, the first anion precursor and/or the modification agent are provided to the primary solvent or solution having a temperature less than, equal to, or greater than the activation temperature. Optionally in any method disclosed herein, the first anion precursor and/or the modification agent are provided to the primary solvent or solution having a temperature less than the activation temperature. Optionally in any method disclosed herein, the first anion precursor and/or the modification agent are provided to the primary solvent or solution having a temperature equal to or greater than the activation temperature. Optionally in any method disclosed herein, the first anion precursor or the modification agent are provided to the primary solvent or solution having a temperature equal to or greater than the activation temperature. Optionally in any method disclosed herein, the first anion precursor and the modification agent are provided to the primary solvent or solution having a temperature less than the activation temperature. Preferably in any method disclosed herein, the provided base-QD, the provided first anion precursor, and the provided modification agent are in the presence of each other in a growth solution prior to and/or during the step of growing. Optionally in any method disclosed herein, the provided base-QD, the provided first anion precursor, and the provided modification agent are in the presence of each other in a growth solution prior to and during the step of growing.

Preferably in any method disclosed herein, the base-QD is a QD core or a QD nucleus. Optionally in any method disclosed herein, the base-QD is a QD core. Optionally in any method disclosed herein, the base-QD is a QD nucleus. Preferably in any method disclosed herein, the base-QD has a composition comprising a base-QD cation element and a base-QD anion element; wherein: (i) the add-layer cation element is identical to the base-QD cation element and the add-layer anion element is identical to the base-QD anion element; or (ii) the add-layer cation element is identical to the base-QD cation element and the add-layer anion element is different from the base-QD anion element, such that the at least one add-layer is a shell on the base-QD; or (iii) the add-layer cation element is different from the base-QD cation element and the add-layer anion element is different from the base-QD anion element, such that the at least one add-layer is a shell on the base-QD. Optionally in any method disclosed herein, the base-QD has a composition comprising a base-QD cation element and a base-QD anion element; wherein: (i) the add-layer cation element is identical to the base-QD cation element and the add-layer anion element is identical to the base-QD anion element. Optionally in any method disclosed herein, the base-QD has a composition comprising a base-QD cation element and a base-QD anion element; wherein: (ii) the add-layer cation element is identical to the base-QD cation element and the add-layer anion element is different from the base-QD anion element, such that the at least one add-layer is a shell on the base-QD. Optionally in any method disclosed herein, the base-QD has a composition comprising a base-QD cation element and a base-QD anion element; wherein: (iii) the add-layer cation element is different from the base-QD cation element and the add-layer anion element is different from the base-QD anion element, such that the at least one add-layer is a shell on the base-QD. Preferably in any method disclosed herein, the modification agent is a Lewis base (LB) or a halide anion. Preferably in any method disclosed herein, the add-layer cation element and/or the add-layer anion element is different from the base-QD cation element and/or the base-QD anion element, respectively; and wherein there the resulting high-quality QD is free of alloying between the base-QD and the at least one add-layer. Preferably in any method disclosed herein, the add-layer cation element and the add-layer anion element is different from the base-QD cation element and the base-QD anion element, respectively; and wherein there the resulting high-quality QD is free of alloying between the base-QD and the at least one add-layer. Preferably in any method disclosed herein, the add-layer cation element and the add-layer anion element is different from the base-QD cation element and the base-QD anion element, respectively; and wherein there the resulting high-quality QD is free of alloying between the base-QD and the at least one add-layer.

We can also controllably achieve gradient core/shell structure. Prior, controlling the core/shell interface structure required using highly reactive precursor and injecting varying compositions of precursors (for gradient QDs, they inject high core+low shell precursors->low core+high shell precursors->shell precursors only). The usage of highly reactive precursor is important to drive complete conversion of precursors so that the composition of injected precursor reflects the gradient profile. High reactivity precursors, however, yield low quality QDs. Low reactivity precursors cannot be used for the traditional injection-based gradient QD synthesis because 1) it requires high reaction temperature that inevitably yields alloying, and 2) precursor conversion is not complete, making it difficult to control the gradient profile.

Preferably in any method disclosed herein, the method comprises providing a cation source having a composition comprising a cation element; wherein the add-layer cation element is identical to the cation element of the cation source. Preferably in any method disclosed herein, the cation source is a cation precursor. Preferably in any method disclosed herein, the cation element of the cation source or the cation precursor is Cd, Pb, In, Zn, Cu, Ga, Al, Zn, Cu, Ag, Sn, or any combination thereof. Preferably in any method disclosed herein, the cation element of the cation source or the cation precursor is Cd, Pb, In, or any combination thereof. Preferably in any method disclosed herein, the anion element of the first anion precursor is S, Se, Te, P, N, As, or Sb. Optionally in any method disclosed herein, the add-layer cation element is a metal or metalloid element. Preferably in any method disclosed herein, the add-layer cation element is a metal element. Preferably in any method disclosed herein, the add-layer cation element is Cd, Pb, In, Zn, Cu, Ga, Al, Zn, Cu, Ag, Sn, or any combination thereof. Preferably in any method disclosed herein, the add-layer anion element is S, Se, Te, P, N, As, Sb, or any combination thereof.

Preferably in any method disclosed herein, the method is a method for making a plurality of high-quality quantum dots (QDs), wherein the resultant plurality of high quality QDs: have a diameter between 1 nm-300 nm; and/or are highly monodisperse (less than or equal to 15%, less than or equal to 10%, less than or equal to 8%, less than or equal to deviation 7%, less than or equal to 6%, preferably less than or equal to 5% polydispersity, or deviation in diameter); and/or have a narrow emission (FWHM of emission curve being less than 150 nm, less than 100 nm, less than 90 nm, less than 80 nm, less than 70 nm, less than 60 nm, less than 50 nm, less than 40 nm, less than 30 nm, preferably less than 25 nm); have a high crystallinity (at least 75%, at least 80%, at least 85%, at least 90%, at least 95%, within 80% to 99%, within 85% to 99%, preferably within 90% to 99%, or within 92% to 95%); and/or are highly spherical (circularity or sphericity greater than or equal to 0.7, greater than or equal to 0.72, greater than or equal to 0.75, greater than or equal to 0.77, greater than or equal to 0.8, greater than or equal to 0.82, preferably greater than or equal to 0.85); and/or have a high quantum yield (QY) (external and/or internal quantum yield being at least 20%, at least 30%, at least 40%, at least 50%, at least 60%, at least 65%, at least 70%, at least 75%, at least 80%, at least 85%, preferably at least 90%, within 50% to 95%, within 70% to 95%, preferably within 75% to 95%, preferably within 80% to 95%, or within 75% to 82%). Preferably in any method disclosed herein, the method is a method for making a plurality of high-quality quantum dots (QDs), wherein the resultant plurality of high quality QDs: have a diameter between 1 nm-300 nm; and/or are highly monodisperse (less than or equal to 15%, less than or equal to 10%, less than or equal to 8%, less than or equal to deviation 7%, less than or equal to 6%, preferably less than or equal to 5% polydispersity, or deviation in diameter); and/or have a narrow emission (FWHM of emission curve being less than 150 nm, less than 100 nm, less than 90 nm, less than 80 nm, less than 70 nm, less than 60 nm, less than 50 nm, less than 40 nm, less than 30 nm, preferably less than 25 nm); have a high crystallinity (at least 75%, at least 80%, at least 85%, at least 90%, at least 95%, within 80% to 99%, within 85% to 99%, preferably within 90% to 99%, or within 92% to 95%); and/or are highly spherical (circularity or sphericity greater than or equal to 0.7, greater than or equal to 0.72, greater than or equal to 0.75, greater than or equal to 0.77, greater than or equal to 0.8, greater than or equal to 0.82, preferably greater than or equal to 0.85).

Preferably in any method disclosed herein, the $T_{act}$ is 10° C. to 30° C. less than a melting temperature $T_m$ of the base-QD. Preferably in any method disclosed herein, the $T_{act}$ is 30° C. to 80° C. less than a melting temperature $T_m$ of the base-QD. Generally, the closer the growth temperature or $T_{act}$ is to the QD melting point $T_m$ the more spherical is the resulting high-quality QDs. Conversely, generally, the further the growth temperature or $T_{act}$ is to the QD melting point $T_m$ the less spherical and more faceted are the resulting high-quality QDs Optionally in any method disclosed herein, the $T_{act}$ is 10° C. to 30° C. less than a melting temperature $T_m$ of the base-QD. For example, but not necessarily, for making spherical high-quality QDs, the $T_{act}$ is 10° C. to 30° C. less than a melting temperature $T_m$ of the base-QD. Optionally in any method disclosed herein, the $T_{act}$ is 80° C. to 100° C. less than a melting temperature $T_m$ of the base-QD. For example, but not necessarily, for making anisotropic high-quality QDs, the $T_{act}$ is 80° C. to 100° C. less than a melting temperature $T_m$ of the base-QD. Optionally in any method disclosed herein, the high-quality QD is anisotropic. Optionally in any method disclosed herein, the high-quality QD is spherical.

Aspects of the invention include a method of making the base-QD according to any of the embodiments disclosed herein, the method further comprising the steps of: providing a base-QD cation precursor having the base-QD cation element; providing a base-QD anion precursor; reacting the base-QD cation precursor and the base-QD anion precursor to form the base-QD. Optionally in any method of making the base-QD disclosed herein, the step of reacting comprises heating up base-QD cation precursor and the base-QD anion precursor together to a nucleation temperature. Optionally in any method of making the base-QD disclosed herein, base-QD cation precursor and the base-QD anion precursor are provided separately. Optionally in any method of making the base-QD disclosed herein, base-QD cation precursor and the base-QD anion precursor are provided simultaneously. Optionally in any method of making the base-QD disclosed herein, base-QD cation precursor and/or the base-QD anion precursor is provided at a temperature (e.g., of a receiving solvent or solution) greater than a base-QD nucleation temperature. Optionally in any method of making the base-QD disclosed herein, base-QD cation precursor or the base-QD anion precursor is provided at a temperature (e.g., of a receiving solvent or solution) greater than a base-QD nucleation temperature.

13
14

Optionally in any method of making the base-QD disclosed herein, the base-QD is formed in the absence of the modification agent. Optionally in any method of making the base-QD disclosed herein, the base-QD anion precursor is a tri-hydrocarbon-silyl precursor. Optionally in any method of making the base-QD disclosed herein, the method comprises purifying the base-QD to remove unreacted base-QD precursors prior to the step of providing the base-QD. Preferably in any method of making the base-QD disclosed herein, the high quality QD is grown in a heat-up synthesis process. Preferably in any method of making the base-QD disclosed herein, nucleation of new QDs or new base-QDs is suppressed and/or undesired alloying is suppressed. Preferably in any method of making the base-QD disclosed herein, the heat-up synthesis process comprises: loading all precursors or all precursors and the base-QD into a vessel to form a reaction solution in the vessel at room temperature; continuously heating the reaction solution to independently initiate shell growth from core nucleation to obtain high-quality QDs. Preferably in any method of making the base-QD disclosed herein, the reaction solution volume and vessel size is selected for large-scale synthesis of QDs.

Preferably in any method disclosed herein, the produced/resultant high quality QD is a semiconductor QD. Preferably in any method disclosed herein, the base-QD is a semiconductor QD. Preferably in any method disclosed herein, the resultant high quality QD is a core-only QD or a core-shell QD. Optionally in any method disclosed herein, the resultant high quality QD is a core-only QD. Optionally in any method disclosed herein, the resultant high quality QD is a core-shell QD. Preferably in any method disclosed herein, the at least one add-layer is a part of the core of the resultant high-quality QD or wherein the at least one add-layer is a part of the shell of the resultant high-quality QD. Optionally in any method disclosed herein, the at least one add-layer is a part of the core of the resultant high-quality QD. Optionally in any method disclosed herein, the at least one add-layer is a part of the shell of the resultant high-quality QD. The method of any one of the preceding claims comprising providing two or more different first anion precursors, each independently comprising an anion element; wherein the chemically modifying step further comprises chemically modifying each of the two or more different first anion precursors by the modification agent thereby inducing a conversion of each of the two or more first anion precursors to a modified anion precursor respectively.

Optionally any method disclosed herein comprises providing two or more different first anion precursors, each independently comprising an anion element; wherein the growing step comprises reacting each of the two or more different first anion precursors and the modification agent; and wherein the step of growing comprises decomposing each of the two or more different first anion precursors as a result of the reaction between each of the two or more different first anion precursors and the modification agent. Optionally any method disclosed herein comprises providing two or more different modification agents. Optionally any method disclosed herein comprises providing one or more ligand precursors, wherein the one or more ligand precursor at least partially forms one or more ligands, respectively, covalently and/or datively bonded with the high-quality QD.

Any method disclosed herein optionally includes any embodiment(s) according to any of the claims presented herein.

Preferably, any method of making a high-quality quantum dot (QD) disclosed herein is performed in a solution, dispersion, or mixture (having a liquid continuous medium or solvent) such that at least the step of growing at least one add-layer occurs in said solution, dispersion, or mixture. Preferably, the step of chemically modifying precursor or of decomposing precursor occur in said solution, dispersion, or mixture. Preferably, but not necessarily, each of the base-QD, precursor(s), and modification agent(s) are provided to said solution, dispersion, or mixture. Optionally, the base-QD is formed in said solution, dispersion, or mixture.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

BRIEF DESCRIPTION OF THE DRAWINGS

FIG. 1 illustrate the structure of precursors, including organoborane species and trimethylsillylethane species. A and Y are candidate for precursors, including each A independently being S, Se, or Te and each Y independently being P, As, or Sb.

FIG. 3 illustrates the scheme of BBN-SH synthesis

FIGS. 6A-6C illustrate a successful CdS growth on CdSe cores. FIG. 6A. PL spectrum of CdSe core (dashed lines) and CdSe/CdS core/shell QDs (solid lines) synthesized using BBN-SH and 4-picoline. (Green: 2.3 nm core with 5 monolayer (ML) shell, Red: 3.4 nm core with 7ML shell) FIGS. 6B-6C. TEM images confirm excellent crystallinity and size distribution. FIG. 6B. ii: red CdSe cores, and (FIG. 6C) iv: red CdSe/CdS QDs. Scale bar=10 nm.

FIGS. 7A-8B illustrate shell growth initiated under various temperature. The reactivity of BBN-SH was modulated by the basicity of pyridine derivatives. Graph showing (FIG. 7A) PL peak and (FIG. 7B) FWHM of PL spectrum of CdSe/CdS QDs during shell growth process. Without a chemical initiator, CdS shell growth was not observed (no PL peak shift).

FIGS. 8A-8B illustrate modulated shell growing kinetics under constant temperature conditions. Evolution of (FIG. 8A) photoluminescence (PL) peak and (FIG. 8B) FWHM of PL spectrum upon Lewis base (DMAP, picoline, or 3-chloropyridine) injection to the mixture of CdSe cores and precursors. CdSe cores and precursors were mixed at 20 minutes (*) and initiators were injected at 40 minutes (**). PL shifts, indicating CdS shell growth on CdSe cores, only occur in the presence of chemical initiators (blue square, green circle, red triangle). FWHM of PL spectrum was not changed during the shell growth, meaning that the size distribution of CdSe/CdS core/shell QDs was not broadened.

FIGS. 9A-9F illustrate CdS shell growth optimized by slow injection of BBN-SH and initiators (DMAP or 3-ClPy) pair in both small and big CdSe core. CdSe/CdS core/shell QDs have been synthesized using conventional precursors (octanethiol or $(TMS)_2S$) as control samples. Evolution of (FIGS. 9A-9C) FWHM, and (FIGS. 9D-9F) QY of CdSe/CdS core/shell QDs. For both small and big size CdSe core, narrow size distribution (lowest FWHM) and high QY were obtained on BBN-SH case, whereas only bug CdSe core resulted FWHM in octanethiol case. In case of $(TMS)_2S$ as precursor, the FWHM is broad on both CdSe QD cores.

FIGS. 10A-10C illustrate (FIG. 10A) absorption (solid) and PL (dotted) spectrum of heat-up CdS shell growth on CdSe QD cores. TEM images of (FIG. 10B) CdSe/CdS core/shell QDs and (FIG. 10C) CdSe QD cores (scale bar: 10 nm).

Figures 11A, 11B, 11C:
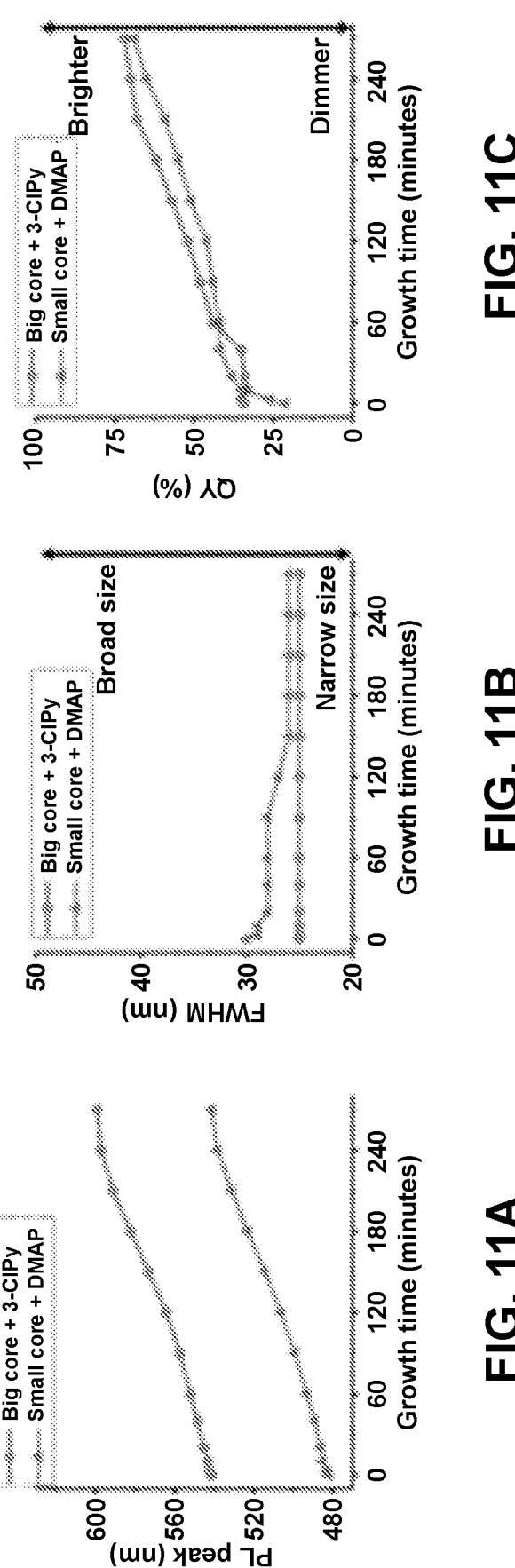
Figure 12A:
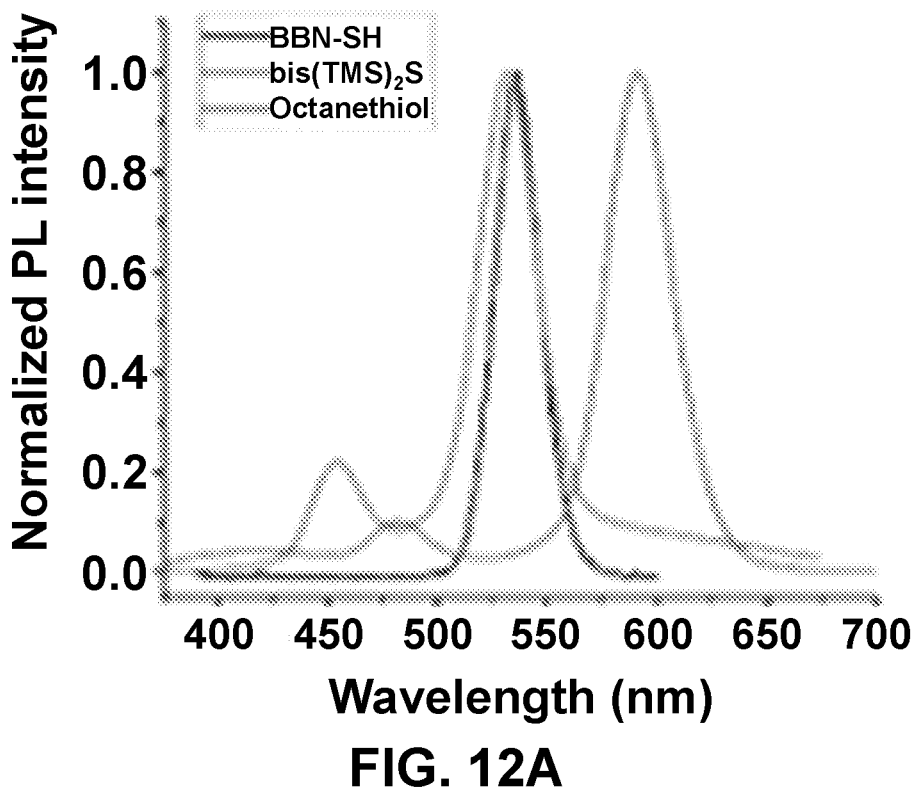
Figure 12B:
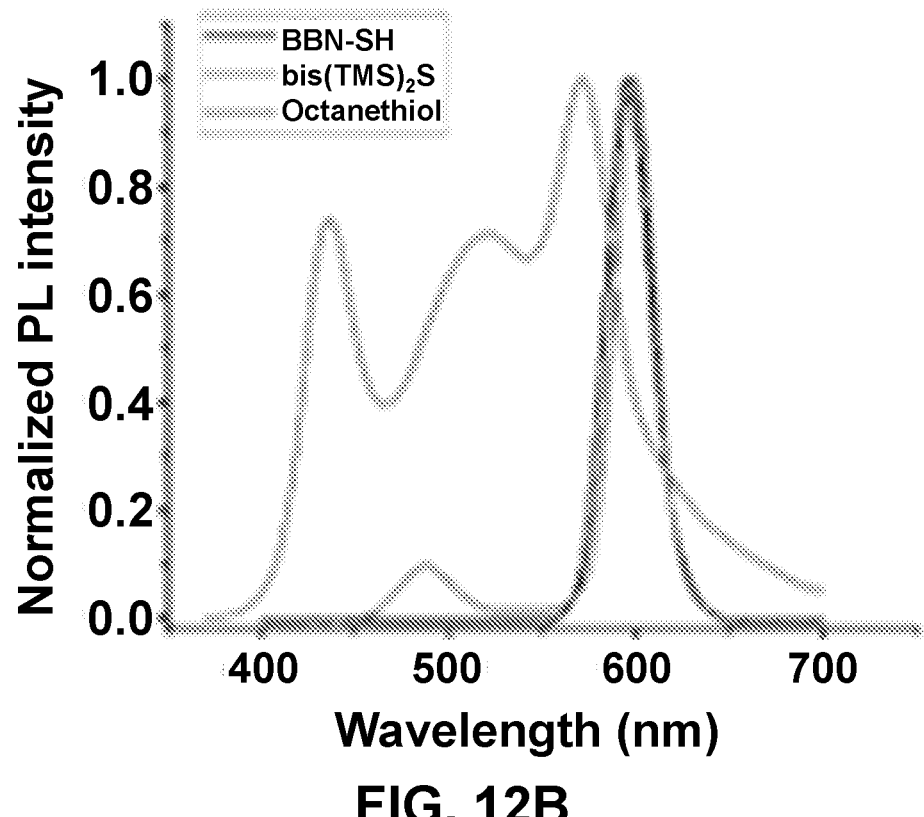
Figure 12C:
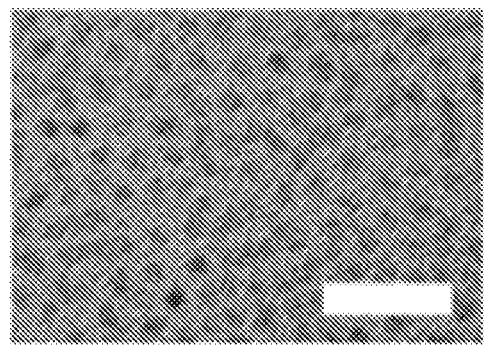
Figure 12D:
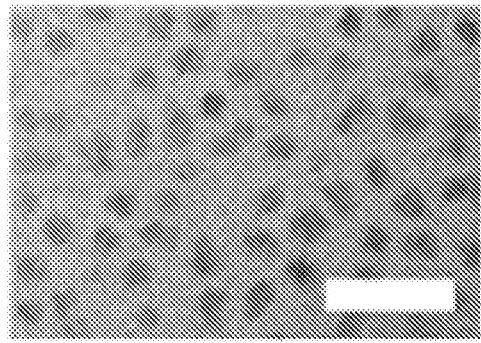

FIGS. 11A-11C illustrate the heated-up CdSe core growth optimized with Lewis base pairs as initiator. Evolution of (FIG. 11A) PL peak, (FIG. 11B) FWHM, and (FIG. 11C) QY of CdSe/CdS core/shell QDs. For big CdSe core, narrow size distribution (lowest FWHM) and high QY were obtained on BBN-SH and 3-ClPy pair. For small CdSe core, narrow size distribution (lowest FWHM) and high QY were obtained on BBN-SH and DMAP pair.

FIGS. 12A-12D illustrate a PL spectrum of CdSe/CdS core/shell QDs via heat-up CdS shell growth on (FIG. 12A) small CdSe core and (FIG. 12B) big CdSe core. Under BBN-SH as a sulfur precursor, smallest FWHM without satellite nanocrystals were obtained using conventional precursors ($(TMS)_2S$ and octanethiol). Transmission electron microscope image of CdSe/CdS core/shell QDs using (FIG. 12C) BBN-SH or (FIG. 12D) octanethiol used as precursor via heat-up CdS shell growth (scale bar: 20 nm)

Figure 13A:
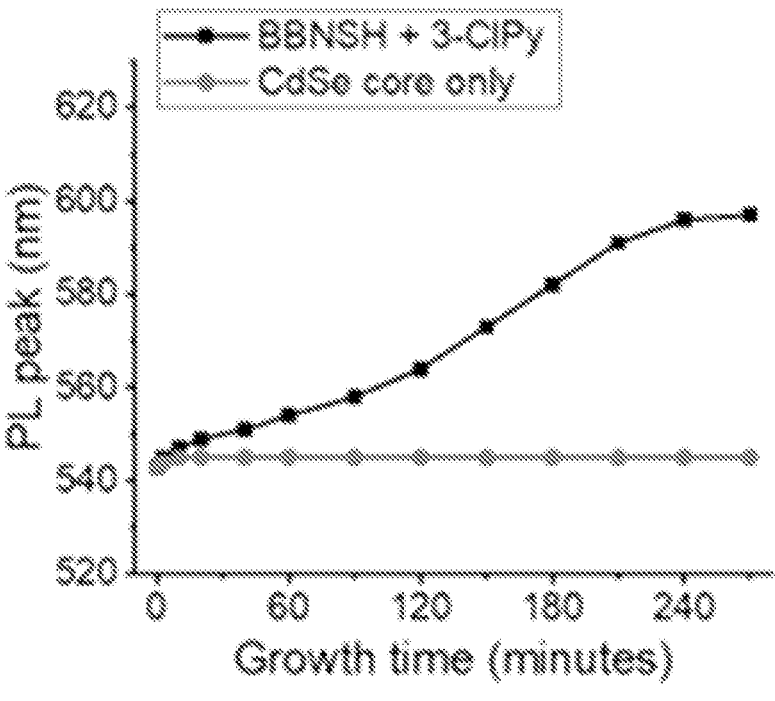
Figure 13B:
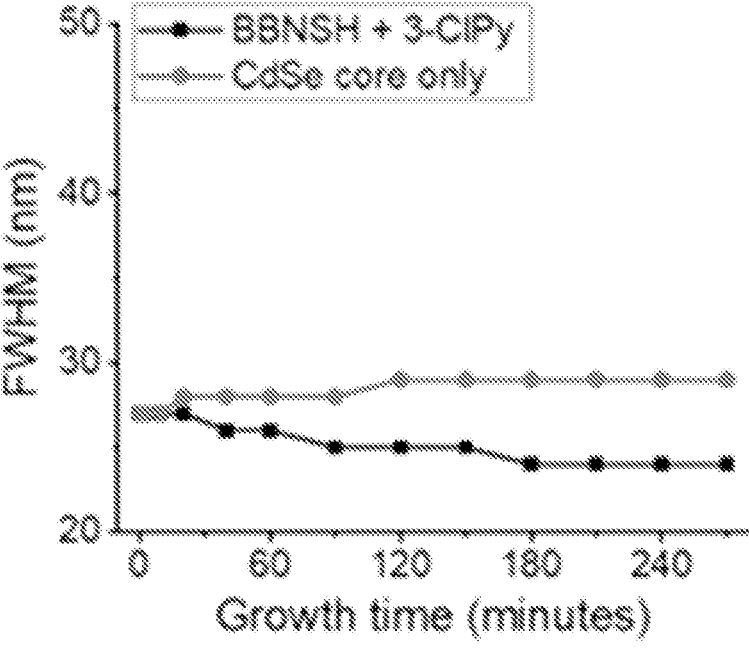

FIGS. 13A-13B illustrate the one-pot core and core/shell synthesis. CdSe cores were synthesized and no purification step was involved. BBN-SH and 3-ClPy pair were added the crude CdSe QD core solution and heat-up the whole reaction vessel. Evolution of (FIG. 13A) PL peak and (FIG. 13B) FWHM of PL spectrum from CdSe/CdS core/shell QDs. Size focusing (FWHM is decreasing during the shell growth process, which indicated the red-shift of PL peak) is observed.

Figure 14A:
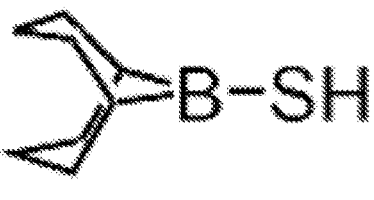
Figure 14B:
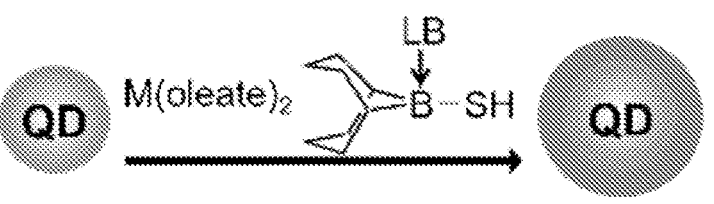
Figure 14C:
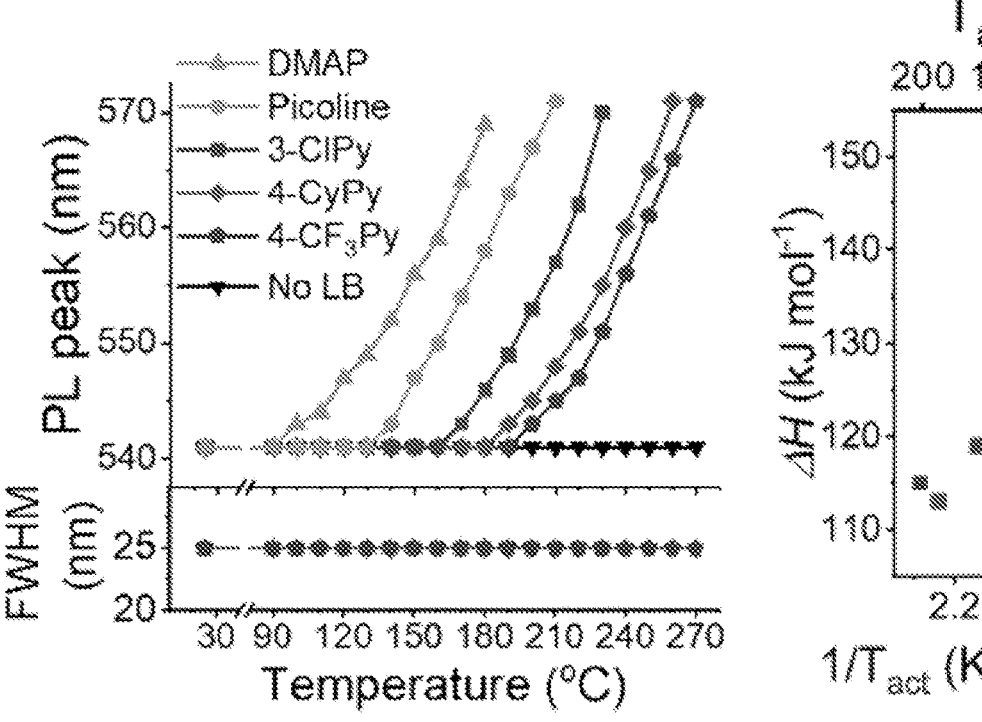
Figure 14D:
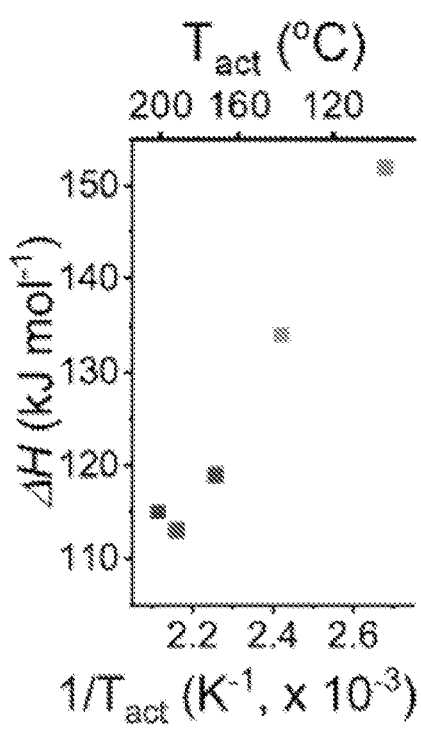
Figure 14E:
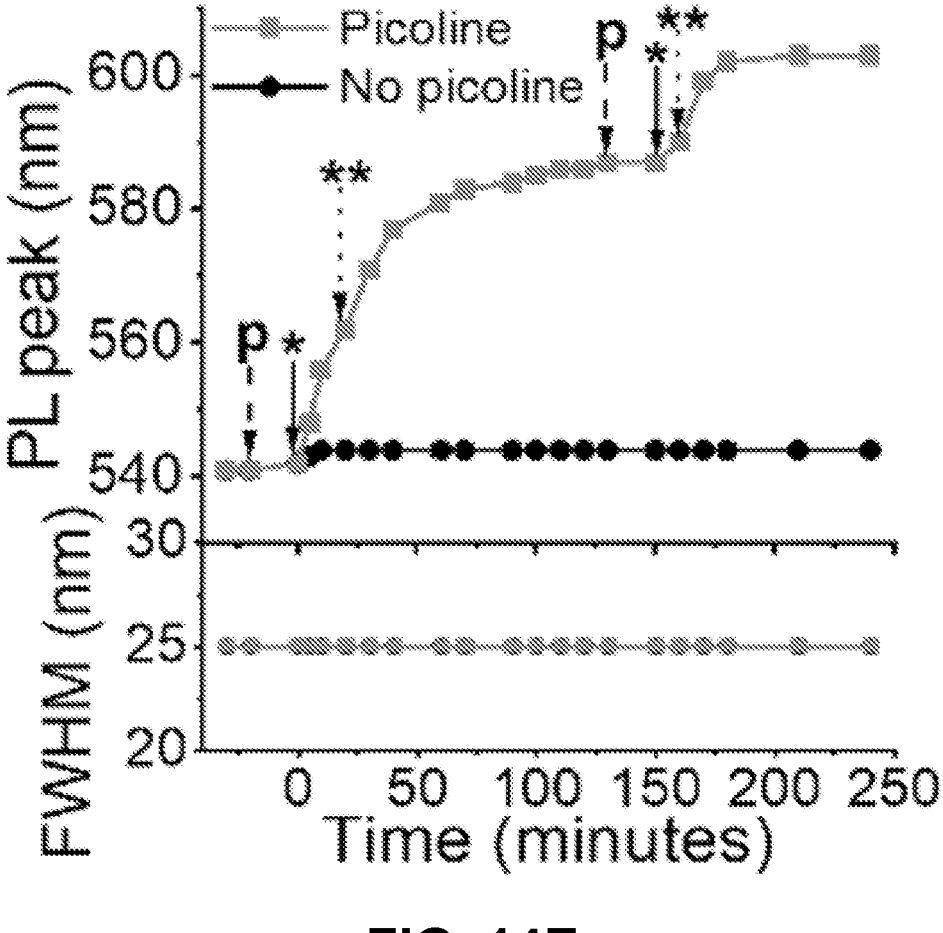

FIGS. 14A-14E. Characterization of [BBN-SH:LB]-based shell growth. FIG. 14A. Chemical structure of BBN-SH. FIG. 14B. A schematic representation of shell deposition using BBN-SH. FIG. 14C. Identification of the activation temperature ($T_{act}$) of BBN-SH upon the addition of LBs by monitoring CdS shell growth. $T_{act}$ of BBN-SH varies with the $BF_3$ affinity of LBs: DMAP (magenta triangle), picoline (olive circle), 3-ClPy (blue square), 4-CyPy (purple diamond), and $4-CF_3Py$ (brown pentagon). FIG. 14D. LBs having higher $BF_3$ affinity (LH) yield lower $T_{act}$. FIG. 14E. LB is consumed during shell growth. (p: precursor injection point, start (*) and stop (**) of picoline injection) QD emission remains tight during shell growth.

Figures 15A, 15B, 15C, 15D, 15E, 15F, 15G, 15H:
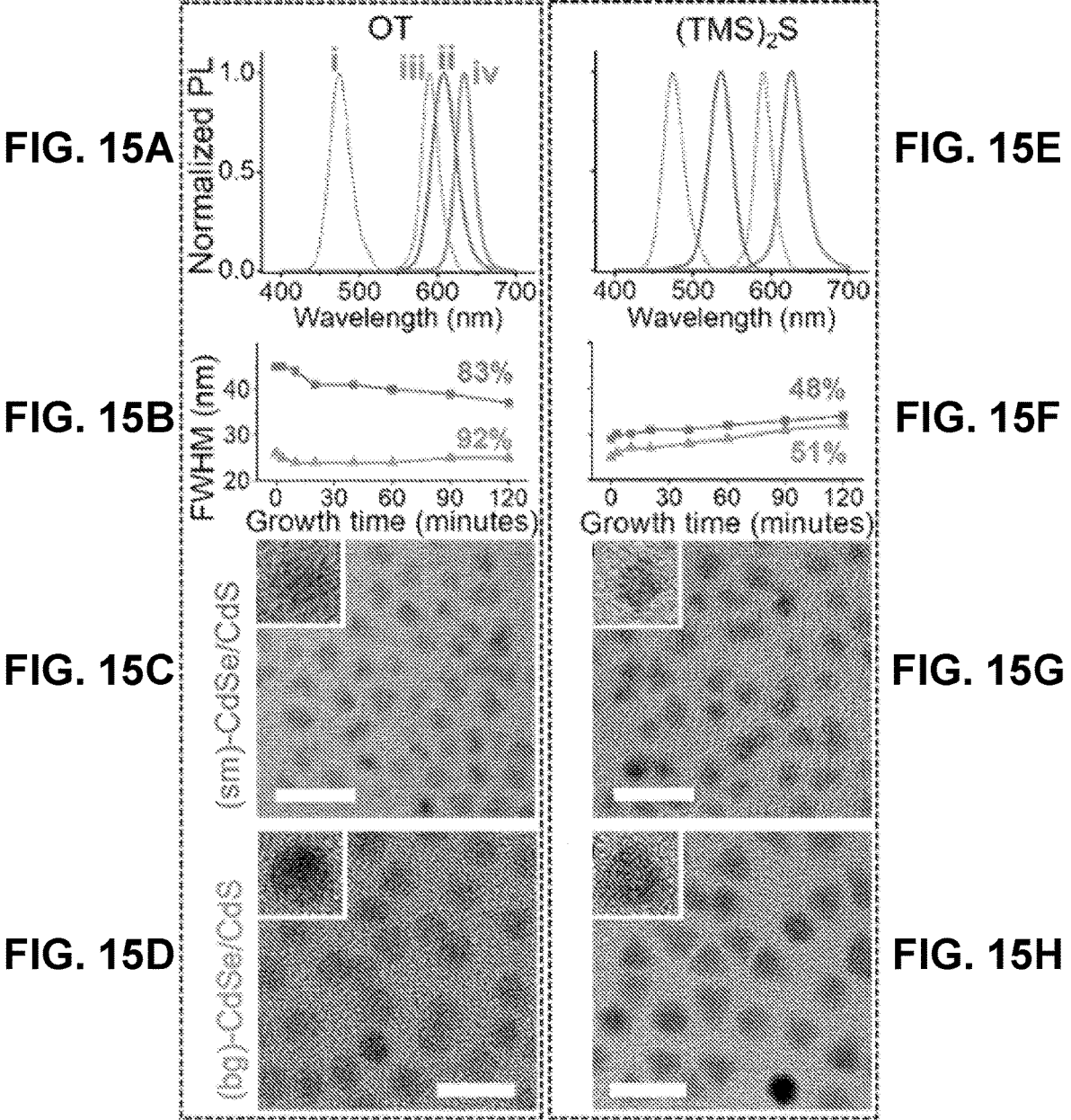
Figures 15I, 15J, 15K, 15L:
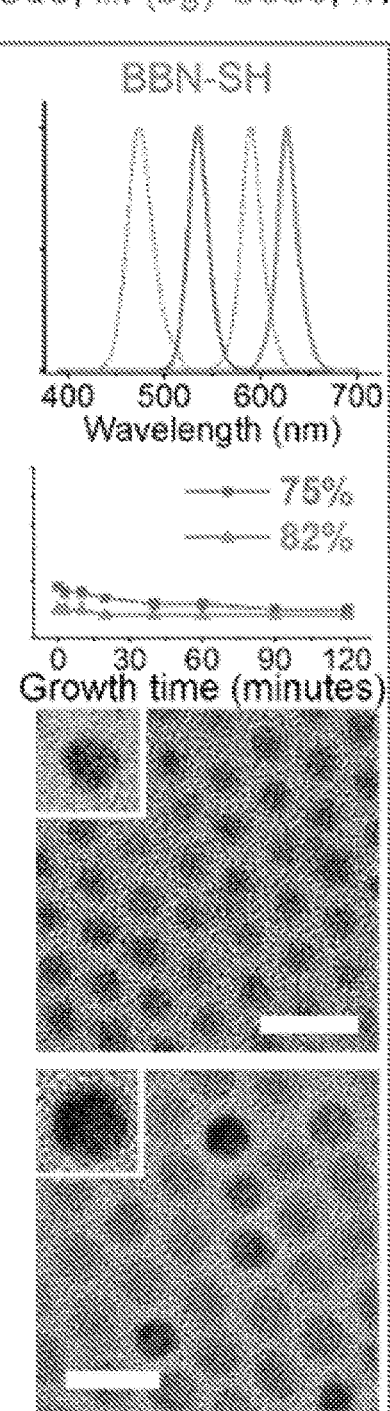

FIGS. 15A-15L. [BBN-SH:LB] enables a systematic growth of high quality shells while the QDs produced with conventional precursors show suboptimal quality for all ($TMS_2S$) or some (OT) of the sizes. FIGS. 15A, 15E and 15I. PL spectra of core (dotted line) and core-shell QDs (solid line). FIGS. 15B, 15F and 15J. Evolution of FWHM during growth, FIGS. 15C, 15D, 15G, 15H, 15K, and 15L. TEM images (inset: HRTEM images) of (sm)-CdSe/CdS (FIGS. 15C, 15G and 15K) or (bg)-CdSe/CdS core/shell QDs (FIGS. 15D, 15H and 15L, scale bar: 20 nm). When using BBN-SH, tight size distribution (FWHM<25 nm) is obtained for both (sm)- and (bg)-CdSe cores, whereas OT produces QDs with narrow FWHM only from (bg)-CdSe cores. In the case of $(TMS)_2S$, the emission of the final QDs is broader (FWHM>32 nm) for both small and big cores. The TEM images confirm narrow size distribution, shape uniformity, and high crystallinity for all size QDs produced with BBN-SH. The structural quality of these QDs is comparable to the QDs grown with OT from big cores.

Figures 16A, 16B, 16C, 16D, 16E, 16F:
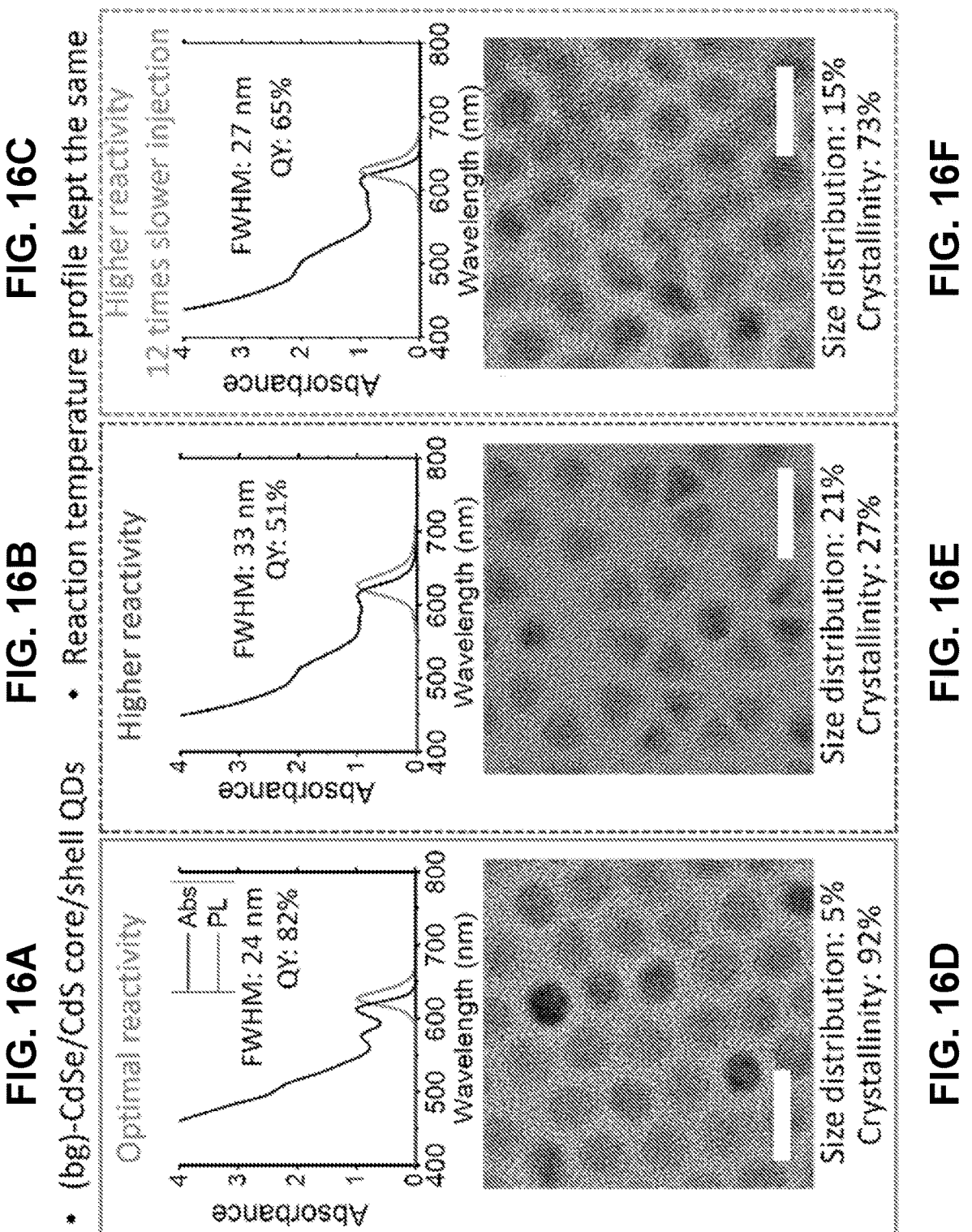

FIGS. 16A-16F. Impact of precursor reactivity to the optical and structural quality of QDs. The (bg)-CdSe/CdS QDs grown at the same reaction temperature by infusing (FIGS. 16A and 16D) $[BBN-SH:4-CF_3Py]$ for 2 hr, (FIGS. 16B and 16E) [BBN-SH:DMAP] for 2 hr, or (FIGS. 16C and 16F) [BBN-SH:DMAP] for 24 hr. FIGS. 16A-16C. Absorbance and PL spectra of (bg)-CdSe/CdS QDs. FIGS. 16D-16F. TEM images of (bg)-CdSe/CdS QDs (scale bar: 20 nm). Higher reactivity of the precursor yields lower QY, inferior crystallinity, broader FWHM, and uncontrolled growth. A significant reduction in the infusion rate partially improves the quality of the produced QDs.

Figure 17:
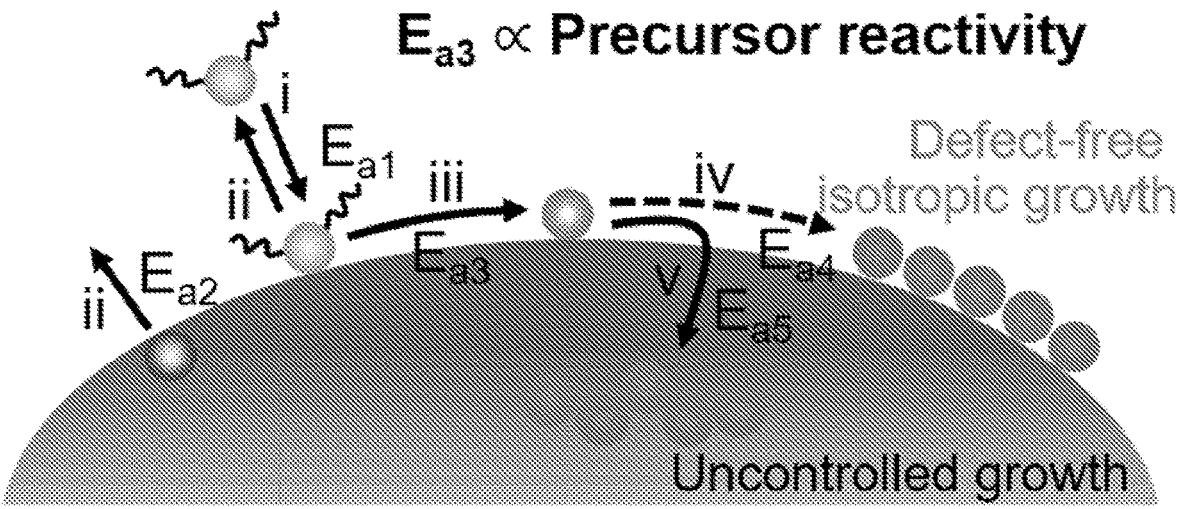

FIG. 17. Detailed processes involved in QD growth. Activated solutes are adsorbed to the surface (i), while the thermal energy of the surface causes surface atoms to be desorbed (ii). The adsorbed atoms are then activated (iii), followed by surface migration and relaxation. The mean-squared-diffusion-length of adatoms must be long enough to induce defect-free isotropic growth (iv). If the density of activated adatoms is excessive, collision between adatoms quenches surface relaxation, leading to uncontrolled growth (v). The activation energy of step iii ($E_{a3}$) is mainly affected by the reactivity of precursors. In comparison, temperature is the key parameter affecting the activation energy of other steps.

Figure 18A:
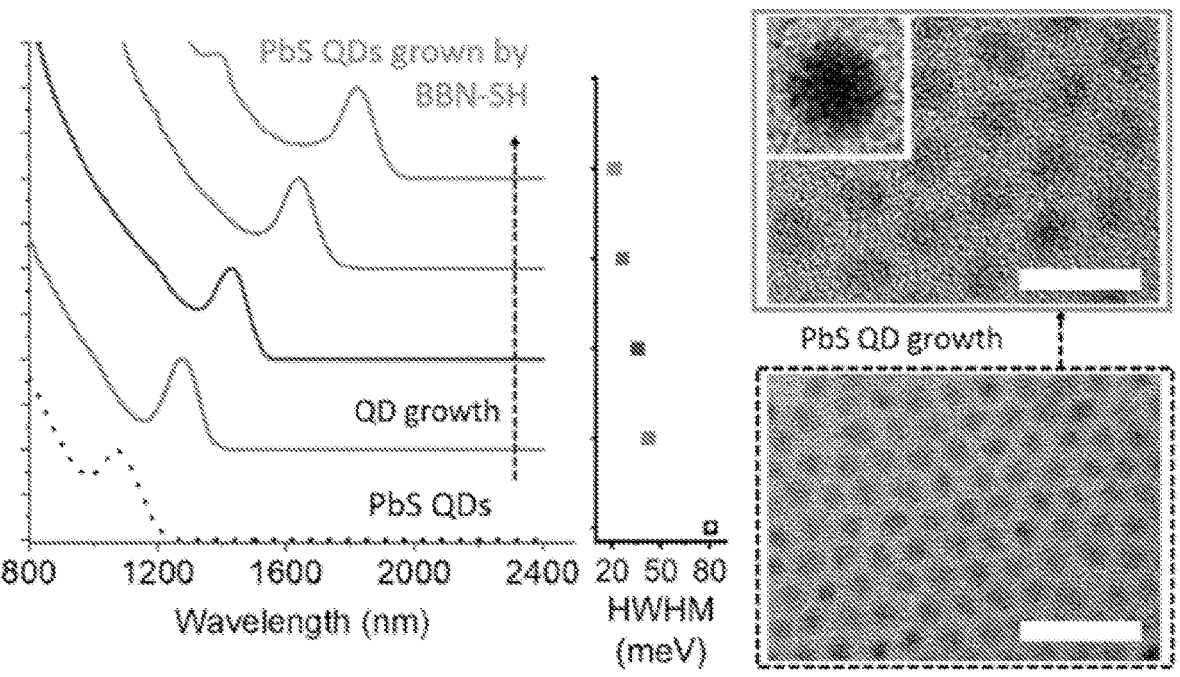
Figure 18B:
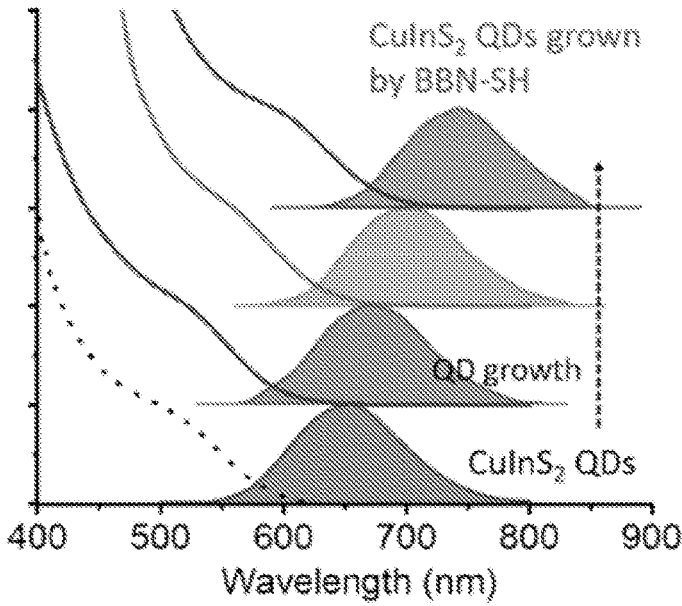

FIGS. 18A-18B. Successful growth of high quality PbS and $CuInS_2$ QDs using BBN-SH. FIG. 18A. Absorbance spectra of PbS QDs during growth. HWHM (meV) progressively narrows during growth (PbS nuclei: black, PbS QDs grown by BBN-SH: other colors). The TEM images of the final QDs and PbS nuclei. (Inset: HRTEM image. Scale bar: 10 nm). FIG. 18B. Absorbance and PL spectra of $CuInS_2$ QDs during growth ($CuInS_2$ nuclei: black, $CuInS_2$ QDs grown by BBN-SH: other colors).

Figure 19:
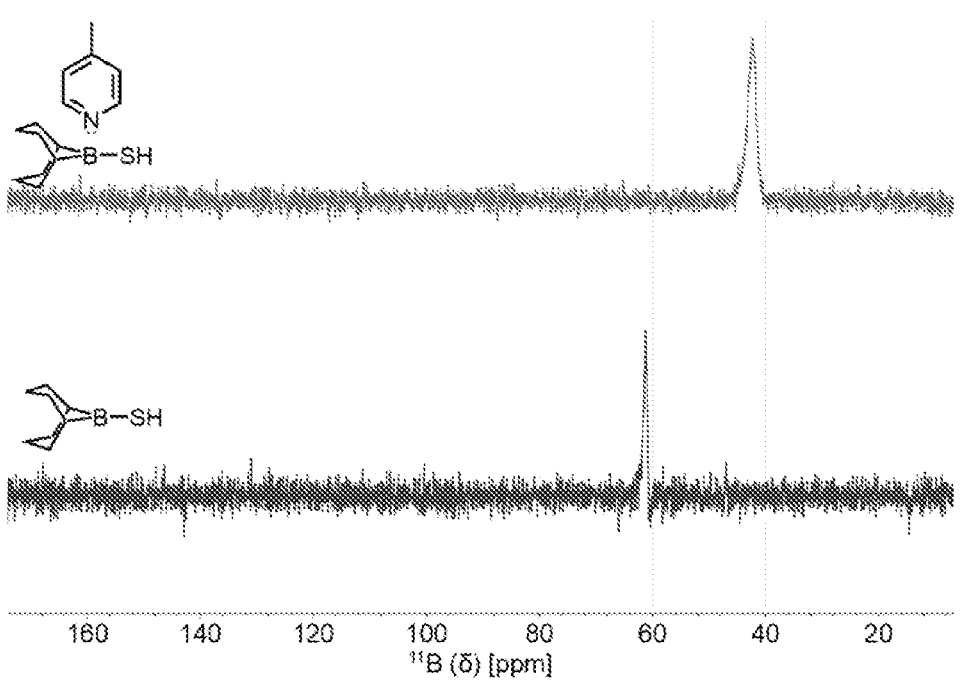

FIG. 19. $^{11}B$ NMR spectrum of BBN-SH before (lower) and after (upper) adding picoline. Upon the addition of picoline, the electron density around the boron atom increases significantly. Therefore, the peak from the boron in BBN-SH at ~61 ppm shifts to up-field (~42 ppm).

Figure 20:
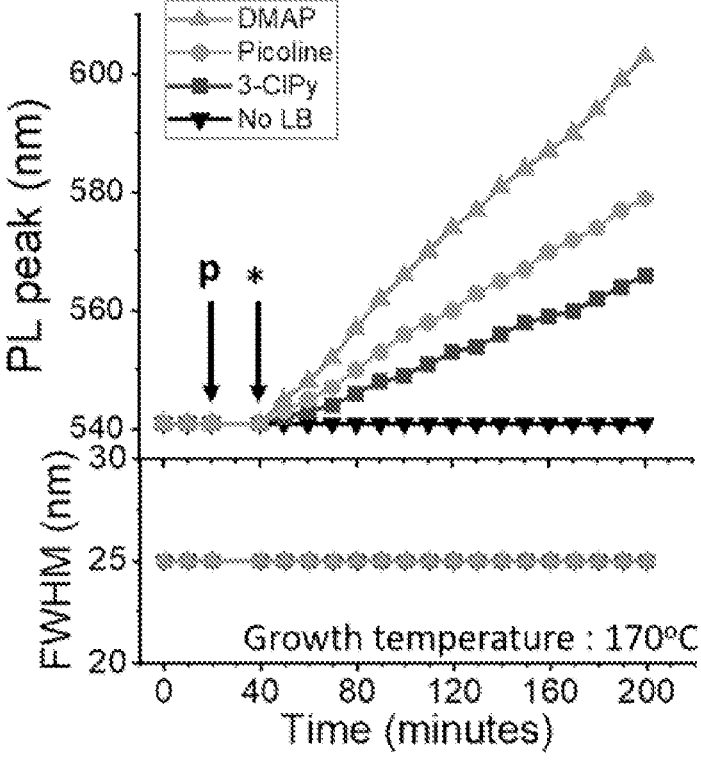

FIG. 20. Modulated shell growth rates by varying LBs under constant temperature condition (170° C.). No growth was observed when the precursors were injected ("p"). Injection of LBs initiates the shell growth (*). LBs yielding higher $T_{act}$ show slower rate of shell growth (magenta triangle: DMAP, olive circle: picoline, blue square: 3-ClPy). The FWHM of PL spectra is maintained narrow during the shell growth, indicating that the tight size distribution of CdSe/CdS core/shell QDs is maintained. In the absence of LB, CdS shell deposition is not initiated (black flipped triangle).

Figure 21:
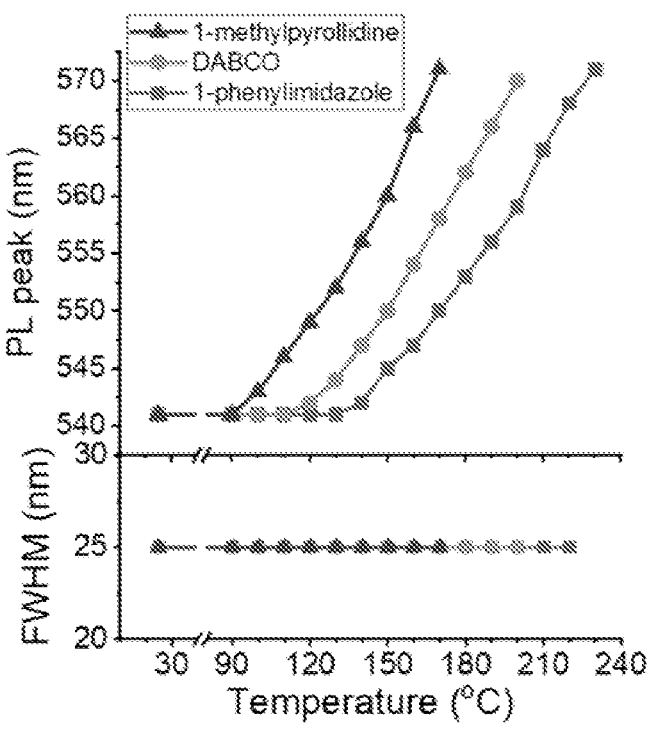

FIG. 21. CdS shell growth using BBN-SH and non-pyridine based LBs. The reactivity of BBN-SH is modulated using LBs having different $BF_3$ affinities (1-methylpyrrolidine (blue triangle), DABCO (magenta circle), 1-phenylimidazole (olive square)). The FWHM of PL spectra is maintained narrow during the shell growth, indicating that the tight size distribution of QDs is maintained.

Figure 22:
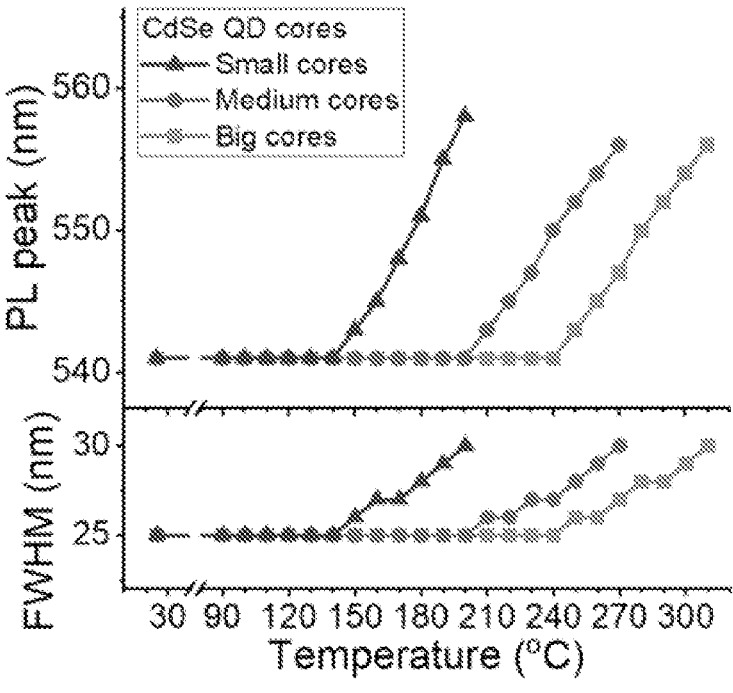

FIG. 22. Melting temperature of CdSe QDs of different sizes. The peak and FWHM of PL spectra of the CdSe QD cores are monitored while increasing the temperature [small size (d: 1.8 nm, blue triangle), medium size (d: 3.6 nm, cyan circle), and big size (d: 4.6 nm, magenta square)]. A red-shifted PL peak and broadened FWHM indicate that CdSe QDs become unstable, leading to Ostwald ripening.

Figures 23A, 23B, 23C, 23D, 23E, 23F:
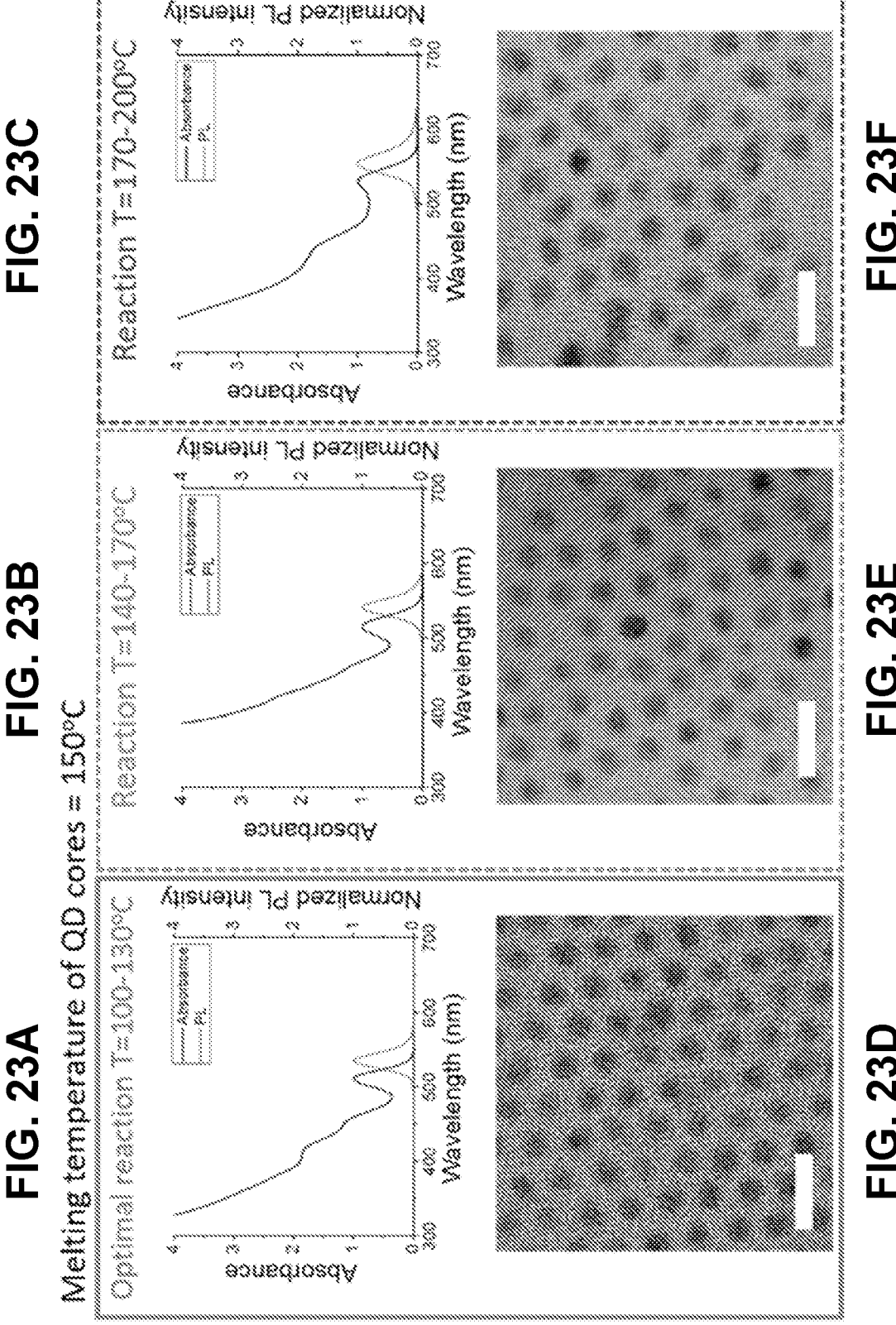
Figure 23G:
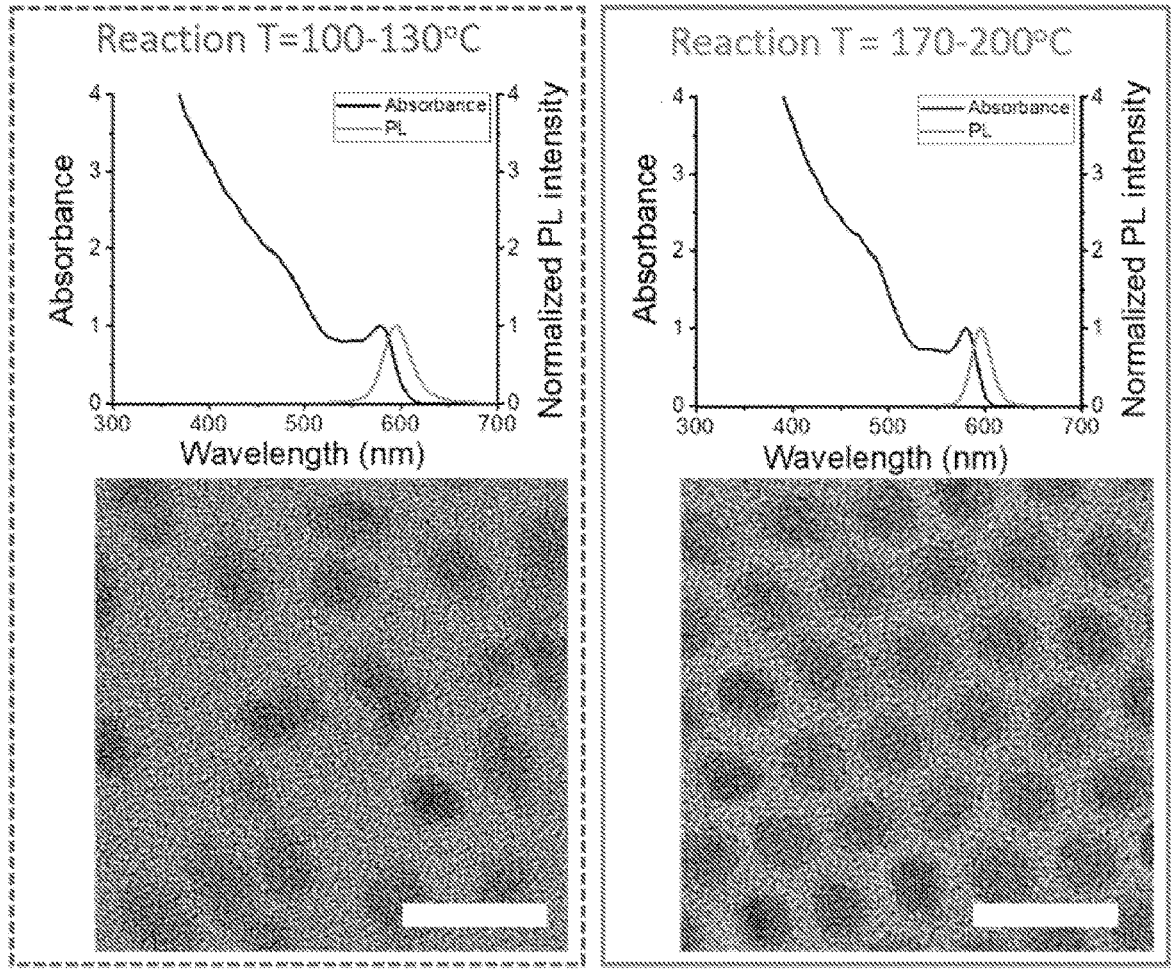

FIGS. 23A-23G. Optimization of the reaction temperature by growing shells onto (sm)-CdSe QDs ($T_m$: 150° C.) using different LBs. The reaction temperature should be in the optimal range (10-20° C. lower than the melting temperature of QD cores). Shell growth at higher reaction temperatures results in lower QY, broad FWHM, undesired alloying, and irregular shapes. FIGS. 23A-23C. The absorbance and PL spectra and (FIGS. 23D-23F) TEM images of (sm)-CdSe/CdS QDs (scale bar: 20 nm). CdS shell growth on (sm)-CdSe QD cores using [BBN-SH:DMAP] (optimal pair, FIGS. 23A and 23D), [BBN-SH:picoline] (b,e), and [BBN-SH:3-CIPy] (FIGS. 23C and 23F). FIG. 23G. Summary of optical and structural quality of each QD sample.

Figures 24E, 25A, 25B:
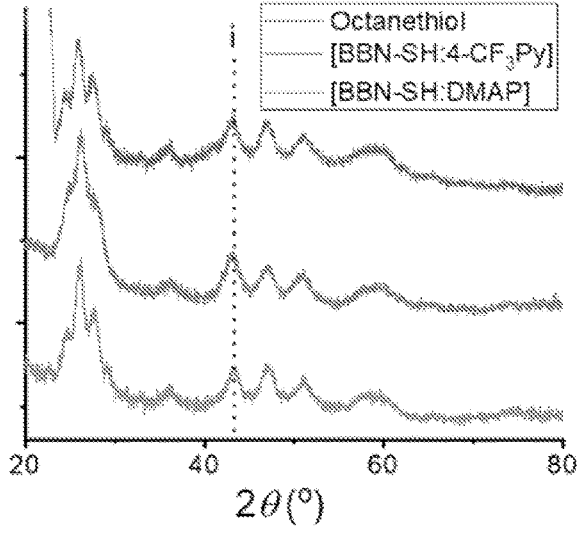

FIGS. 24A-24E. Optimization of the reaction temperature by growing shells onto medium CdSe QDs ($T_m$: 210° C.) using different LBs. The reaction temperature should be in the optimal range (10-20° C. lower than the melting temperature of QD cores). Shell growth at lower reaction temperatures results in lower QY, broad FWHM, undesired alloying, and irregular shapes. FIGS. 24A-24B. Absorbance and PL spectra and (FIGS. 24C-24D) TEM images of CdSe/CdS QDs after shell growth (scale bar: 20 nm). CdS shell growth on medium size CdSe QD cores using [BBN-SH:DMAP] (FIGS. 24A and 24C) and [BBN-SH:3-CIPy] (optimal pair, FIGS. 24B and 24D). Shell growth at the optimal temperature produce QDs having narrow FWHM, high QY, and regular shape and size. FIG. 24E. Summary of the optical and structural quality of each QD sample.

FIGS. 25A-25B. Higher precursor reactivity negatively impacts the crystallinity of QDs. FIG. 25A. XRD data and (FIG. 25B) the summary of the CdS wurzite (wz) (110) peak ("i") from (bg)-CdSe/CdS core/shell QDs synthesized by either octanethiol (olive), [BBN-SH:4-CF₃Py] pair (red), or [BBN-SH:DMAP] pair with 12 times slower injection (magenta).

Figures 26A, 26B, 26C, 26D, 26E, 26F:
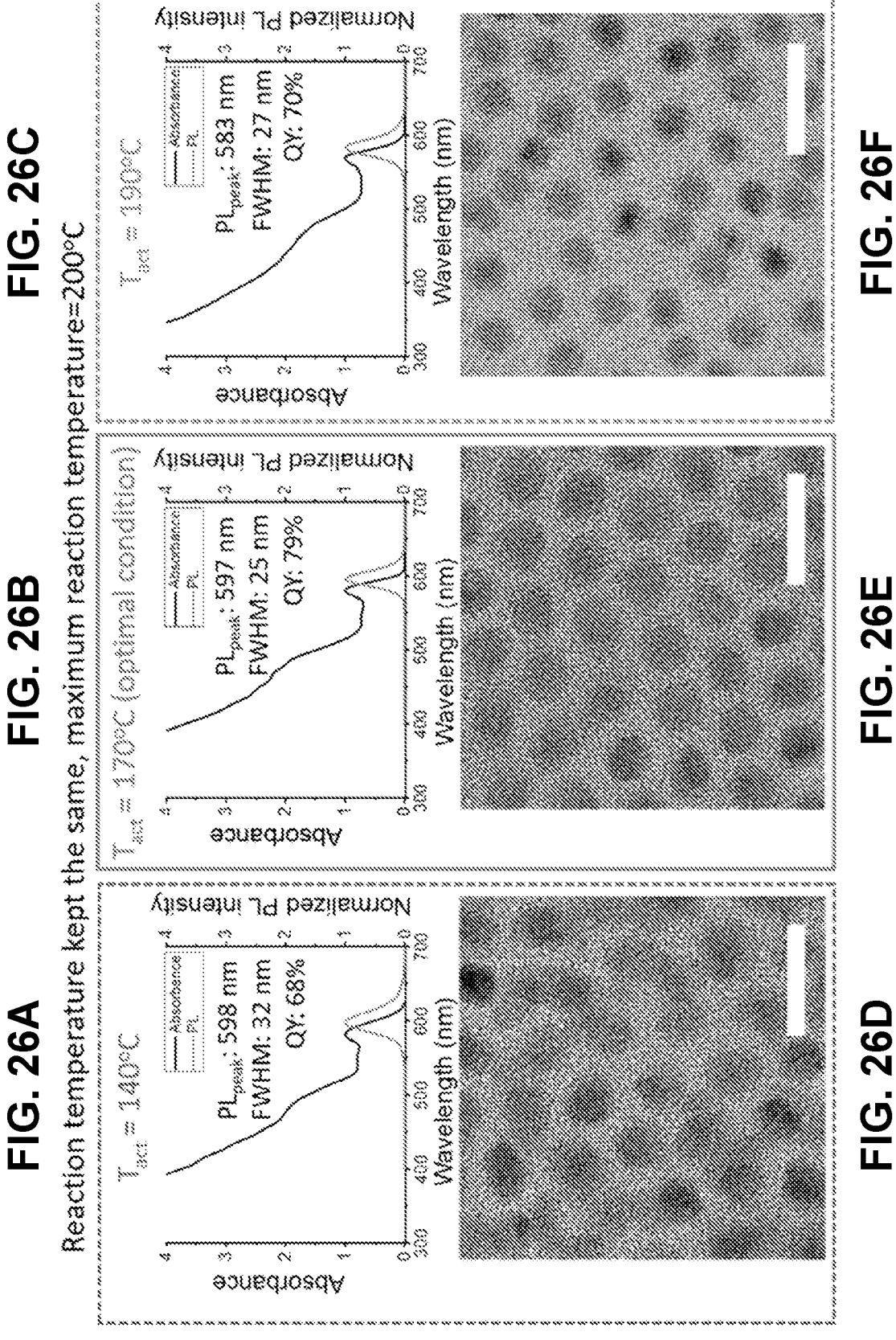

FIGS. 26A-26G. Impact of precursor reactivity on the optical and structural quality of QDs. CdSe/CdS QDs was synthesized at the same reaction temperatures using BBN-SH and Lewis bases that have different activation temperature. Higher reactivity precursor results in irregular shape and broad FWHM, whereas lower reactivity precursor results the inefficient shell growth. FIGS. 26A-26C. Absorbance and PL spectra and (FIGS. 26D-26F) the TEM images of CdSe/CdS QDs (scale bar: 20 nm). CdS shell growth onto the medium size CdSe QD cores at the same reaction temperature (200° C.) using (FIGS. 26A and 26D) [BBN-SH:picoline] (olive, $T_{act}$=140° C.), (FIGS. 26B and 26E) [BBN-SH:3-CIPy] (red, optimal condition, $T_{act}$=170° C.), and (FIGS. 26C and 26F) [BBN-SH:4-CyPy] (magenta, $T_{act}$=190° C.). FIG. 26G. Summary of the optical and structural quality of each QD sample.

FIGS. 27A-27B. Characterization of the activation temperature of thiourea-based sulfur precursors. We examined two thioureas having either the highest (k: 1100) or the lowest conversion rate (k: 1). FIG. 27A. The activation temperature of thiourea precursors are low (60-110° C.), making them undesired candidates for shell growth. FIG.

27B. The PL spectra of CdSe/CdS QDs (PL peak ~570 nm) produced with different thioureas indicates satellite particle formation.

Figures 28A, 28B, 28C:
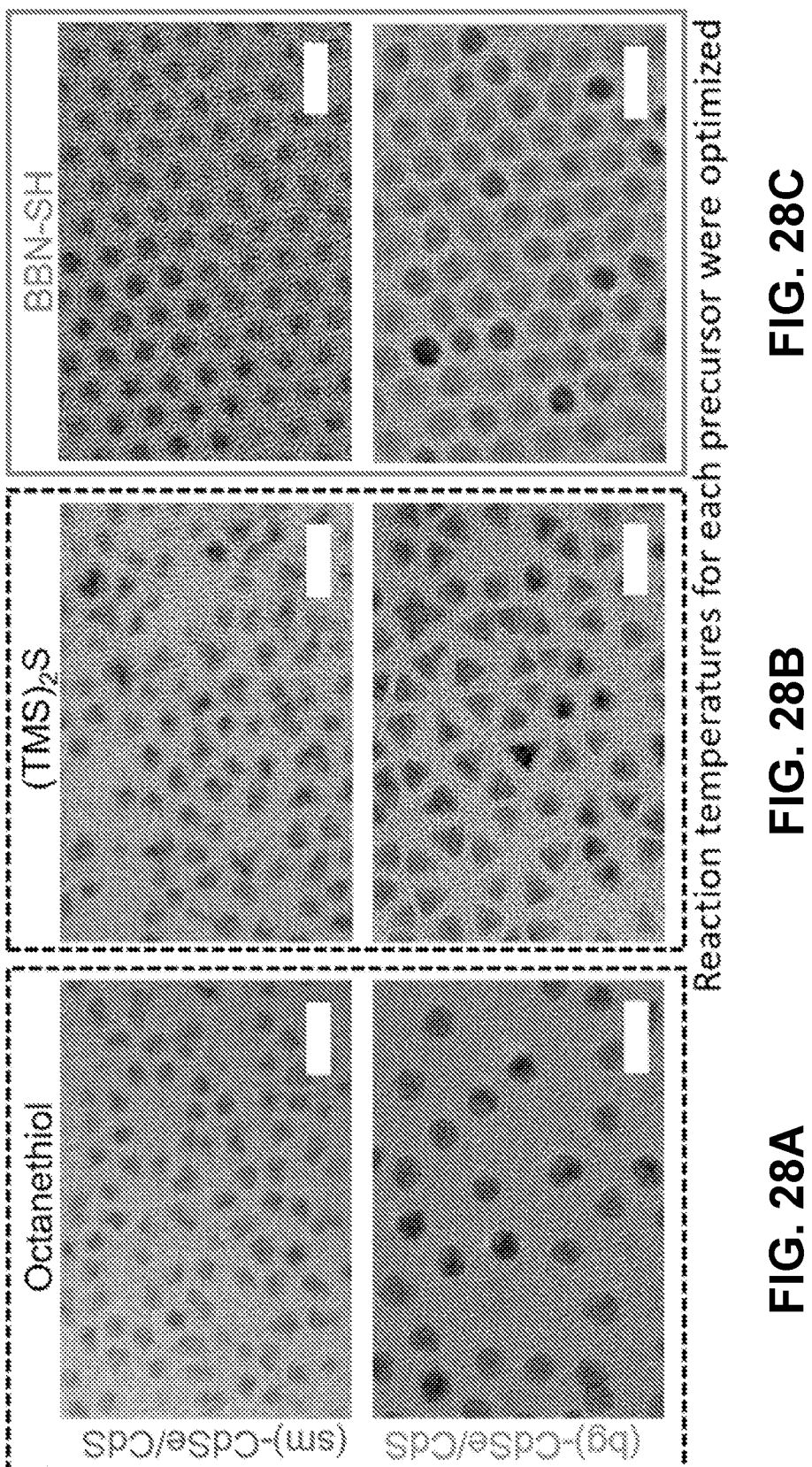

FIGS. 28A-28C. The wide field view of the TEM images in FIGS. 15A-15L. [BBN-SH:LB] enables a systematic growth of high quality shells. The QDs produced with conventional precursors show low crystallinity, poor uniformity in size, and irregular shape, except (bg)-CdSe/CdS QDs grown with OT.

Figure 29A:
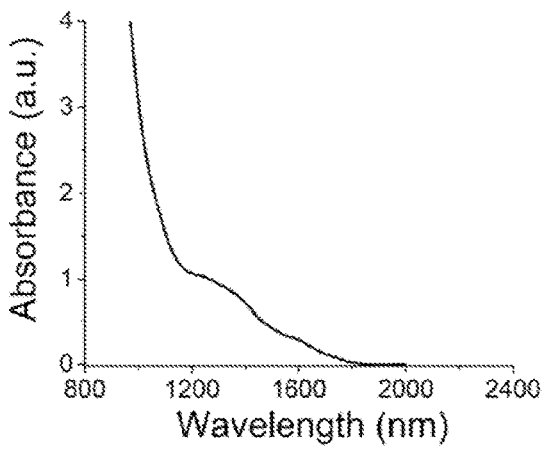
Figure 29B:
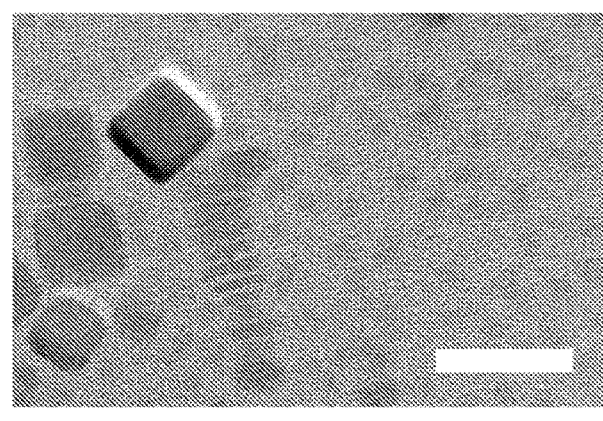

FIGS. 29A-29B. Synthesis of PbS QDs by the slow infusion of (TMS)₂S as a sulfur precursor. FIG. 29A. Absorbance spectrum and (FIG. 29B) TEM image of resulted PbS QDs (scale bar: 20 nm).

Figure 30:
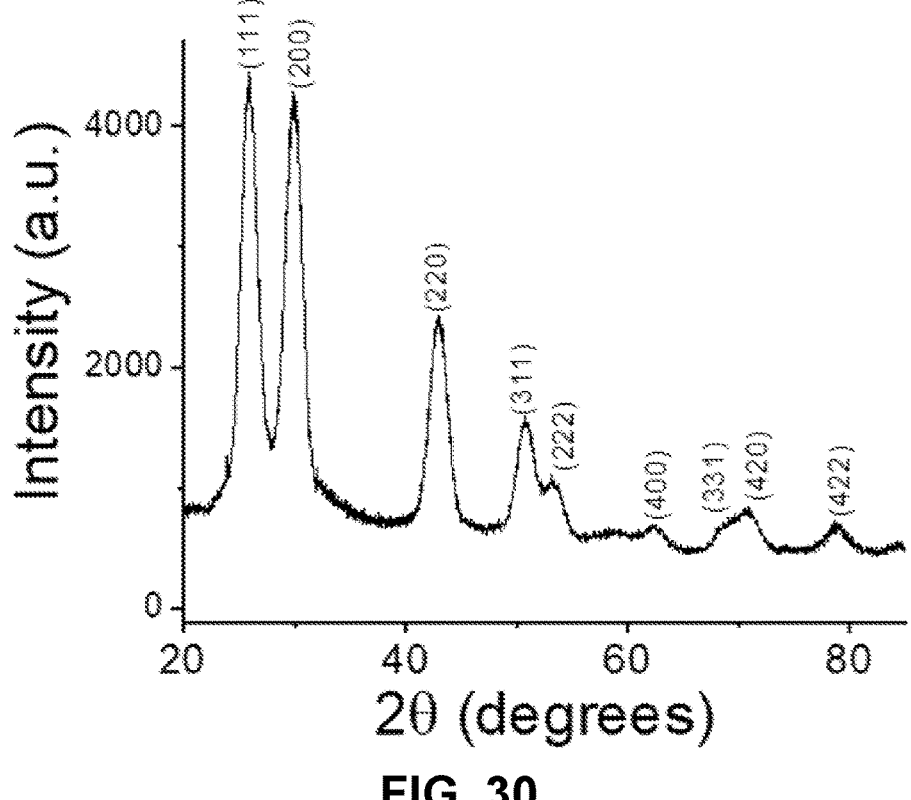

FIG. 30. XRD data shows the highly crystallinity of PbS QDs prepared with BBN-SH and DMAP.

Figure 31A:
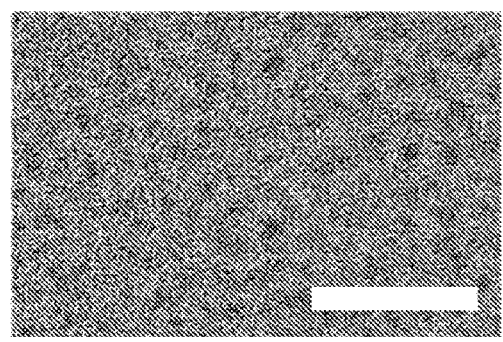
Figure 31B:
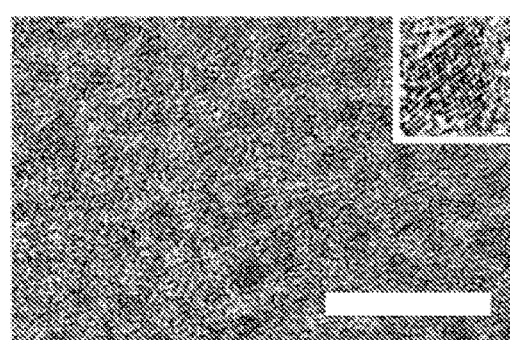

FIGS. 31A-31B. CuInS₂ QDs growth using BBN-SH:3-CIPy. The TEM images of (FIG. 31A) CuInS₂ nuclei (d: 2.6 nm) and (FIG. 31B) CuInS₂ QDs grown with BBN-SH (d: 5.0 nm), scale bar: 20 nm.

Figure 32A:
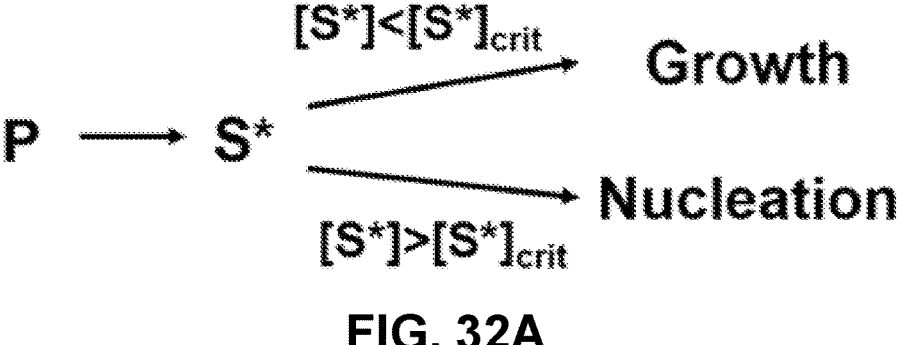
Figure 32B:
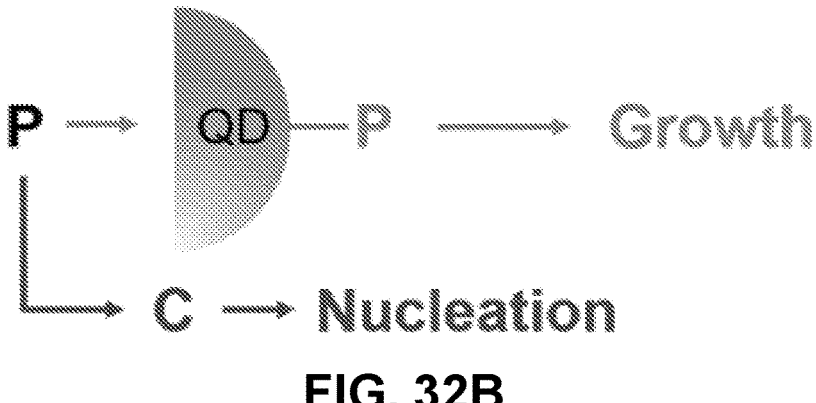

FIGS. 32A-32B. Nucleation and growth mechanisms for (FIG. 32A) conventional and (FIG. 32B) new precursors. FIG. 32A. Conventional precursors share the same intermediate (activated solutes, S*) for nucleation and growth. The concentration of the active solutes ([S*]) determines which reaction path is activated. FIG. 32B. New precursors have completely separated reaction paths for nucleation and growth. Growth occurs via surface assisted conversion of precursors, while nucleation requires the formation of clusters in solution.

Figure 33:
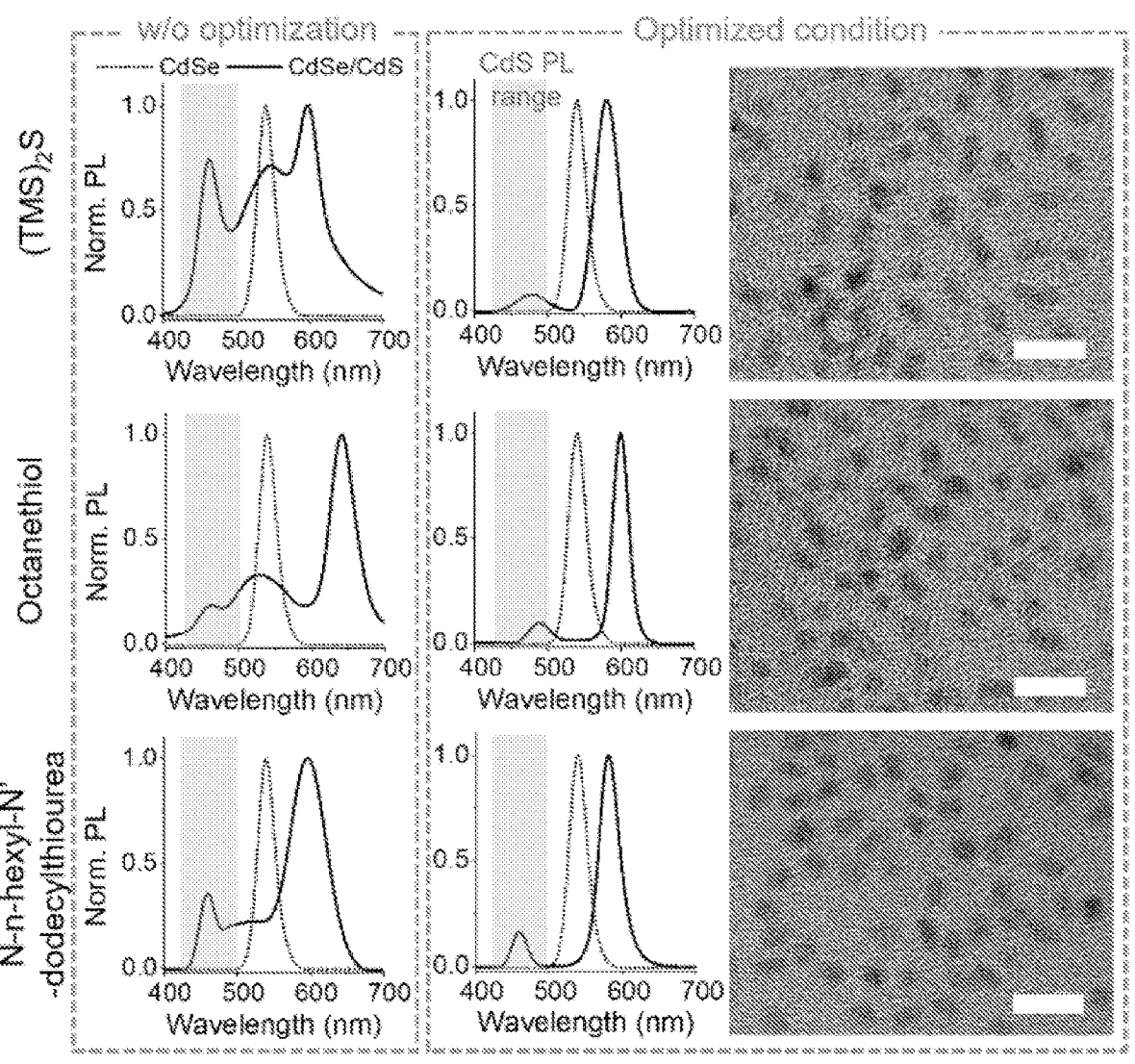

FIG. 33. Heat-up synthesis of CdSe/CdS QDs using conventional precursors results in secondary nucleation and uncontrolled growth (green box). The blue box indicates the range of emission corresponding to CdS QDs (secondary nucleation, 420-500 nm). After heat-up-based shell growth, multiple QDs are produced. CdS QDs are produced via secondary nucleation, CdSe$_x$S$_{1-x}$ QDs are formed via undesired alloying (500-550 nm), and CdSe/CdS QDs (~600 nm) are produced via sequential growth of cores and shells. Even after optimizing the temperature profile of the reaction vessel, secondary nucleation still occurred, evidenced by CdS QD formation (magenta box). The TEM images show that QDs are irregularly shaped and have low crystallinity after shell deposition, indicating uncontrolled growth (scale bar: 20 nm).

Figure 34:
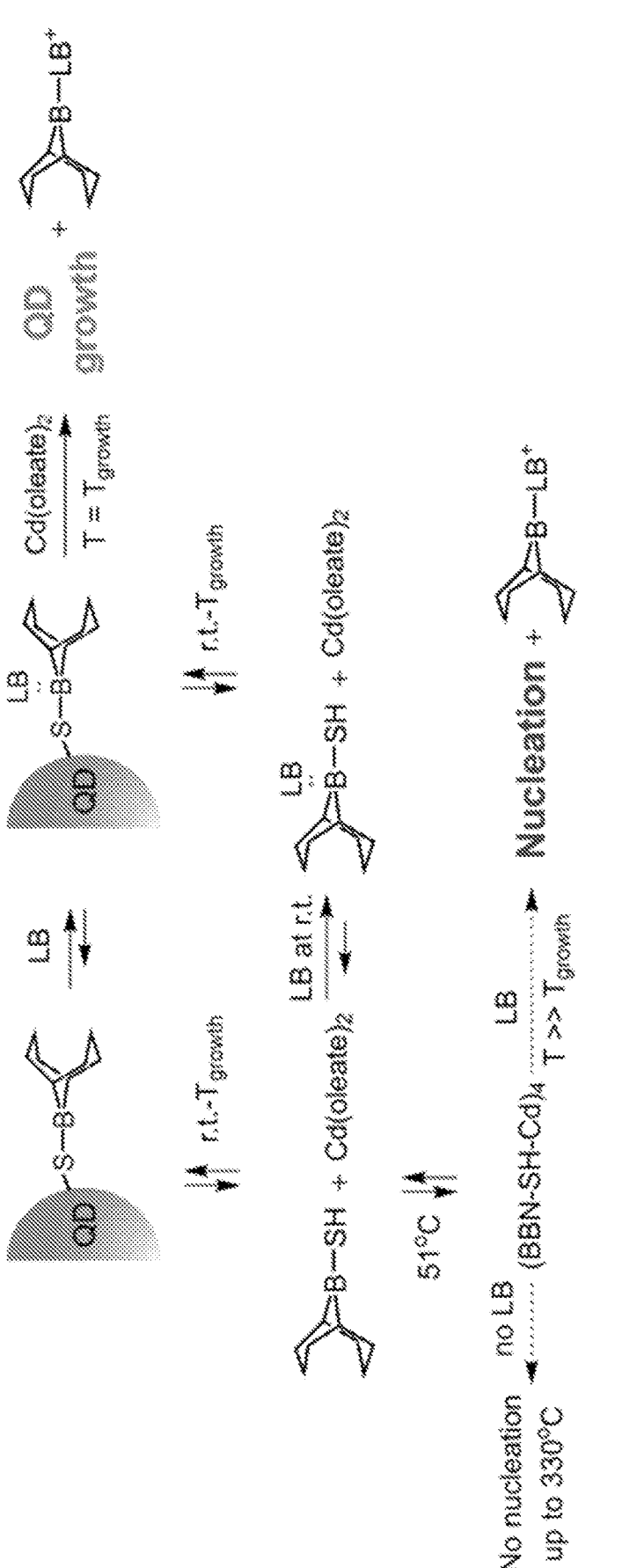

FIG. 34. Detailed reaction mechanism for BBN-SH. Nanoparticle growth proceeds via the surface assisted conversion of BBN-SH, while nucleation requires the formation of (BBN-SH-Cd)₄ in solution. Nucleation is effectively inhibited during growth because 1) the formation of (BBN-SH-Cd)₄ is strongly suppressed in the presence of LB and 2) nucleation is initiated at a temperature that is significantly higher than the growth temperature ($T_{growth}$).

Figure 35A:
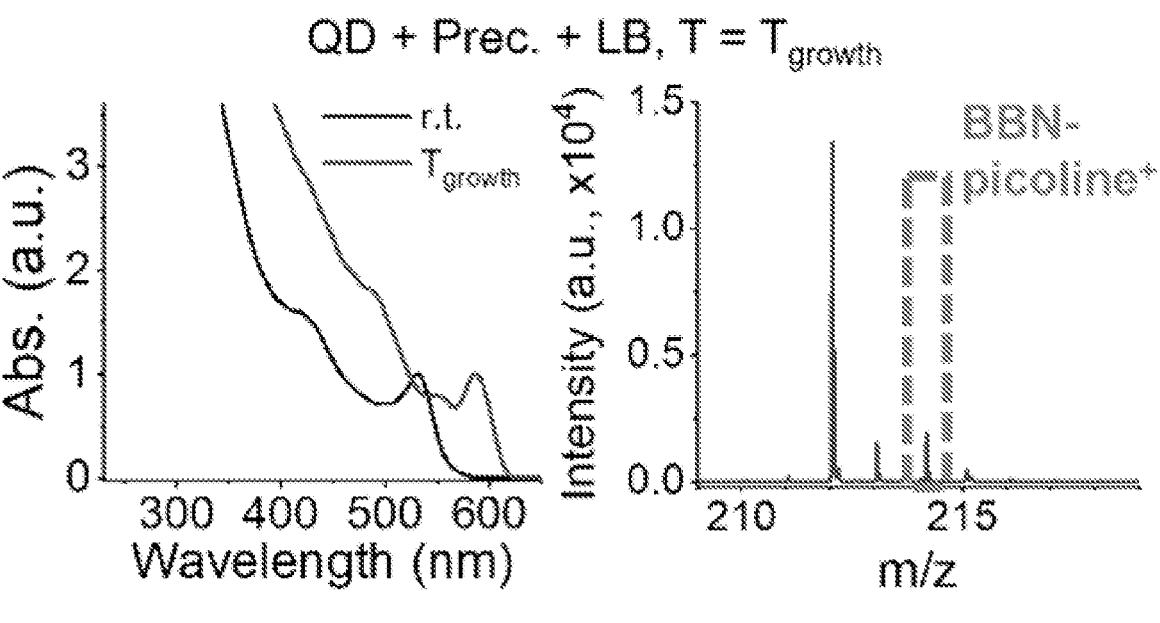
Figure 35B:
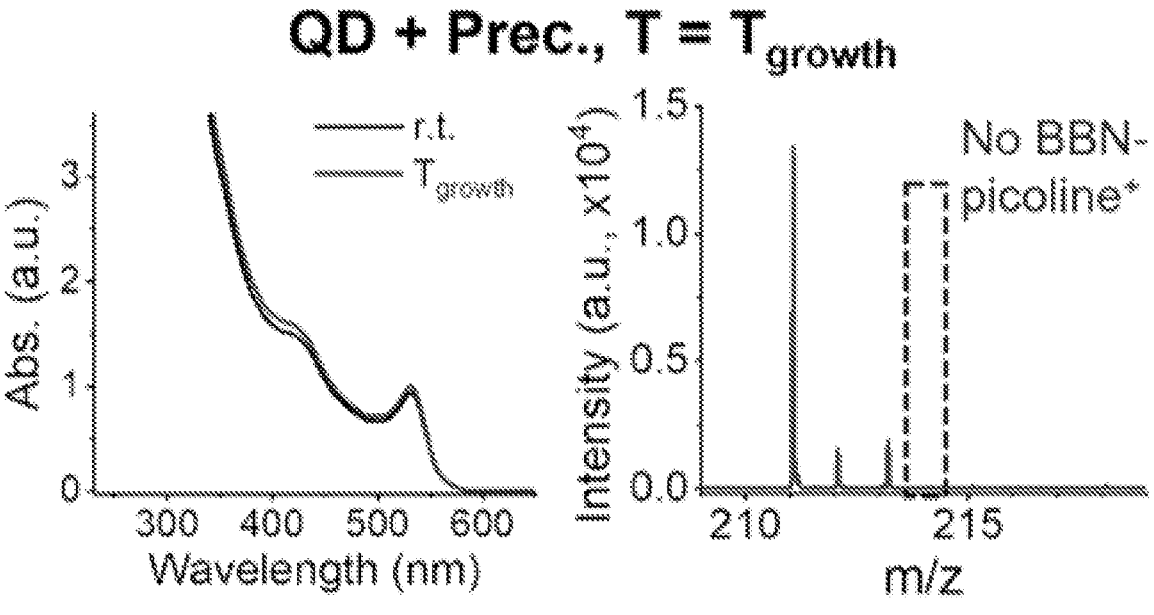
Figure 35C:
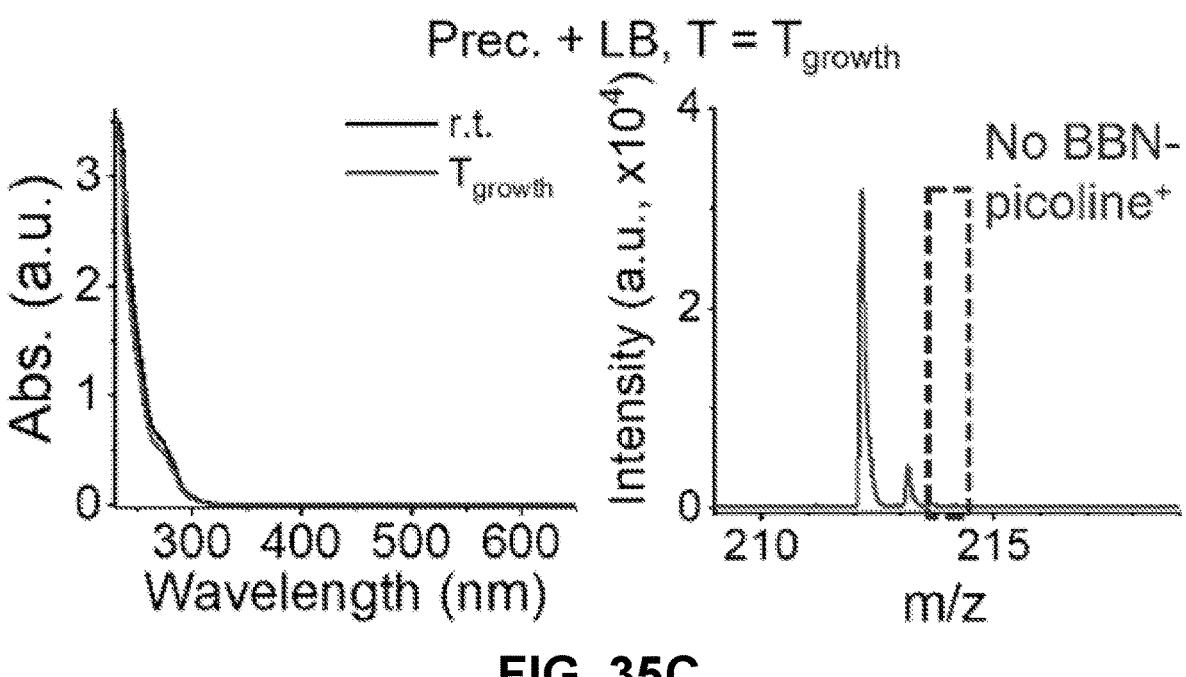
Figure 35D:
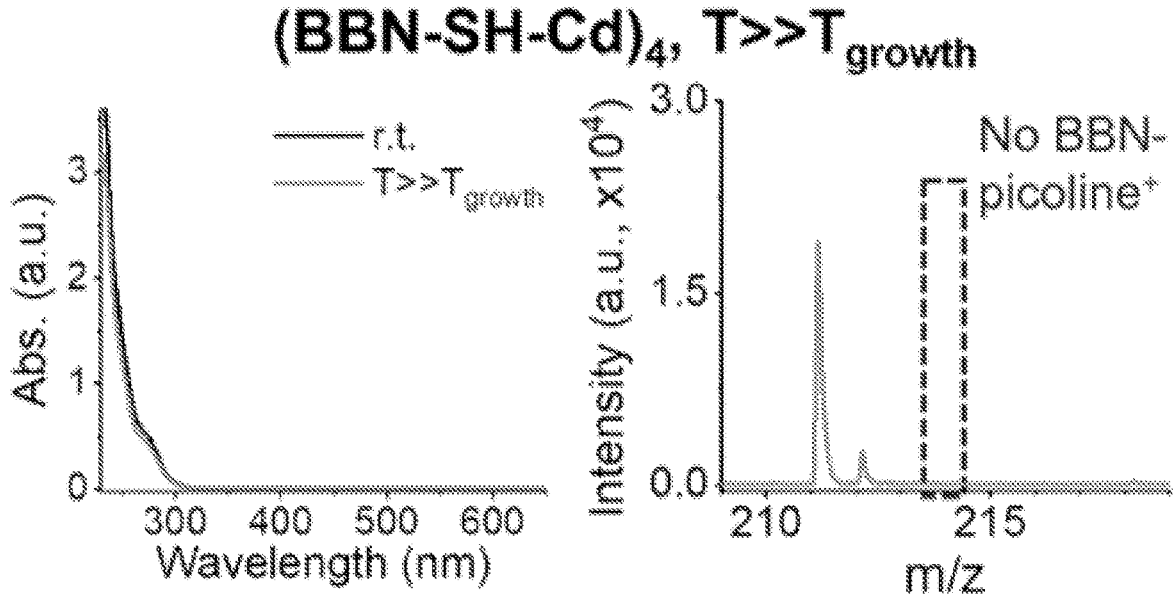
Figure 35E:
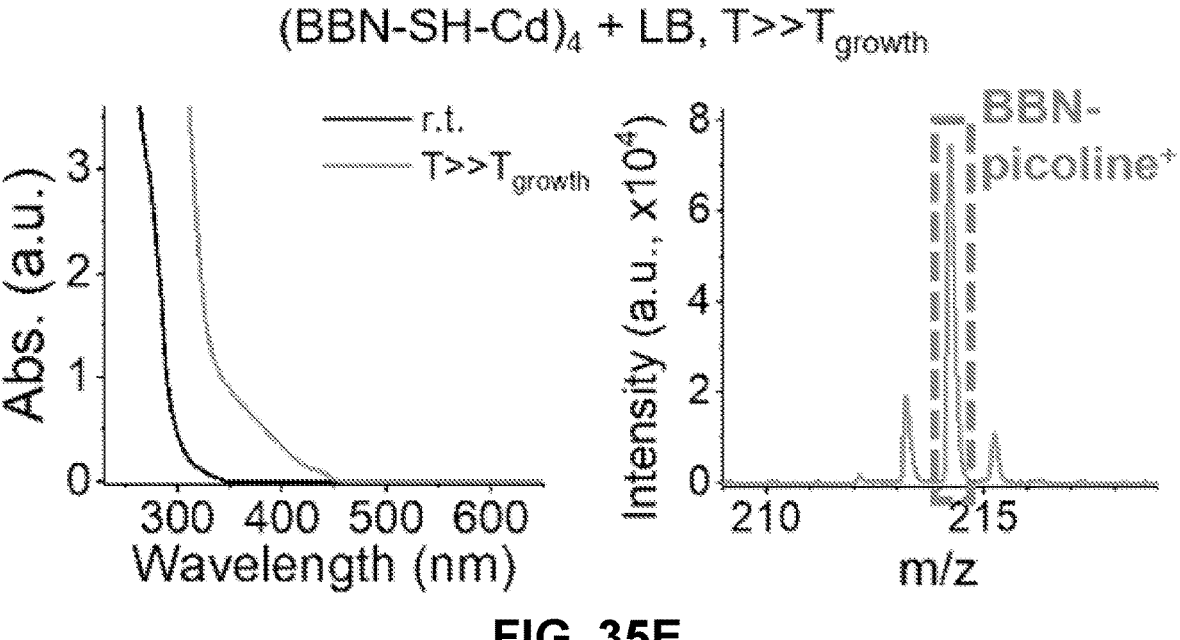
Figure 35F:
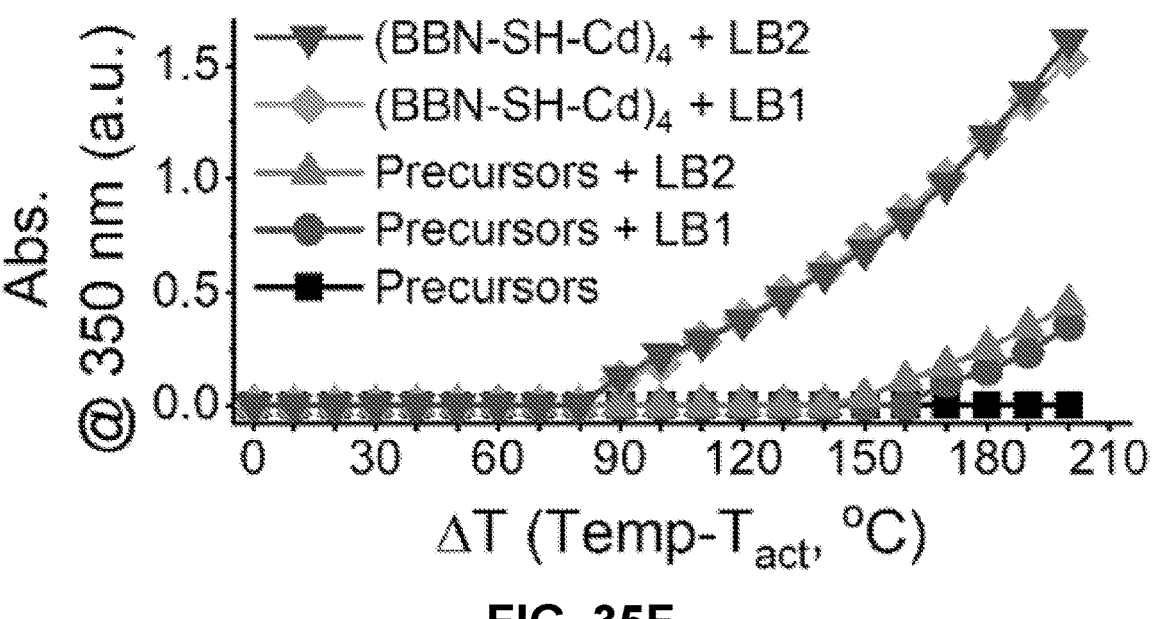

FIGS. 35A-35F. Mechanistic studies for BBN-SH based growth and nucleation. Absorption and mass spectroscopy are used to confirm nucleation and growth. FIG. 35A. Shell growth occurs upon incubation of QD cores, precursors and LB and produces BBN-picoline as a byproduct. FIG. 35B. In the absence of LB, shell growth does not occur. FIG. 35C. Precursor remains intact in the absence of QD cores, indicating the surface-assisted conversion. FIG. 35D. (BBN-SH-Cd)₄ is stable even at high temperature, but (FIG. 35E) contributes to nucleation in the presence of LB at a temperature significantly higher than $T_{growth}$. FIG. 35F. Change in absorption at 350 nm indicates nucleation. The rate-limiting step for nucleation is (BBN-SH-Cd)₄ formation. Thus, preformed (BBN-SH-Cd)₄ initiates nucleation at a much lower temperature than a regular growth mixture. In both cases, the temperature that initiates nucleation is significantly higher than the temperature that initiates growth ($T_{act}$).

Figure 36A:
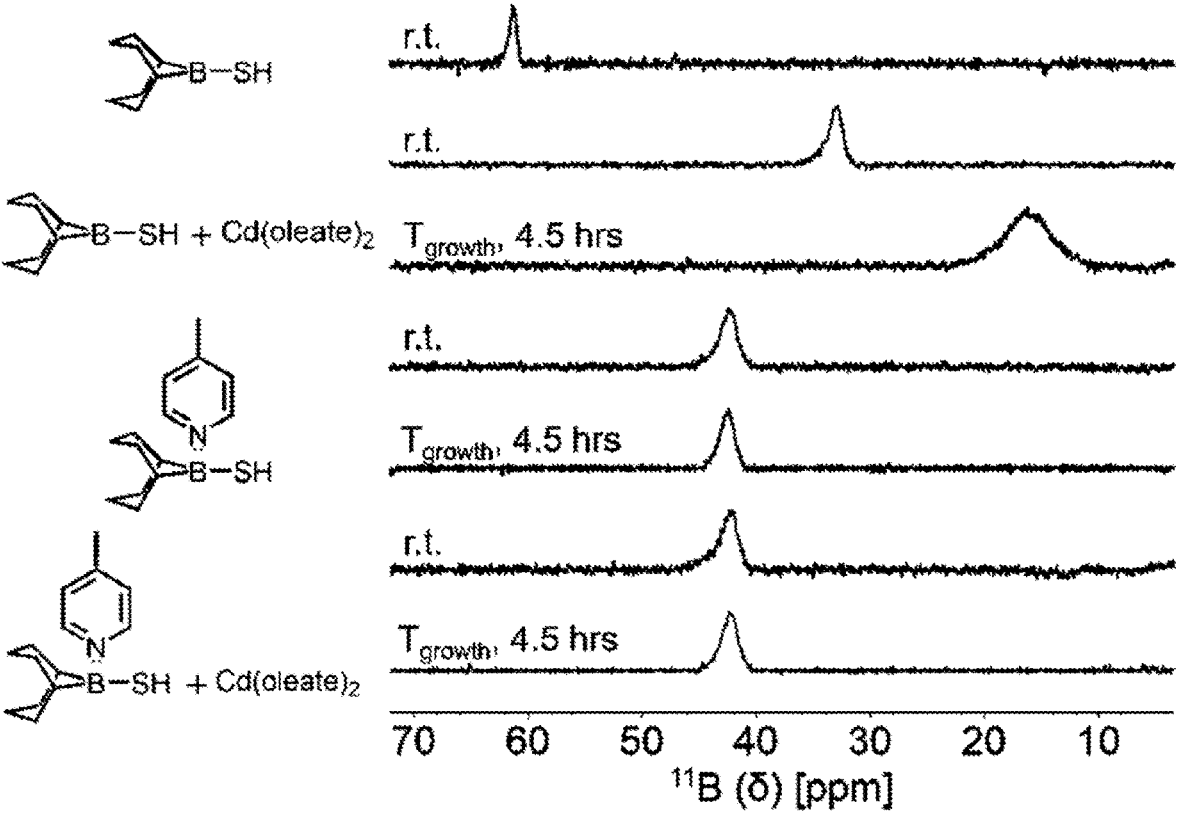
Figure 36B:
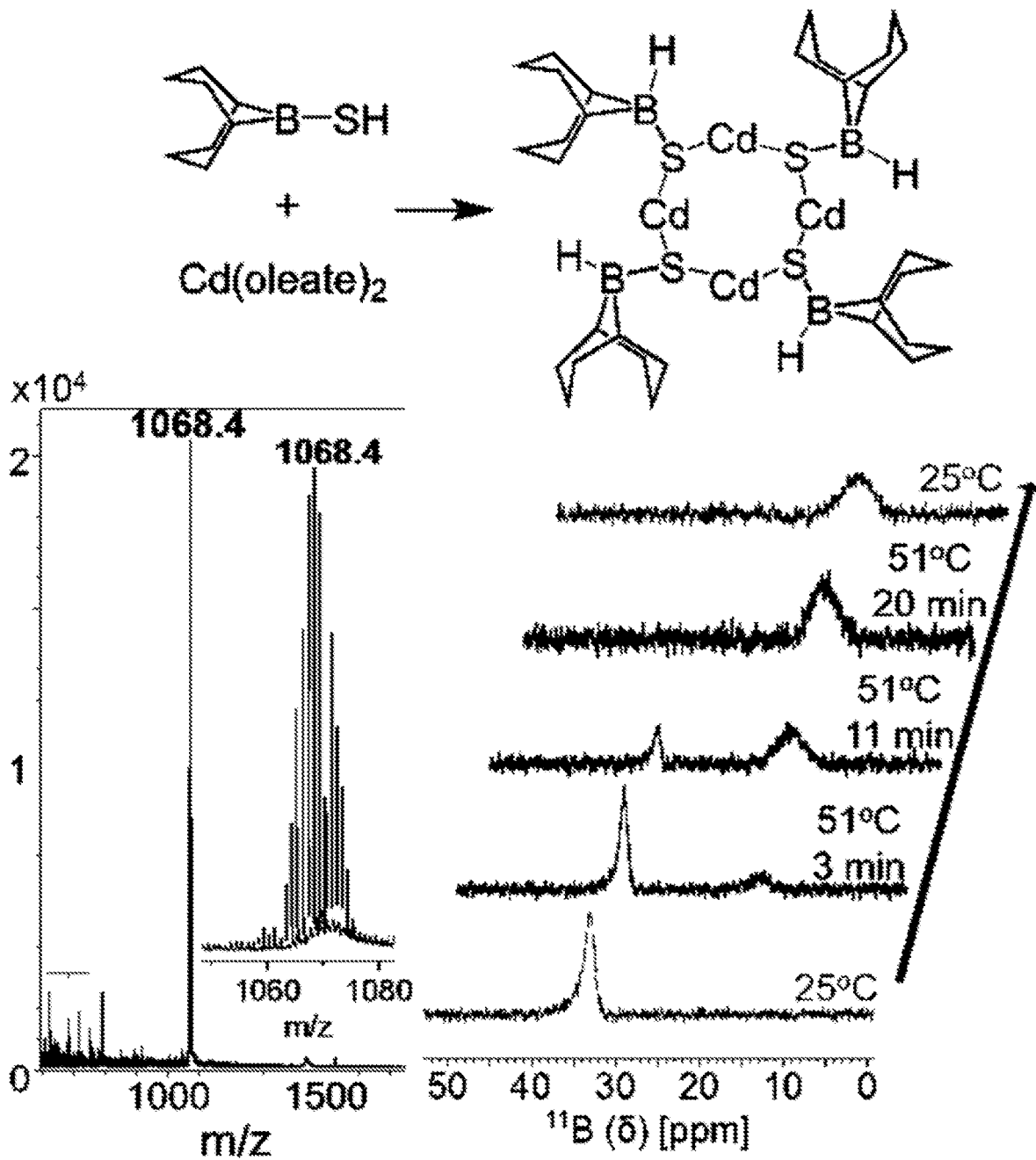

FIGS. 36A-36B. Molecular transformations involved in BBN-SH based shell growth. FIG. 36A. The $^{11}$B NMR studies show the formation of BBN-SH:Cd(oleate)$_2$ complex (magenta, r.t.) and (BBN-SH-Cd)$_4$ cluster (magenta, $T_{growth}$) in the absence of picoline. In the presence of picoline, BBN-SH forms a BBN-SH:picoline complex (blue) and the association with Cd(oleate)$_2$ is inhibited (green). FIG. 36B. MALDI/MS and $^{11}$B NMR confirm the irreversible formation of a Cd—S cluster upon heating the mixture of BBN-SH and Cd(oleate)$_2$. By analyzing the MS spectrum, the chemical formula of the cluster is identified as (BBN-SH-Cd)$_4$. The chemical structure of this cluster is determined by additional NMR experiments and MS data as explained in the main body.

Figure 37C:
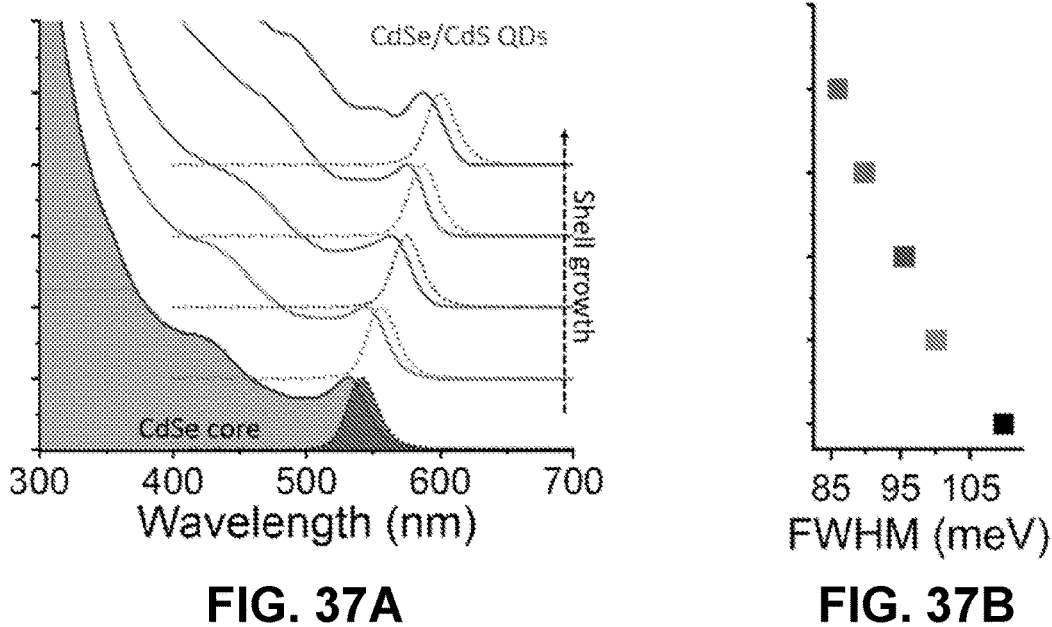
Figure 37C:
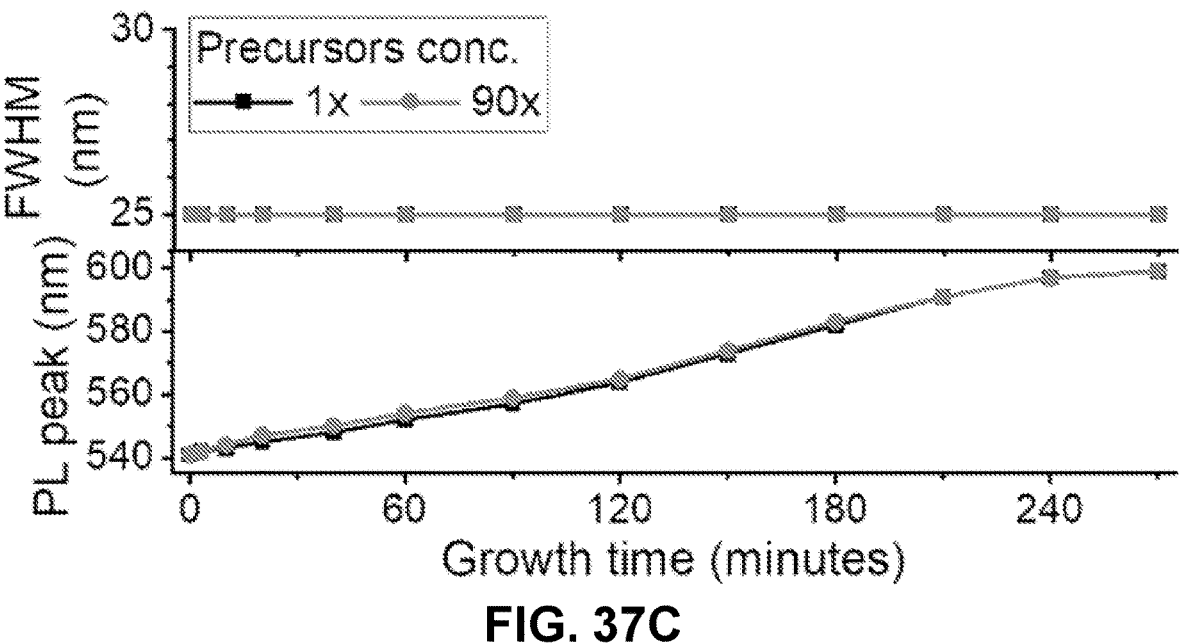

FIGS. 37A-37C. Heat-up-based CdS shell growth on CdSe cores using BBN-SH. FIG. 37A. Evolution of the absorption (solid lines) and emission (dotted lines) spectra during shell deposition suggests controlled growth without secondary nucleation. FIG. 37B. FWHM of the emission profile progressively narrows during shell growth (CdSe cores: black, CdSe/CdS QDs: other colors). FIG. 37C. The shell growth kinetics and FWHM are independent of precursor concentration, indicating the surface limited growth.

Figure 38A:
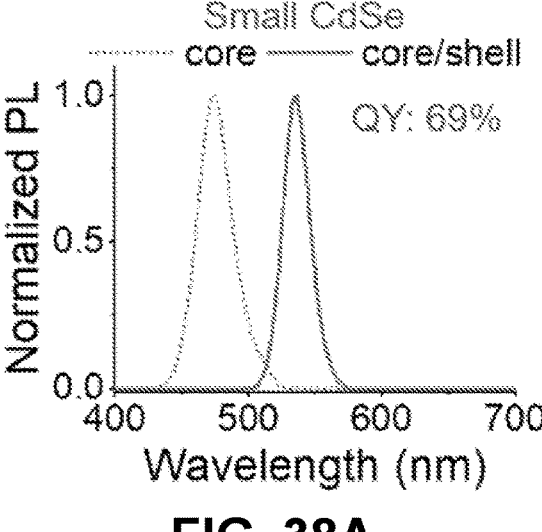
Figure 38B:
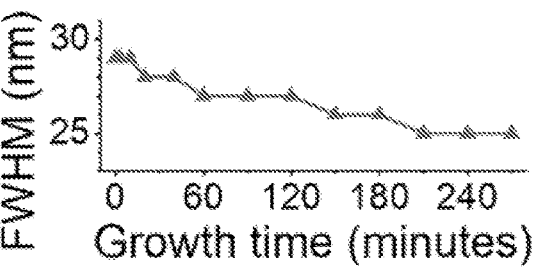
Figure 38C:
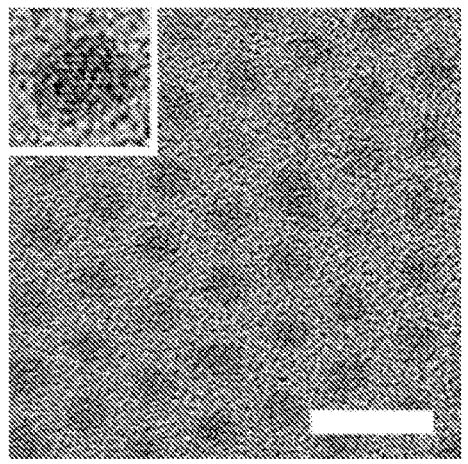
Figure 38D:
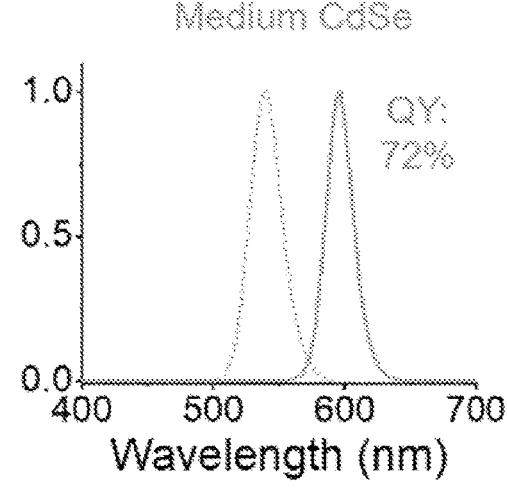
Figure 38E:
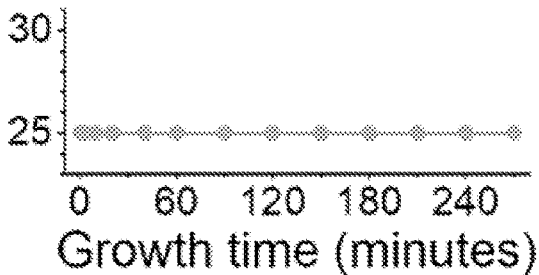
Figure 38F:
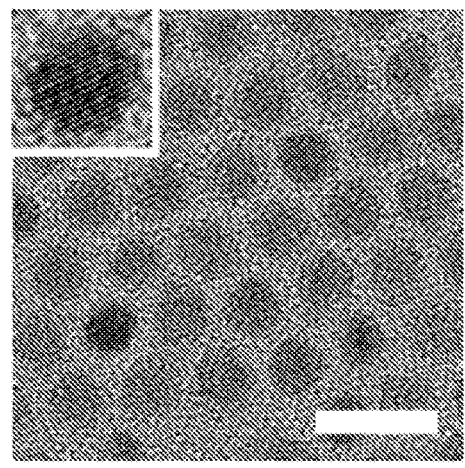
Figure 38G:
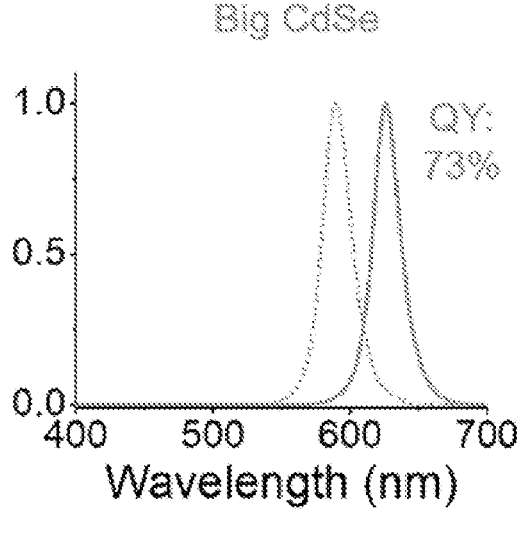
Figure 38H:
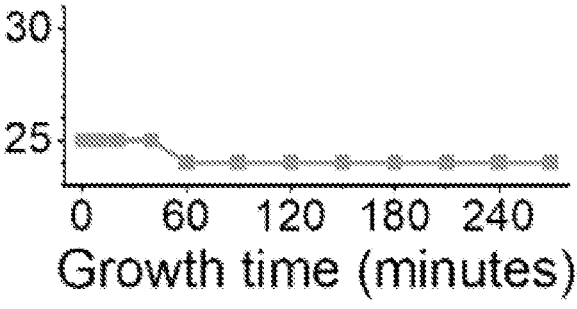
Figure 38I:
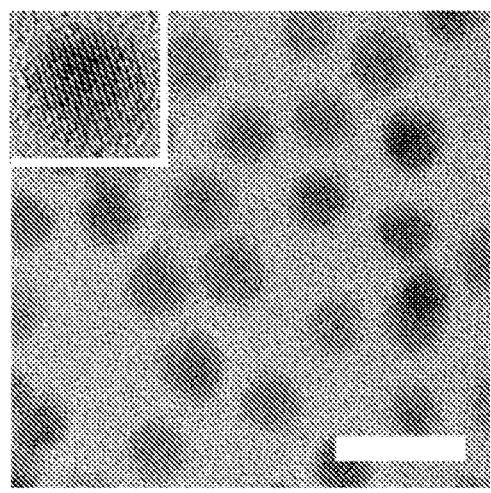

FIGS. 38A-38I. BBN-SH/LB chemistry enables a systematic growth of high-quality shells on CdSe cores of different sizes (small: 1.8 nm, medium: 3.6 nm, big: 4.6 nm). FIGS. 38A, 38B, 38D, 38E, 38G and 38H. The emission spectra remain narrow and symmetric during shell growth (dotted lines: cores, solid lines: core/shell QDs). FIGS. 38C, 38F and 38I. The TEM images of core/shell QDs prove that they are monodisperse, spherical and highly crystalline (inset: HRTEM images, scale bar: 20 nm).

Figure 39A:
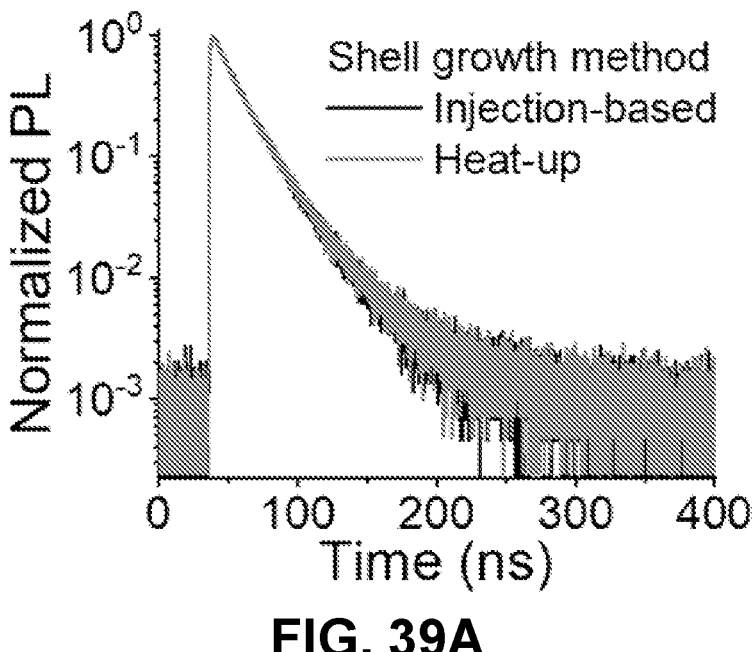
Figure 39B:
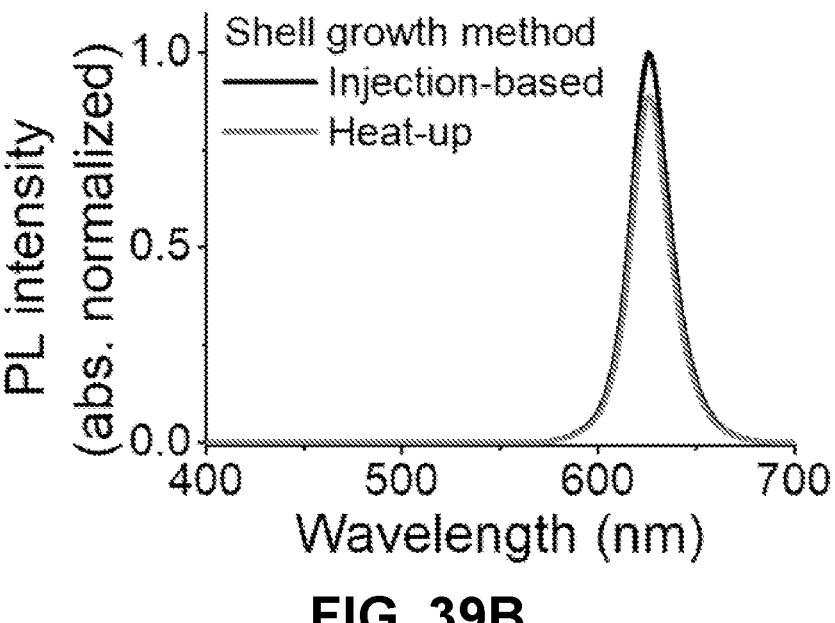
Figure 39C:
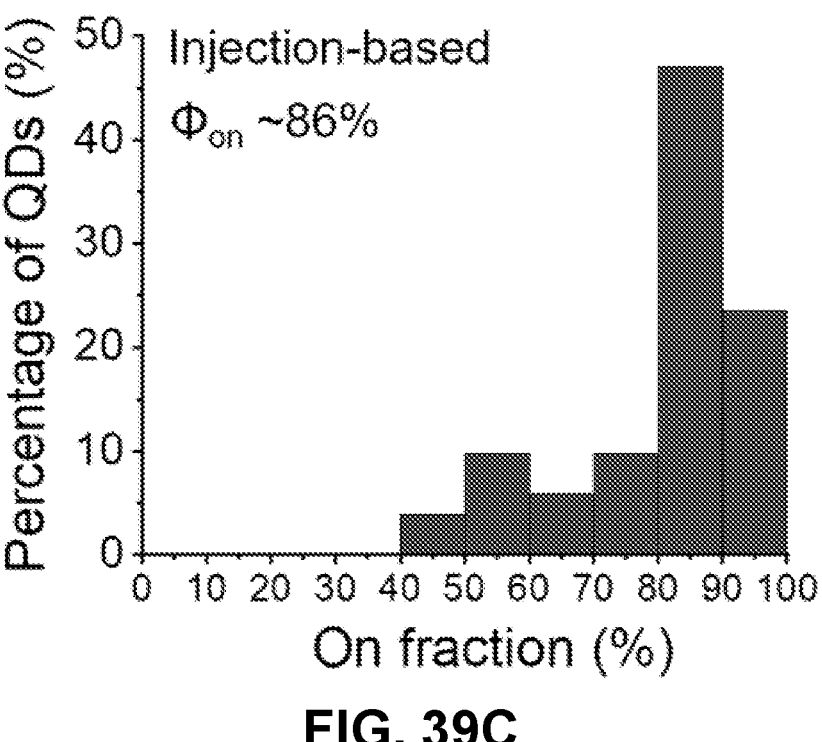
Figure 39D:
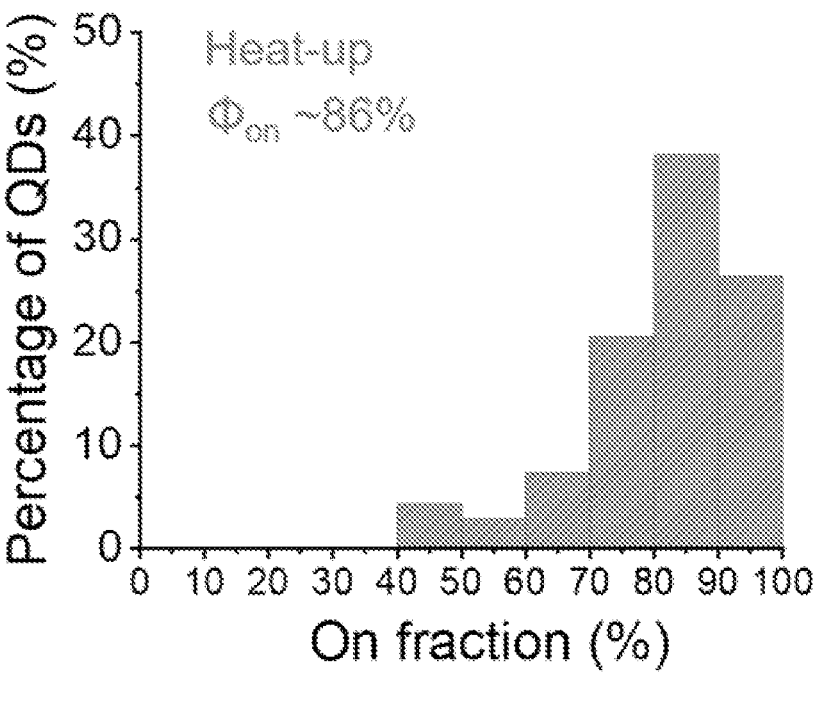

FIGS. 39A-39D. Heat-up and injection-based shell growth produce CdSe/CdS QDs having comparable optical qualities. FIG. 39A. PL decay profile of QDs produced by either heat-up (red) or injection-based (black) shell growth. FIG. 39B. Emission profile of the two samples. FIGS. 39C-39D. Histogram of the blinking ON-time fraction for the injection (FIG. 39C) and heat-up (FIG. 39D) sample. The average ON-time fraction ((Don) is identical (0.86) for the two samples.

Figure 40D:
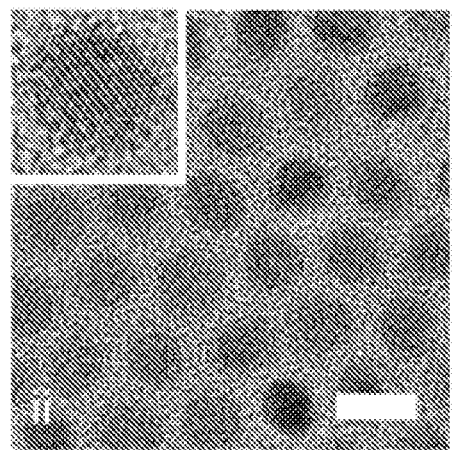
Figure 40E:
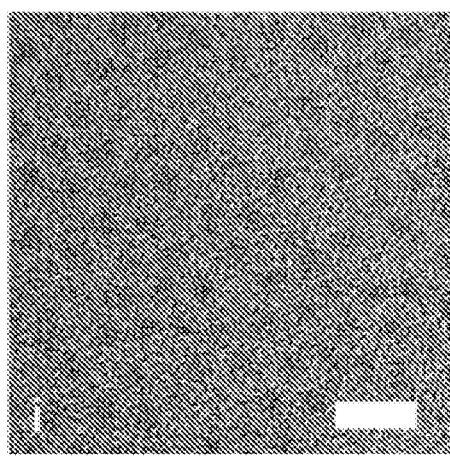

FIGS. 40A-40E. A new, simple synthetic scheme produces high-quality core/shell QDs. FIG. 40A. Schematics of the newly established synthesis method for core/shell QDs. In this scheme, cores are produced at full conversion, followed by heat-up-based shell growth. Lack of a purification step and bulk delivery of shell precursors render the scheme economical and reproducible. FIG. 40B. Absorption (solid lines) and emission (dotted lines) spectra of CdSe and CdSe/CdS QDs collected during QD synthesis using the new scheme (CdSe cores: black, CdSe/CdS QDs: other colors). FIG. 40C. FWHM of the emission profile progressively narrows during shell growth. FIGS. 400-40E. The TEM images of the final CdSe/CdS QDs having 7 MLs of CdS shells (FIG. 40D) and CdSe cores (FIG. 40E) (inset: HRTEM image, scale bar: 10 nm).

Figure 41:
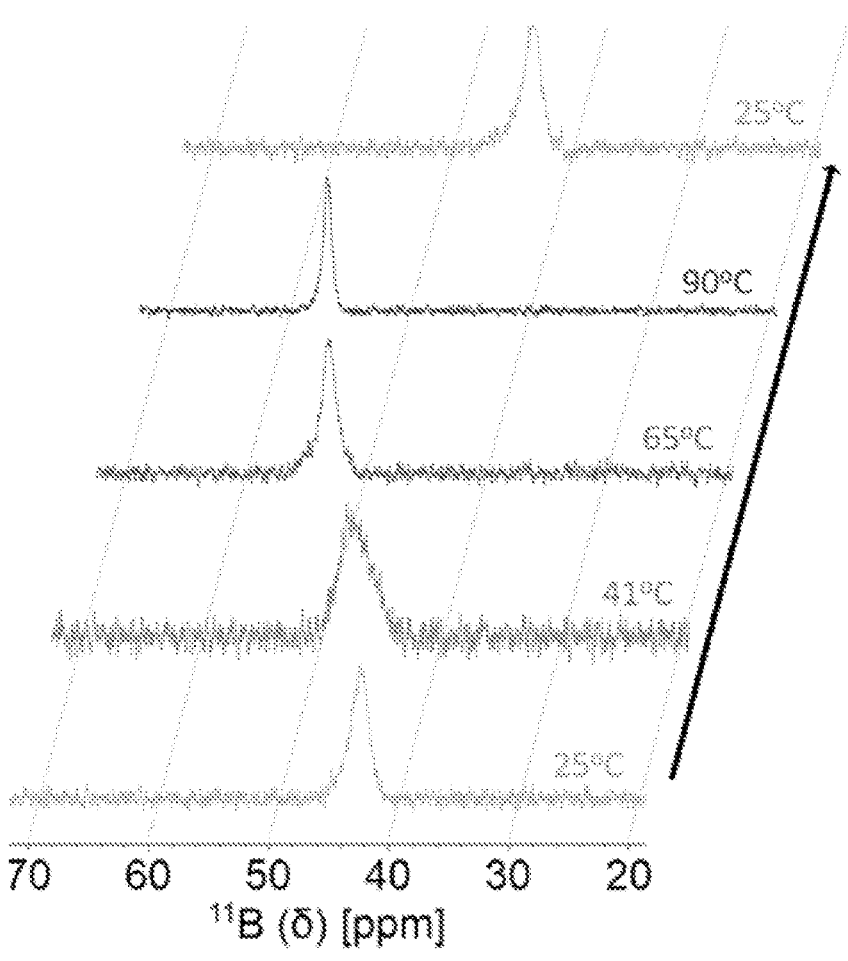

FIG. 41. VT $^{11}$B NMR spectrum of a mixture of BBN-SH and picoline. As the sample is heated up, the coordination bond on the boron of BBN-SH with picoline gets weaker. Therefore, the peak from the boron atom at ~42 ppm shifts to down-field (~56 ppm). After cooling down to r.t., the peak comes back to ~42 ppm.

Figure 42A:
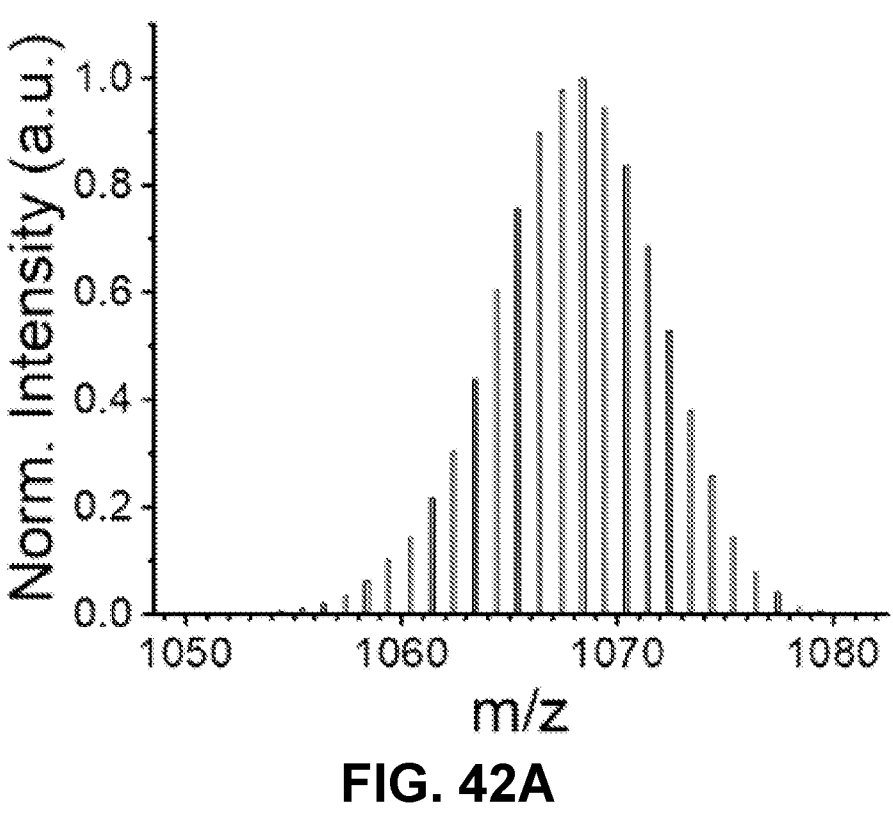
Figure 42B:
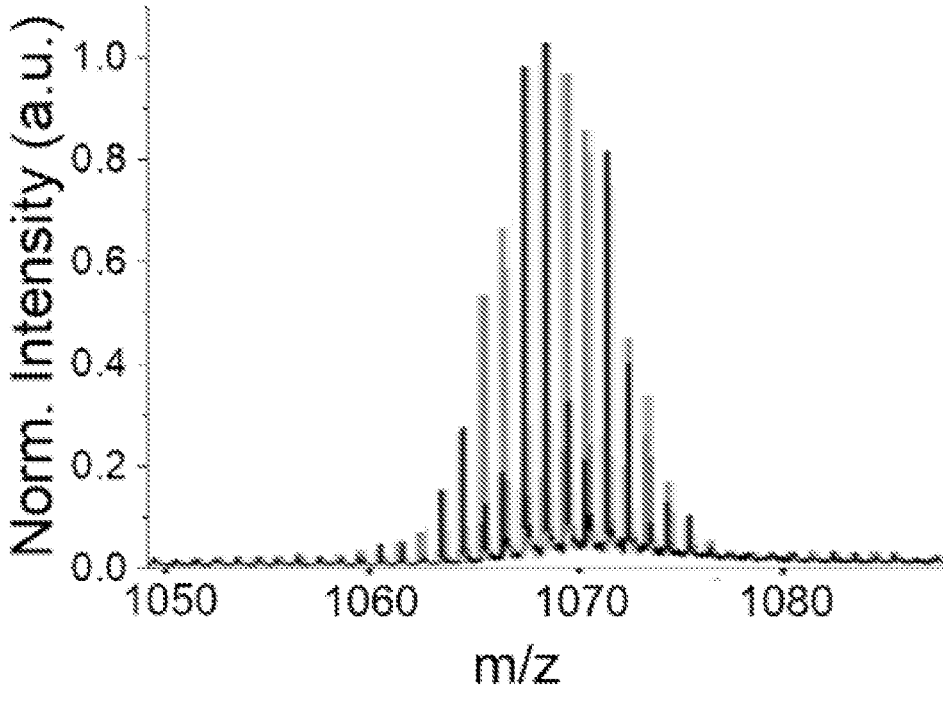

FIGS. 42A-42B. Mass spectrum of (BBN-SH-Cd)$_4$ cluster from either (FIG. 42A) simulation or (FIG. 42B) experimental data. Each of the mass spectra shows a similar pattern to each other, originated from the isotope peaks of the natural abundance of atoms.

Figure 43:
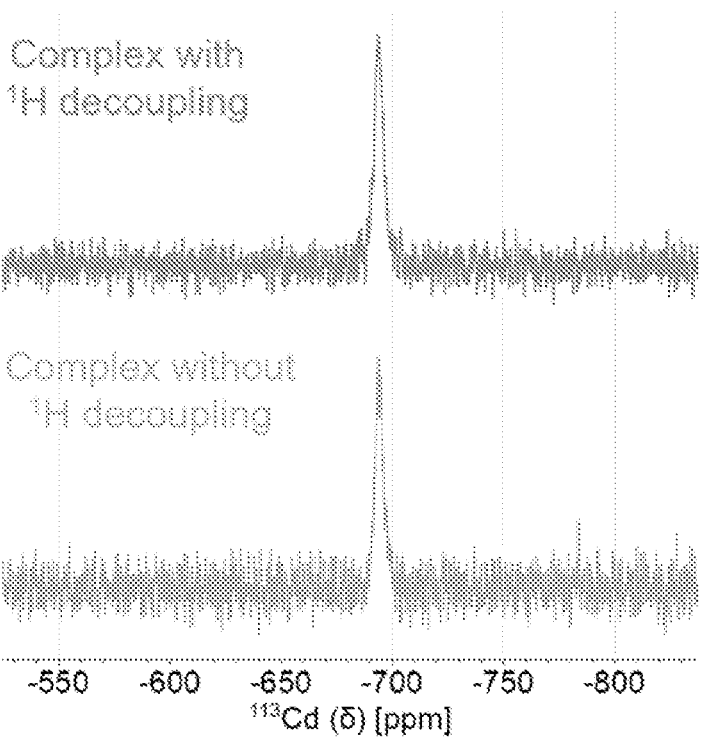

FIG. 43. $^{113}$Cd NMR spectrum of (BBN-SH-Cd)$_4$ clusters. Regardless of decoupling $^1$H NMR signal, there is no noticeable change of the peak from the cadmium atom in (BBN-SH-Cd)$_4$ clusters. This result shows (BBN-SH-Cd)$_4$ clusters do not have a Cd—H bond.

Figure 44:
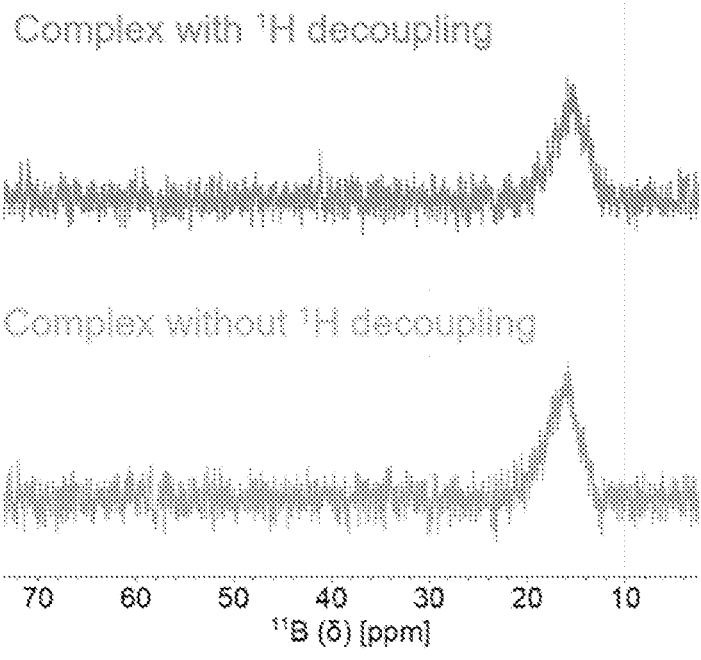
Figure 45A:
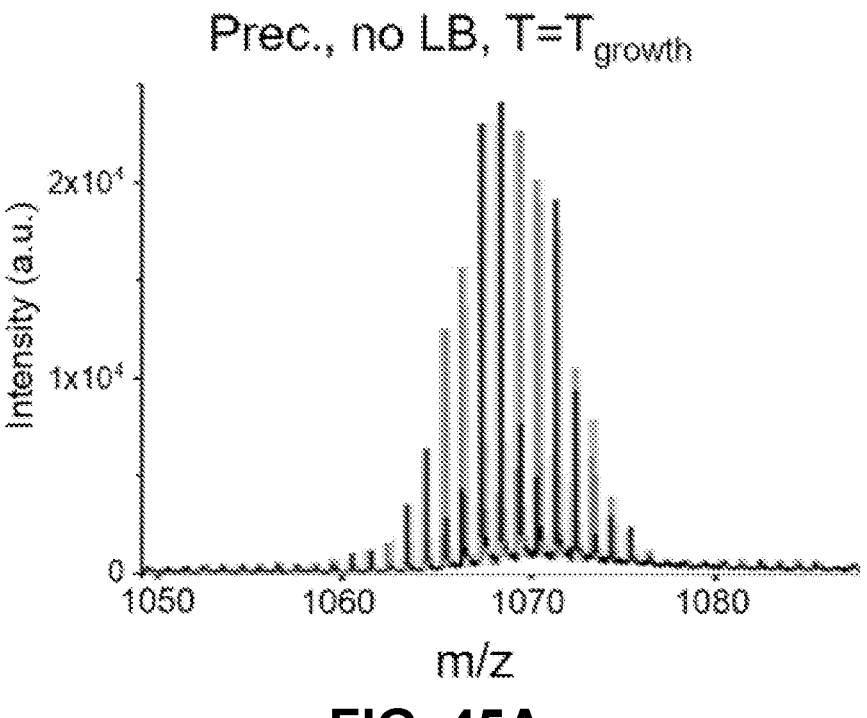
Figure 45B:
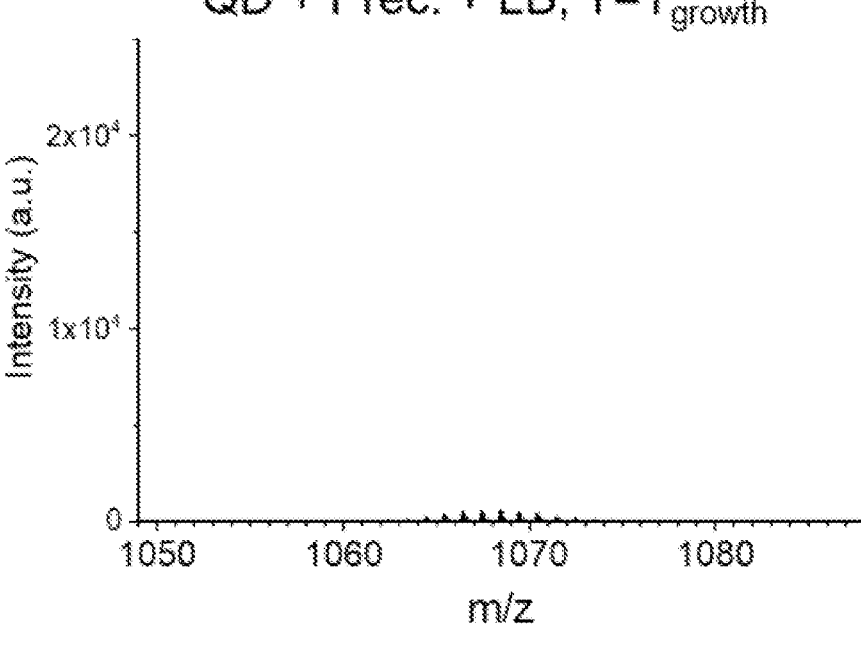
Figure 45C:
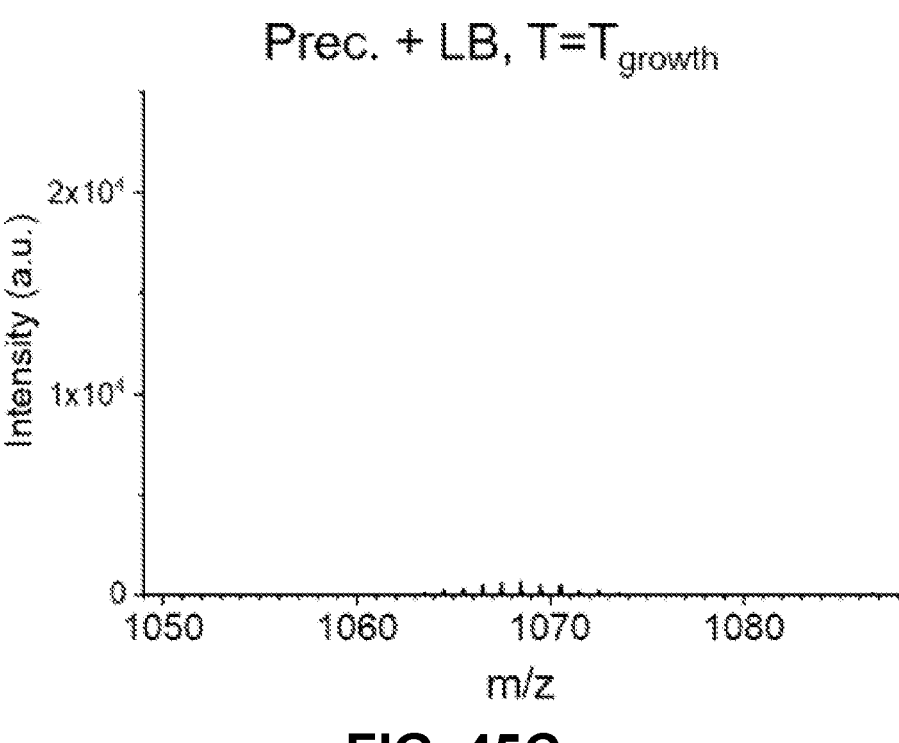
Figure 45D:
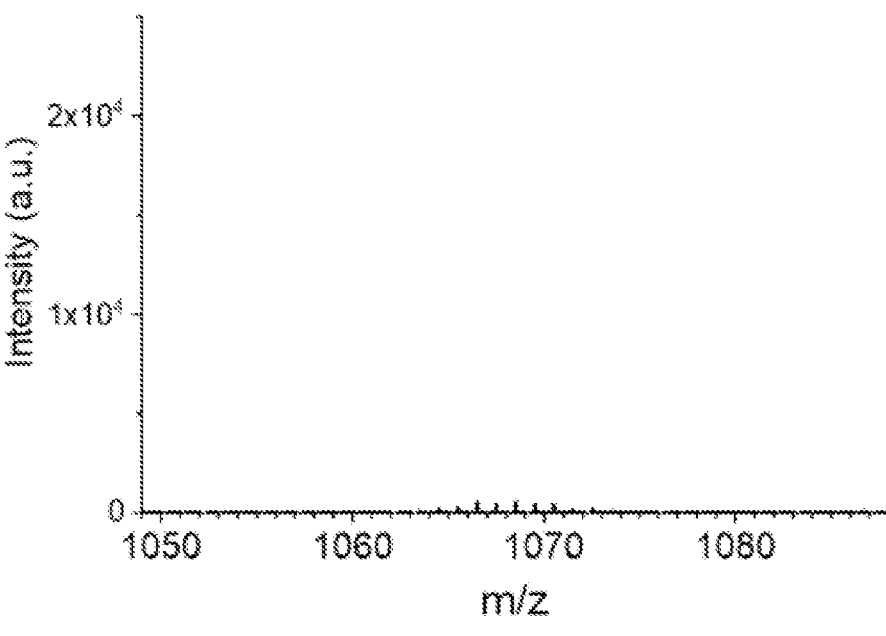

FIG. 44. $^{11}$B NMR spectrum of (BBN-SH-Cd)$_4$ clusters. Regardless of decoupling $^1$H NMR signal, there is no noticeable change of the peak from the boron atom in (BBN-SH-Cd)$_4$ clusters. This result shows (BBN-SH-Cd)$_4$ cluster does not have a B—H bond.

FIGS. 45A-45D. Mass spectrum of (BBN-SH-Cd)$_4$ from (FIG. 45A) precursor mixture without LB, (FIG. 45B) CdSe/CdS QDs grown using precursor mixture, (FIG. 45C) precursor mixture at 170° C. for 4.5 hrs, (FIG. 45D) precursor mixture at 300° C. for 4.5 hrs. Picoline was used as LB in all cases. The peak intensities from the samples with LB are ~40 times lower than the mass peak of (BBN-SH-Cd)$_4$ from the precursor mixture without LB.

Figure 46:
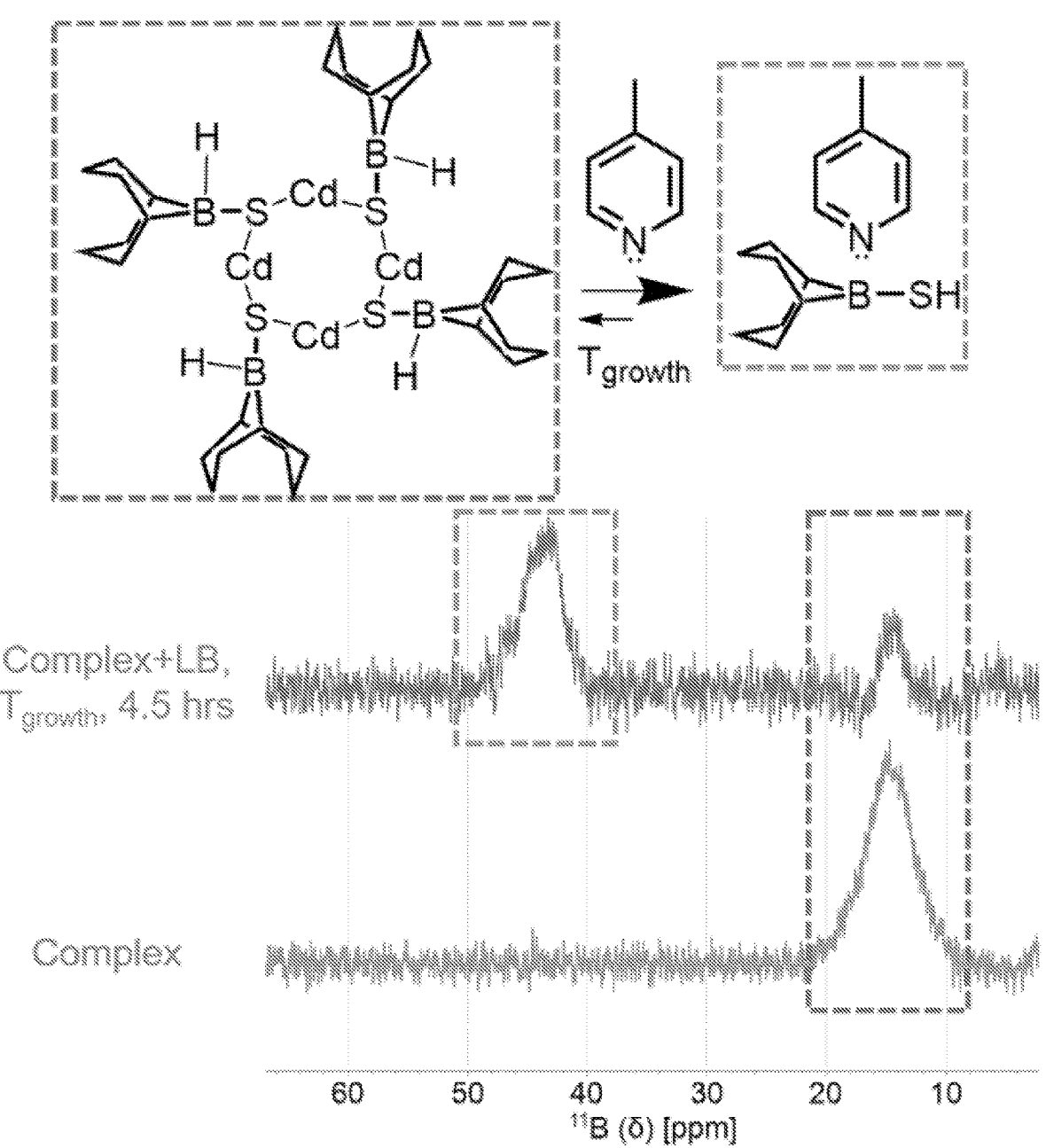

FIG. 46. $^{11}$B NMR spectrum of (BBN-SH-Cd)$_4$ clusters. In the presence of LB, the dissolution of the cluster happens under the growth temperature ($T_{growth}$: 170° C.). Original NMR peak position from the boron of (BBN-SH-Cd)$_4$ clusters were ~16 ppm. In the presence of LB (picoline), the major portion of (BBN-SH-Cd)$_4$ clusters convert to BBN-SH:picoline complex (peak position of the boron: ~42 ppm), while the mixture is maintained at 170° C. for 4.5 hrs.

Figure 47:
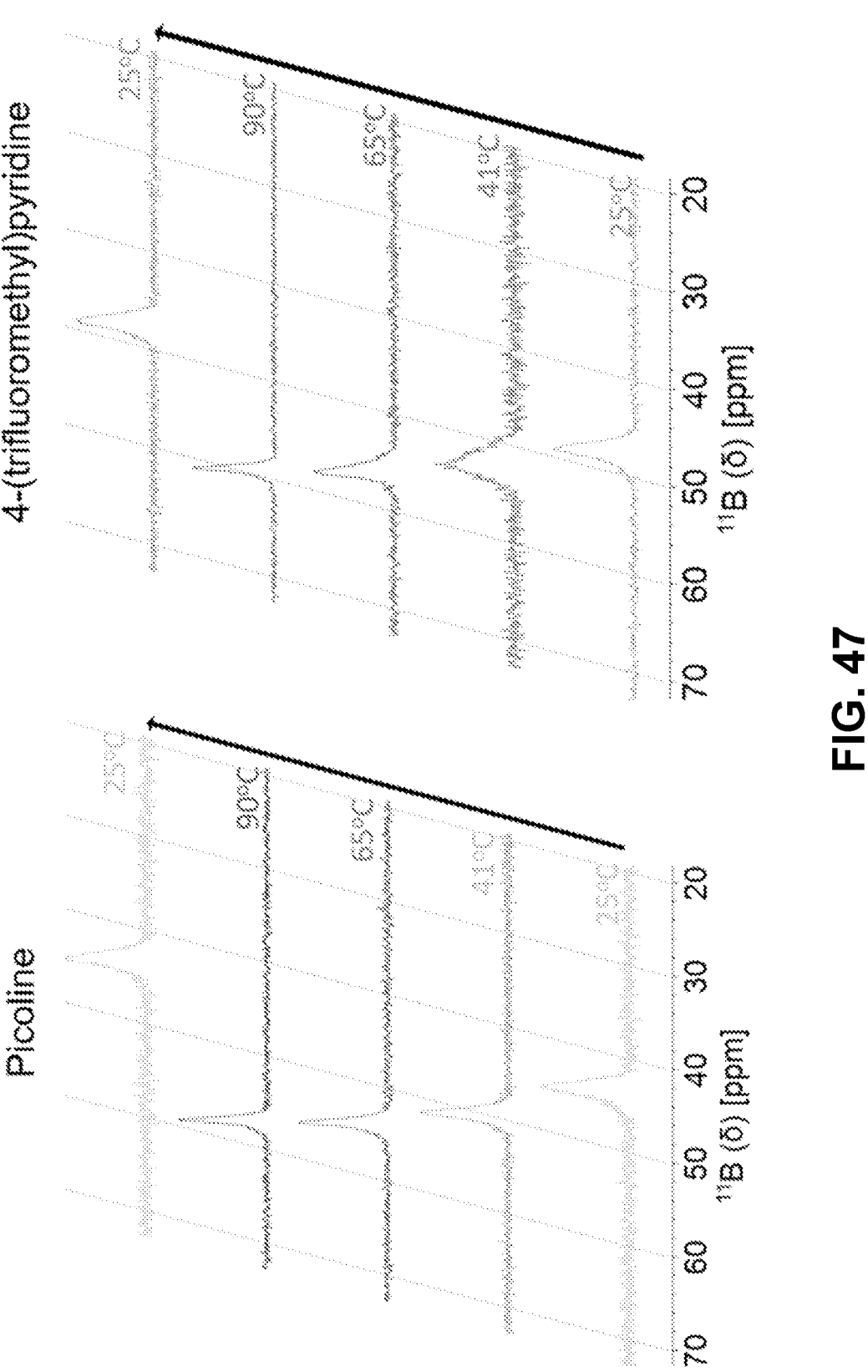

FIG. 47. VT $^{11}$B NMR spectrum of a mixture of BBN-SH, Cd(oleate)$_2$, and LBs (picoline or 4-(trifluoromethyl)pyridine (4-CF$_3$Py)) shows BBN-SH:LB complex is preserved in the presence of Cd(oleate)$_2$. Even in the presence of Cd(oleate)$_2$, the coordination bond on the boron of BBN-SH with LBs is observed (42 ppm for picoline, 46 ppm for 4-CF$_3$Py). The coordination bond on the boron gets weaker as the sample is heated up. In the case of picoline, the peak of the boron atom (~42 ppm) shifts to down-field (56 ppm). In the case of 4-CF$_3$Py, the peak from the boron atom at 46 ppm shifts to down-field (58 ppm). After cooling down to r.t., the peak comes back to the original positions for both cases.

Figure 48A:
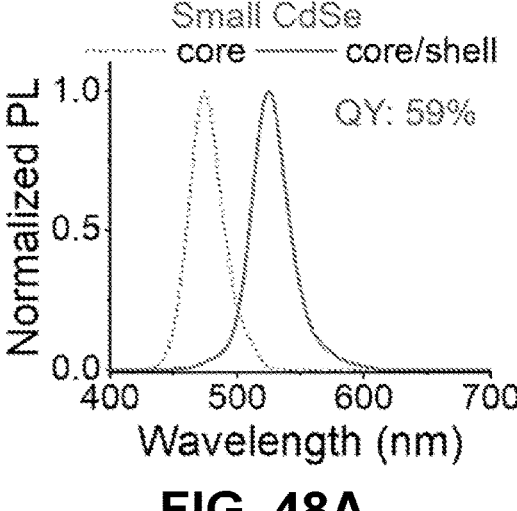
Figure 48B:
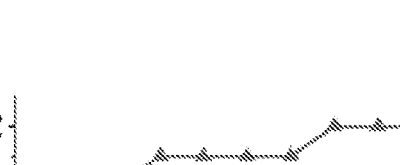
Figure 48C:
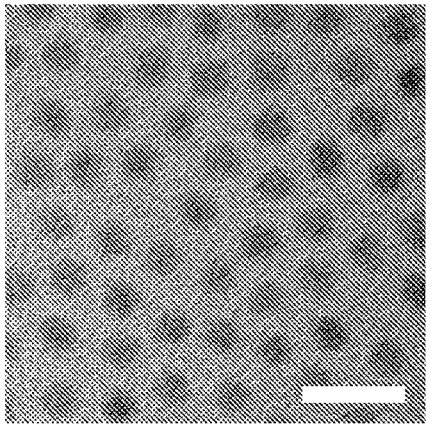
Figure 48D:
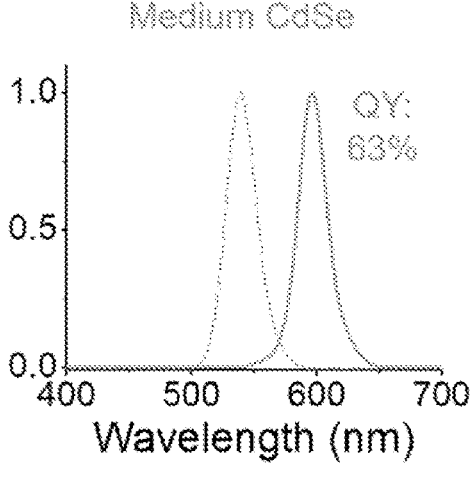
Figure 48E:
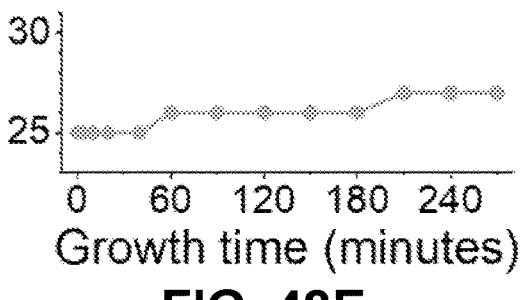
Figure 48F:
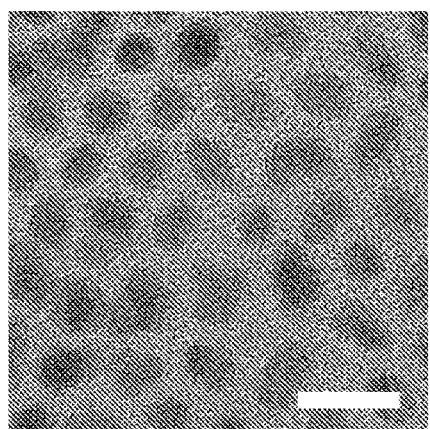
Figure 48G:
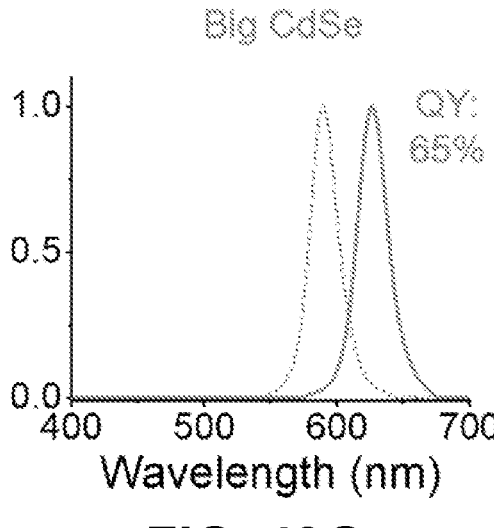
Figure 48H:
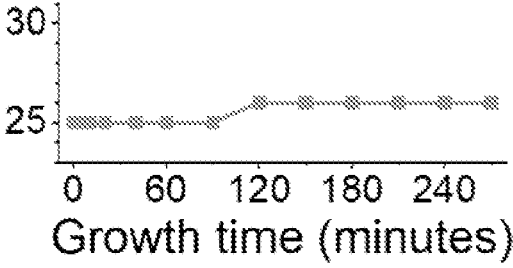
Figure 48I:
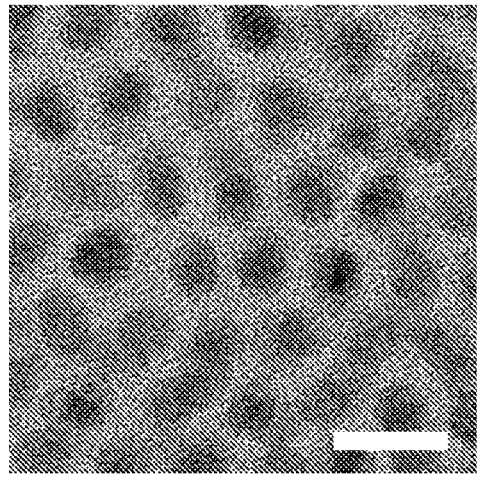

FIGS. 48A-48I. Suboptimal pair of BBN-SH:LB for heat-up shell growth results in CdSe/CdS QDs with inferior optical properties. FIGS. 48A, 48D and 48G. Emission spectra of core (dotted line) and core/shell QDs (solid line). FIGS. 48B, 48E and 48H. Evolution of FWHM during growth of small-CdSe/CdS (LB: DABCO), medium-CdSe/CdS (LB: DMAP), or big-CdSe/CdS (LB: DMAP) core/shell QDs. In all cases, broad size distribution (FWHM 26-32 nm) and low QY (59-63%) are obtained. FIGS. 48C, 48F and 48I. TEM images of resulted QDs show irregular shapes and sizes with low crystallinity (scale bar: 20 nm).

Figure 49:
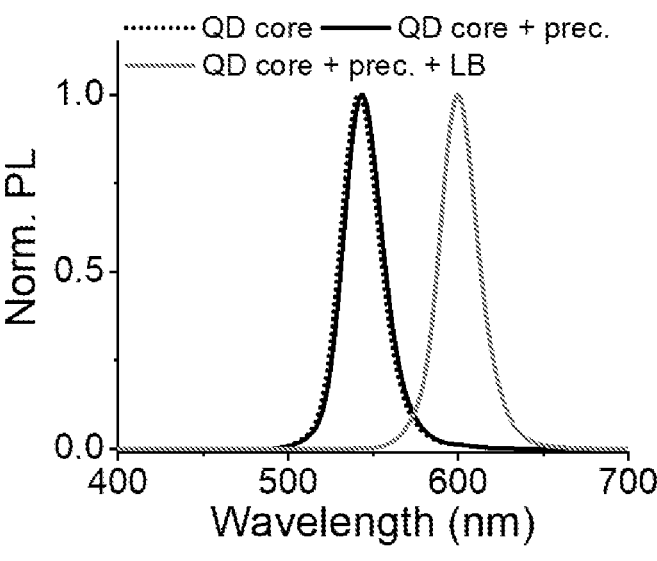

FIG. 49. Emission spectra of CdSe cores (dotted line) and core/shell QDs (solid lines) grown by BBN-SH via heat-up synthesis. In the absence of LB (black solid), a tight FWHM (~25 nm) of the emission spectrum confirms that no Ostwald ripening and shell growth are observed. The CdS shell growth on CdSe cores can be induced in the presence of LB (red) while maintaining the tight FWHM (~25 nm) of the emission spectrum.

Figure 50A:
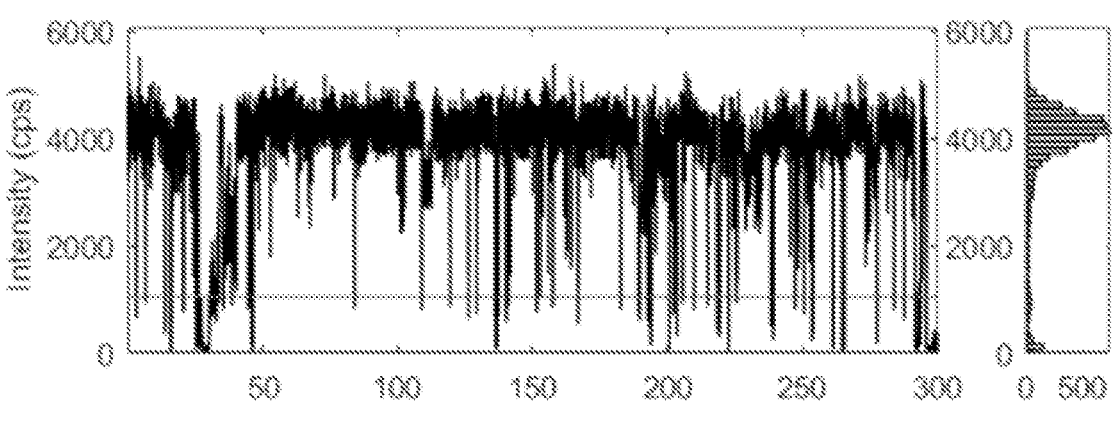
Figure 50B:
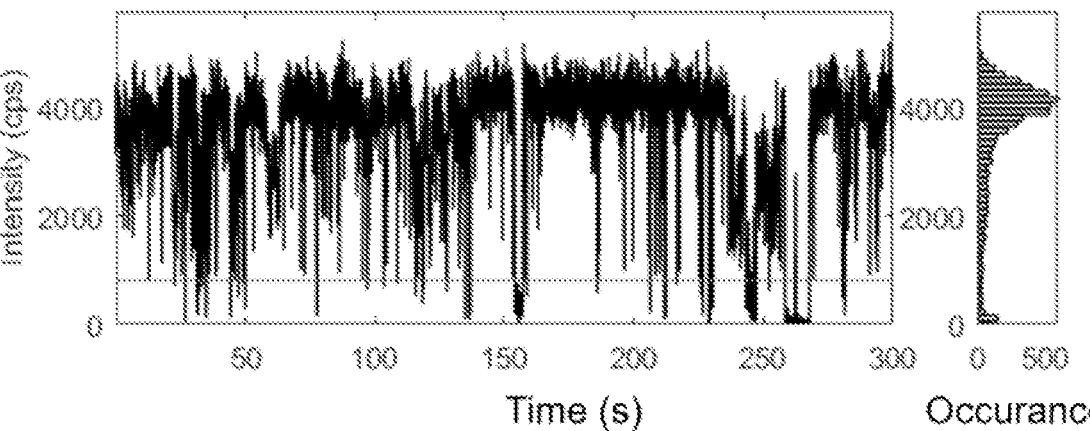

FIGS. 50A-50B. Representative single QD blinking traces for CdSe/CdS core/shell QDs grown with different methods ((FIG. 50A) heat-up or (FIG. 50B) injection-based method) using BBN-SH precursor.

Figure 51A:
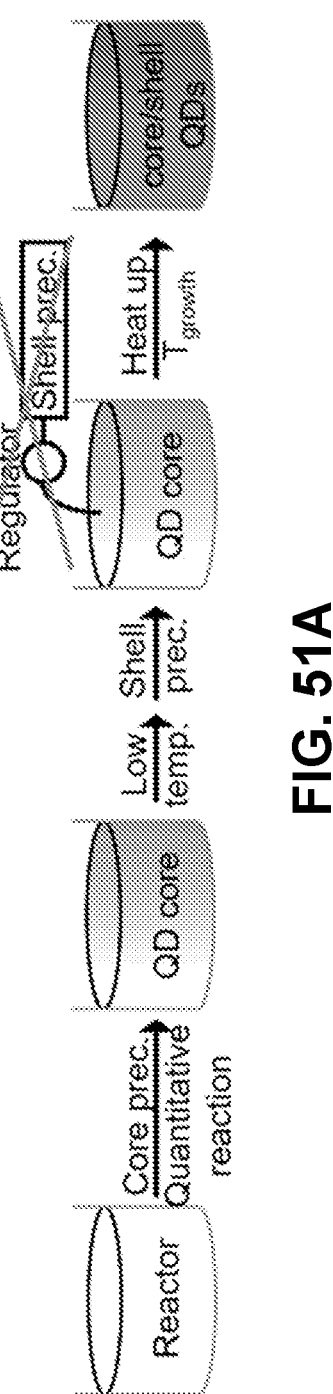
Figure 51B:
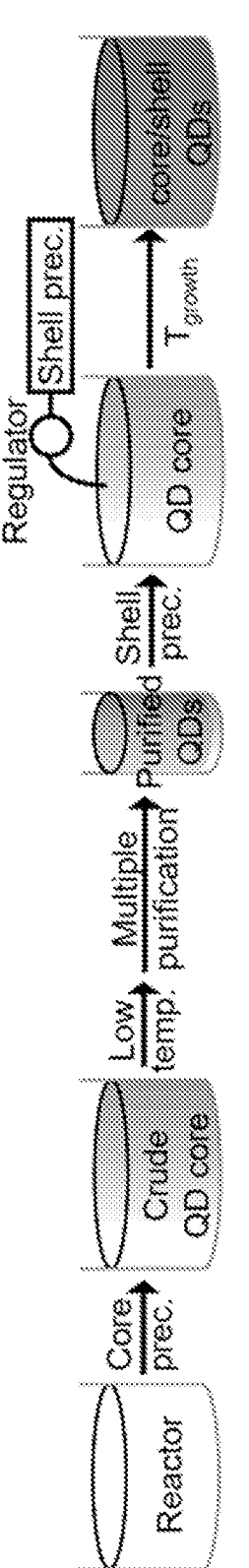

FIGS. 51A-51B. Schematic representation shows two different core/shell QD synthesis schemes, (FIG. 51A) puri-

fication-free single-vessel heat-up synthesis and (FIG. 51B) conventional injection-based method. Purification-free single-vessel heat-up QD synthesis does not require the purification of QD cores and complex injection apparatus. However, the convention injection-based method needs both a purification step and a complex injection apparatus to maintain the optimal concentration of shell precursors for shell growth.

Figure 52:
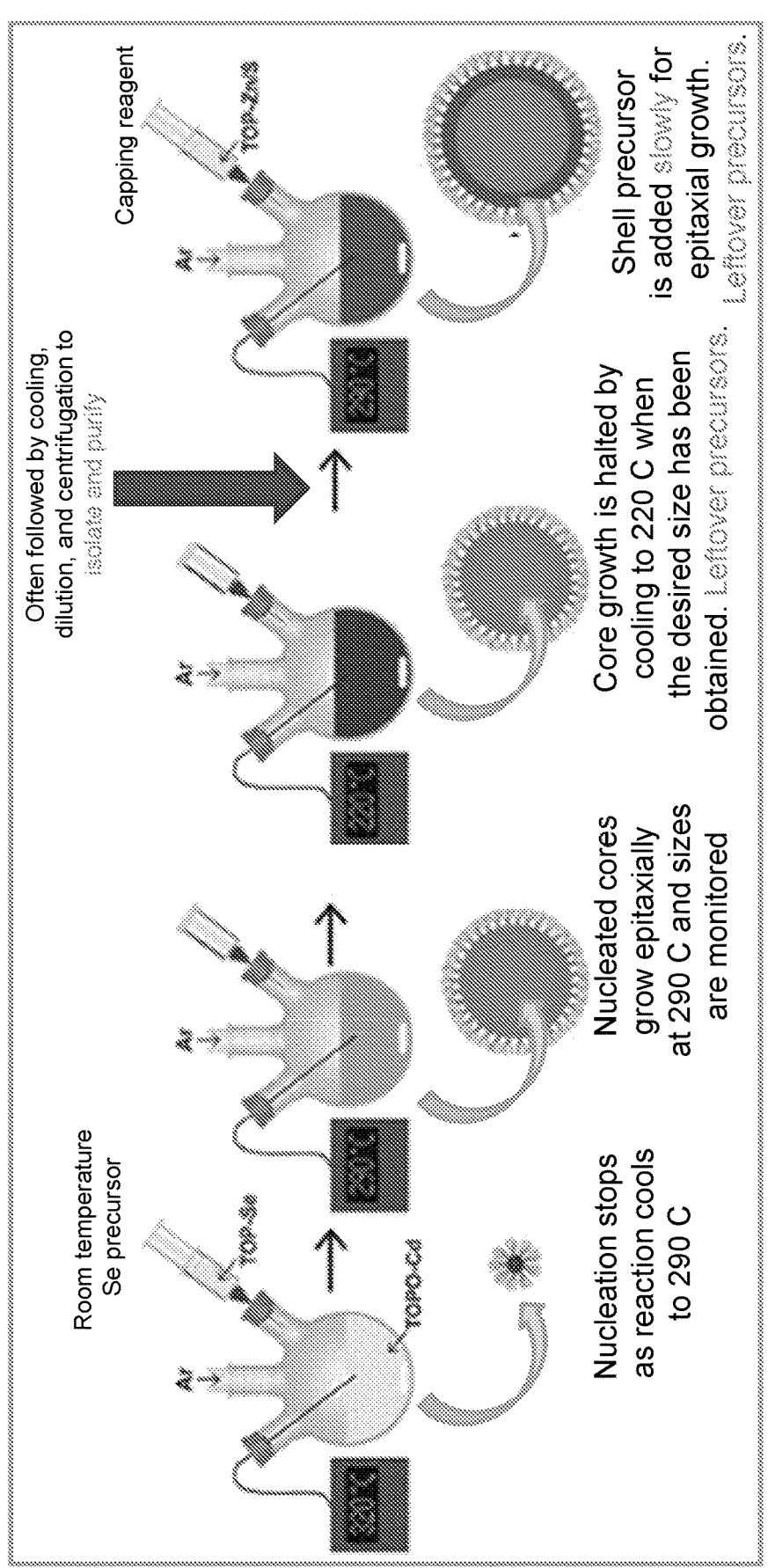

FIG. 52. An overview of typical QD-core and core/shell syntheses, prior to this disclosure, and challenges-to-industry associated with these conventional techniques. A challenge, for example, hot injection QD synthesis or slow injection of precursors for QD-core or core/shell growth.

Figure 53:
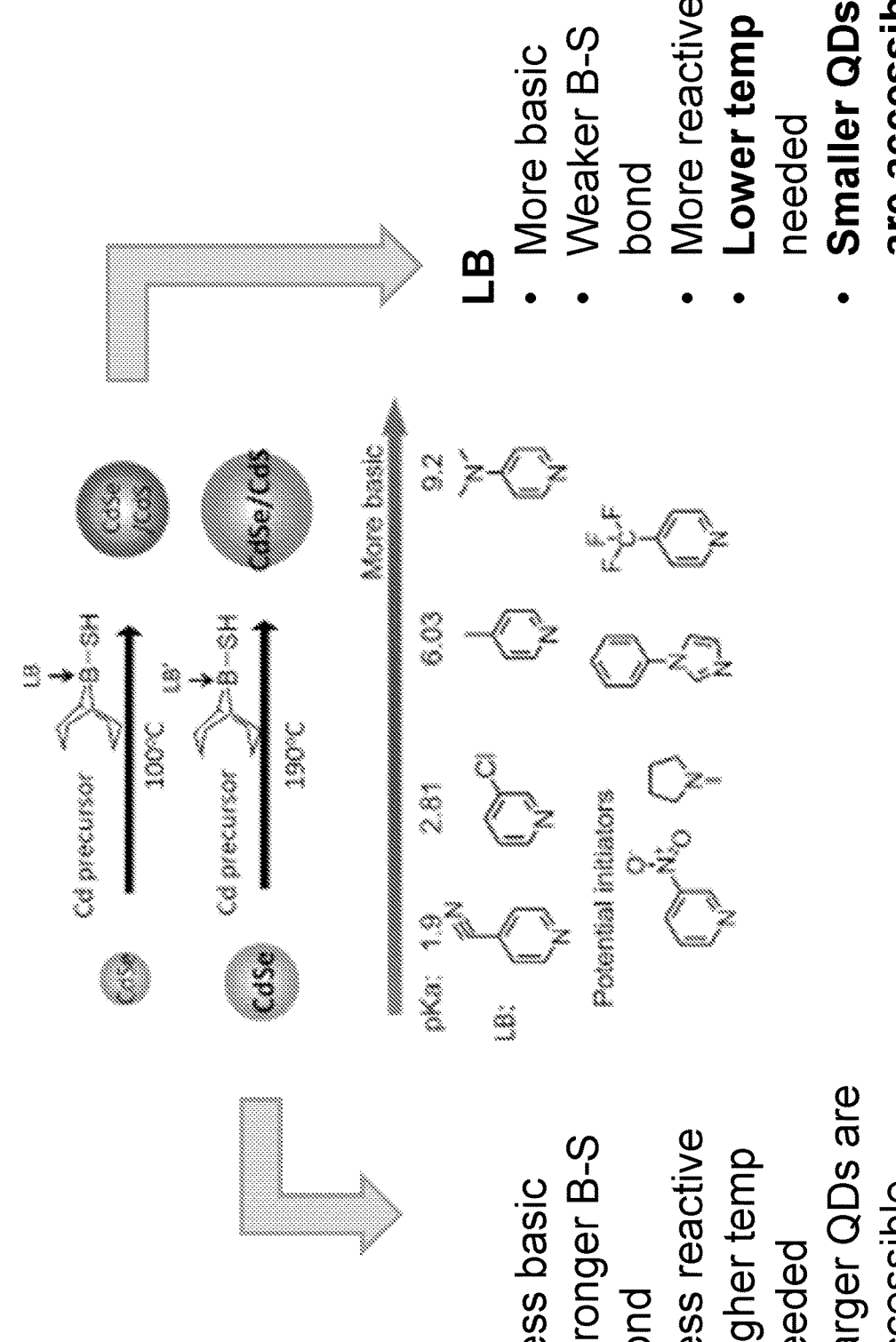

FIG. 53. Summary and illustration of characteristics of the range of aspects and embodiments of method disclosed herein.

Figure 54:
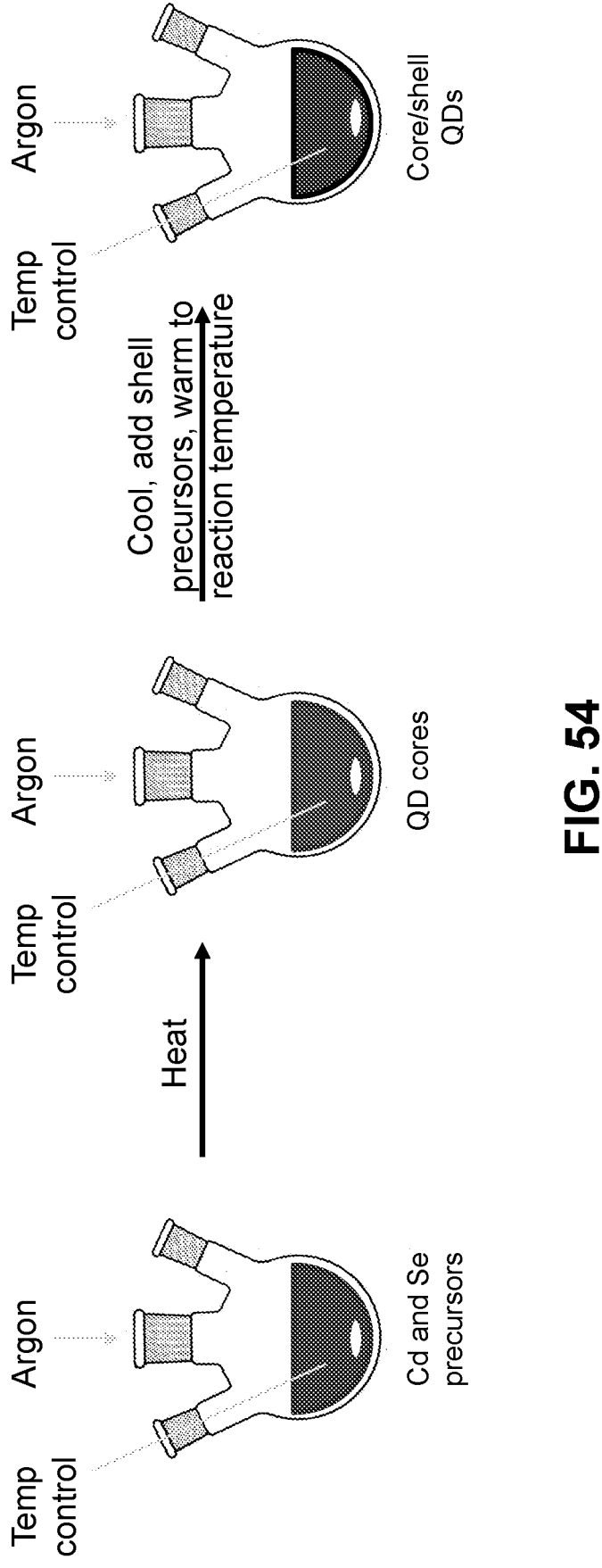

FIG. 54. Illustration of an exemplary synthesis method for core/shell high quality QDs.

Figure 55:
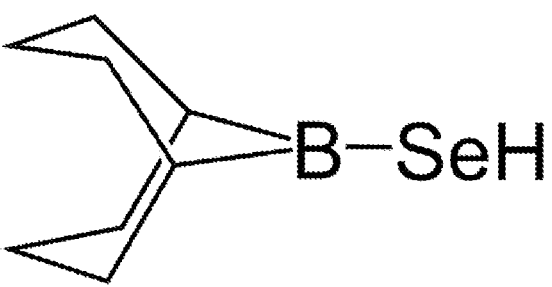

FIG. 55. Chemical structure of BBN-SeH.

Figure 56:
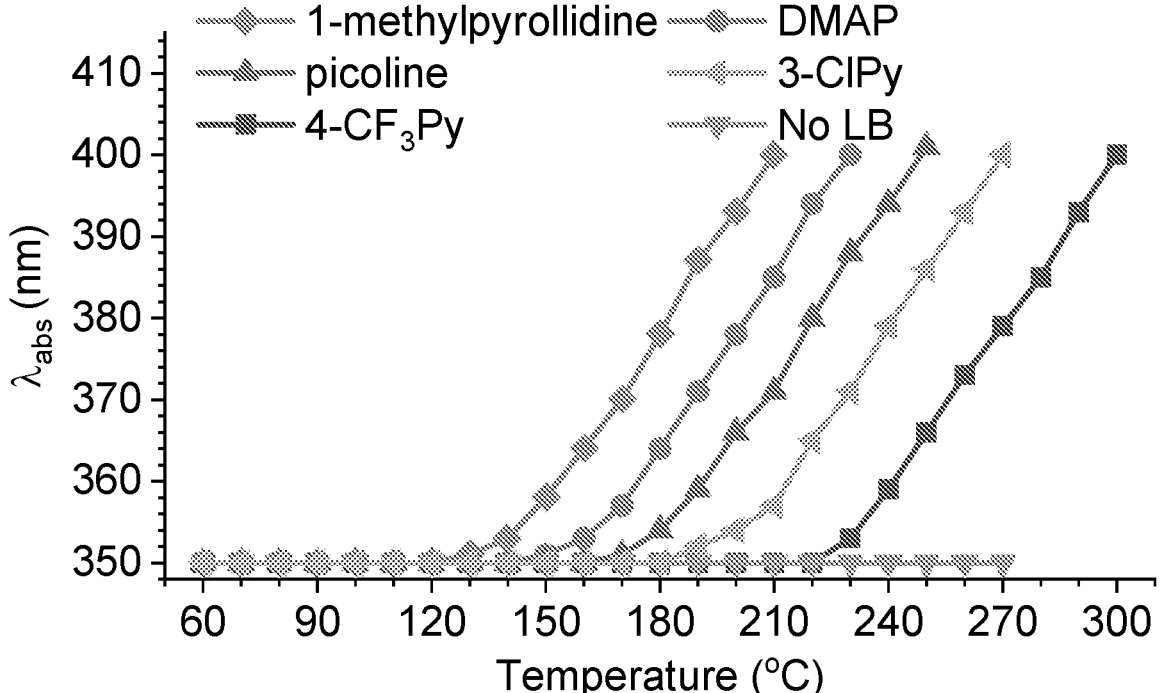

FIG. 56. ZnSe QD growth using BBN-SeH. $T_{act}$ is controllably tuned by pyridine-based LBs (130-230° C.).

STATEMENTS REGARDING CHEMICAL COMPOUNDS AND NOMENCLATURE

As used herein, the term "QD" is an acronym referring to quantum dot.

The term "activation temperature" or "$T_{act}$" refers to a characteristic temperature of the onset or initiation of growth of the at least one add-layer according to embodiments of methods disclosed herein using precursor(s) disclosed herein. Preferably, the activation temperature ($T_{act}$) is a characteristic minimum temperature of the onset of growth of the at least one add-layer when a base-QD is in the presence of the modified anion precursor (such as according to embodiments of the "first method") or in the presence of the first anion precursor and the modification agent (such as according to embodiments of the "second method"). Preferably, the activation temperature ($T_{act}$) is an empirically determined characteristic temperature of the onset of growth of the at least one add-layer according to embodiments of methods disclosed herein using precursor(s) disclosed herein. Exemplary methods for empirically determining the activation temperature are described herein throughout, such as in Examples 1A and 1B. At a temperature below the activation temperature, or a nominally given activation temperature, growth of the at least one add-layer does not occur. $T_{act}$ depends, of course, on the specific conditions and constituents used in the method and so $T_{act}$ will vary. Representative examples, include, but are not limited to, $T_{act}$ between about 100° C. and 200° C. For example, the at least one add-layer corresponds to growth of a QD core and/or a QD shell on a base-QD. For example, growth of the at least one add-layer refers to growth of the at least one add-layer facilitated by a decomposition of a precursor according to embodiments provided herein, such as a decomposition of a modified anion precursor, such as an organoborane anion precursor coordination with a Lewis base, or decomposition of a first anion precursor, such as decomposition of a tri-hydrocarbon-silyl precursor due to its reaction with a halide. In some embodiments, such as embodiments including forming a modified anion precursor, such as one including a B—X bond (X being an anion element), such as one including an organoborane anion precursor coordinated with a Lewis base, the activation temperature ($T_{act}$) is, is correlated with, coincides with, approximates, or corresponds to the temperature at which the provided modified anion precursor decomposes in a way that allows the growth of the at least one add-layer, such as by cleavage of the anion atom from the modified anion precursor thereby allowing the cleaved anion to incorporate into and facilitate growth of at least one add-layer. Below activation $T_{act}$, for example, the B-anion bond stays intact. In some embodiments, such as embodiments including decomposing the first anion precursor, such as decomposing the first anion precursor being a tri-hydrocarbon-silyl precursor, the activation temperature ($T_{act}$) is, is correlated with, coincides with, approximates, or corresponds to the temperature at which the provided modification agent, such as a halide, chemically attacks or otherwise chemically reacts with the provided first anion precursor, such as a tri-hydrocarbon-silyl precursor, leading to decomposition of said first anion precursor in a way that allows the growth of the at least one add-layer. For example, generally, below the activation temperature, the reaction between the halide (a modification agent) and the tri-hydrocarbon-silyl (a first anion precursor) will not proceed even when the halide and the tri-hydrocarbon-silyl are in each other's presence (e.g., in a common solution) if their temperature (or, temperature of their common solution) is below the activation temperature. One of skill in the art would recognize that the onset of the growth of the at least one add-layer involves kinetics such that growth may initiate at a temperature slightly less than the nominally given activation temperature, but would proceed at a substantially lower rate than the rate at the nominally given activation temperature. Optionally, for a nominally given activation temperature (e.g., a reported, disclosed, or claimed herein $T_{act}$) of $T_{nom}$, the activation temperature or the onset temperature of the growth of the at least one add-layer is any temperature or temperature range that is within 10%, within 5%, within 1%, within 0.5%, within 0.1%, or within 0.05% of $T_{nom}$. Optionally, for a nominally given activation temperature (e.g., a reported, disclosed, or claimed herein $T_{act}$) of $T_{nom}$, the activation temperature or the onset temperature of the growth of the at least one add-layer is any temperature or temperature range that is within 5°, within 3°, within 2°, within 1°, within 0.5°, or within 0.1° of $T_{nom}$. Optionally, the precursor(s) and the modification agent(s) are provided to a primary solvent or solution, optionally already having the base-QD. Preferably, the precursor(s), the modification agent(s), and the base-QD(s) are in the presence of each other in a growth solution. Optionally, the growth temperature is determined or measured by determining or measuring the temperature of the growth solution during growth (and optionally before and/or after growth) of the at least one add-layer. Growth temperature is selected depending on the desired quantum dot structure and core-shell interface. Isotropic growth requires higher temperature than anisotropic growth. Heterostructure core/shell QDs requires lower growth temperature than gradient core/shell QDs. To avoid particle melting, the growth temperature is preferably maintained below the melting temperature of the nanoparticles. Optionally, if the temperature in the presence of the first anion precursor, the modification agent, and/or the modified anion precursor (such as the temperature of the solution comprising said first anion precursor, the modification agent, and/or the modified anion precursor) is decreased to below the respective activation temperature, the growth of the at least one add-layer is stopped (or, quenched).

A more accurate property to use than activation temperature is "activation energy" for the growth. Activation temperature is not dependent on growth temperature. The activation temperature of existing precursors cannot be predictably tuned. For example, activation temperature is dependent on the size and materials of QDs. The new precursor chemistry provided herein allows controllable tuning of activation temperature (or activation energy for the QD growth). The optimal growth temperature is determined by QD size, QD materials and core/shell interface structure. Activation temperature of precursors is likely not much lower than growth temperature because it will induce high reactivity of precursors yielding uncontrolled growth. Because previous precursors cannot tune their activation temperature, different precursors must be synthesized and tested to find the precursor yielding the optimal activation temperature.

Precursor reactivity can be understood as the activation energy ($E_a$) for growth. There can be multiple reaction steps between precursors and QD growth but $E_a$ can still be defined in terms of the overall reaction. In the conventional precursor situation, $E_a$ cannot be changed or, at best, only marginally changed without any predictability. Because $E_a$ is set, k (growth rate) is determined by the reaction temperature (cannot change precursor reactivity independent of temperature). For the precursor chemistry provided herein, we can predictably change the $E_a$ using chemical additives. Thus, our precursor chemistry has an additional handle to vary for the optimization of reaction conditions. $E_a$ well represents precursor reactivity. If $E_a$ is low, precursor reactivity is high. If $E_a$ is high, precursor reactivity is low. There is no clear numerical value determining high vs low reactivity but it is widely accepted that Bis(trimethylsilyl)sulfide (TMS$_2$S) has a very high reactivity (driving QD growth even at or new room temperature) and octanethiol has low reactivity (driving QD growth at 240° C.-300° C.). If $E_a$ is too low, precursor is too reactive causing not-controlled growth. If $E_a$ is too high, precursor requires really high temperature to be converted.

Accordingly, the term "independently varying $T_{act}$ and $T_{growth}$" can be more accurately stated as having the ability to predictably tune $E_a$ of the growth reaction using chemical additives, which has not been previously possible. Reaction temperature governs the instability of nanoparticles and $E_a$ governs the reaction kinetics on the QD surface. Both parameters must be optimized for high quality QD growth. In contrast, previous work has tried different precursors and reaction temperature to find the optimal combination of precursor and reaction temperature yielding high quality growth. Due to the lack of predictable tunability for the $E_a$ of a precursor, different precursors must be synthesized to achieve the optimal $E_a$. Finally, $E_a$ is independent of temperature. The Arrhenius equation determines the temperature dependence of reaction rate.

The term "decomposition temperature" refers to a characteristic lower-bound or minimum temperature at which kinetic and/or thermodynamic barriers are overcome and chemical decomposition of a compound, molecule, or material onsets or initiates. For example, in the presence of a halide anion (an exemplary modification agent), a tri-hydrocarbon-silyl precursor (an exemplary first anion precursor) has a characteristic decomposition temperature at which the halide anion chemically attacks the tri-hydrocarbon-silyl precursor leading to the decomposition of the tri-hydrocarbon-silyl precursor, such as into hydride anion species, including hydro chalcogenide or hydro pnictogenide ions, that facilitate or contribute to growth of the at least one add-layer. Selecting a different halide anion can change the decomposition temperature of the tri-hydrocarbon-silyl precursor. For example, a modified anion precursor, such as an organoborane anion precursor complexed or coordinated with a Lewis base, has a decomposition temperature at which the modified anion precursor chemically decomposes allowing for growth of the at least one add-layer. Selecting a different Lewis base can tune the decomposition temperature of the resulting modified anion precursor. Generally, the decomposition temperature corresponds to the activation temperature of the growth of the at least one add-layer, at least because decomposition of the modified anion precursor (e.g., in a "first method") or the first anion precursor (e.g., in a "second method") leads to growth of the at least one add-layer, at least because one or more decomposition products of said decomposition directly or indirectly contribute to or are incorporated into the at least one add-layer. Again, it is challenging to accurately connect decomposition temperature with activation temperature or growth temperature. For example, it can be challenging to measure the decomposition temperature and numerically relate it with growth or activation temperature. The QD growth can happen by overcoming the thermodynamic barrier of each precursor. Since we monitor the temperature when QDs start to grow, we cannot really say this is "decomposition temperature" of the precursor. However, we confirm this temperature does initiate the QD growth. For this reason, in the examples provided herein we use the term "activation temperature". Of course, the temperature range for decomposition is typically very similar with the temperature range for activating the QD growth.

Generally, an add-layer refers to a partial or complete layer, such as but not necessarily a monolayer, of atoms added to a surface of an existing QD, base-QD, QD shell, or nucleus of a QD. An add-layer is not necessarily formed uniformly on a surface but can, for example, non-uniformly with prefers for certain sites or portion, such as crystalline directions or planes, of the base-QD upon which the add-layer is formed. Formation or deposition of at least one add-layer, according to embodiments herein, preferably results in formation of a high-quality QD.

As used herein, a base-QD is a QD, a QD nucleus, a QD core, a QD shell, a core/shell QD (i.e., a QD having a core and a shell), or optionally any substrate for deposition or formation of an add-layer thereon such as to result in a high-quality QD. Preferably, base-QD is a QD, a QD nucleus, a QD core, or a QD shell which serves as a substrate for deposition or formation of an add-layer thereon. In some embodiments wherein a base-QD is a nucleus, the at least one add-layer corresponds to growth of a core of a high-quality QD, the high-quality QD optionally being a core-only high-quality QD. In some embodiments wherein a base-QD is a QD core or a core/shell QD (having a shell already), the at least one add-layer corresponds to growth of a shell of a high-quality QD, the high-quality QD being a core/shell QD.

A quantum dot, or QD, is preferably, though not necessarily, a nanocrystal.

Generally, the term "cation" in the term "cation precursor" refers to the atom or element (or group of atoms or elements) of the cation precursor that become a cation, or cations, in a resultant QD, add-layer(s) thereof, or shell thereof, formed or grown via the cation precursor (such as but not necessarily via decomposition of the cation precursor at a base-QD surface to form an add-layer). For example, a cation precursor is a source of one or more cations for a QD or one or more add-layers of a QD, or shell thereof, such as, but not limited to, Cd, Pb, In, Zn, Cu, or any combination thereof.

Generally, the term "anion" in the term "anion precursor" refers to the atom or element (or group of atoms or elements) of the anion precursor that become an anion, or anions, in a resultant QD, add-layer(s) thereof, or shell thereof, formed or grown via the anion precursor (such as but not necessarily via decomposition of the anion precursor at a base-QD surface to form an add-layer). For example, an anion precursor is a source of one or more anions for one or more add-layers of a QD, or shell thereof, such as, but not limited to, S, Se, Te, P, As, Sb, or any combination thereof.

The term "cation element" refers to an element of the Periodic Table corresponding to the cation being referenced. For example, a QD having the composition CdS has a composition comprising a cation ($Cd^{2+}$), wherein the element of the cation, or the cation element, is Cd. For example, a cation precursor can have a composition comprising Pb which forms the cation(s) in a resultant QD or add-layer(s) thereof, wherein the element of the cation or the cation element thus is or comprises Pb. In other words, whereas a cation is optionally charged, the term cation element refers to the element, of the Periodic Table, that corresponds to the cation atom regardless of its charge in the QD, in the respective precursor, or any other form. The term "anion element" refers to an element of the Periodic Table corresponding to the anion being referenced. For example, a QD having the composition CdS has a composition comprising an anion ($S^{2-}$), wherein the element of the anion or the anion element is S. For example, an anion precursor can have a composition comprising S, wherein the element of the anion or the anion element is S. In other words, whereas an anion is optionally charged, the term anion element refers to the element, of the Periodic Table, that corresponds to the anion atom regardless of its charge in the QD, in the respective precursor, or any other form.

The term "metal element" refers to a metal element of the periodic table of elements. Optionally, the "metalloids" includes elements such as B, Si, Ge, As, Sb, and Te. Optionally, metalloid elements include B, Si, Ge, As, Sb, Te, Po, At, and Se.

The term "dispersed" refers to species, such as nanoparticles, in a fluid forming a dispersion. As used herein, the term "dispersion" broadly refers to a mixture of one or more chemical species, such as nanoparticles, in a fluid, such as the art-recognized meaning of solution, dispersion, and/or suspension. The chemical species, such as nanoparticles, dispersed in a dispersion can be referred as a dispersed species. Preferably, a dispersion is a mixture of nanoparticles, such as semiconductor nanocrystals or quantum dots, in a liquid, such as a solvent. Preferably, but not necessarily, a dispersion is a homogeneous mixture. In the context of a dispersion, the term "homogeneous" refers to a liquid mixture that appears uniform to the naked eye. In contrast, a heterogenous liquid mixture includes particles that are precipitated from or suspended in the liquid mixture and are large enough to be distinctly identifiable by the naked eye in the liquid mixture. A heterogeneous liquid mixture includes, for example, sedimented and/or sedimenting particles. Preferably, but not necessarily, the term "dispersion" is broadly intended to include solutions and dispersions, such as colloids, which are not heterogenous liquid mixtures. Preferably, but not necessarily, a dispersion is a microscopically homogenous, or uniform, mixture of particles in a liquid, such as a solvent. Preferably, but not necessarily, a dispersion is thermodynamically favored remain stably dispersed or is thermodynamically favored to segregate by sedimentation but wherein sedimentation is kinetically slowed or prevented. Nanoparticles, of a zo dispersion, that are characterized as stably dispersed remain dispersed in the dispersion and do not sediment or precipitate out of the liquid, of the dispersion, for at least 5 hours, preferably at least 12 hours, preferably at least 24 hours, and more preferably at least 1 week, under normal temperature and pressure (NTP) and exposure to air. In embodiments, particles that are not or cannot be dispersed in a fluid refer to particles that form precipitates or sediments upon being mixed in the fluid.

As used herein, the term "group" may refer to a functional group of a chemical compound. Groups of the present compounds refer to an atom or a collection of atoms that are a part of the compound. Groups of the present invention may be attached to other atoms of the compound via one or more covalent bonds. Groups may also be characterized with respect to their valence state. The present invention includes groups characterized as monovalent, divalent, trivalent, etc. valence states.

The term "moiety" refers to a group, such as a functional group, of a chemical compound or molecule. A moiety is a collection of atoms that are part of the chemical compound or molecule. The present invention includes moieties characterized as monovalent, divalent, trivalent, etc. valence states. Generally, but not necessarily, a moiety comprises more than one functional group.

As used herein, the term "substituted" can mean that one or more hydrogens on the designated atom or group (e.g., substituted alkyl group) are replaced with another group provided that the designated atom's normal valence is not exceeded. For example, when the substituent is oxo (i.e., $=O$), then two hydrogens on the atom are replaced. The substituent group can be any substituent group described herein. For example, substituent groups can include, but are not limited to, one or more of a halogen/halide/halo (e.g., fluoro), an alkyl, a cycloalkyl, an aryl, a heteroaryl, an acyl, an alkoxy, an alkenyl, an alkynyl, an alkylaryl, an arylene, a heteroarylene, an alkenylene, a cycloalkenylene, an alkynylene, a hydroxyl (—OH), a carbonyl (e.g., RCOR'), a sulfide (e.g., RSR'), a phosphate (e.g., $ROP(=O)(OH)_2$), an azo (e.g., RNNR'), a cyanate (e.g., ROCN), an amino (e.g., primary, secondary, or tertiary), an imine (e.g., $RC(=NH)$ R'), a nitrile (e.g., RCN), a pyridinyl (or pyridyl), a diamine, a triamine, an azide, a diimine, a triimine, an amide, a diimide, or an ether (e.g., ROR'), an aldehyde, a carboxylic acid, an ester, a ketone, nitro, an urea, a guanidine, cyano, fluoroalkyl (e.g., trifluoromethane), aryl (e.g., phenyl), heterocyclyl or heterocyclic group (i.e., cyclic group, e.g., aromatic (e.g., heteroaryl) or non-aromatic where the cyclic group has one or more heteroatoms), oxo, or any combination(s) thereof. Combinations of substituents and/or variables are permissible provided that the substitutions do not significantly adversely affect synthesis or use of the compound.

As used herein, the term "derivative" refers to a compound wherein an atom or functional group is replaced by another atom or functional group (e.g., a substituent function group as also described below), including, but not limited to: a hydrogen, a halogen or halide, an alkyl, a cycloalkyl, an aryl, a heteroaryl, an acyl, an alkoxy, an alkenyl, an alkynyl, an alkylaryl, an arylene, a heteroarylene, an alkenylene, a cycloalkenylene, an alkynylene, a hydroxyl (—OH), a carbonyl (RCOR'), a sulfide (e.g., RSR'), a phosphate (ROP $(=O)(OH)_2$), an azo (RNNR'), a cyanate (ROCN), an amine (e.g., primary, secondary, or tertiary), an imine ($RC(=NH)$ R'), a nitrile (RCN), a pyridinyl (or pyridyl), a diamine, triamine, an azide, a diimine, a triimine, an amide, a diimide, or an ether (ROR'); where each of R and R' is independently a hydrogen or a substituted or unsubstituted alkyl group, aryl group, alkenyl group, or a combination of these. Optional substituent functional groups are also described below. Preferably, the term "derivative" refers to a compound wherein one or two atoms or functional groups are independently replaced by another atom or functional group. Preferably, but not necessarily, the term derivative does not refer to or include replacement of a B, Si, a chalcogen, or a metal element.

As is customary and well known in the art, hydrogen atoms in formulas, such as in formula FX1, are not always explicitly shown, for example, hydrogen atoms bonded to the carbon atoms of aromatic, heteroaromatic, and alicyclic rings are not always explicitly shown. The structures provided herein, for example in the context of the description of formula (FX1) and schematics and structures in the drawings, are intended to convey to one of reasonable skill in the art the chemical composition of compounds of the methods and compositions of the invention, and as will be understood by one of skill in the art, the structures provided do not indicate the specific positions and/or orientations of atoms and the corresponding bond angles between atoms of these compounds.

As used herein, the terms "alkylene" and "alkylene group" are used synonymously and refer to a divalent group derived from an alkyl group as defined herein. The invention includes compounds having one or more alkylene groups. Alkylene groups in some compounds function as linking and/or spacer groups. Compounds of the invention may have substituted and/or unsubstituted $C_1$-$C_{20}$ alkylene, alkylene and $C_1$-$C_5$ alkylene groups, for example, as one or more linking groups (e.g. $L^1$-$L^6$).

As used herein, the terms "cycloalkenylene" and "cycloalkenylene group" are used synonymously and refer to a divalent group derived from a cycloalkenyl group as defined herein. The invention includes compounds having one or more cycloalkenylene groups. Cycloalkenylene groups in some compounds function as linking and/or spacer groups. Compounds of the invention may have substituted and/or unsubstituted $C_3$-$C_{20}$ cycloalkenylene, $C_3$-$C_{10}$ cycloalkenylene and $C_3$-$C_5$ cycloalkenylene groups, for example, as one or more linking groups (e.g. $L^1$-$L^6$).

As used herein, the terms "arylene" and "arylene group" are used synonymously and refer to a divalent group derived from an aryl group as defined herein. The invention includes compounds having one or more arylene groups. In some embodiments, an arylene is a divalent group derived from an aryl group by removal of hydrogen atoms from two intra-ring carbon atoms of an aromatic ring of the aryl group. Arylene groups in some compounds function as linking and/or spacer groups. Arylene groups in some compounds function as chromophore, fluorophore, aromatic antenna, dye and/or imaging groups. Compounds of the invention include substituted and/or unsubstituted $C_3$-$C_{30}$ arylene, $C_3$-$C_{20}$ arylene, $C_3$-$C_{10}$ arylene and $C_1$-$C_5$ arylene groups, for example, as one or more linking groups (e.g. $L^1$-$L^6$).

As used herein, the terms "heteroarylene" and "heteroarylene group" are used synonymously and refer to a divalent group derived from a heteroaryl group as defined herein. The invention includes compounds having one or more heteroarylene groups. In an embodiment, a heteroarylene is a divalent group derived from a heteroaryl group by removal of hydrogen atoms from two intra-ring carbon atoms or intra-ring nitrogen atoms of a heteroaromatic or aromatic ring of the heteroaryl group. Heteroarylene groups in some compounds function as linking and/or spacer groups. Heteroarylene groups in some compounds function as chromophore, aromatic antenna, fluorophore, dye and/or imaging groups. Compounds of the invention include substituted and/or unsubstituted $C_3$-$C_{30}$ heteroarylene, $C_3$-$C_{20}$ heteroarylene, heteroarylene and $C_3$-$C_5$ heteroarylene groups, for example, as one or more linking groups (e.g. $L^1$-$L^6$).

As used herein, the terms "alkenylene" and "alkenylene group" are used synonymously and refer to a divalent group derived from an alkenyl group as defined herein. The invention includes compounds having one or more alkenylene groups. Alkenylene groups in some compounds function as linking and/or spacer groups. Compounds of the invention include substituted and/or unsubstituted $C_2$-$C_{20}$ alkenylene, $C_2$-$C_{10}$ alkenylene and $C_2$-$C_5$ alkenylene groups, for example, as one or more linking groups (e.g. $L^1$-$L^6$).

As used herein, the terms "cycloalkenylene" and "cycloalkenylene group" are used synonymously and refer to a divalent group derived from a cycloalkenyl group as defined herein. The invention includes compounds having one or more cycloalkenylene groups. Cycloalkenylene groups in some compounds function as linking and/or spacer groups. Compounds of the invention include substituted and/or unsubstituted $C_3$-$C_{20}$ cycloalkenylene, $C_3$-$C_{10}$ cycloalkenylene and $C_3$-$C_5$ cycloalkenylene groups, for example, as one or more linking groups (e.g. $L^1$-$L^2$).

As used herein, the terms "alkynylene" and "alkynylene group" are used synonymously and refer to a divalent group derived from an alkynyl group as defined herein. The invention includes compounds having one or more alkynylene groups. Alkynylene groups in some compounds function as linking and/or spacer groups. Compounds of the invention include substituted and/or unsubstituted $C_2$-$C_{20}$ alkynylene, $C_2$-$C_{10}$ alkynylene and $C_2$-$C_5$ alkynylene groups, for example, as one or more linking groups (e.g. $L^1$-$L^6$).

As used herein, the term "halo" refers to a halogen group such as a fluoro (—F), chloro (—Cl), bromo (—Br), iodo (—I) or astato (—At).

The term "heterocyclic" refers to ring structures containing at least one other kind of atom, in addition to carbon, in the ring. Examples of such heteroatoms include nitrogen, oxygen and sulfur. Heterocyclic rings include heterocyclic alicyclic rings and heterocyclic aromatic rings. Examples of heterocyclic rings include, but are not limited to, pyrrolidinyl, piperidyl, imidazolidinyl, tetrahydrofuryl, tetrahydrothienyl, furyl, thienyl, pyridyl, quinolyl, isoquinolyl, pyridazinyl, pyrazinyl, indolyl, imidazolyl, oxazolyl, thiazolyl, pyrazolyl, pyridinyl, benzoxadiazolyl, benzothiadiazolyl, triazolyl and tetrazolyl groups. Atoms of heterocyclic rings can be bonded to a wide range of other atoms and functional groups, for example, provided as substituents.

The term "carbocyclic" refers to ring structures containing only carbon atoms in the ring. Carbon atoms of carbocyclic rings can be bonded to a wide range of other atoms and functional groups, for example, provided as substituents.

The term "alicyclic ring" refers to a ring, or plurality of fused rings, that is not an aromatic ring. Alicyclic rings include both carbocyclic and heterocyclic rings.

The term "aromatic ring" refers to a ring, or a plurality of fused rings, that includes at least one aromatic ring group. The term aromatic ring includes aromatic rings comprising carbon, hydrogen and heteroatoms. Aromatic ring includes carbocyclic and heterocyclic aromatic rings. Aromatic rings are components of aryl groups.

The term "fused ring" or "fused ring structure" refers to a plurality of alicyclic and/or aromatic rings provided in a fused ring configuration, such as fused rings that share at least two intra ring carbon atoms and/or heteroatoms.

As used herein, the term "alkoxyalkyl" refers to a substituent of the formula alkyl-O-alkyl.

As used herein, the term "polyhydroxyalkyl" refers to a substituent having from 2 to 12 carbon atoms and from 2 to 5 hydroxyl groups, such as the 2,3-dihydroxypropyl, 2,3,4-trihydroxybutyl or 2,3,4,5-tetrahydroxypentyl residue.

As used herein, the term "polyalkoxyalkyl" refers to a substituent of the formula alkyl-(alkoxy)$_n$-alkoxy wherein n is an integer from 1 to 10, preferably 1 to 4, and more preferably for some embodiments 1 to 3.

Amino acids include glycine, alanine, valine, leucine, isoleucine, methionine, proline, phenylalanine, tryptophan, asparagine, glutamine, glycine, serine, threonine, serine, threonine, asparagine, glutamine, tyrosine, cysteine, lysine, arginine, histidine, aspartic acid and glutamic acid. As used herein, reference to "a side chain residue of a natural α-amino acid" specifically includes the side chains of the above-referenced amino acids. Peptides are comprised of two or more amino-acid connected via peptide bonds.

Alkyl groups include straight-chain, branched and cyclic alkyl groups. Alkyl groups include those having from 1 to 30 carbon atoms. Alkyl groups include small alkyl groups having 1 to 3 carbon atoms. Alkyl groups include medium length alkyl groups having from 4-10 carbon atoms. Alkyl groups include long alkyl groups having more than 10 carbon atoms, particularly those having 10-30 carbon atoms. The term cycloalkyl specifically refers to an alky group having a ring structure such as ring structure comprising 3-30 carbon atoms, optionally 3-20 carbon atoms and optionally 2-10 carbon atoms, including an alkyl group having one or more rings. Cycloalkyl groups include those having a 3-, 4-, 5-, 6-, 7-, 8-, 9- or 10-member carbon ring(s) and particularly those having a 3-, 4-, 5-, 6-, 7-, or 8-member ring(s). The carbon rings in cycloalkyl groups can also carry alkyl groups. Cycloalkyl groups can include bicyclic and tricycloalkyl groups. Alkyl groups are optionally substituted. Substituted alkyl groups include among others those which are substituted with aryl groups, which in turn can be optionally substituted. Specific alkyl groups include methyl, ethyl, n-propyl, iso-propyl, cyclopropyl, n-butyl, s-butyl, t-butyl, cyclobutyl, n-pentyl, branched-pentyl, cyclopentyl, n-hexyl, branched hexyl, and cyclohexyl groups, all of which are optionally substituted. Substituted alkyl groups include fully halogenated or semihalogenated alkyl groups, such as alkyl groups having one or more hydrogens replaced with one or more fluorine atoms, chlorine atoms, bromine atoms and/or iodine atoms. Substituted alkyl groups include fully fluorinated or semifluorinated alkyl groups, such as alkyl groups having one or more hydrogens replaced with one or more fluorine atoms. An alkoxy group is an alkyl group that has been modified by linkage to oxygen and can be represented by the formula R—O and can also be referred to as an alkyl ether group. Examples of alkoxy groups include, but are not limited to, methoxy, ethoxy, propoxy, butoxy and heptoxy. Alkoxy groups include substituted alkoxy groups wherein the alky portion of the groups is substituted as provided herein in connection with the description of alkyl groups. As used herein MeO— refers to $CH_3O$—. Compositions of some embodiments of the invention comprise alkyl groups as terminating groups, such as polymer backbone terminating groups and/or polymer side chain terminating groups. Substituted alkyl groups may include substitution to incorporate one or more silyl groups, for example wherein one or more carbons are replaced by Si.

Alkenyl groups include straight-chain, branched and cyclic alkenyl groups. Alkenyl groups include those having 1, 2 or more double bonds and those in which two or more of the double bonds are conjugated double bonds. Alkenyl groups include those having from 2 to 20 carbon atoms. Alkenyl groups include small alkenyl groups having 2 to 3 carbon atoms. Alkenyl groups include medium length alkenyl groups having from 4-10 carbon atoms. Alkenyl groups include long alkenyl groups having more than 10 carbon atoms, particularly those having 10-20 carbon atoms. Cycloalkenyl groups include those in which a double bond is in the ring or in an alkenyl group attached to a ring. The term cycloalkenyl specifically refers to an alkenyl group having a ring structure, including an alkenyl group having a 3-, 4-, 5-, 6-, 7-, 8-, 9- or 10-member carbon ring(s) and particularly those having a 3-, 4-, 5-, 6- or 7-member ring(s). The carbon rings in cycloalkenyl groups can also carry alkyl groups. Cycloalkenyl groups can include bicyclic and tricyclic alkenyl groups. Alkenyl groups are optionally substituted. Substituted alkenyl groups include among others those which are substituted with alkyl or aryl groups, which groups in turn can be optionally substituted. Specific alkenyl groups include ethenyl, prop-1-enyl, prop-2-enyl, cycloprop-1-enyl, but-1-enyl, but-2-enyl, cyclobut-1-enyl, cyclobut-2-enyl, pent-1-enyl, pent-2-enyl, branched pentenyl, cyclopent-1-enyl, hex-1-enyl, branched hexenyl, cyclohexenyl, all of which are optionally substituted. Substituted alkenyl groups include fully halogenated or semihalogenated alkenyl groups, such as alkenyl groups having one or more hydrogens replaced with one or more fluorine atoms, chlorine atoms, bromine atoms and/or iodine atoms. Substituted alkenyl groups include fully fluorinated or semifluorinated alkenyl groups, such as alkenyl groups having one or more hydrogen atoms replaced with one or more fluorine atoms. Compositions of some embodiments of the invention comprise alkenyl groups as terminating groups, such as polymer backbone terminating groups and/or polymer side chain terminating groups.

Aryl groups include groups having one or more 5-, 6-7-, or 8-member aromatic rings, including heterocyclic aromatic rings. The term heteroaryl specifically refers to aryl groups having at least one 5-, 6-7-, or 8-member heterocyclic aromatic rings. Aryl groups can contain one or more fused aromatic rings, including one or more fused heteroaromatic rings, and/or a combination of one or more aromatic rings and one or more nonaromatic rings that may be fused or linked via covalent bonds. Heterocyclic aromatic rings can include one or more N, O, or S atoms in the ring. Heterocyclic aromatic rings can include those with one, two or three N atoms, those with one or two O atoms, and those with one or two S atoms, or combinations of one or two or three N, O or S atoms. Aryl groups are optionally substituted. Substituted aryl groups include among others those that are substituted with alkyl or alkenyl groups, which groups in turn can be optionally substituted. Specific aryl groups include phenyl, biphenyl groups, pyrrolidinyl, imidazolidinyl, tetrahydrofuryl, tetrahydrothienyl, furyl, thienyl, pyridyl, quinolyl, isoquinolyl, pyridazinyl, pyrazinyl, indolyl, imidazolyl, oxazolyl, thiazolyl, pyrazolyl, pyridinyl, benzoxadiazolyl, benzothiadiazolyl, and naphthyl groups, all of which are optionally substituted. Substituted aryl groups include fully halogenated or semihalogenated aryl groups, such as aryl groups having one or more hydrogens replaced with one or more fluorine atoms, chlorine atoms, bromine atoms and/or iodine atoms. Substituted aryl groups include fully fluorinated or semifluorinated aryl groups, such as aryl groups having one or more hydrogens replaced with one or more fluorine atoms. Aryl groups include, but are not limited to, aromatic group-containing or heterocyclic aromatic group-containing groups corresponding to any one of the following: benzene, naphthalene, naphthoquinone, diphenylmethane, fluorene, anthracene, anthraquinone, phenanthrene, tetracene, tetracenedione, pyridine, quinoline, isoquinoline, indoles, isoindole, pyrrole, imidazole, oxazole, thiazole, pyrazole, pyrazine, pyrimidine, purine, benzimidazole, furans, benzofuran, dibenzofuran, carbazole, acridine, acridone, phenanthridine, thiophene, benzothiophene, dibenzothiophene, xanthene, xanthone, flavone, coumarin, azulene or anthracycline. As used herein, a group corresponding to the groups listed above expressly includes an aromatic or heterocyclic aromatic group, including monovalent, divalent and polyvalent groups, of the aromatic and heterocyclic aromatic groups listed herein are provided in a covalently bonded configuration in the compounds of the invention at any suitable point of attachment. In embodiments, aryl groups contain between 5 and 30 carbon atoms. In embodiments, aryl groups contain one aromatic or heteroaromatic six-member ring and one or more additional five- or six-member aromatic or heteroaromatic ring. In embodiments, aryl groups contain between five and eighteen carbon atoms in the rings. Aryl groups optionally have one or more aromatic rings or heterocyclic aromatic rings having one or more electron donating groups, electron withdrawing groups and/or targeting ligands provided as substituents. Compositions of some embodiments of the invention comprise aryl groups as terminating groups, such as polymer backbone terminating groups and/or polymer side chain terminating groups.

Arylalkyl groups are alkyl groups substituted with one or more aryl groups wherein the alkyl groups optionally carry additional substituents and the aryl groups are optionally substituted. Specific alkylaryl groups are phenyl-substituted alkyl groups, e.g., phenylmethyl groups. Alkylaryl groups are alternatively described as aryl groups substituted with one or more alkyl groups wherein the alkyl groups optionally carry additional substituents and the aryl groups are optionally substituted. Specific alkylaryl groups are alkyl-substituted phenyl groups such as methylphenyl. Substituted arylalkyl groups include fully halogenated or semihalogenated arylalkyl groups, such as arylalkyl groups having one or more alkyl and/or aryl groups having one or more hydrogens replaced with one or more fluorine atoms, chlorine atoms, bromine atoms and/or iodine atoms. Compositions of some embodiments of the invention comprise arylalkyl groups as terminating groups, such as polymer backbone terminating groups and/or polymer side chain terminating groups.

As to any of the groups described herein which contain one or more substituents, it is understood that such groups do not contain any substitution or substitution patterns which are sterically impractical and/or synthetically nonfeasible. In addition, the compounds of this invention include all stereochemical isomers arising from the substitution of these compounds. Optional substitution of alkyl groups includes substitution with one or more alkenyl groups, aryl groups or both, wherein the alkenyl groups or aryl groups are optionally substituted. Optional substitution of alkenyl groups includes substitution with one or more alkyl groups, aryl groups, or both, wherein the alkyl groups or aryl groups are optionally substituted. Optional substitution of aryl groups includes substitution of the aryl ring with one or more alkyl groups, alkenyl groups, or both, wherein the alkyl groups or alkenyl groups are optionally substituted.

Optional substituents for any alkyl, alkenyl and aryl group includes substitution with one or more of the following substituents, among others:

halogen, including fluorine, chlorine, bromine or iodine; pseudohalides, including —CN;

—COOR where R is a hydrogen or an alkyl group or an aryl group and more specifically where R is a methyl, ethyl, propyl, butyl, or phenyl group all of which groups are optionally substituted;

—COR where R is a hydrogen or an alkyl group or an aryl group and more specifically where R is a methyl, ethyl, propyl, butyl, or phenyl group all of which groups are optionally substituted;

—CON(R)$_2$ where each R, independently of each other R, is a hydrogen or an alkyl group or an aryl group and more specifically where R is a methyl, ethyl, propyl, butyl, or phenyl group all of which groups are optionally substituted; and where R and R can form a ring which can contain one or more double bonds and can contain one or more additional carbon atoms;

—OCON(R)$_2$ where each R, independently of each other R, is a hydrogen or an alkyl group or an aryl group and more specifically where R is a methyl, ethyl, propyl, butyl, or phenyl group all of which groups are optionally substituted; and where R and R can form a ring which can contain one or more double bonds and can contain one or more additional carbon atoms;

—N(R)$_2$ where each R, independently of each other R, is a hydrogen, or an alkyl group, or an acyl group or an aryl group and more specifically where R is a methyl, ethyl, propyl, butyl, phenyl or acetyl group, all of which are optionally substituted; and where R and R can form a ring which can contain one or more double bonds and can contain one or more additional carbon atoms;

—SR, where R is hydrogen or an alkyl group or an aryl group and more specifically where R is hydrogen, methyl, ethyl, propyl, butyl, or a phenyl group, which are optionally substituted;

—SO$_2$R, or —SOR where R is an alkyl group or an aryl group and more specifically where R is a methyl, ethyl, propyl, butyl, or phenyl group, all of which are optionally substituted;

—OCOOR where R is an alkyl group or an aryl group;

—SO$_2$N(R)$_2$ where each R, independently of each other R, is a hydrogen, or an alkyl group, or an aryl group all of which are optionally substituted and wherein R and R can form a ring which can contain one or more double bonds and can contain one or more additional carbon atoms; and —OR where R is H, an alkyl group, an aryl group, or an acyl group all of which are optionally substituted. In a particular example R can be an acyl yielding —OCOR" where R" is a hydrogen or an alkyl group or an aryl group and more specifically where R" is methyl, ethyl, propyl, butyl, or phenyl groups all of which groups are optionally substituted.

Specific substituted alkyl groups include haloalkyl groups, particularly trihalomethyl groups and specifically trifluoromethyl groups. Specific substituted aryl groups include mono-, di-, tri, tetra- and pentahalo-substituted phenyl groups; mono-, di-, tri-, tetra-, penta-, hexa-, and hepta-halo-substituted naphthalene groups; 3- or 4-halo-substituted phenyl groups, 3- or 4-alkyl-substituted phenyl groups, 3- or 4-alkoxy-substituted phenyl groups, 3- or 4-RCO-substituted phenyl, 5- or 6-halo-substituted naphthalene groups. More specifically, substituted aryl groups include acetylphenyl groups, particularly 4-acetylphenyl groups; fluorophenyl groups, particularly 3-fluorophenyl and 4-fluorophenyl groups; chlorophenyl groups, particularly 3-chlorophenyl and 4-chlorophenyl groups; methylphenyl groups, particularly 4-methylphenyl groups; and methoxyphenyl groups, particularly 4-methoxyphenyl groups.

As to any of the above groups which contain one or more substituents, it is understood that such groups do not contain any substitution or substitution patterns which are sterically impractical and/or synthetically non-feasible.

Many of the molecules disclosed herein contain one or more ionizable groups. Ionizable groups include groups from which a proton can be removed (e.g., —COOH) or added (e.g., amines) and groups that can be quaternized (e.g., amines). All possible ionic forms of such molecules and salts thereof are intended to be included individually in the disclosure herein. With regard to salts of the compounds herein, one of ordinary skill in the art can select from among a wide variety of available counterions that are appropriate for preparation of salts of this invention for a given application. In specific applications, the selection of a given anion or cation for preparation of a salt can result in increased or decreased solubility of that salt.

The compounds of this invention can contain one or more chiral centers. Accordingly, this invention is intended to include racemic mixtures, diastereomers, enantiomers, tautomers and mixtures enriched in one or more stereoisomer. The scope of the invention as described and claimed encompasses the racemic forms of the compounds as well as the individual enantiomers and non-racemic mixtures thereof.

As used herein, the term "isomers" refers to compounds having the same number and kind of atoms, and hence the same molecular weight, but differing in respect to the structural arrangement or configuration of the atoms.

The term "tautomer," as used herein, refers to one of two or more structural isomers which exist in equilibrium and which are readily converted from one isomeric form to another.

Where substituent groups are specified by their conventional chemical formulae, written from left to right, they equally encompass the chemically identical substituents that would result from writing the structure from right to left, e.g., —$CH_2O$— is equivalent to —$OCH_2$—.

DETAILED DESCRIPTION OF THE INVENTION

Generally, developments and benefits, particularly over conventional art, included herein can be categorized as providing (1) new precursor designs for chemically induced modification of its reactivity and (2) new precursor chemistry that have separated reaction paths for nucleation and growth. With respect to (1), enabling controllable modulation of precursor reactivity in a temperature independent manner allows systematically growing QDs having high structural qualities (crystallinity, controlled morphology, size distribution, etc.). Accordingly, included herein are two non-limiting types of designs or approaches for new precursors: B—X bond incorporating precursors and tri-hydro-carbon-silyl-based precursors. With respect to (2), high quality growth requires the nucleation and growth stages to be well separated. The overlap of these stages results in secondary nucleation, deteriorating the size distribution of the QD samples. This overlap is hard to avoid in heat-up synthesis, a preferred method for large scale synthesis (simple, economical and more reproducible). In a heat up synthesis, the entire precursors are added upfront, yielding high precursor concentration. In the conventional synthesis method, both nucleation and growth utilize the same reaction intermediate and the concentration of intermediate determines which pathway is activated. Therefore, at the conditions involving high precursor concentrations, nucleation continues even during growth. Shown here, for example, is that new precursors such as, but not limited to, BBN-SH, separate nucleation and growth pathways, enabling high quality growth even using the heat up-based growth method. Both aspects (1) and (2) are directed to inducing well controlled growth, free of secondary nucleation, of high quality QDs but approaches and precursors can vary according to embodiments disclosed herein.

Included herein are new chemical principles of designing precursors for high-quality quantum dot (QDs) synthesis. The new chemistry enables controlled modulation reactivity of precursors by adding chemical additives. The reactivity of our new precursor chemistry can be modulated in a temperature-independent manner. This new chemistry enables one to decouple the reactivity modulation of precursor with the surface instability of NCs. This new chemistry allows one to synthesize high-quality QDs of various sizes and compositions.

Figure 1:
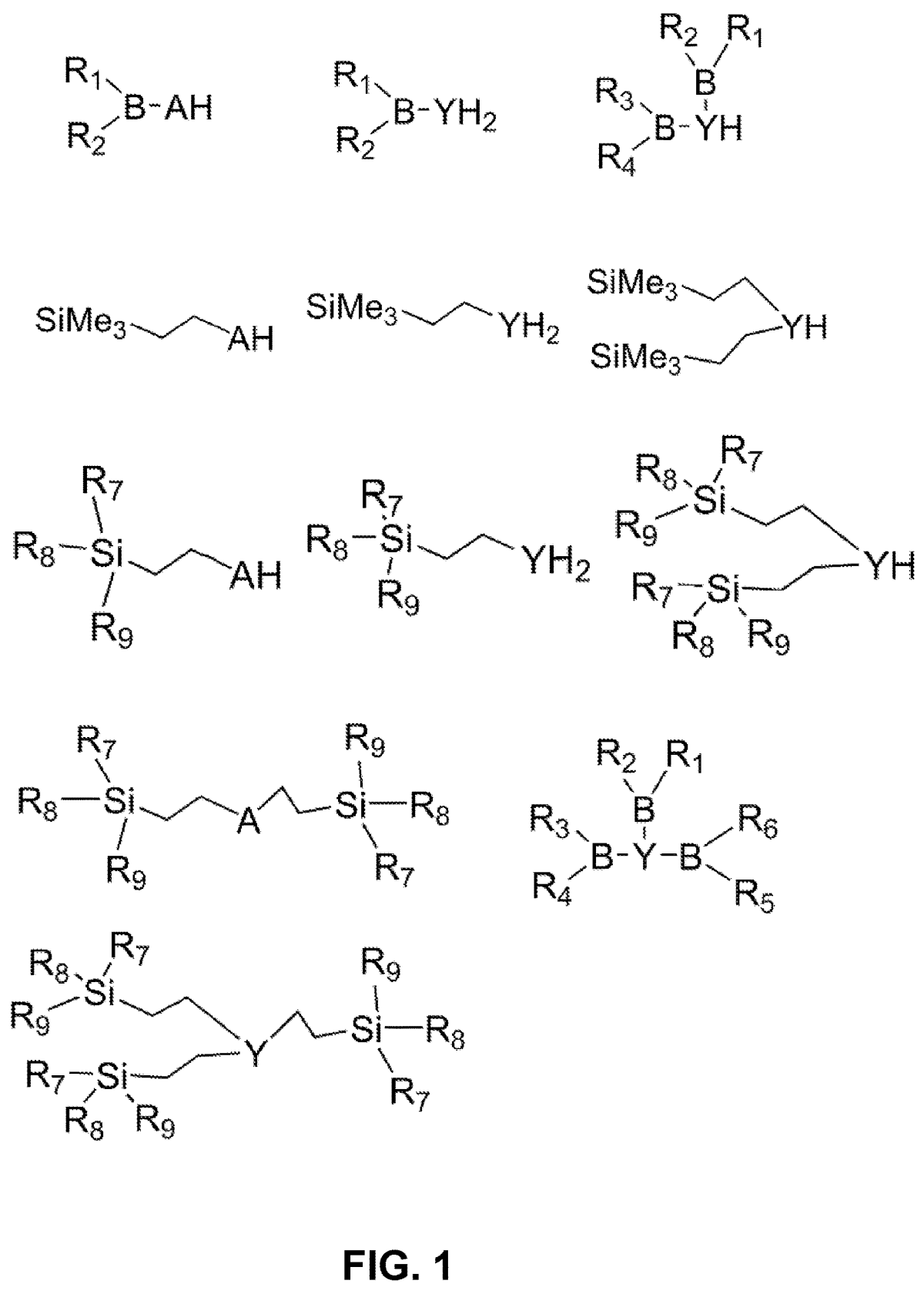
Figure 2A:
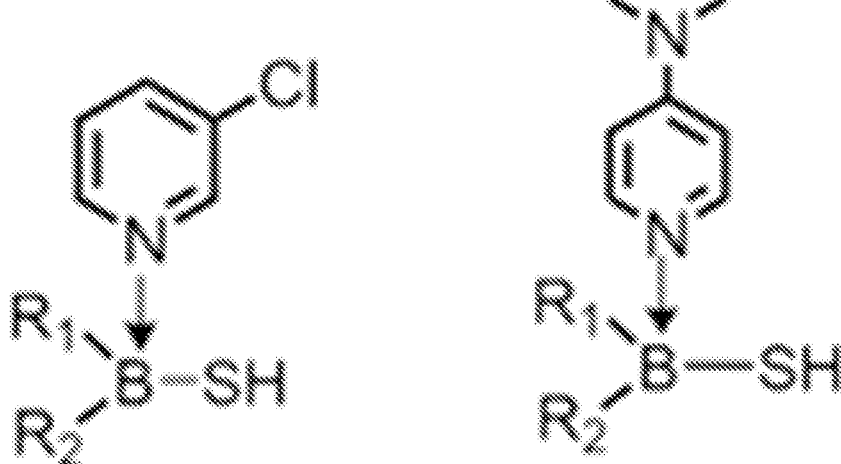
FIGS. 2A-2B illustrate exemplary schemes, according to certain embodiments disclosed herein, for modifying a first anion precursor (an organoborane in FIG. 2A and a trimethylsillyl in FIG. 2B) using a modification agent (a pyridine derivative in FIG. 2A and a halide in FIG. 2B) to form a second anion precursor or a modified anion precursor.

Anion precursor, according to certain embodiments: Organoborane species: Organoborane species can form a dative bond by accepting lone pair electron from other molecules and releasing the adjacent atoms. Stronger dative bond with higher basicity of Lewis base results in weakening the bond strength between boron and adjacent atom. Our new chemistry can be expanded to other atoms, including, but not limited to, S, Se, Te, P, As, and Sb. To showcase our new precursor chemistry concept, embodiments herein developed the thiol version of organoborane precursor. Depending on the strength of this dative bond, the bond strength between boron and adjacent atom (A or Y in FIG. 1a) can be modulated precisely. If the dative bond strength getting greater, adjacent atom can be easily released, which means higher reactivity. If the dative bond strength getting smaller, adjacent atom would not be released easily, which implies lower reactivity. This new chemistry allows one to tune the reactivity of precursor predictably by changing the basicity of chemical additives. (FIG. 2a)

Figure 2B:
Figure 4A:
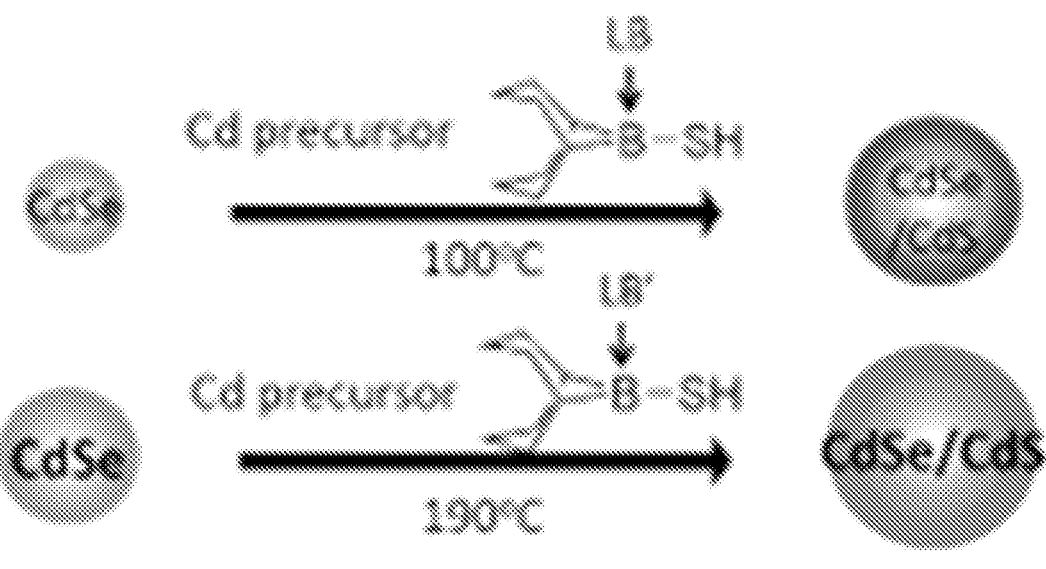
FIGS. 4A-4C illustrate the (FIG. 4A) scheme of CdSe/CdS core/shell QD synthesis using reactivity modulatable BBN-SH with different type of Lewis bases, (FIG. 4B) candidates for pyridine derivatives as chemical initiators for BBN-SH, and (FIG. 4C) potential initiators for growing CdS shell
Figure 4B:
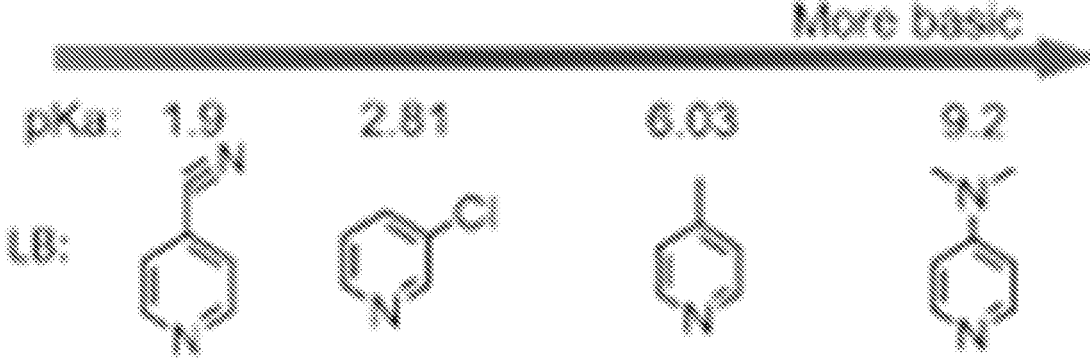
Figure 4C:
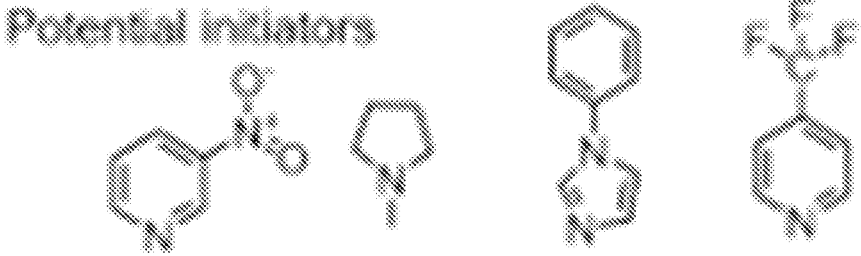

Anion precursor, according to certain embodiments: tri-hydrocarbon-silyl anion precursors, tri-hydrocarbon-silyl such as 2-tri-hydrocarbon-silyle anion precursors, such as trimethylsillylethane species: For example, these precursors can be represented as 2-tri-hydrocarbon-silylethane-XH or -XH2 (where X is an anion such as S, P, Se, As, etc.). The reactivity of tri-hydrocarbon-silyl compounds can be modulated by different halide anion treatment. For example, reacting this anion precursor with a halide anion (an exemplary modification agent), results in halide-assisted dissociation of the precursor into tri-hydrocarbon-silyl-Z (Z: halide), ethane, for example, and XH— or $XH_2$—. This compound can release ethylene gas, for example, and adjacent atom (A or Y in FIG. 1b) by beta-elimination under halide anion treatment condition. The new chemistry can be expanded to other atoms, including, but not limited to, S, Se, Te, P, As, and Sb. Depending on the electronegativity of halide anion, the precursor reactivity can be tuned. (FIG. 2b) If Me-$_3$Si moiety, for example, was attacked by higher electronegativity halide anions, the reactivity of precursor would be increased. If Me-$_3$Si moiety, for example, was attacked by lower electronegativity halide anions, the reactivity of precursor would be decreased. In this chemistry, the nucleophilicity of halide ions and the steric hindrance of hydrocarbon of the silyl group determine the thermodynamics and kinetics of precursor conversion (dissociation), therefore altering the $T_{act}$. Generally, the tri-hydrocarbon-silyl anion precursors disclosed herein (for example, as used in embodiments including forming a second anion precursor) are useful for both growth and nucleation. Exemplary tri-hydrocarbon-silyl anion precursors useful herein include, but are not limited to: tri-hydrocarbon-silyl)ethanethiol, (tri-hydrocarbon-silyl)ethaneselenol, (tri-hydrocarbon-silyl) ethanetellurol, (tri-hydrocarbon-silyl)ethanephosphine, any isomer of these, any substituted product of these, and any combination of these. The term "hydrocarbon" in the term "tri-hydrocarbon-silyl" refers to a group or moiety having at least one carbon and at least one hydrogen covalently bonded to said at least one carbon. Non-limiting example of moieties or groups corresponding to the term "hydrocarbon" in the term "tri-hydrocarbon-silyl" include: methyl, phenyl, 4-methylphenyl, 4-chlorophenyl, 4-(trifluoromethyl)phenyl, tert-butyl, and any combination of these. So, exemplary tri-hydrocarbon-silyl anion precursors useful herein include, but are not limited to: (trimethylsilyl)ethanethiol, (trimethylsilyl)ethaneselenol, (trimethylsilyl)ethanetellurol, (trimethylsilyl)ethanephosphine, (tri-phenyl-silyl)ethanethiol, (tri-phenyl-silyl)ethaneselenol, (tri-phenyl-silyl)ethanetellurol, (tri-phenyl-silyl)ethanephosphine, (tri-4-methylphenyl-silyl)ethanethiol, (tri-4-methylphenyl-silyl)ethaneselenol, (tri-hydrocarbon-silyl)ethanetellurol, (tri-4-methylphenyl-silyl)ethanephosphine, (tri-4-chlorophenyl-silyl)ethanethiol, (tri-4-chlorophenyl-silyl)ethaneselenol, (tri-4-chlorophenyl-silyl)ethanetellurol, (tri-4-chlorophenyl-silyl)ethanephosphine, (tri-4-(trifluoromethyl)phenyl-silyl) ethanethiol, (tri-4-(trifluoromethyl)phenyl-silyl)ethaneselenol, (tri-4-(trifluoromethyl)phenyl-silyl)ethanetellurol, (tri-4-(trifluoromethyl)phenyl-silyl)ethanephosphine, (tri-tert-butyl-silyl)ethanethiol, (tri-tert-butyl-silyl)ethaneselenol, (tri-tert-butyl-silyl)ethanetellurol, (tri-tert-butyl-silyl)ethanephosphine, any isomer of these, any substituted product of these, and any combination of these.

High-quality shell growth on QDs: Slow injection of precursor to grow the high-quality shell deposition on QD cores: Growing high-quality shell on QDs is crucial to achieve excellent optical and physical properties (i.e. small full-width at half maximum (FWHM) of PL spectrum, which is related with color purity, high QY) for further application as light-emitting materials. Slow injection of shell precursor is well-known method to grow the shell layers on QD cores. Here, embodiments herein showed that the controllable reactivity of our new precursor, 9-mercapto-9-borabicyclo[3.3.1]nonane (BBN-SH), can be modulated using pyridine derivatives and the high-quality CdS shell can be deposited on different sizes of CdSe QD cores resulted in narrow size distribution and high QY. We successfully balance the surface instability of QD cores in any size with the precursor reactivity using our new chemistry with modulatable reactivity. In comparison, the reactivity of bis(trimethylsilyl)sulfide ((TMS)$_2$S), which is a commercially available and highly reactive sulfur precursors for growing the CdS shell, cannot be tuned. The broad size distribution and low QY is obtained for both sizes of CdSe core. The shell deposition reaction can undergo as low as room temperature with (TMS)$_2$S, which can result in the poor crystallinity with stacking faults over the entire QDs and size broadening. [Ref. 1] Alkylthiols, a commercially available and less reactive precursor, cannot be tuned the reactivity. The strong bond between carbon and sulfur in alkylthiol induce the slow and defect-free shell growth on QD cores at high temperature (>300° C.), which leads high-quality core/shell QDs. [Ref. 2] However, the high-quality shell deposition is only applicable for big enough sizes of QD cores that can survive in such high reaction temperatures.

Heat-up shell growth on existing QD cores: Heat-up synthesis of high-quality core/shell QDs were demonstrated by using BBN-SH based chemistry for different size of QD cores. Heat-up shell growth is defined as mixing QD cores and shell precursors in single reaction pot and heating up the reaction pot slowly to synthesize the core/shell QDs. The active precursor concentration would be precisely controlled using BBN-SH and optimal initiator pair at the given temperature. Heat-up shell growth on nanocrystals has never been demonstrated by conventional precursors. We have confirmed that both (TMS)$_2$S and octanethiol resulted broad size distribution and low QY. Also, the second population of CdS nanoparticles were generated by using those conventional precursors. Since the reactivity is already determined by the chemical structure of conventional precursor, precise control of active precursor concentration is almost impossible to achieve. As a result, growing shell on QD cores cannot be obtained selectively by high concentration of the active shell precursors. This heat-up shell growth method enables reproducible synthesis of core/shell QDs at an industrial scale without involving complicated apparatus. Previously, slow injection of precursor to QD core solution is mostly used for small scale synthesis. However, the slow injection method requires complex injection apparatus and homogenous mixing of huge volume of reactants. QD cores and precursors are placed in same reaction pot and slowly heated up the reaction pot with all of the mixture can minimize the cost to synthesize QD in large scale reaction. We also showed purification-free heat-up core/shell QD synthesis. Purification of QD cores is defined as removing excess amounts of precursors and ligands for core synthesis. Huge amount of anti-solvents needs to be added on crude QD core solution to generate QD precipitates selectively. When it becomes industrial scale synthesis, this purification step needs a lot of time and cost to accomplish. The purification step is irreproducible process. To overcome this, embodiments herein adopted a full conversion chemistry to synthesize CdSe QD cores and successfully grow high-quality CdS shell using BBN-SH based chemistry on CdSe QD cores without the purification step.

Fine-tuning of QD core size and composition: QD core synthesis with fine-tuning size and composition can be also obtained by our new precursor chemistry. To achieve monodisperse QD cores, an injection at high temperature of low reactivity precursor, as known as hot-injection method, have been accepted as the most common method. For example, trioctylphosphine selenide (TOPSe) have been widely used for synthesizing CdSe QDs via a hot-injection method. However, reaction yield is very low and quality (e.g. size distribution) of resulting QD cores is highly irreproducible especially for large scale synthesis. Other core synthesis method is full conversion method using thiourea as a precursor. [Ref. 4] This method provides high reaction yield (~99%) and reproducibility. However, precursor conversion for synthesizing QD is very fast, the QD core size cannot be tuned further. Since the whole process undergo with full conversion, final size of QD core is always fixed with the reaction kinetic constant of precursor. To modulate the size of QD core precisely, embodiments herein can adopt the full conversion method to get QD nuclei and grow QD core further using our new precursor chemistry with tunable reactivity. One can achieve QD core with controllable graded composition (e.g. CdSe$_x$S$_{1-x}$), embodiments herein can grow QD core using two different precursors with tunable reactivity and tune their composition by varying the ratio between two precursors. Our new precursor chemistry showed a quantitative growing QD with full conversion precursors. Because of our chemistry through a full conversion route, embodiments herein can achieve the fine-tuning of NC core size, high reproducibility, economical, and easily scale-up capability for QD core synthesis.

The benefits of using our new chemistry for QD synthesis are high reproducible synthesis of defect-free monodispersed QDs with high QY. Narrow size distribution resulted in small FWHM and high QY, which is crucial for applying QDs to image displays and light-emitting materials. Our new chemistry can lower the cost of synthesis, which enables the synthesis of QDs with full conversion pathway. Using our heat-up shell growth method, it is free from using complex injecting apparatus and mixing the large quantity of reaction solvent. For our heat-up core/shell QD synthesis, a purification step of QD core solution is not needed. Purification of QD core requires a lot of anti-solvent and manpower, which needs huge amount of cost and time. This purification-free heat-up process lower a lot of cost and maximize a possible loss of reaction yield. Because of the purification-free heat-up core/shell synthesis, it is easy to increase the reaction scale, which is a lot beneficial for companies. For start-up companies, a lot of QD based products have been proposed. For example, type-II QD solar cell (QD solar), luminescent solar cell concentrator (ubiQD), QD based color filter (Quantum Dot Enhancement Film (QDEF), Nanosys), cadmium-free QDs for LED (CFQD, Nanoco) and low-cost light source with variable color ratio in smart farm (ubiQD). For established companies, QD based image displays and bio-imaging probes have been commercialized. For example, image display (QLED TV, Samsung), imaging probes (Qdot bioconjugates, Thermo Fisher Scientific), and QD materials (QDs, Merck group).

Researchers never achieved temperature-independent modulation of precursor reactivity and purification-free heat-up synthesis of high-quality QDs. Our new chemistry opens up a new way of making QDs in a lot different way compared to any existing precursors. For high-quality shell deposition on versatile QD cores, there is no similar method to compare. Fine tuning of QD core size is only achieved by low reactivity precursors, which results low reaction yield and irreproducibility on the size distribution of QDs. Using our new chemistry with full conversion, embodiments herein can tuned the size of QD core precisely, which enables economical and easily scale-up synthesis. One-pot synthesis of core/shell QDs defined as placing cores and shell precursors in a single reaction pot for synthesizing the QDs. There is one approach to get CdSe/CdS core/shell QD through the one-pot synthesis. Unfortunately, to achieve the CdSe/CdS core/shell QDs, the reaction kinetic constant of selenium precursor should be thousand-fold greater than that of thiol precursors at least. It is only applicable for synthesizing certain size of CdSe/CdS core/shell QDs with limited PL emitting range. Using our new chemistry, embodiments herein synthesize QD core and shell separately and finely tune the both QD core size and shell thickness, which is not limited to certain size of QDs. Also, our core/shell QD synthesis method enables one to remove a complicate injection tools and purification steps for QD cores.

To achieve the reactivity modulation of precursor, embodiments herein started with 9-mercapto-9-borabicyclo [3.3.1]nonane (BBN-SH) due to the extensive studies about BBN moiety in organic synthesis field. BBN-SH was synthesized by reacting 9-BBN dimers with hydrogen sulfide.

The reactivity of the BBN-SH precursor can be modulated by the basicity of Lewis base. The nitrogen atom of Lewis base can make a coordinate bond to a boron atom of BBN-SH (a). The bond strength between boron and sulfur in BBN-SH would be modulated by the basicity of Lewis base (b). As a result, BBN-SH can act as a sulfur precursor under various activation temperature range to grow the metal sulfide shell on any size of QD cores. For example, cadmium sulfide (CdS) shell can be deposited on any size of cadmium selenide (CdSe) QD cores using our new precursor chemistry.

To understand the factor modulating the reaction kinetics of CdS shell deposition on CdSe QDs, CdSe QD cores and shell precursors (cadmium oleates and BBN-SH) were mixed in a reaction pot. Because the energy band alignment of CdSe/CdS core/shell QDs, the shift of photoluminescence (PL) peak position to the higher wavelength would be observed by growing CdS shell on the surface of CdSe QD cores. Until heating up the reaction pot to 180° C. without injecting anything (before time 0 in fig a), almost no change of PL peak and full-width at half maximum (FWHM) of PL spectrum showed. Once the picoline was injected, the PL peak was red-shifted from 542 nm to 584 nm as growing CdS shell on CdSe cores. For control sample, without adding picoline, the PL peak was marginally shifted from 541 to 544 under same temperature profile as picoline injected sample. The marginal shift of PL peak is originated from the adsorption of cadmium atom on the surface of CdSe core presumably. While the CdS shell growing in picoline injected sample, FWHM of PL spectrum was not changed at all. The second injection of the picoline also initiated a red-shifting of the PL peak from 584 nm to 603 nm as growing the CdS shell further. These results showed that the CdS shell deposition using BBN-SH can be initiated by picoline, which can bind to boron atom of BBN-SH and induce a labile bond between sulfur and boron.

Using BBN-SH and Lewis base pair as precursor and initiator, embodiments herein were able to synthesize monodisperse, maintained the FWHM of PL spectrum, CdSe/CdS core/shell QDs with two different core sizes.

The reactivity of BBN-SH for CdS shell growth is increased by a higher basicity of Lewis base. This increased reactivity of BBN-SH leads to the lower activation temperature for the CdS shell growing process on CdSe cores. To measure the activation temperature for each pair of BBN-SH and Lewis base, CdSe and precursors were placed in the same reaction vessel and heat up slowly. For dimethylaminopyridine (DMAP), CdS shell growth was initiated as low as 100° C. For picoline and 3-chloropyridine, the activation temperature was found as 140 and 160° C., respectively. Only BBN-SH was not able to initiate the CdS shell growth on CdSe QD core. FWHM of PL spectrum was not changed for all 4 cases. This means the size distribution of core/shell QDs maintained for the CdS shell growing process using our BBN-SH.

Figure 5A:
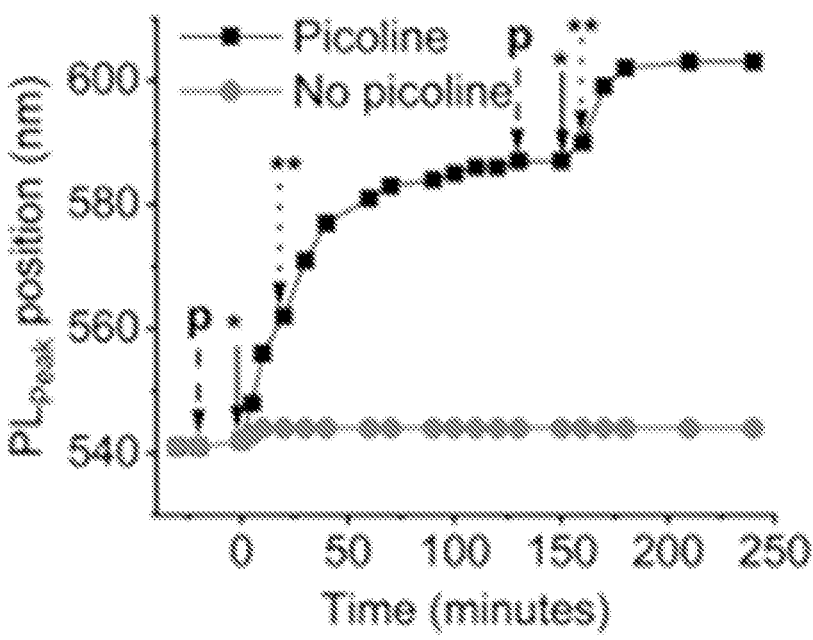
FIGS. 5A-5B illustrate a CdS shell deposition that requires 4-picoline. Evolution of (FIG. 5A) photoluminescence (PL) peak and (FIG. 5B) PWHM of PL upon picoline injection to the mixture of CdSe cores and precursors ('p' indicates precursor injection for both black and red graph). PL shifts, indicating CdS shell growth on CdSe cores, only occur in the presence of picoline (black, start(*) and end(**) of picoline injection), whereas those for BBN-SH only treated sample without picoline (red) do not occur.
Figure 5B:
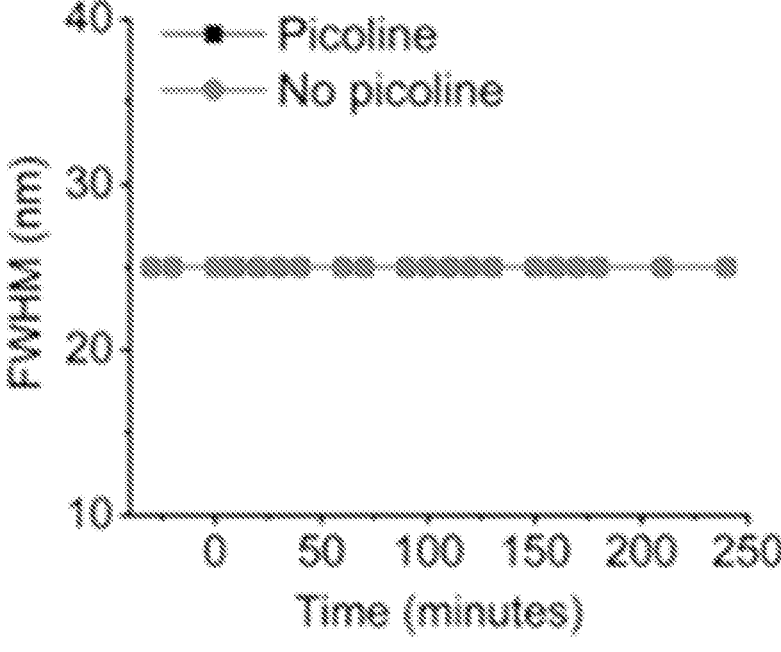
Figure 7A:
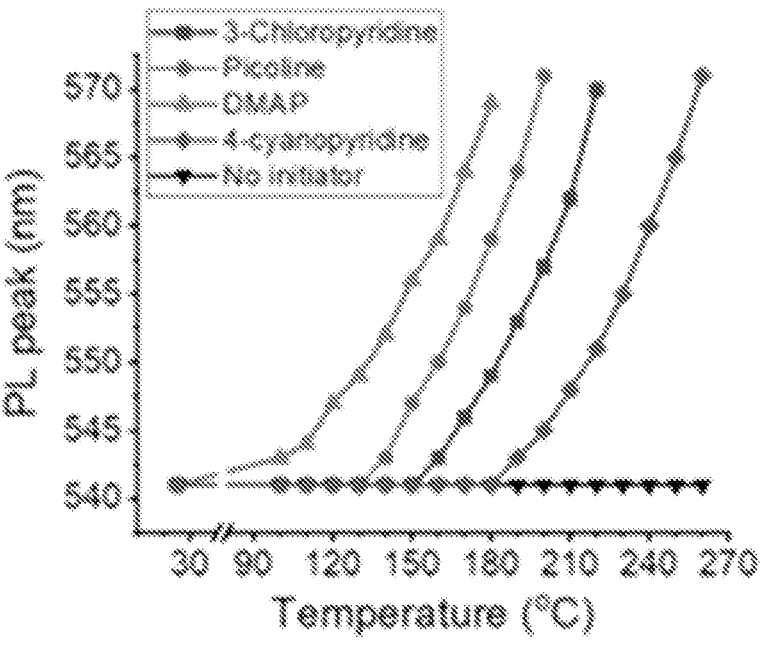
Figure 7B:
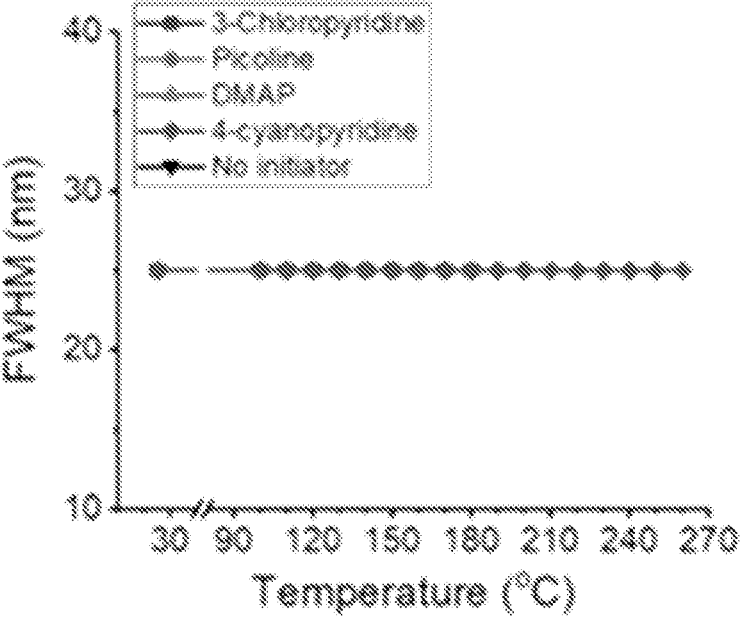
Figure 8A:
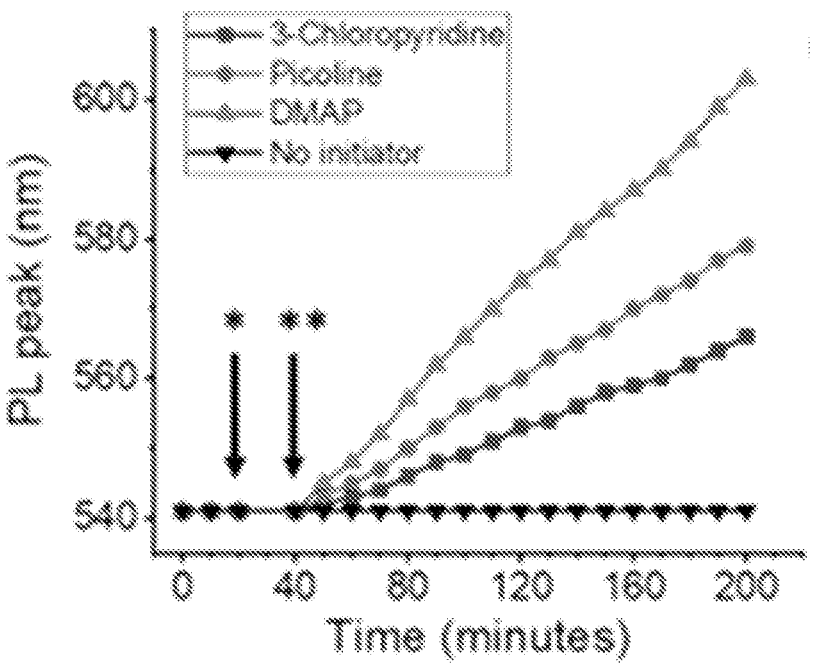
Figure 8B:
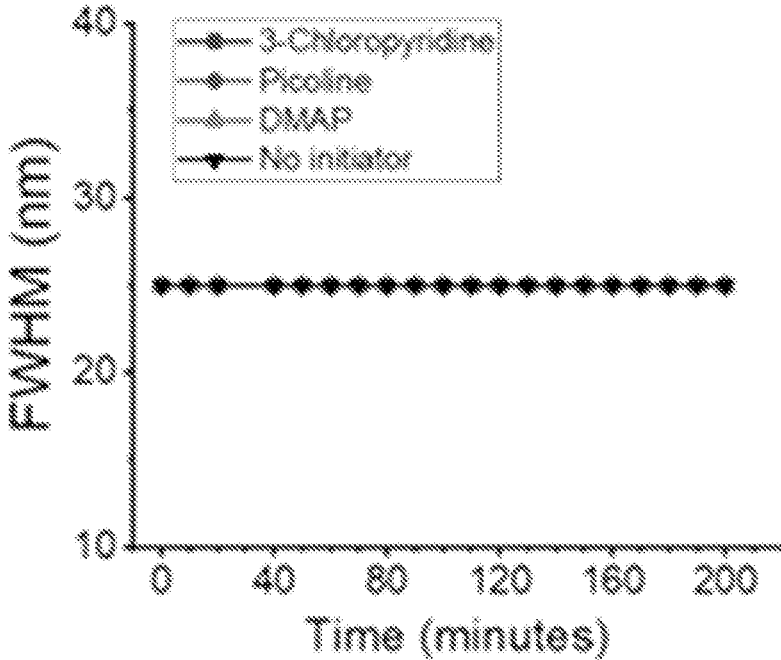
Figures 9A, 9B, 9C:
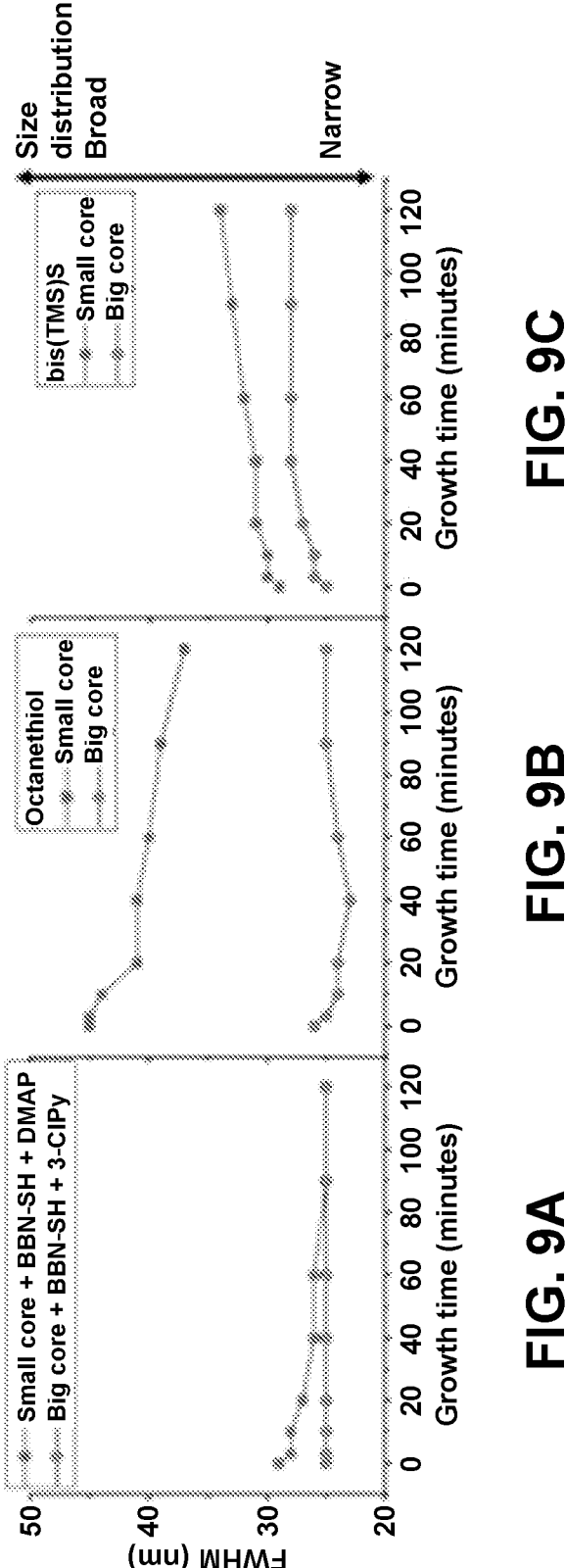
Figures 9D, 9E, 9F:
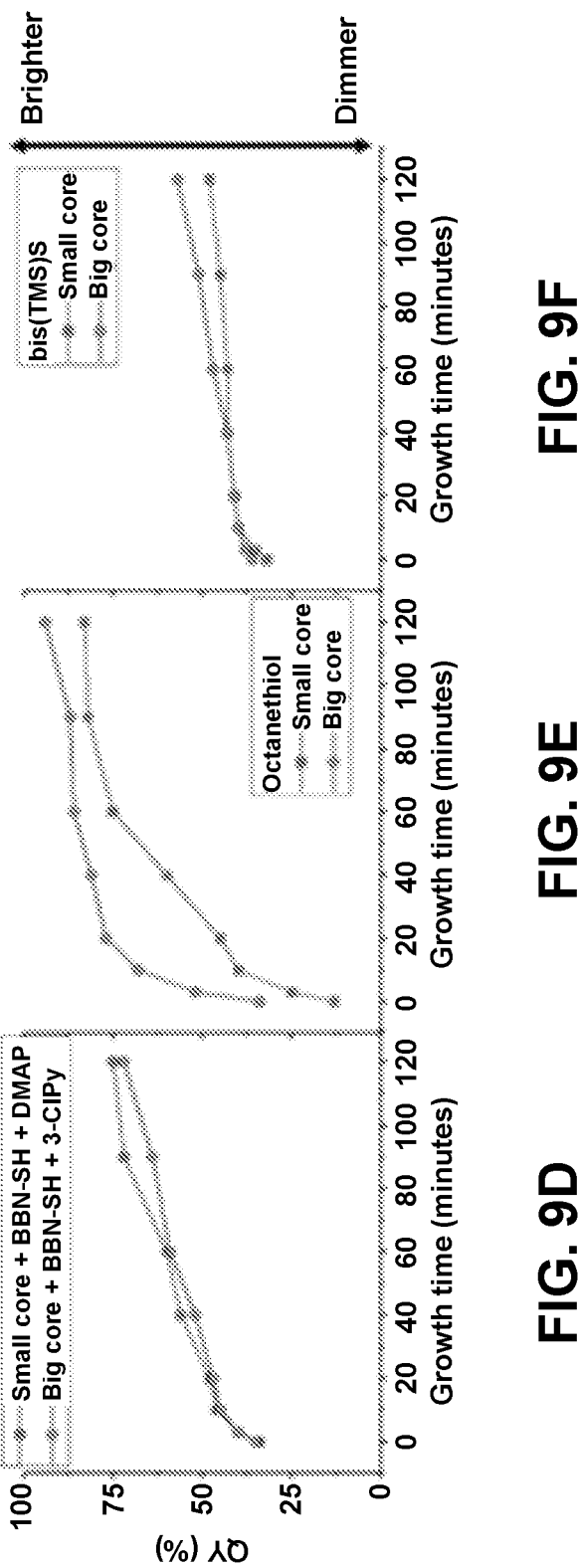

To compare the reaction kinetics of CdS shell growth, CdSe QD cores and precursors were placed in same reaction vessel and heat up to same temperature (170° C., marked as "*" in FIG. 5a). The temperature of reaction vessel kept in constant (170° C.), there are no CdS shell growth (PL peak positions were not changed) without injecting the Lewis bases. After 20 min, Lewis bases were injected (marked as "**" in FIG. 5a). Fastest CdS shell growth was observed in DMAP case. The kinetics of the picoline case was faster than that of 4-chloropyridine case. We were able to modulate the reaction kinetics of BBN-SH as sulfur precursor in the temperature range which is higher than the activation temperature. Under constant temperature conditions, the reactivity of BBN-SH is also increased as increasing the basicity of Lewis base.

BBN-SH enables to get small FWHM and high QY for both QD core sizes. Depending on the size of QD core, embodiments herein claim the surface instability of QD core and precursor reactivity must be matched. Since the surface instability of QD core is dependent on the size of QD core, each size of QD core has optimal reaction temperature to fulfill both effective shell growing and narrow size distribution. To grow high-quality shell on both small CdSe core (~2.6 nm in diameter), the reactivity of precursor should be high enough to react under low-temperature condition. To grow high-quality shell on big CdSe core (~3.6 nm in diameter), the reactivity of precursor is high enough to react. For BBN-SH, embodiments herein use DMAP and BBN-SH pair to grow CdS shell on small CdSe cores and 3-ClPy and BBN-SH pair to grow CdS shell on big CdSe core. Since embodiments herein can tune the reactivity of precursors in temperature-independently, reactivity of precursors matched with the surface instability of CdSe core at given temperature for different QD core size. When octanethiol was used as precursor, high activation temperature for precursor (~310° C.) resulted in broad size distribution (FWHM~40 nm) for small CdSe core. Only big CdSe core resulted small FWHM (25 nm) and high QY. In case of (TMS)₂S, which is very reactive precursor, the size distribution was poor (FWHM~35 nm) and QY was lower than 50% for small CdSe cores. For Big CdSe cores, the size distribution was getting broader (from 25 to 28 nm in FWHM) and QY was about 50%.

To confirm the ability of heat-up shell growth using our new chemistry, embodiments herein placed premade CdSe QDs and shell precursors (cadmium oleates for Cd precursor, BBN-SH and 3-chloropyridine for S precursor) in a one reaction pot and heated up. As CdS shell grows, the absorption and PL peak shifted to the higher wavelength, which means CdS shell deposition occurred during the heat-up process. Single crystalline structure throughout the entire core and shell region was confirmed with transmission electron microscope (TEM) images after the CdS shell growth.

The heat-up method for growing shell layers on nanocrystals have never been demonstrated. The core particles and shell precursors have been mixed in same reaction vessel and the vessel was slowly heated up. For shell growth using heat-up, the concentration of activated shell precursors should be finely controlled to get high-quality shell. Otherwise, satellite particle formation and broadening size distribution can occur. For BBN-SH, embodiments herein tested DMAP and 3-chloropyridine (3-ClPy) as an initiator. DMAP initiates the CdS shell growth on small CdSe cores and 3-ClPy initiates the CdS shell growth on big CdSe cores (PL peak was shifted to the higher wavelength region). Small FWHM and high QY were obtained for both cases. This result showed that shell growth process for each size of QD core must be precisely tuned and optimized by various precursor reactivity.

Heat-up shell growth on CdSe cores was demonstrated using BBN-SH, (TMS)₂S, and octanethiol. BBN-SH and DMAP pair was used as precursor for small core and 3-ClPy pair was used for big CdSe QD cores. Two conventional precursors, (TMS)₂S and octanethiol, induced the formation of satellite nanocrystals for both small and big CdSe core cases (2nd or 3rd PL peak appeared in 400-500 nm range). However, there were no satellite nanocrystals formation using BBN-SH as a sulfur precursor in both cases. Octanethiol is less reactive precursor, which only activated over 310° C. At high temperature (~310° C.) for activating an octanethiol, cadmium precursors are also very reactive and higher population of satellite nanocrystals can be induced. (TMS)₂S is very reactive under low temperature. Due to their high reactivity, the satellite nanocrystals can be generated easily under the high concentration of precursor. BBN-SH can only react at the activation temperature (100~180° C.) and cadmium precursors are not reactive enough to induce the formation of satellite nanocrystals.

Purification-free One-pot heat-up shell growth defined as synthesizing CdSe cores and growing CdS shell growth in a same reaction vessel without purification. This one-pot heat-up shell growth process has been demonstrated by using BBN-SH as precursor. If the purification step after CdSe core synthesis can be removed during core/shell synthesis process, it will be huge benefit for industrial-scale QD synthesis. We followed the full conversion method to prepare CdSe QD core, which means the reaction yield is almost 100% and no precursors from core synthesis will remain in the reaction pot. After the core synthesis, embodiments herein lowered the temperature of reaction pot and BBN-SH with Lewis base and cadmium precursor was directly injected to the crude CdSe core solution. To confirm the cadmium and selenium precursors are fully converted to CdSe QDs, embodiments herein also slowly heated up the CdSe QD only without BBN-SH precursor. During the heat-up process, only BBN-SH with Lewis base case showed the red-shift of PL peak (indicating CdS shell growth on CdSe QD cores), whereas marginal change of PL peak from CdSe cores. FWHM for BBN-SH case is decreased due to the size focusing during the shell growth process. This result showed that one-pot heat-up growth of CdSe/CdS core/shell QDs can be possible.

Without wishing to be bound by any particular theory, there can be discussion herein of beliefs or understandings of underlying principles or mechanisms relating to embodiments of the disclosure. It is recognized that regardless of the ultimate correctness of any explanation or hypothesis, an embodiment of the disclosure can nonetheless be operative and useful.

References corresponding to above description: (1) Peng, X.; Schlamp, M. C.; Kadavanich, A. V.; Alivisatos, A. P. Epitaxial Growth of Highly Luminescent CdSe/CdS Core/Shell Nanocrystals with Photostability and Electronic Accessibility. *J. Am. Chem. Soc.* 1997, 119 (30), 7019-7029. (2) Chen, O.; Zhao, J.; Chauhan, V. P.; Cui, J.; Wong, C.; Harris, D. K.; Wei, H.; Han, H. S.; Fukumura, D.; Jain, R. K.; et al. Compact High-Quality CdSe-CdS Core-Shell Nanocrystals with Narrow Emission Linewidths and Suppressed Blinking. *Nat. Mater.* 2013, 12 (5), 445-451. (3) Hamachi, L. S.; Yang, H.; Jen-La Plante, I.; Saenz, N.; Qian, K.; Campos, M. P.; Cleveland, G. T.; Rreza, I.; Oza, A.; Walravens, W.; Chan, E. M.; Hens, Z.; Crowther, A. C.; Owen, J. S., Precursor reaction kinetics control compositional grading and size of CdSe₁₋ₓSₓ nanocrystal heterostructures. *Chem. Sci.* 2019, 10 (26), 6539-6552. (4) Hendricks, M. P.; Campos, M. P.; Cleveland, G. T.; Plante, I. J. La; Owen, J. S. A Tunable Library of Substituted Thiourea Precursors to Metal Sulfide Nanocrystals. *Science* (80-.). 2015, 348 (6240), 1226-1230.

The foregoing and other objects and features of the disclosure will become more apparent from the following detailed description, which proceeds with reference to the accompanying figures. Further embodiments, forms, features, aspects, benefits, objects, and advantages of the present application shall become apparent from the detailed description and figures provided herewith.

Example 1A: Temperature Independent, Chemical Modulation of Precursor Reactivity for High Quality Quantum Dot Synthesis Abstract: The optical and electronic performance of quantum dots (QDs) are affected by their size distribution and structural quality. Although the synthetic strategies for size control are well established, no systematic approach yet exists to achieve high structural quality of nanocrystals. Here, embodiments herein show that reaction temperature and precursor reactivity must be independently tuned to grow high-quality nanocrystals. The reactivity of existing precursors is tuned by reaction temperature, preventing the simultaneous optimization of these parameters. To enable temperature-independent modulation of precursor reactivity, embodiments herein designed a new sulfur precursor employing a boron-sulfur bond, whose reactivity can be predictably tuned by adding different Lewis bases. The new precursor chemistry allows the systematic optimization of reaction conditions for high-quality QD growth from cores of various sizes and materials. This work provides critical insights into the nanoparticle growth process and new precursor designs, enabling the systematic preparation of high-quality QD of any sizes and materials.

With their size-dependent electronic properties, solution processability, and synthetic tunability, quantum dots (QDs) have been heavily studied for both fundamental research and commercial applications. Fundamental studies have revealed how the structural parameters of nanocrystals, such as size,[1,2] shape,[3,4] shell thickness,[5,6] and ligands,[7,8,9] influence the electronic structure of QDs. The precise control of the electronic structure of QDs renders them attractive for a broad range of applications, including light-emitting devices,[10,11] quantum information processing,[12,13] and bio-imaging.[14] A critical requirement for high-performance QD devices is a QD material with a well-defined electronic structure, which requires tight size distribution as well as high structural quality. A tight size distribution ensures that each QD has uniform electronic characteristics, resulting in a narrow emission profileww[15] and homogeneous band structure throughout the QD layer.[16] Uniform size also allows for a controlled assembly of nanoparticles into a higher-order structure.[17] Size control of QDs has been extensively studied and a controlled growth based on the LaMer model yields QDs with less than a single monolayer difference in their size variation.[18,19]

Other than the size, the structural quality of nanocrystals also affects the electronic structure of the QD ensemble. The structural quality of crystals is often assessed by crystallinity, morphology, and a controlled interface structure. Crystallinity is a direct measure of the density of lattice defects, which often serve as sub-bandgap trap states.[20] These poorly defined electronic defects promote the non-radiative decay process, negatively impacting the quantum yield (QY) of QDs.[21,22,23] Spherical QDs are often preferred for QD-based devices. Previous studies confirm that spherical QDs yield improved optical and electronic properties compared to faceted QDs both in solution[24] and solid-state devices.[25] Especially for core-shell QDs, the spherical shape ensures uniform shell passivation, resulting in well-confined carrier wave functions.[26] The core-shell interface is another factor affecting the electronic structure of QDs. For instance, a gradient shell creates a soft confinement potential, suppressing non-radiative Auger decay, thereby minimizing blinking.[27,28] Despite the importance of the structural quality, no systematic method exists to grow highly crystalline, spherical QDs having a desired core-shell interface structure.

Instead, the growth condition is mostly optimized by trial and error, and an optimal condition for one QD system cannot be adapted to QDs of different sizes or materials.

A systematic growth of high quality QDs, both core-only and core-shell QDs, requires careful optimization of reaction temperature and precursor reactivity. Reaction temperature governs the surface instability of QDs as well as lattice reconfiguration. High instability of surfaces promotes particle dissolution and undesired alloying of the core-shell materials. To avoid excessively labile surface, growth temperature must be lower than the melting temperature ($T_m$) of nanocrystals. On the other hand, high temperature growth is preferred to promote thermal annealing of defects and kinetically controlled growth, which creates spherical QDs.[5,25] Precursor reactivity is another parameter to be tuned. It governs reaction kinetics at the surface, thereby impacting the crystallinity and morphology of the resulting crystals. Previous studies on thin film growth confirm that the reactivity of precursors greatly affects the quality of the surface; highly reactive precursors produce rough surfaces,[29,30] crystalline defects,[31] or irregular grains.[32,33] For nanocrystal growth, however, precursor reactivity has been mostly considered to achieve size focusing,[34] not to improve the structural quality. These observations emphasize that high quality QD growth requires both reaction temperature and precursor reactivity to be optimized. Unfortunately, existing precursors do not allow temperature-independent tuning of their reactivity, making it difficult to simultaneously vary these two parameters. Recently, researchers have made progress toward a systematic modulation of precursor conversion rate by synthesizing a library of molecules containing different organic substituents.[19,35,36,37] However, this approach is labor intensive and time consuming; furthermore, their reactivity is not optimal for QD growth. Here, embodiments herein introduce a new organoboron-based sulfur precursor whose reactivity can be predictably modulated using commercially available chemical additives. With its ability to fine-tune the precursor reactivity in a temperature-independent manner, the new precursor can serve as a universal precursor for growing high-quality QDs of various materials and sizes.

Results and Discussion:

Design principle of new precursor chemistry: We designed a new sulfur precursor (R—α-SH) to enable the chemical-based modulation of precursor reactivity (FIG. 14A). A α-S bond is employed because the bond length between boron and the adjacent atom can be altered upon the coordination of a Lewis base (LB) to boron.[38] We expect that LBs with a higher affinity to boron weaken the α-S bond to a greater extent, increasing the reactivity of the precursor. The Lewis affinity of organoborons has been characterized by the enthalpy change (LH) upon complex formation between $BF_3$ and LBs.[39] Common LBs for $BF_3$ include amines, amidines, ketones, and ethers. For our studies, pyridine derivatives are used because: 1) embodiments herein can remotely vary the electron donating strength through substituents on the pyridine ring, 2) they have a wide range of $BF_3$ affinities, and 3) they are commercially available. By varying organic substitutes on the pyridine ring with electron donating or electron withdrawing groups, embodiments herein modulate their $BF_3$ affinities significantly (113 kJ·mol$^{-1}$ to 152 kJ·mol$^{-1}$, Table 2). The R group chosen for our precursor is 9-borabicyclo[3.3.1]nonane (BBN). This group is widely used in organoborane chemistry and their locked conformation ensures low steric hindrance around boron. Multigram quantity of the newly designed precursor, 9-mercapto-9-borabicyclo[3.3.1]nonane (BBN-SH), is obtained with 89% yield via simple 1-step synthesis (See methods). We confirmed the coordination of a pyridine derivative, picoline, to the boron atom in BBN-SH by observation of an up-field peak shift in $^{11}B$ NMR (FIG. 19).

Chemical-based modulation of BBN-SH reactivity: We confirmed that the reactivity of BBN-SH precursor can be predictably modulated by varying the $BF_3$ affinity of LBs. Precursor reactivity is characterized by monitoring the temperature at which the CdS shell growth is initiated (FIG. 14B). We referred to this as activation temperature ($T_{act}$). Briefly, a reaction vessel containing CdSe cores, precursors, and LB is slowly heated while monitoring the QD photoluminescence (PL) (FIG. 14C). The growth of CdS shells results in delocalization of the electron wave function into the shell layer, causing a redshift of the PL peak. LBs used for this study include dimethylaminopyridine (DMAP), picoline, 3-chloropyridine (3-ClPy), 4-(trimethylfluoro)-pyridine (4-$CF_3Py$), and 4-cyanopyridine (4-CyPy), in the decreasing order of their $BF_3$ affinity (Table 2). As shown in FIG. 14C, the $T_{act}$ of BBN-SH can be tuned over a wide range (100-200° C.) by adding different LBs. As expected, pyridine derivatives with higher $BF_3$ affinity result in lower $T_{act}$, corresponding to increased reactivity of BBN-SH (FIG. 14D). However, between 4-CyPy and 4-$CF_3Py$, which has a marginal difference in $\Delta H$ (113 vs 115 kJ·mol$^{-1}$), 4-$CF_3Py$ yields higher $T_{act}$. We attribute this reversed trend to steric hindrance by the BBN group. In all cases, the PL of QDs remains narrow (25 nm) during shell growth, indicating highly monodisperse size distribution. We then compared the rate of shell growth at a constant temperature in the presence of different LBs (FIG. 20). As expected, LBs yielding higher reactivity of BBN-SH (or lower $T_{act}$) induce faster shell growth. We verified that non-pyridine based LBs, such as 1,4-diazabicyclo[2.2.2]octane (DABCO), 1-methylpyrolidine, and 1-phenylimidazole, modulate the reactivity of BBN-SH in the same way as the pyridine-based LBs (FIG. 21). Of note, shell growth is not initiated even at high temperatures (>300° C.) in the absence of a LB. This observation reiterates the unique shell growth mechanism of our new precursor chemistry: chemically-induced precursor conversion. In contrast, existing shell growth chemistries involve heat-activated shell growth.

During growth, BBN-SH is quantitatively converted into shells. Shell thickness measured by TEM images matches the expected monolayers (MLs) based on the injected amount of precursors. We then examined whether LB is consumed after precursor conversion. To test this, embodiments herein first deposited a CdS shell on CdSe cores and waited for PL peak shift to the plateau, indicating the termination of shell growth. Then fresh precursors were injected, but the PL of QDs did not change. PL shift is reinitiated upon the injection of fresh picoline, confirming that LBs are consumed during the reaction (FIG. 14E).

Limitations of conventional precursors and suboptimal quality of QDs: High quality shell deposition is achieved when 1) growth is carried out at a temperature that is slightly lower than the $T_m$ of the cores, and 2) precursors exhibit optimal reactivity at a given temperature so that they are efficiently converted into activated solutes and induce controlled, defect-free growth without generating satellite particles. To prevent surface atoms from becoming excessively labile while still promoting effective elimination of structural defects via thermal annealing, the growth temperature should be slightly below the $T_m$ of nanoparticles. Of note, the $T_m$ of nanoparticles varies significantly depending on their size and material (FIG. 22). Accordingly, QDs of various sizes or materials require significantly different growth temperatures. More importantly, it is difficult to find precursors with optimal reactivity due to the limitations of existing precursors. First, no existing precursor exhibits optimal conversion rates at a wide range of temperatures, making it difficult to grow high quality QDs of different sizes and materials using a single precursor. Second, no systematic method exists to identify a precursor that has optimal reactivity at a given reaction temperature, leading to a trial-and-error based selection of precursors. Third, the conversion rate of existing precursors is only controlled by reaction temperature, making it challenging to achieve optimal growth temperature and reactivity simultaneously. Due to these limitations, current synthetic methods fail to grow high quality QDs of a wide range of sizes and materials, for both core-only and core-shell types.

The most commonly used sulfur precursors are octanethiol (OT) and bis(trimethylsilyl)sulfide ($TMS_2S$). OT is well-known to grow highly crystalline and high QY QDs.[5,40] OT grows high quality core-shell QDs from big cores (FIGS. 15A, 15B and 15D). These QDs are highly crystalline and have high QY and narrow FWHM (25 nm). However, the high growth temperature (~300° C.) imposed by the low reactivity of OT limits the application of OT to cores with low $T_m$ (e.g. small CdSe QDs and PbS QDs). As shown in FIGS. 15A-15C, CdS deposition onto small CdSe cores (diameter (d): 1.8 nm, $T_m$: 150° C.) using OT yields QDs with non-uniform shape and size as well as broad emission (FWHM: 37 nm, Table 3). This result indicates that QD growth at a temperature higher than the $T_m$ of cores leads to particle disintegration41 and undesired alloying42 at the core-shell interface, evidenced by a large redshift in PL. FIGS. 15A and 15E show that the QDs grown with OT exhibit significantly larger PL shift than those grown with $TMS_2S$, which produces heterogeneous core-shell structure due to the low temperature growth. Even though $TMS_2S$ allows shell growth at low temperature (100-130° C.), its high reactivity induces uncontrolled growth[29,32] leading to inferior quality crystals (45-61%), broad emission (32-34 nm), non-spherical shape (circularity: <0.5), and low QY (FIGS. 15E-15H). To evaluate the crystallinity of each sample, embodiments herein use the percentage of particles showing clear fringes throughout the entire particles. These examples emphasize the limitation of conventional precursors whose reactivity can only be tuned by reaction temperature.

Systematic growth of high quality shells onto cores of various sizes using BBN-SH: Unlike conventional precursors, the reactivity of BBN-SH can be chemically tuned in a predictable manner and independent of temperature. We optimized the reaction condition by examining the impact of growth temperature and precursor reactivity to the structural quality of QDs. We found that well-controlled growth of shells occurs at a temperature that is 10-20° C. lower than the $T_m$ of cores. At higher temperatures, surface atoms become excessively labile, leading to undesired alloying or dissolution of surface atoms (FIGS. 23A-23G). In comparison, lower temperatures induce uncontrolled shell growth (FIGS. 24A-24E). Precursor reactivity is a parameter that also carries a significant impact on the crystallinity of QDs, but it has been optimized only for size focusing. FIGS. 16A-16F compare QDs that are grown at the same temperature and growth rate but with LBs yielding significantly different $T_{act}$ (4-$CF_3Py$ vs DMAP). The QDs grown with BBN-SH and 4-$CF_3Py$, which initiate shell growth at higher temperature, exhibit remarkably higher crystallinity, more uniform shape, higher QY, tighter size distribution, and narrower FWHM (FIGS. 16A-16F, Table 4). The negative impact of highly reactive precursors (BBN-SH with DMAP) can be partially compensated by slowing down the rate of shell growth; however, even with a 12 fold decrease in precursor injection rate, the quality of the final QDs are significantly worse than those produced using BBN-SH and 4-$CF_3$Py (FIGS. 16C, 16F and 25A-25B). This result emphasizes the difference between the strategies used for size focusing versus quality improvement. For size focusing, the concentration of activated solutes is controlled by adjusting either the reactivity or infusion rate of precursors[34]; however, to improve the structural quality of nanocrystals, optimizing the precursor reactivity itself is crucial. QDs with the best quality are synthesized with a LB yielding $T_{act}$ that is 30° C. lower than the growth temperature (FIGS. 26A-26G). LBs yielding even lower $T_{act}$ produce QDs with non-uniform size and shape, lower QY, and significantly broad FWHM, whereas LBs that yield higher $T_{act}$ result in inefficient growth and lower QY. With appropriate LBs, BBN-SH allows high quality shell growth a wide range of temperature (100-230° C.), covering most QDs of different sizes and materials. This temperature range can be further extended by using different LBs. Of note, a library of thiourea precursors allow shell growth at a limited range of temperature (60-110° C.), which is too low for efficient shell growth, and easily form satellite particles (FIGS. 27A-27B).

Using the optimized growth condition, embodiments herein successfully produced high quality CdSe/CdS QDs from CdSe cores of any sizes with a well-defined core-shell structure (d: 1.8-4.6 nm). FIGS. 15A-15L present the QDs produced from the smallest and biggest cores. Different from conventional precursors (FIGS. 15A-15H), BBN-SH produces QDs with high monodispersity (<5% deviation), narrow emission (FWHM: <25 nm), high crystallinity (92-95%), spherical shape (circularity: >0.8), and high QYs (75-82%) from all size cores (FIGS. 15I-15L, 28A-28C and Table 3). To better evaluate the crystallinity of QDs, embodiments herein analyzed XRD data as well as the TEM images. The FWHM of XRD peaks is negatively correlated to the density of defects. Both the TEM and XRD data confirm that the crystallinity of all QDs created with BBN-SH is comparable with big QDs grown with OT (FIGS. 25A-25B). In comparison, conventional precursors either grow high quality shells only from cores of limited sizes or produce low quality shells, even upon extensive optimization of growth condition (FIGS. 15A-15H).

Detailed QD growth process and its impact on the crystal quality: Close examination of the growth results provides insight into a nanoparticle growth process. FIG. 17 illustrates detailed steps for QD growth. Upon injection, precursors are converted into activated solutes. These solutes are then adsorbed to the QD surface (i). Concurrently, the thermal energy of nanoparticles causes surface atoms to be desorbed (ii). The adsorbed atoms on the surface are then activated; this step often involves ligand cleavage (iii). The activation energy for this process ($E_{a3}$) is dependent on the reactivity of precursors. The activated atoms then undergo surface migration and relaxation (iv). To generate a defect-free and highly crystalline surface, the mean squared diffusion length of adatoms must be long enough so that they settle at an optimal location and configuration.[43] The surface reconfiguration process is quenched upon the collision with other adatoms; this undesired process results in uncontrolled growth (v). Table 1 summarizes the results of suboptimal reaction conditions for shell growth. Excessive heating causes surface desorption to dominate over adsorption, inducing undesired alloying or Ostwald ripening (FIGS.

15A and 15C). High reactivity precursors yields a high density of activated adatoms promoting the undesired quenching of surface relaxation, therefore, producing QDs with irregular shape (FIGS. 16A-16F). Slow infusion of precursors compensates for this negative impact by reducing the density of activated adatoms on the surface; however, insufficient precursor supply causes surface desorption to dominate over adsorption, inducing unstable growth (FIGS. 16C and 16F). Precursors with insufficient reactivity also produce QDs with reduced crystallinity (FIGS. 26A-26G). This is because inefficient growth increases the minimum diffusion length required for defect-free growth, which promotes incomplete surface relaxation. Detailed understanding of the growth process allows a systematic optimization of reaction conditions to produce high quality nanocrystals of various sizes and materials, including non-sulfur-containing QDs and other types of inorganic nanoparticles.

TABLE 1

| Summary of the growth results due to suboptimal reaction conditions | | |
| --- | --- | --- |
| | Low growth temperature | High growth temperature |
| Low prec. reactivity | Inefficient shell growth | Undesired alloying Particle disintigration |
| High prec. reactivity | Uncontrolled shell growth | Optimal for nucleation not for shell growth |

Systematic growth of high quality core-only QDs using BBN-SH: The growth principles established above apply to both core-shell and core-only QDs. We demonstrate that embodiments herein can also grow high quality cores of various materials using the new precursor chemistry. To decouple growth from nucleation, embodiments herein first generated small nuclei, removed unreacted precursors, and initiated growth by adding fresh precursors including BBN-SH and LB. We performed the growth studies with lead sulfide (PbS) and copper indium sulfide ($CuInS_2$) QDs. PbS QDs are promising materials for flexible and low-cost optoelectronics. Due to highly labile surface atoms, the $T_m$ of PbS QDs is particularly low (40-150° C.).[44] Low growth temperature restricts the choice of precursors to highly reactive ones, which often leads to poor crystal quality (FIGS. 29A-29B).[45] A recent study reports that monodisperse PbS QDs with high crystallinity can be prepared by using elemental sulfur and $PbCl_2$, while the lead precursor being in large excess (Pb:S=~24:1).[46,47] In this method, however, >97% of Pb precursors are left unconsumed after QD growth. The multi-step, expensive, overnight purification scheme required for this method limits their applications to large scale synthesis and commercial products. Our new precursor chemistry overcomes this limitation with its capability to efficiently grow high quality PbS QDs with full-conversion of precursors (FIG. 18A). Upon the addition of growth precursors (Pb(oleate)$_2$:BBN-SH:DMAP=1:1:1), the half width at half maximum (HWHM) of the first absorption peak decreases significantly (81 to 42 meV). The HWHM progressively decreases as PbS QDs grow. After growing 3 MLs of PbS, the size distribution of the ensemble becomes close to the homogeneous limit (HWHM: 21 meV). The produced QDs also show high crystallinity, evidenced by clear fringes in TEM images and a narrow XRD peaks (FIG. 30). Due to the full conversion of precursors, the conventional and simple crash-out method is used for purification, greatly simplifying the post-synthesis processing. Note that such quality PbS QDs has not been achieved using the method yielding the full conversion of precursors. We also demonstrate the growth of high quality CuInS$_2$ QDs using our new precursor chemistry. CuInS$_2$ QDs has been recognized as an environmentally-friendly alternative to Cd- or Pb-based QDs with their band gap in the NIR region, a large absorption coefficient, and high photostability.[48,49] FIG. 18B shows a controllable growth of CuInS$_2$ using BBN-SH and 3-ClPy. FIGS. 31A-31B shows that the produced CuInS$_2$ QDs show clear fringes, indicating high quality crystals. Elemental analysis using inductively coupled plasma-optical emission spectrometry (ICP-OES) confirmed the ratio of Cu:In:S remains 1:1:2 after shell growth (Table 6). A relatively broad emission is mainly attributed to the random positioning of the Cu-related defect emitting center.[50] These results emphasize the wide applicability of the BBN-SH chemistry to any sulfur-containing QDs.

Conclusions for Example 1A: We have established a systematic approach to achieve high structural quality QDs. Previously, the crystallinity and morphology of QDs have been improved by trial and error. We show that precursor reactivity and growth temperature are the key parameters that impact the quality of nanocrystals, including their crystallinity, morphology, density of defects, and core-shell interface structure. Growth temperature governs how labile the surface atoms are, while precursor reactivity affects the reaction kinetics on the QD surface. These two parameters must be independently tuned in a systematic manner to create highly crystalline, spherical QDs with minimal defects and a well-controlled core-shell structure. Existing precursors do not allow temperature-independent modulation of their reactivity. Instead, new precursors must be synthesized for different reaction conditions. To address this limitation, we designed a new sulfur precursor, BBN-SH, that has a reactivity that can be chemically tuned in a predictable manner. With LB coordination, BBN-SH covers a broad range of reactivity, allowing their applications at various temperatures. By monitoring the structural quality of the QDs while independently tuning growth temperature and precursor reactivity, we identified the optimal growth condition that can be applied to QDs of different sizes and materials. The detailed understanding of the growth process allows logical tuning of the growth condition. We show that BBN-SH can be universally used to prepare high quality sulfur-containing QDs of various sizes and materials; these QDs have high crystallinity, spherical shape, narrow emission, high QY, excellent monodispersity and a well-defined core-shell interface structure. The QD growth principle established here inspires the design of new precursors for other types of nanoparticles, including non-sulfur based QDs and other inorganic nanoparticles. This study provides a foundation for the controlled growth of high quality nanocrystals.

Methods for Example 1A

Initiation CdS shell growth by picoline and BBN-SH: 50 nmol of CdSe cores (medium CdSe core (535 nm absorption peak)) were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr, then the temperature was dropped to 60° C. For the first round of CdS shell growth, the amount of each Cd or S precursor was calculated for growing 5 ML of CdS shell on the CdSe QD cores. The Cd precursor (0.15 mmol Cd-oleate in ODE) and the S precursor (0.15 mmol of BBN-SH in 1 mL of OAm, and 1 mL of TOP) were injected to the CdSe core solution sequentially. The reaction temperature for the mixture of CdSe cores and shell precursors was heated to 170° C. for 20 min. 0.15 mmol of picoline in 1 mL of ODE was injected for 20 min and CdS shell growth was initiated. The reaction temperature was increased by 15° C. every 5 minutes up to 200° C. The reaction temperature was kept at 200° C. for another 110 min. The temperature was then dropped to 60° C. quickly. For the second round of CdS shell growth, the amount of each Cd or S precursor was calculated for growing additional 2 ML of CdS shell layers. The Cd precursor (0.13 mmol Cd-oleate in ODE) and the S precursor (0.13 mmol of BBN-SH in 1 mL of OAm, and 1 mL of TOP) were injected to the CdSe core solution sequentially. The mixture of CdSe cores and shell precursors was heated at 200° C. for 20 min. 0.13 mmol of picoline in 1 mL of ODE was injected for 10 min and $2^{nd}$ round of CdS shell growth was initiated. The reaction temperature was kept at 200° C. for another 80 min. After the CdS growth, the reaction temperature was dropped to r.t. quickly.

Characterization of the activation temperature ($T_{act}$) upon the addition of different Lewis bases: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr and dropped to 60° C. The amount of each Cd or S precursor was calculated for growing 4 ML of CdS shell on the CdSe QD cores. The Cd precursor (0.11 mmol Cd-oleate in ODE) and the S precursor (0.11 mmol of BBN-SH in 1 mL of OAm, and 1 mL of TOP) were injected to the CdSe core solution sequentially. 0.11 mmol of each chemical initiator (DMAP, picoline, 3-chloropyridine, 4-cyanopyridine, 4-(trifluoromethyl)pyridine, 1-methylpyrollidine, DABCO, and 1-phenylimidazole) was added in the mixture. To determine the $T_{act}$ by different types of activators, the reaction temperature for the mixture of CdSe cores and shell precursors was slowly increased by 10° C. over 20 min and maintained for another 20 min. For thioureas, either N,N'-diphenylthiourea or N-n-hexyl-N'-dodecylthiourea was used as sulfur precursor. The total amount of each Cd or S precursor was calculated for growing 4 ML of CdS shell on the CdSe QD cores. While the temperature profile was kept the same as above, the amount of Cd or S precursors for growing 0.5 ML of CdS shell were added sequentially (in 10 min gap between Cd and S precursor injection) every step of 10° C. increasing in reaction temperature.

References Associated with Example 1A

1. Yin Y, Alivisatos A P. Colloidal nanocrystal synthesis and the organic-inorganic interface. Nature 2005, 437(7059): 664-670.
2. Murray C B, Norris D J, Bawendi M G. Synthesis and characterization of nearly monodisperse CdE (E=sulfur, selenium, tellurium) semiconductor nanocrystallites. J Am Chem Soc 1993, 115(19): 8706-8715.
3. Peng X. Mechanisms for the Shape-Control and Shape-Evolution of Colloidal Semiconductor Nanocrystals. Adv Mater 2003, 15(5): 459-463.
4. Park Y S, Lim J, Klimov V I. Asymmetrically strained quantum dots with non-fluctuating single-dot emission spectra and subthermal room-temperature linewidths. Nat Mater 2019, 18: 249-255.

5. Chen O, Zhao J, Chauhan V P, Cui J, Wong C, Harris D K, et al. Compact high-quality CdSe—CdS core-shell nanocrystals with narrow emission linewidths and suppressed blinking. Nat Mater 2013, 12(5): 445-451.

6. Mahler B, Spinicelli P, Buil S, Quelin X, Hermier J-P, Dubertret B. Towards non-blinking colloidal quantum dots. Nat Mater 2008, 7: 659.

7. Kirkwood N, Monchen J O V, Crisp R W, Grimaldi G, Bergstein H A C, du Fosse I, et al. Finding and Fixing Traps in II-VI and III-V Colloidal Quantum Dots: The Importance of Z-Type Ligand Passivation. J Am Chem Soc 2018, 140(46): 15712-15723.

8. Brown P R, Kim D, Lunt R R, Zhao N, Bawendi M G, Grossman J C, et al. Energy Level Modification in Lead Sulfide Quantum Dot Thin Films through Ligand Exchange. ACS Nano 2014, 8: 5863-5872.

9. Boles M A, Ling D, Hyeon T, Talapin D V. The surface science of nanocrystals. Nat Mater 2016, 15: 141-153.

10. Choi M K, Yang J, Hyeon T, Kim D-H. Flexible quantum dot light-emitting diodes for next-generation displays. Npj Flexible Electron 2018, 2(1): 10.

11. Shirasaki Y, Supran G J, Bawendi M G, Bulović V. Emergence of colloidal quantum-dot light-emitting technologies. Nat Photonics 2012, 7: 13.

12. Aharonovich I, Englund D, Toth M. Solid-state single-photon emitters. Nat Photonics 2016, 10: 631-641.

13. Kloeffel C, Loss D. Prospects for Spin-Based Quantum Computing in Quantum Dots. Annu Rev Condens Matter Phys 2013, 4(1): 51-81.

14. Jin Z, Hildebrandt N. Semiconductor quantum dots for in vitro diagnostics and cellular imaging. Trends Biotechnol 2012, 30: 394-403.

15. Reiss P, Protière M, Li L. Core/Shell Semiconductor Nanocrystals. Small 2009, 5(2): 154-168.

16. Guyot-Sionnest P. Electrical Transport in Colloidal Quantum Dot Films. J Phys Chem Lett 2012, 3(9): 1169-1175.

17. Nagaoka Y, Tan R, Li R, Zhu H, Eggert D, Wu Y A, et al. Superstructures generated from truncated tetrahedral quantum dots. Nature 2018, 561(7723): 378-382.

18. Abe S, Oapek R K, De Geyter B, Hens Z. Tuning the Postfocused Size of Colloidal Nanocrystals by the Reaction Rate: From Theory to Application. ACS Nano 2012, 6(1): 42-53.

19. Hendricks M P, Campos M P, Cleveland G T, Plante I J L, Owen J S. A Tunable library of substituted thiourea precursors to metal sulfide nanocrystals. Science 2015, 348: 1226-1230.

20. Voznyy O, Sargent E H. Atomistic Model of Fluorescence Intermittency of Colloidal Quantum Dots. Phys Rev Lett 2014, 112(15): 157401.

21. Qin W, Liu H, Guyot-Sionnest P. Small Bright Charged Colloidal Quantum Dots. ACS Nano 2014, 8(1): 283-291.

22. Zhao J, Nair G, Fisher B R, Bawendi M G. Challenge to the Charging Model of Semiconductor-Nanocrystal Fluorescence Intermittency from Off-State Quantum Yields and Multiexciton Blinking. Phys Rev Lett 2010, 104(15): 157403.

23. Qin H, Niu Y, Meng R, Lin X, Lai R, Fang W, et al. Single-Dot Spectroscopy of Zinc-Blende CdSe/CdS Core/Shell Nanocrystals: Nonblinking and Correlation with Ensemble Measurements. J Am Chem Soc 2014, 136(1): 179-187.

24. Liu L, Zhuang Z, Xie T, Wang Y-G, Li J, Peng Q, et al. Shape Control of CdSe Nanocrystals with Zinc Blende Structure. J Am Chem Soc 2009, 131(45): 16423-16429.

25. Won Y-H, Cho O, Kim T, Chung D-Y, Kim T, Chung H, et al. Highly efficient and stable InP/ZnSe/ZnS quantum dot light-emitting diodes. Nature 2019, 575(7784): 634-638.

26. Tong X, Kong X-T, Wang C, Zhou Y, Navarro-Pardo F, Barba D, et al. Optoelectronic Properties in Near-Infrared Colloidal Heterostructured Pyramidal "Giant" Core/Shell Quantum Dots. Adv Sci 2018, 5(8): 1800656.

27. Dey S, Chen S, Thota S, Shakil M R, Suib S L, Zhao J. Effect of Gradient Alloying on Photoluminescence Blinking of Single CdSxSe1-x Nanocrystals. J Phys Chem C 2016, 120(37): 20547-20554.

28. Nasilowski M, Spinicelli P, Patriarche G, Dubertret B. Gradient CdSe/CdS Quantum Dots with Room Temperature Biexciton Unity Quantum Yield. Nano Lett 2015, 15: 3953-3958.

29. Liao W, Ekerdt J G. Precursor dependent nucleation and growth of ruthenium films during chemical vapor deposition. Journal of Vacuum Science & Technology A 2016, 34(4): 041514.

30. Methaapanon R, Geyer S M, Lee H-B-R, Bent S F. The low temperature atomic layer deposition of ruthenium and the effect of oxygen exposure. J Mater Chem 2012, 22(48): 25154-25160.

31. Stringfellow G B. Epitaxy. Rep Prog Phys 1982, 45(5): 469-525.

32. Bernal Ramos K, Saly M J, Chabal Y J. Precursor design and reaction mechanisms for the atomic layer deposition of metal films. Coord Chem Rev 2013, 257(23): 3271-3281.

33. Hwang C S. (Ba,Sr)TiO3 thin films for ultra large scale dynamic random access memory: A review on the process integration. Mater Sci Eng, B 1998, 56(2): 178-190.

34. Franke D, Harris D K, Chen O, Bruns O T, Carr J A, Wilson M W B, et al. Continuous injection synthesis of indium arsenide quantum dots emissive in the short-wavelength infrared. Nat Commun 2016, 7(1): 12749.

35. Hamachi L S, Yang H, Jen-La Plante I, Saenz N, Qian K, Campos M P, et al. Precursor reaction kinetics control compositional grading and size of CdSe1-xSx nanocrystal heterostructures. Chem Sci 2019, 10(26): 6539-6552.

36. Ruberu T P A, Albright H R, Callis B, Ward B, Cisneros J, Fan H-J, et al. Molecular Control of the Nanoscale: Effect of Phosphine-Chalcogenide Reactivity on CdS-CdSe Nanocrystal Composition and Morphology. ACS Nano 2012, 6(6): 5348-5359.

37. Gary D C, Glassy B A, Cossairt B M. Investigation of Indium Phosphide Quantum Dot Nucleation and Growth Utilizing Triarylsilylphosphine Precursors. Chem Mater 2014, 26(4): 1734-1744.

38. Momeni M R, Shulman L, Rivard E, Brown A. Interplay of donor-acceptor interactions in stabilizing boron nitride compounds: insights from theory. Phys Chem Chem Phys 2015, 17(25): 16525-16535.

39. Laurence C, Gal J F. The BF3 Affinity Scale. Lewis Basicity and Affinity Scales. Wiley: New Jersey, US, 2009, pp 85-109.

40. Shen H, Bai X, Wang A, Wang H, Qian L, Yang Y, et al. High-Efficient Deep-Blue Light-Emitting Diodes by Using High Quality ZnxCd1-xS/ZnS Core/Shell Quantum Dots. Adv Funct Mater 2014, 24(16): 2367-2373.

41. Rossinelli A A, Riedinger A, Marqués-Gallego P, Knüsel P N, Antolinez F V, Norris D J. High-temperature growth of thick-shell CdSe/CdS core/shell nanoplatelets. Chem Commun 2017, 53(71): 9938-9941.

42. Garcia-Santamaria F, Brovelli S, Viswanatha R, Hollingsworth J A, Htoon H, Crooker S A, et al. Breakdown of Volume Scaling in Auger Recombination in CdSe/CdS Heteronanocrystals: The Role of the Core-Shell Interface. Nano Lett 2011, 11(2): 687-693.

43. Murphy T E, Walavalkar S, Phillips J D. Epitaxial growth and surface modeling of ZnO on c-plane $Al_2O_3$. Appl Phys Lett 2004, 85(26): 6338-6340.

44. Keitel R C, Weidman M C, Tisdale W A. Near-Infrared Photoluminescence and Thermal Stability of PbS Nanocrystals at Elevated Temperatures. J Phys Chem C 2016, 120(36): 20341-20349.

45. Zhang J, Gao J, Miller E M, Luther J M, Beard M C. Diffusion-Controlled Synthesis of PbS and PbSe Quantum Dots with in Situ Halide Passivation for Quantum Dot Solar Cells. ACS Nano 2014, 8(1): 614-622.

46. Weidman M C, Beck M E, Hoffman R S, Prins F, Tisdale W A. Monodisperse, Air-Stable PbS Nanocrystals via Precursor Stoichiometry Control. ACS Nano 2014, 8: 6363-6371.

47. Moreels I, Lambert K, Smeets D, De Muynck D, Nollet T, Martins J C, et al. Size-Dependent Optical Properties of Colloidal PbS Quantum Dots. ACS Nano 2009, 3(10): 3023-3030.

48. Zang H, Li H, Makarov N S, Velizhanin K A, Wu K, Park Y-S, et al. Thick-Shell $CuInS_2$/ZnS Quantum Dots with Suppressed "Blinking" and Narrow Single-Particle Emission Line Widths. Nano Lett 2017, 17(3): 1787-1795.

49. Jara D H, Yoon S J, Stamplecoskie K G, Kamat P V. Size-Dependent Photovoltaic Performance of $CuInS_2$ Quantum Dot-Sensitized Solar Cells. Chem Mater 2014, 26(24): 7221-7228.

50. Knowles K E, Hartstein K H, Kilburn T B, Marchioro A, Nelson H D, Whitham P J, et al. Luminescent Colloidal Semiconductor Nanocrystals Containing Copper: Synthesis, Photophysics, and Applications. Chem Rev 2016, 116(18): 10820-10851.

Example 1B: Supporting Information for Example 1A

(See also FIGS. 19-31B.)
Materials and Methods:

Materials: n-tetradecylphosphonic acid (TDPA, 97%), oleylamine (OAm, 70%), 1-octadecene (ODE, 90%), trioctylphosphine oxide (TOPO, 99%), trioctylphosphine (TOP, 97%), oleic acid (OA, 90%), hexadecylamine (HDA, 90%), diphenylphosphine (DPP, 98%), 4-(dimethylamino)pyridine (DMAP, 99%), picoline (99%), 3-chloropyridine (99%), 4-cyanopyridine (98%), 1,4-diazabicyclo[2.2.2]octane (DABCO, 99%), 1-methylpyrolidine (98%), 1-phenylimidazole (97%), hydrogen sulfide solution (0.8 M in tetrahydrofuran), octanethiol (OT, 98.5%), diphenyl ether (99%), lead(II) oxide (99.999%), trifluoroacetic anhydride (99%), trifluoroacetic acid (99%), aniline (99%), phenyl isothiocyantate (98%), indium(III) acetate (99.99%), copper(I) iodide (99.999%), dodecanethiol (DDT, >98%), and 9-borabicyclo [3.3.1]nonane dimer were purchased from Sigma Aldrich. 4-(trifluoromethyl)pyridine (99%) was purchased from Oakwood Chemical. Selenium shot, cadmium oxide (CdO, 99.999%), and hexyl isothiocyanate (97%) were purchased from Alfa Aesar. Tributylphosphine (TBP) was purchased from Strem Chemicals. Bis(trimethylsilyl)sulfide ($(TMS)_2S$) and dodecylamine (98%) were purchased from Acros Organics. All reagents were used as received unless noted. Toluene was prepared by a solvent purification system (SPS). Other solvents were of reagent grade or higher and were used without further purification. 1.5 M trioctylphosphine selenide (TOP-Se) was prepared by dissolving 0.15 mmol of selenium shot in 100 mL of TOP under inert atmosphere and stirring vigorously overnight, forming a 1.5 M TOPSe solution. BBN-SH, Pb(oleate)$_2$, 1,3-diphenylimidazolidine-2-selenone (Se-Im(Ph$_2$)), and N,N'-diphenylthiourea were synthesized using the previously reported method.[1,2] All air sensitive materials were handled in a glove box under dry nitrogen atmosphere with oxygen levels <0.1 ppm.

TEM measurement: Samples for TEM were prepared by dropping on a TEM grid and drying highly concentrated pure QDs in the mixture of chloroform and toluene. TEM images were acquired using JEOL 2010 LaB6 operating at 200 kV in the Frederick Seitz Materials Research Laboratory Central Research Facilities at UIUC.

XRD measurement: Samples for XRD were prepared by dropping and drying highly concentrated pure QDs in hexane on quartz holder. XRD patterns were acquired using a Rigaku MiniFlex 600 in the George L. Clark X-Ray Facility and 3M Materials Laboratory at UIUC. The instrument was equipped with a Cu Kα line (λ=1.5406 Å) X-ray source operating at 40 kV, 15 mA and scattering signals were collected in θ-2θ scan mode in 3~100° 2θ range with 0.4° min$^{-1}$ scanning speed.

Pb(oleate)$_2$ synthesis: Pb(oleate)$_2$ was synthesized using a previously reported method.[1] 22.4 mmol (5.00 g) of lead(II) oxide and 10 mL of acetonitrile are mixed in a 100 mL round bottom flask. The suspension is stirred while being cooled in an ice bath for 5 minutes. 4.48 mmol (0.35 mL, 0.2 eq to lead(II) oxide) of trifluoroacetic acid and 22.4 mmol (3.1 mL, 1 eq to lead(II) oxide) of trifluoroacetic anhydride were added to the round bottom flask. The yellow lead oxide was dissolved, resulting in a clear and colorless lead trifluoroacetate solution that is allowed to warm to room temperature for 20 minutes. To another 250 mL round bottom flask, 45.2 mmol (12.78 g, 2.02 eq to lead(II) oxide) of oleic acid, 90 mL of isopropanol, and 50.6 mmol of triethylamine (5.12 g, 2.26 eq to lead(II) oxide) are added. The lead trifluoroacetate solution is then added to the oleic acid solution slowly with stirring, resulting in the formation of a white precipitate. The mixture is heated to dissolve the precipitate and results in a clear and colorless solution. The clear solution allowed to slowly cool to room temperature for 1 hour, followed by further cooling in a −20° C. freezer overnight. The resulting white powder is isolated by suction filtration using a glass fritted funnel. The filtrate thoroughly washed with 300 mL of methanol three times. The white powder is dried under vacuum for 6 hours. The resulted Pb(oleate)$_2$ powder is stored in a nitrogen-filled glovebox. The yield of Pb(oleate)$_2$ powder was 16.4 g (95%).

9-mercapto-9-borabicyclo[3.3.1]nonane (BBN-SH) synthesis: 9-mercapto-9-borabicyclo[3.3.1]nonane (BBN-SH) was synthesized using a previously reported method.[3] Under the inert gas environment, 10 mmol (2.44 g) of 9-borabicyclo[3.3.1]nonane (9-BBN) dimer was placed in a flask. 50 mL of toluene was freshly purified by SPS and added in the flask. The flask with the mixture of 9-BBN and toluene was sealed and connected under a nitrogen flow from Schlenk line. 25 mL of H$_2$S solution (0.8 M in tetrahydrofuran) was added slowly to the flask and heated up to 80° C. After the solution become clear, the solution was refluxed overnight. The residual solvent was removed by rotary evaporation. Pure BBN-SH (2.72 g, 89%) was isolated by vacuum sublimation. $^1$H NMR (ppm, CDCl$_3$, 400 MHz): δ=3.71 (s, H, —SH), 2.20-1.13 (m, 14H, —BC$_8$H$_{14}$); $^{11}$B NMR (ppm, CDCl$_3$, 400 MHz): δ=61.2 (s).

Synthesis of N,N'-diphenylthiourea: N,N'-diphenylthiourea was synthesized using a previously reported method.[1]

Briefly, 30 mmol (2.79 g) of aniline in 10 mL of toluene and phenyl isothiocyanate (4.06 g, 30 mmol) in another 10 mL of toluene were mixed, resulting in a white powder. Toluene was removed by a rotary evaporator. Residual toluene was removed under vacuum for 2 hours. Yield: 6.71 g (98%). $^1$H NMR (ppm, $C_6D_6$, 400 MHz): $\delta$=7.01 (m, 10H, —$C_6H_5$), 7.59 (s, 2H, NH).

Synthesis of N-n-hexyl-N'-dodecylthiourea: N-n-hexyl-N'-dodecylthiourea was synthesized using a previously reported method.[1] Briefly, 30 mmol (5.56 g) of dodecylamine in 10 mL of toluene and hexyl isothiocyanate (4.30 g, 30 mmol) in another 10 mL of toluene were mixed, resulting in a white powder. Toluene was removed by a rotary evaporator. Residual toluene was removed under vacuum for 2 hours. Yield: 9.39 g (95%). $^1$H NMR ($C_6D_6$, 400 MHz): $\delta$=0.86 (t, 3H, —$CH_3$), 0.91 (t, 3H, —$CH_3$), 1.11-1.40 (m, 28H, $(CH_2)_{10}$ and $(CH_2)_4$), 3.21 (b, 4H, —$CH_2$), 5.42 (b, 2H, NH).

Quantum yield (QY) measurement: QYs of CdSe/CdS QDs were measured relative to rhodamine 560, rhodamine 640, and cresyl violet 670. Fluorescence spectra of QD and dye were taken under identical spectrometer conditions in triplicate and averaged. The optical density was kept below 0.1 between 300 and 700 nm, and the integrated intensities of the emission spectra, corrected for differences in index of refraction and concentration, were used to calculate the quantum yields using the expression QY QD QD=$QY_{Dye}$×(absorbance$_{dye}$/absorbance$_{QD}$)×(peak area$_{QD}$/peak area$_{Dye}$)×($n_{QD}$ solvent)$^2$/($n_{Dye}$ solvent)$^2$ (n: refractive index of each solvent).

Core synthesis: CdSe cores with 455 nm first absorption peak (small size) were synthesized using a previously reported method.[4] To summarize, 0.44 mmol (60 mg) of CdO, 0.88 mmol (0.2475 g) of TDPA, 5 mL of ODE, and 2 g of HDA were placed in 25 mL round bottom flask. The solution was degassed for 1 hr at 100° C. and heated to 310° C. under nitrogen until the CdO dissolved and formed a clear homogenous solution. 4.5 mL of TOP, 0.3 mmol (55.9 mg) of DPP, and 2 mL of 1.5 M TOPSe solution was rapidly injected. The cores were then grown further at 270° C. to produce cores with 455 nm for the first absorption feature.

CdSe cores with 535 nm first absorption peak (medium size) were synthesized using a previously reported method.[4] To summarize, 0.44 mmol (60 mg) of CdO, 0.88 mmol (0.2475 g) of TDPA, 9.56 mmol (3.70 g) of TOPO were placed in 25 mL round bottom flask. The solution was degassed for 1 hr at 120° C. and heated to 320° C. under nitrogen until the CdO dissolved and formed a clear homogenous solution. 1 mL of TOP was injected and the solution was reheated to 330° C. under nitrogen. 1.5 mL of 1.5 M TOP-Se solution was rapidly injected. The cores were then grown further at 280° C. to produce cores with 535 nm for the first absorption feature.

CdSe cores with 580 nm first absorption peak (big size) were synthesized using a previously reported method.[4] To summarize, 0.44 mmol (60 mg) of CdO, 0.88 mmol (0.2475 g) of TDPA, 9.56 mmol (3.70 g) of TOPO were placed in 25 mL round bottom flask. The solution was degassed for 1 hr at 120° C. and heated to 320° C. under nitrogen until the CdO dissolved and formed a clear homogenous solution. 1 mL of TOP was injected and the solution was reheated to 350° C. under nitrogen. 1.5 mL of 1.5 M TOP-Se solution was rapidly injected. The cores were then grown further at 280° C. to produce cores with the 580 nm for the first absorption feature.

Evaluation of the melting temperature of CdSe QD cores: 50 nmol of CdSe cores (small cores: 1.8 nm (in diameter), medium: 3.6 nm, big: 4.6 nm) were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr. To determine the melting temperature, the reaction temperature for the CdSe cores and shell precursors was slowly increased by 10° C. over 20 min and maintained for another 20 min.

Identification of the optimal activation temperature for the shell growth: CdS shell growth on medium size CdSe core (535 nm absorption peak) using BBN-SH. 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr. The temperature was increased to 170° C. The amount of each Cd or S precursor was calculated for growing 7 ML of CdS shell on the CdSe QD cores. The Cd precursor (0.28 mmol Cd-oleate in 6 mL of ODE) and the S precursor (0.28 mmol of BBN-SH in 0.28 mmol of 3-chloropyridine, 1 mL of OAm, 0.95 mL of TOP, and 4 mL of ODE) were slowly injected (3 mL/hr) to the CdSe core solution simultaneously. The reaction temperature was maintained for 10 min and increased by 5° C. every 5 minutes up to 200° C. The reaction temperature was kept at 200° C. for another 80 min. After the 2 hr precursor injection, the reaction vessel was cooled down to r.t. For the picoline case, all parameters were the same as above. For the 4-cyanopyridine case, the reaction temperature was kept at 190° C. and increased 5° C. by every 15 minutes up to 200° C. Other parameters were the same as above.

CdS shell growth kinetics study: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr and dropped to 60° C. The amount of each Cd or S precursor was calculated for growing 7 ML of CdS shell on the CdSe QD cores. The Cd precursor (0.28 mmol Cd-oleate in ODE) and the S precursor (0.28 mmol of BBN-SH in 1 mL of OAm, and 1 mL of TOP) were injected to the CdSe core solution sequentially. The reaction temperature for the mixture of CdSe cores and shell precursors was brought to 170° C. and maintained for 20 min. 0.28 mmol of each chemical initiator (DMAP, picoline, 3-chloropyridine) in 0.5 mL OAm was added in the mixture. For the control sample, no chemical initiator was added. To determine the CdS shell growth kinetics by different types of activators, the reaction temperature was kept at 170° C. and the emission spectrum (the peak wavelength and FWHM of the photoluminescence spectrum) was recorded every 10 min.

CdS shell growth on small size CdSe core (455 nm absorption peak) using BBN-SH: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr. The amount of each Cd or S precursor was calculated for growing 7 ML of CdS shell on the CdSe QD cores. The Cd precursor (0.15 mmol Cd-oleate in 6 mL of ODE) and the S precursor (0.15 mmol of BBN-SH in 0.15 mmol of DMAP, 1 mL of OAm, 1 mL of TOP, and 4 mL of ODE) were slowly injected (3 mL/hr) to the CdSe core solution simultaneously. The reaction temperature was maintained for 10 min, then increased by 5° C. every 5 minutes up to 130° C. The reaction temperature was kept at 130° C. for another 80 min. After the 2 hr precursor injection, the reaction vessel was cooled down to r.t. To assess how the reaction temperature impacts on the quality of resulted core/shell QDs, [BBN-SH:picoline] pair used at 140-170° C. or [BBN-SH:3-ClPy] pair used at 170-200° C. while keeping all other procedures the same as above.

CdS shell growth on medium size CdSe core (535 nm absorption peak) using BBN-SH: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr. The temperature was increased to 170° C. The amount of each Cd or S precursor was calculated for growing 7 ML of CdS shell on the CdSe QD cores. The Cd precursor (0.28 mmol Cd-oleate in 6 mL of ODE) and the S precursor (0.28 mmol of BBN-SH in 0.28 mmol of 3-chloropyridine, 1 mL of OAm, 0.95 mL of TOP, and 4 mL of ODE) were slowly injected (3 mL/hr) to the CdSe core solution simultaneously. The reaction temperature was maintained for 10 min, then increased by 5° C. every 5 minutes up to 200° C. The reaction temperature was kept at 200° C. for another 80 min. After the 2 hr precursor injection, the reaction vessel was cooled down to r.t.

CdS shell growth on big size CdSe core (580 nm absorption peak) using BBN-SH: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr. The temperature was increased to 200° C. The amount of each Cd or S precursor was calculated for growing 7 ML of CdS shell on the CdSe QD cores. The Cd precursor (0.41 mmol Cd-oleate in 6 mL of ODE) and the S precursor (0.41 mmol of BBN-SH in 0.41 mmol of 4-(trifluoromethyl)pyridine, 1 mL of OAm, 0.9 mL of TOP, and 4 mL of ODE) were slowly injected (3 mL/hr) to the CdSe core solution simultaneously. The reaction temperature was maintained for 10 min, then increased by 5° C. every 5 minutes up to 230° C. The reaction temperature was kept at 230° C. for another 80 min. After the 2 hr precursor injection, the reaction vessel was cooled down to r.t. To assess how the precursor reactivity impacts on the quality of resulted core/shell QDs, [BBN-SH:DMAP] pair used for 2 hr precursor injection or [BBN-SH:DMAP] pair used for 24 hr precursor injection while keeping all other procedures the same as above.

CdS shell growth on small size CdSe core (455 nm absorption peak) using (TMS)$_2$S: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr. The amount of each Cd or S precursor was calculated for growing 7 ML of CdS shell on the CdSe QD cores. The Cd precursor (0.15 mmol Cd-oleate, 0.3 mmol of OAm, and 5.9 mL of TOP)

and the S precursor (0.15 mmol of (TMS)$_2$S in 6 mL of TOP) were slowly injected (3 mL/hr) to the CdSe core solution simultaneously. The reaction temperature was maintained for 10 min, then increased by 5° C. every 5 minutes up to 130° C. The reaction temperature was kept at 130° C. for another 80 min. After the 2 hr precursor injection, the reaction vessel was cooled down to r.t.

CdS shell growth on small size CdSe core (455 nm absorption peak) using octanethiol: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr. The temperature was increased to 240° C. The amount of each Cd or S precursor was calculated for growing 7 ML of CdS shell on the CdSe QD cores. The Cd precursor (0.15 mmol Cd-oleate in 6 mL of ODE) and the S precursor (0.15 mmol of octanethiol in 6 mL of ODE) were slowly injected (3 mL/hr) to the CdSe core solution simultaneously. The reaction temperature was increased by 7° C. every in 1 minute up to 310° C. The reaction temperature was kept at 310° C. for another 110 min. After the 2 hr precursor injection, the reaction vessel was cooled down to r.t.

CdS shell growth on big size CdSe core (580 nm absorption peak) using (TMS)$_2$S: 50 nmol of CdSe cores isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr. The temperature was increased to 130° C. The amount of each Cd or S precursor was calculated for growing 7 ML of CdS shell on the CdSe QD cores. The Cd precursor (0.41 mmol Cd-oleate, 0.82 mmol of OAm in 5.7 mL of TOP) and the S precursor (0.41 mmol of (TMS)$_2$S in 6 mL of TOP) were slowly injected (3 mL/hr) to the CdSe core solution simultaneously. The reaction temperature was maintained for 10 min, then increased by 5° C. every 5 minutes up to 130° C. The reaction temperature was kept at 130° C. for another 80 min. After the 2 hr precursor injection, the reaction vessel was cooled down to r.t.

CdS shell growth on big size CdSe core (580 nm absorption peak) using octanethiol: 50 nmol of CdSe cores isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr. The temperature was increased to 240° C. The amount of each Cd or S precursor was calculated for growing 7 ML of CdS shell on the CdSe QD cores. The Cd precursor (0.41 mmol Cd-oleate in 6 mL of ODE) and the S precursor (0.41 mmol of octanethiol in 6 mL of ODE) were slowly injected (3 mL/hr) to the CdSe core solution simultaneously. The reaction temperature was increased by 7° C. every in 1 minute up to 310° C. The reaction temperature was kept at 310° C. for another 110 min. After the 2 hr precursor injection, the reaction vessel was cooled down to r.t.

PbS QDs synthesis and PbS QDs size tuning with BBN-SH: PbS QD cores were synthesized by using a previously reported method with modification.[1] Briefly, 0.11 mmol (88 mg) of Pb(oleate)$_2$, 0.22 mmol (65 mg) of OA, and 2 mL of ODE were degassed under 100° C. for 1 hr. 0.76 mmol (17 mg) of N,N'-diphenylthiourea in 300 μL of diphenyl ether was injected at 95° C. Nucleation is started within 60 seconds. After 2 minutes for growing further PbS QD cores, the heating mantle was removed and the reaction vessel was cooled down quickly to room temperature. Crude PbS QDs were purified by adding toluene and ethyl acetate (toluene: ethyl acetate=1:3 (v/v)) 2 times. The concentration of PbS QD was determined by the absorbance at 400 nm, where the extinction is proportional to the concentration of PbS QDs for different sizes of PbS QDs.[5] 50 nmol of PbS QD cores were transferred in 3 mL of OAm and 3 mL of ODE. The reaction solution was degassed under vacuum at 100° C. for 1 hr and the temperature was kept at 100° C. The Pb precursor (0.21 mmol Pb(oleate)$_2$ in 6 mL of ODE) and the S precursor (0.21 mmol of BBN-SH in 0.21 mmol of DMAP, 1 mL of OAm, 0.9 mL of TOP, 4 mL of ODE) were slowly injected (3 mL/hr) to the PbS QD solution simultaneously. The reaction temperature was maintained for 10 min and increased by 10° C. every 10 minutes up to 130° C. After the precursor injection for 2 hrs, the reaction vessel was cooled down to r.t.

CuInS$_2$ QD synthesis and tuning the size of CuInS$_2$ QDs with BBN-SH: CuInS$_2$ QD cores were synthesized by using a previously reported method with modification.[6] Briefly, 0.5 mmol (95 mg) of copper(I) iodide and 0.5 mmol (146 mg) of indium (III) acetate, and 3 mL of dodecanethiol (DDT) were employed as precursors and solvent. 1.5 g of OA and 2 mL of ODE were also added. Under vacuum, the reaction was heated for 30 min at 100° C. Then the temperature was raised to 220° C. After 10 minutes of growing further CuInS$_2$ QDs cores, the heating mantle was removed and the reaction vessel was cooled down quickly to room temperature. Crude CuInS$_2$ QDs were purified by adding acetone and methanol 2 times. 50 nmol of CuInS$_2$ QD cores were transferred in 3 mL of OAm and 3 mL of ODE. The reaction solution was degassed under vacuum at 100° C. for 1 hr and the temperature was kept at 170° C. The Cu and In precursor (0.11 mmol Cu(oleate), 0.11 mmol In(oleate)$_3$ in 6 mL of ODE) and the S precursor (0.11 mmol of BBN-SH in 0.11 mmol of 4-ClPy, 1 mL of OAm, 0.9 mL of TOP, 4 mL of ODE) were slowly injected (3 mL/hr) to the CuInS$_2$ QD solution simultaneously. The reaction temperature was kept for 10 min and increased by 10° C. every 10 minutes up to 200° C. After the precursor injection for 2 hr, the reaction vessel was cooled down to r.t.

TABLE 2

BF3 affinity scale for pyridine-based Lewis bases

| | Dimethyl-aminopyridine (DMAP) | Picoline | 3-chloropyridine (3-ClPy) | 4-(trimethylfluoro) pyridine (4-CF$_3$Py) | 4-cyanopyridine (4-CyPy) |
|---|---|---|---|---|---|
| Lewis base | | | | | |
| ΔH (kJ mol$^{-1}$) | 152 | 134 | 119 | 115 | 113 |

45

TABLE 3

Summary of the optical and physical properties of CdSe/CdS QDs grown with different precursors (BBN-SH, OT, and (TMS)$_2$S).

| Precursor type | Core size | Core PL peak (nm) | Core/shell PL peak (nm) | FWHM (nm) | QY (%) | Size (±std dev) (nm) | Circularity (±std dev) |
|---|---|---|---|---|---|---|---|
| BBN-SH | (sm)-CdSe | 474 | 536 | 25 | 75 | 6.3 (±0.3) | 0.80 (±0.08) |
| | (bg)-CdSe | 590 | 627 | 24 | 82 | 9.1 (±0.4) | 0.84 (±0.09) |
| (TMS)$_2$S | (sm)-CdSe | 474 | 538 | 34 | 48 | N/A | 0.50 (±0.18) |
| | (bg)-CdSe | 590 | 627 | 32 | 51 | N/A | 0.44 (±0.21) |
| Octanethiol | (sm)-CdSe | 474 | 607 | 37 | 83 | N/A | 0.44 (±0.17) |
| | (bg)-CdSe | 590 | 634 | 25 | 92 | 9.3 (±0.8) | 0.82 (±0.12) |

TABLE 4

Figure 3:
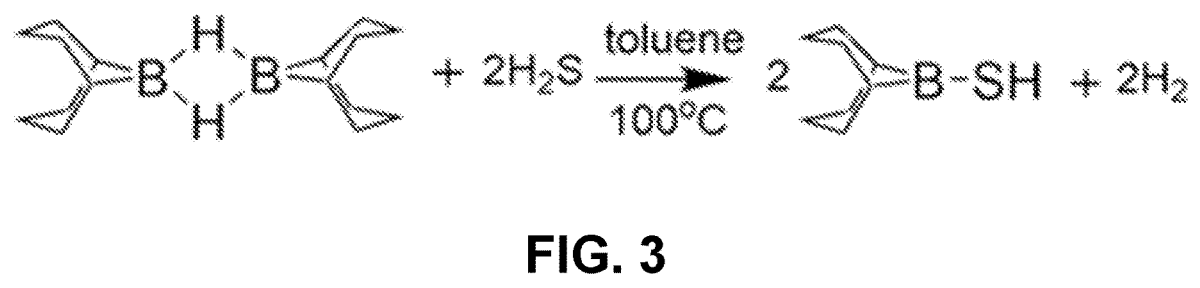

Summary of the optical and the structural quality the QDs in FIG. 3.. High reactivity precursor results in QDs with low QY, broad FWHM and uncontrolled shape and size. Slower infusion (12X) of the high reactivity precursor partially compensates the negative impact of suboptimal reactivity, however, the resulting QDs have significantly inferior structural quality compared to the QDs grown at the optimal condition.

| Precursor reactivity | PL peak (nm) | FWHM (nm) | Size distribution (%) | QY (%) | Crystallinity (%) |
|---|---|---|---|---|---|
| Optimal | 627 | 24 | 5 | 82 | 92 |
| High | 627 | 33 | 21 | 51 | 27 |
| High (12 times slower injection) | 627 | 27 | 15 | 65 | 73 |

TABLE 5

Temperature profile for shell deposition for the QDs presented in FIGS. 15A-15L.

| CdSe QD | Reaction temperatures (° C.) | | |
|---|---|---|---|
| core size | BBN-SH | Octanethiol | (TMS)$_2$S |
| Small core | 100-130 | 240-310 | 100-130 |
| Medium core | 170-200 | 240-310 | 100-130 |
| Big core | 200-230 | 240-310 | 100-130 |

TABLE 6

Atomic ratio of Cu:In:S found in the resulted CuInS2 QDs determined by ICP-OES

| | Element | | |
|---|---|---|---|
| | Cu | In | S |
| Experimental value (at %) | 24.8 | 24.5 | 50.7 |
| Theoretical value (at %) | 25.0 | 25.0 | 50.0 |

References Associated with Example 1B
(Supporting Information to Example 1A)

1. Hendricks M P, Campos M P, Cleveland G T, Plante I J L, Owen J S. A Tunable library of substituted thiourea precursors to metal sulfide nanocrystals. *Science* 2015, 348: 1226-1230.

2. Hamachi L S, Yang H, Jen-La Plante I, Saenz N, Qian K, Campos M P, et al. Precursor reaction kinetics control compositional grading and size of CdSe1-xSx nanocrystal heterostructures. Chem Sci 2019, 10(26): 6539-6552.

3. Köster R, Seidel G, Siebert W, Gangnus B. In: Grimes R N (ed). Inorganic Syntheses, vol. 29. Wiley: New Jersey, US, 1992, pp 60-69.

4. Han H-S, Devaraj N K, Lee J, Hilderbrand S A, Weissleder R, Bawendi M G. Development of a Bioorthogonal and Highly Efficient Conjugation Method for Quantum Dots Using Tetrazine-Norbornene Cycload-dition. J Am Chem Soc 2010, 132(23): 7838-7839.

5. Moreels I, Lambert K, Smeets D, De Muynck D, Nollet T, Martins J C, et al. Size-Dependent Optical Properties of Colloidal PbS Quantum Dots. ACS Nano 2009, 3(10): 3023-3030.

6. Jara D H, Yoon S J, Stamplecoskie K G, Kamat P V. Size-Dependent Photovoltaic Performance of CuInS$_2$ Quantum Dot-Sensitized Solar Cells. Chem Mater 2014, 26(24): 7221-7228.

Example 2A: Nanocrystal Precursor Incorporating Separated Reaction Mechanisms for Nucleation and Growth to Unleash the Potential of Heat-Up Synthesis Abstract: A heat-up method for quantum dots (QDs) synthesis holds unique benefits for large-scale production with its simplicity, scalability, and high reproducibility. Its applications, however, have been limited because it inevitably yields a strong overlap between the nucleation and growth stages. We addressed this long-standing problem by introducing a new type of precursor having separated reaction paths for nucleation and growth. Unlike existing precursors, which employs a shared intermediate for both reactions, 9-mercapto-9-borabicyclo[3.3.1]nonane (BBN-SH) induces growth via surface-assisted conversion and drives nucleation via cluster formation in solution. Furthermore, this precursor chemistry embeds an efficient mechanism to suppress nucleation during growth. As such, BBN-SH allows heat-up-based growth of high-quality shells that are comparable to those created by the injection method. It is also notable that BBN-SH-based heat-up synthesis shows mitigated sensitivity to temperature fluctuation; therefore, it is highly suitable for industrial-scale reactions. We established a simple, scalable, and economic scheme for core/shell QDs by streamlining quantitative core synthesis and heat-up-based shell growth and showed that the new scheme produces QDs of comparable quality to those produced by the traditional method. Here, embodiments herein introduce a new type of precursor that drives a new mode of nanoparticle growth. We anticipate our study to inspire the design of other new precursors that can unleash the full potential of heat-up synthesis.

The unique optical properties of quantum dots (QDs) have led to their incorporation in a variety of technologies: displays,[1] solid-state lighting,[2] biological imaging,[3] quantum information processing,[4] and photovoltaics.[5] Recently, QD-containing displays and light bulbs have been commercialized[6-8] and more QD-based devices, such as QD-based light-emitting diodes[9] and photovoltaics[10], are being explored for their commercial potential. Most QD-based-devices require core/shell QDs due to their enhanced stability, high brightness, surface passivation, and well-defined charge carrier wave-functions.[11,12] Extensive efforts have been made to produce high-quality core/shell quantum dots and II-VI core/shell QDs can now be prepared to have near unity quantum yield (QY) and an emission linewidth as narrow as a single dot linewidth.[13-15] However, all these schemes involve an injection-based method, which holds inherent limitations for industrial-scale production. The quality of QDs synthesized using the injection-based method is highly sensitive to mixing capacity, detailed temperature profile, and injection rate. Unfortunately, these parameters are either limited or not well-controlled during large-scale synthesis. Additionally, the well-regulated delivery of precursors requires an expensive and complex apparatus, increasing the production cost. Heat-up synthesis has been explored as a promising alternative due to its scalability, simplicity, and minimal batch-to-batch variation. In this scheme, all reagents are loaded into a vessel at room temperature, followed by subsequent heating of the reaction solution to initiate nucleation and growth. The absence of injection steps alleviates the sensitivity to mixing limitations and removes the uncertainty in heat management during injection. Furthermore, the heat-up method enables the use of a simple apparatus without regulated injection ports. Despite its potential, the heat-up approach has not been widely adopted due to the difficulty in identifying reaction conditions that effectively separate reaction stages: nucleation, core growth, and shell growth. Overlap between these stages produce QDs that are highly polydisperse.[16,17] As a result, conventional precursor chemistry requires dedicated and extensive optimization to produce monodisperse QDs during heat-up synthesis.

A number of studies show that monodisperse core-only QDs can be produced by carefully balancing the nucleation and growth rates using appropriate precursors, additives, and heating rates.[18-22] The reported reaction conditions, however, are not generalizable and only applicable to specific materials or sizes. Heat-up-based synthesis of core/shell QDs requires even more strict conditions to effectively separate nucleation, core growth, and shell growth processes. Limited studies achieved this criterion by loading core and shell precursors that have vastly different reactivity[23,24]; the rapidly converting precursors contribute to core synthesis, followed by shell deposition with low reactivity precursors. However, in the heat-up setting, it is extremely hard to achieve complete separation of core growth from shell growth. The reaction condition and precursors that achieve sequential growth are selected mostly by trial-and-error and those protocols are highly restricted to QDs of certain materials and dimensions. In addition, these schemes suffer from satellite particle formation. When using the heat-up method, complete inhibition of secondary nucleation is difficult, especially during thick shell growth, which requires a large amount of shell precursors to be loaded.[13,25] Continuous activation of these precursors during heating produces a high concentration of activated solutes, increasing the risk of secondary nucleation. In general, satellite particle formation can be reduced by adding ligands that increase the critical nucleation size for shell precursors[26] or by using shell precursors with a very low conversion rate.[13] However, most of these strategies are not applicable to heat-up synthesis. Changing ligands alters the reaction kinetics of both cores and shells, perturbing the delicate balance established for the sequential growth of cores and shells. Additionally, using precursors that have slow conversion requires an impractically long growth time. The inability to completely separate core and shell growth induces undesired alloying. As such, the core/shell interface structure (e.g., abrupt vs. gradient shell or the degree of the gradient) is hard to control during heat-up synthesis. Lastly, once a delicate balance is achieved among core and shell precursors, further optimization of reaction conditions is almost impossible, making it difficult to further improve the crystal quality of QDs.

We aim to achieve a new mode of nanoparticle growth by using a precursor that inherently separates growth from nucleation. Physical separation of the reaction stages will unleash the full potential of heat-up synthesis. The biggest challenge in conventional heat-up synthesis is balancing the conflicting reaction conditions required at different stages. Synchronous nucleation requires a rapid accumulation of activated solutes and fast nucleation rate, while controlled shell growth requires a slow generation of activated solutes with a minimal nucleation rate. By developing a nanoparticle growth method that is completely decoupled from nucleation regardless of concentration, embodiments herein establish a sequential heat-up synthesis. In this new scheme, nucleation and growth will be driven using different precursors and the reaction kinetics of each stage will be independently optimized. This approach is particularly useful for core/shell synthesis, which requires complete separation of the shell growth step from the nucleation and core growth steps. Numerous precursors have been reported that achieve rapid nucleation upon heating, allowing their usage for the nucleation stage; however, no precursor chemistry yet exists that effectively precludes nucleation during growth even at high precursor concentration. For conventional precursors, both nucleation and growth processes share the same intermediate (activated solutes) and nucleation is triggered when the concentration of activated solutes exceeds the "critical concentration" (FIG. 32A).[16] Therefore, nucleation and growth are hard to decouple, especially during heat-up-based growth, which requires a high concentration of precursors. To successfully implement an isolated growth stage during heat-up synthesis, it is necessary to utilize a new precursor chemistry that has separate reaction paths for nucleation and growth and can activate each path at significantly different reaction conditions (FIG. 32B). The new type of precursor will allow high-temperature shell growth and thick shell deposition, which are commonly used strategies to improve the optical quality and stability of QDs. High-temperature growth is known to produce high-quality shells via thermal annealing[9,15]. Thick shells are used to decouple surface states from the core exciton[27] and to suppress the nonradiative Auger recombination process.[28] These reaction conditions, however, have been avoided for the heat-up method as they induce a high concentration of activated solutes, increasing the risk of secondary nucleation.

Here, embodiments herein show that our designed precursor has the separated reaction paths for nucleation and growth and employs an effective mechanism suppressing nucleation. This precursor enables nucleation-free growth even at high concentrations, allowing one to implement an isolated growth stage during heat-up synthesis. By completely separating the shell growth stage from the nucleation and core growth stages, reaction conditions can be systematically optimized without affecting the reaction kinetics of other stages. Using this precursor and optimized reaction conditions, we successfully deposited high-quality shells on various cores, whose quality is comparable to those grown using the conventional injection method. Finally, we report a simple, economical, and scalable synthesis method for core/shell QDs that employs the heat-up-based shell growth scheme. This new scheme eliminates the need for continuous delivery of shell precursors, therefore greatly simplifying the synthesis processes for core/shell QDs and improving reproducibility.

Results and Discussion:

Conventional precursors produce suboptimal quality shells during heat-up synthesis: QD synthesis involves two stages: nucleation and growth. Separation of these reaction stages is critical to achieve monodisperse QDs. In other words, synchronous nucleation, followed by well-controlled growth, produces QDs with narrow size distributions. In conventional injection-based methods, these stages are effectively separated. A short, burst-like nucleation stage is driven by the swift injection of precursors into a hot reaction solution.[29] Rapid cooling due to large volume injection and immediate consumption of activated solutes terminates nucleation. For shell growth, shell precursors are slowly injected into the reaction vessel containing purified cores, allowing easy manipulation of precursor concentration in the vessel. However, the heat-up method involves the upfront loading of precursors and continuous heating of the reaction vessel. Accordingly, the concentration of activated solutes is often high, leading to continuous nucleation and undesired alloying. Secondary nucleation is especially prominent during thick shell growth, which requires a large amount of shell precursors, and during high-temperature growth, which increases the conversion rate of precursors. FIG. 33 presents the typical results of heat-up-based shell growth using conventional precursors. For this Example, we deposited CdS shells on premade CdSe cores using conventional sulfur precursors: bis(trimethylsilyl)sulfide ((TMS)$_2$S), octanethiol, or N-n-hexyl-N'-dodecylthiourea. For all cases, we used cadmium oleate (Cd(oleate)$_2$) as a cadmium precursor. To synthesize CdSe cores, a typical hot injection method was used[30] and unreacted precursors were removed using a precipitation-based cleanup method (crash out). After mixing CdSe cores with the desired amount of shell precursors, the reaction vessel is slowly heated up (See method for detail). Initially, we used a temperature profile that is adapted from the commonly used injection method.[13,15,30] The emission spectra of nanoparticles after shell growth clearly show that multiple types of particles are produced; CdS QDs (420-500 nm) are produced via secondary nucleation, CdSe$_x$S$_{1-x}$ QDs (500-550 nm) are produced via alloying, and heterostructure CdSe/CdS QDs (~600 nm) are produced via sequential growth of cores and shells (green box, FIG. 33). Even after extensive optimization of growth temperature and heating rate, a complete suppression of secondary nucleation was either impossible or impractical. Low reaction temperatures and slow heating rates are also required to prevent nucleation during growth, but these conditions yield unreasonably long reaction times or inefficient growth. For all precursors, secondary nucleation still occurred even after optimization (magenta box, FIG. 33). More importantly, the TEM images show that the produced QDs have irregular shapes and low crystallinity, indicating uncontrolled growth due to the high concentration of activated solutes. These results emphasize the importance of developing new precursors that have distinct reaction paths for nucleation and growth. With these new precursors, nucleation and growth can be efficiently separated during heat-up synthesis, enabling the controlled growth of high-quality shells like those from the injection-based synthesis.

BBN-SH/LB chemistry has separated reaction paths for nucleation and growth and embeds a mechanism to suppress nucleation: We recently designed a new sulfur precursor employing a boron-sulfur bond (9-mercapto-9-borabicyclo [3.3.1]nonane, BBN-SH) to achieve temperature-independent modulation of precursor reactivity.[31] The new precursor is designed so that the coordination of a Lewis base (LB) to boron weakens the boron-sulfur bond, assisting the bond cleavage. The degree of bond weakening is positively related to the boron affinity of a LB, allowing controlled modulation of precursor reactivity. Here, embodiments herein characterize detailed reaction mechanisms for BBN-SH/LB chemistry and show that it satisfies all the criteria presented in FIG. 32B. For this study, various subsets of BBN-SH, picoline (as a LB), Cd(oleate)$_2$, and CdSe cores are incubated at different temperatures and their reactions are closely monitored using NMR, absorption spectroscopy, and mass spectroscopy. FIG. 34 summarizes the proposed mechanism based on our observation. This scheme illustrates that BBN-SH chemistry has distinctive reaction paths for nucleation and growth and embeds an effective mechanism for nucleation suppression.

In BBN-SH/LB chemistry, shell growth occurs via surface assisted cleavage of the α-S bond with the help of a LB.

Incubation of CdSe cores with BBN-SH, picoline, and Cd(oleate)$_2$ at growth temperature (T$_{growth}$, 170° C.) leads to CdS shell growth, evidenced by the redshift of the absorption profile (FIG. 35A). The picoline-assisted cleavage of the α-S bond produces BBN-picoline as a byproduct, which is confirmed by a peak at 214.2 in the matrix-assisted laser desorption ionization mass spectrum (MALDI/MS, FIG. 35A). As expected, shell growth does not occur in the absence of LB (FIG. 35B). We then used $^{11}$B NMR to characterize the detailed molecular transformation occurring in the reaction solution (FIGS. 36A-36B). Addition of picoline to BBN-SH induces a strong upfield shift (61 to 42 ppm) due to the coordination of picoline to boron (black and blue, FIG. 36A). The dative nature of this bond is confirmed by the reversion of this shift upon heating (FIG. 41). This coordination is quite strong and prevents the formation of a BBN-SH:Cd(oleate)$_2$ complex, a product that is formed in the absence of LB (green and magenta, FIG. 36A). Notably, the presence of Cd(oleate)$_2$ does not alter the strength of the dative bond between picoline and BBN-SH (blue and green, FIG. 36A). During the shell growth, the α-S bond of BBN-SH:picoline complex is cleaved, depositing the sulfur atom on the surface. Surprisingly, in the absence of CdSe cores, BBN-SH:picoline complex remains intact even after prolonged incubation at T$_{growth}$ (blue and green, FIG. 36A). This result proves that at T$_{growth}$, the conversion of BBN-SH only occurs on the QD surface, not in free solution. The absorption and mass spectra reiterate this observation; after heating BBN-SH, picoline, and Cd(oleate)$_2$ without CdSe cores, no change is observed in the absorption spectrum and the BBN-picoline peak is not observed in the mass spectrum (FIG. 35C). Exclusive conversion of BBN-SH on the QD surface contradicts the conventional mechanism for precursor conversion, where precursors are converted into activated solutes in solution that contribute to growth.

While shell growth progresses via direct conversion of BBN-SH on the surface, it is likely that nucleation involves the formation of sulfur-cadmium clusters in solution. Thus, we examined a mechanism for cluster formation in BBN-SH chemistry. The $^{11}$B NMR experiment shows that mild heating of BBN-SH and Cd(oleate)$_2$ produces a stable Cd-S cluster at 100% conversion efficiency (FIG. 36B). The mass spectrum confirms the existence of a single cluster species, which has the molecular weight (MW) of 1068.4 (FIG. 36B). Its isotope pattern indicates the presence of multiple cadmium atoms in the cluster. Based on the mass information, the chemical formula of this cluster is identified as (BBN-SH-Cd)$_4$. FIGS. 42A-42B confirm that a simulated mass spectrum of (BBN-SH-Cd)$_4$ matches well with the isotope pattern of the cluster. To identify the chemical structure of the cluster, various NMR experiments were performed. Addition of Cd(oleate)$_2$ to BBN-SH at room temperature induces a significant upfield shift (61 to 33 ppm), indicating the coordination of cadmium to boron (black & magenta, FIG. 36A). Upon heating, the peak is shifted even further (16 ppm) and becomes broader (magenta, FIG. 36A). This upfield shift suggests the spa hybridization of boron while the broad peak width indicates asymmetric bonds around boron. We then performed $^{113}$Cd NMR with and without hydrogen decoupling to determine whether the cluster contains a Cd-H bond. As shown in FIG. 43, hydrogen decoupling does not change the peak width, implying the absence of a Cd-H bond. Similarly, the results from H decoupling experiments on $^{11}$B NMR suggest the absence of a α-H bond (FIG. 44). FIG. 36B presents the chemical structure of (BBN-SH-Cd)$_4$ determined from these observations. The mass peak corresponding to this cluster (MW: 1068.4) always appears after heating BBN-SH and Cd(oleate)$_2$, regardless of the presence of LB or QD cores and even when the reaction does not yield shell growth or nucleation (FIGS. 45A-45D). However, the peak intensity of the cluster is orders of magnitudes lower for the samples containing picoline, indicating that LB efficiently suppresses the formation of (BBN-SH-Cd)$_4$ (FIG. 36B).

Next, embodiments herein show that (BBN-SH-Cd)$_4$ cluster mediates nucleation and the reaction path leading to nucleation is effectively suppressed in growth conditions. The cluster itself is highly stable even at exceedingly high temperatures. The absorption spectra show that the cluster remains intact even after incubation at 330° C. for 4 hours (FIG. 35D). The addition of LB induces nucleation via LB-assisted cleavage of BBN-group; however, this nucleation process is only spontaneous at a temperature that is significantly higher than T$_{growth}$. Nuclei formation is confirmed by strong absorption in the 300-450 nm range, where CdS QDs absorb, as well as the BBN-LB peak in the mass spectrum (MW: 214.2, FIG. 35E). We previously showed that the temperature that initiates the conversion of BBN-SH (T$_{act}$) varies significantly depending on the boron affinity of LB.[31] However, in all cases, nucleation is activated at a temperature that is at least 90° C. higher than T$_{act}$ (FIG. 35F). The big difference between the nucleation and growth temperatures allows effective separation of these two reactions. BBN-SH/LB chemistry embeds an additional mechanism to suppress nucleation during growth. The NMR results demonstrate that LB strongly inhibits the formation of (BBN-SH-Cd)$_4$, a critical intermediate for nucleation. FIG. 36A shows that in the presence of picoline and Cd(oleate)$_2$, entire BBN-SH remains as BBN-SH:picoline complex even after incubation at T$_{growth}$ for 4.5 hours. Similarly, the addition of picoline to preformed (BBN-SH-Cd)$_4$ induces the cluster dissolution, producing BBN-SH:picoline complex (FIG. 46). Lastly, we show that (BBN-SH-Cd)$_4$ formation is the rate-limiting step for nucleation. To test this hypothesis, we induced nucleation from either preformed (BBN-SH-Cd)$_4$ versus a regular growth mixture containing BBN-SH, LB, and Cd(oleate)$_2$. As shown in FIG. 35F, the precursor mixture solution initiates nucleation at a significantly higher temperature than the solution containing the preformed clusters. This result is consistent with our previous observation that the majority of BBN-SH remains as BBN-SH:LB complex in the presence of LB (FIGS. 36A and 47). These results prove that nucleation requires the formation of (BBN-SH-Cd)$_4$ and this nucleation pathway is efficiently suppressed in the presence of LB. Accordingly, BBN-SH/LB chemistry achieves nucleation-free growth at a wide range of temperatures regardless of its concentration.

Heat-up-based growth of high-quality shells using BBN-SH: With its unique reaction mechanism, BBN-SH/LB chemistry achieves nucleation-free and controlled shell growth during heat-up synthesis. The absorption and emission spectra taken during the deposition of CdS shells on CdSe cores are presented in FIGS. 37A-37C. The spectra continuously evolve to higher wavelengths without any evidence of CdS formation (FIG. 37A). Both the sharp first absorption feature and the narrow, symmetric emission profile are well-maintained during shell growth. The FWHM of the emission peak decreases progressively (110 to 86 meV), indicating size focusing (FIG. 37B). The amount of precursors added to this experiment corresponds to 7 monolayers (MLs) of CdS shell growth. Size analysis based on TEM images suggests the quantitative conversion of shell precursors (see method for details). Complete conversion of precursors is especially beneficial for industrial-scale synthesis, because it ensures high reproducibility and predictability in wavelength targeting, eliminates the need for extensive purification, and reduces the cost of reagents. It is also worth mentioning that BBN-SH-based heat-up method grows CdS shells as fast as the injection-based shell growth method. So far, heat-up synthesis of core/shell QDs has involved particularly slow shell growth to achieve a sequential growth of cores and shells in a single step and to prevent secondary nucleation. Unfortunately, this strategy inevitably yields impractically long reaction times. By enabling fast, nucleation-free shell growth, BBN-SH makes the heat-up approach a viable option for core/shell QD synthesis. We reaffirm the surface-assisted conversion of precursors during shell growth by comparing the shell growth kinetics at different concentrations of precursors. As shown in FIG. 37C, the precursor concentration does not affect how fast the shell grows. If precursor conversion occurs in solution, precursors at a higher concentration will generate a proportionally higher concentration of activated solutes, yielding faster growth. The surface limited growth with strong inhibition of the nucleation path drives well-regulated growth for shells, producing spherical and highly crystalline QDs (FIGS. 38A-38I). This result contrasts with the QDs produced using the conventional precursors, which suffer from uncontrolled growth due to a high concentration of activated solutes (FIG. 33). Here, we show that the surface-assisted shell growth by BBN-SH addresses the long-standing problem of a strong overlap between nucleation and growth in heat-up synthesis and produces monodisperse and high-quality core/shell QDs.

An additional unique benefit of our nucleation-free growth chemistry is the ability to tune the reaction conditions for high-quality shell growth. Previous to this work, reaction conditions were optimized just to balance the nucleation and growth rates so that only synchronous nucleation and a decent separation of nucleation and growth could be achieved during the single-step heat-up synthesis. This optimization is itself challenging because the precursor proceeds through the same reaction intermediate for both nucleation and growth. As such, this leaves almost no room for optimizing the reaction conditions to improve other characteristics as well, such as the crystallinity of shells and the core/shell interface structure. In contrast, our BBN-SH/LB chemistry effectively separates growth from nucleation at a wide range of temperatures and enables a systematic optimization of reaction temperature and precursor reactivity for high-quality shell growth.[31] These traits are also crucial to tune growth conditions for different cores and for constructing a desired core/shell interface structure (e.g., heterostructure or alloyed interface). For instance, cores of different sizes or materials require different growth conditions due to their different melting temperatures. Reaction conditions optimized for cores with a high melting temperature (e.g., big cores[31] or InP QDs[9]) often induce Ostwald ripening or undesired alloying for cores with a low melting temperature (e.g., small cores[31] or Ag$_2$S QDs[32]). But BBN-SH/LB chemistry, with its allowance for extensive modulation of growth conditions during heat-up synthesis, can serve as a universal precursor for the heat-up-based shell growth of various cores.

Using the optimized growth condition, we successfully produced high-quality CdSe/CdS QDs from CdSe cores of various sizes (d: 1.8-4.6 nm, FIGS. 38A-38I). For all these samples, 7 MLs of CdS shells are deposited. The detailed growth condition for each core is summarized in the method. After shell growth, QDs have narrow emission linewidth (<25 nm), tight size distribution (<7%), high quantum yields (QY, >70%), high crystallinity (>90%), and spherical shape (circularity: >0.8). The crystallinity of each sample is evaluated by counting the percentage of particles showing clear fringes throughout the entire particles. Table 7 compares the structural and optical qualities of CdSe/CdS QDs grown with optimized vs. unoptimized reaction conditions. Both reaction temperature and precursor reactivity impact the quality of nanocrystals. As described in our previous study, QDs that are grown with optimized versus suboptimal conditions, embodiments herein demonstrate the importance of tuning reaction conditions to prepare high-quality QDs. BBN-SH precursor drives a new shell growth mode that allows an extensive modulation of reaction conditions without inducing secondary nucleation. Moreover, its reduced sensitivity to temperature variation makes BBN-SH ideal for large-scale, heat-up synthesis.

TABLE 7

Summary of the optical and structural properties of CdSe/CdS QDs grown with different reaction conditions for heat-up synthesis.

| Core size | Reaction condition | Core PL peak (nm) | Core/shell PL peak (nm) | FWHM (nm) | QY (%) | QY w/ post-treat (%) | Size (±std dev) (nm) | Circularity (±std dev) | Crystallinity (%) |
|---|---|---|---|---|---|---|---|---|---|
| Small CdSe | Optimized (100° C., DMAP) | 474 | 537 | 25 | 69 | 83 | 6.4 (±0.4) | 0.80 (±0.07) | 91 (273/300) |
| | Suboptimal LB (100° C., DABCO) | 474 | 525 | 32 | 59 | 67 | 5.4 (±0.9) | 0.69 (±0.15) | 68 (204/300) |
| | Suboptimal T (160° C., DMAP) | 474 | 539 | 26 | 64 | 71 | 6.3 (±0.6) | 0.74 (±0.10) | 83 (249/300) |
| Medium CdSe | Optimized (140° C., 3-ClPy) | 541 | 595 | 25 | 72 | 87 | 8.2 (±0.5) | 0.84 (±0.09) | 94 (282/300) |
| | Suboptimal LB (140° C., DMAP) | 541 | 597 | 27 | 63 | 70 | 8.3 (±1.5) | 0.64 (±0.18) | 74 (222/300) |
| | Suboptimal T (230° C., 3-ClPy) | 541 | 596 | 25 | 70 | 75 | 8.4 (±1.3) | 0.66 (±0.15) | 71 (213/300) |
| Big CdSe | Optimized (200° C., 4-CF$_3$Py) | 590 | 626 | 24 | 73 | 90 | 9.1 (±0.6) | 0.79 (±0.10) | 87 (261/300) |
| | Suboptimal LB (200° C., DMAP) | 590 | 627 | 26 | 65 | 71 | 9.4 (±1.6) | 0.62 (±0.19) | 80 (240/300) |
| | Suboptimal T (260° C., 4-CF$_3$Py) | 590 | 630 | 26 | 65 | 73 | 9.3 (±1.2) | 0.67 (±0.14) | 81 (243/300) | reaction temperature governs the instability of the QD surface as well as the level of lattice relaxation, while precursor reactivity impacts the reaction kinetics at the surface.[31] Accordingly, the QDs produced with suboptimal LB pairs have lower QY, worse crystallinity, broader emission linewidth, more irregular shape and larger size variations (FIGS. 48A-48I and Table 7). Suboptimal growth temperature also negatively impacts the crystallinity, shape, QY, emission linewidth, and monodispersity of QDs. The selection criteria for LB and reaction conditions are described in the method. Interestingly, for BBN-SH, growth temperature has a less prominent impact on shell qualities compared to the choice of LB, which alters precursor reactivity. This result is due to the ligand function of BBN-SH. With its thiol moiety, BBN-SH binds strongly to the QD surface and lowers surface energy. As a result, BBN-SH coated QDs do not participate in Ostwald ripening without LB and maintain their original emission linewidth even at high temperatures (>330° C.) (FIG. 49). Similarly, the instability of the QD surface due to excessive heating during shell growth is mitigated for the QDs coated with BBN-SH. Consequently, the QY, size distribution, shape uniformity, and emission linewidth of the resulting QDs are not as sensitively affected by growth temperature as they are by variations in precursor reactivity. The reduced sensitivity of QD qualities to temperature profiles is especially beneficial for industry-scale reactions (Table 8). In a large scale reaction, it is difficult to achieve precise control of reaction temperature and to avoid temperature gradients within the solution; therefore, BBN-SH/LB chemistry, which has a higher tolerance for temperature variation than existing precursors, is expected to produce higher quality QDs via large-scale heat-up synthesis. By comparing the quality of Heat-up-based shell growth using BBN-SH produces core/shell QDs whose quality is comparable to those from injection-based synthesis: We then compared the optical and structural qualities of CdSe/CdS QDs produced using the heat-up-based shell growth method to those produced by the continuous injection of shell precursors (FIGS. 39A-39D and Table 9). In contrast to this study, the heat-up approach has previously produced inferior quality shells than the injection method due to uncontrolled growth induced by a high concentration of activated solutes. But, our new precursor, BBN-SH, achieves surface-limited and well-controlled growth even during heat-up synthesis; therefore, we expect that BBN-SH based heat-up synthesis will produce shells that have the comparable structural quality to those prepared by the injection method. The crystal quality of shells can be evaluated by either analyzing their TEM images or examining the photophysical properties of QDs. The photoluminescence (PL) decay profile and blinking statistics are sensitively affected by the structural quality of core/shell QDs.[33,34] For instance, structural defects often serve as electronic defects, promoting nonradiative decay, resulting in the prominent multi-exponential components of PL decay.[35,36] Electronic traps or defects also enhance charge trapping, increasing the frequency and duration of the "off" state.[37,38] For comparison, CdS shells on CdSe cores are prepared using either heat-up or injection-based method. The same reaction mixtures are used for both cases (BBN-SH, 4-(trifluoromethyl)pyridine, Cd(oleate)$_2$, and 4.6 nm CdSe cores) while the temperature profiles are independently optimized (see method for details). FIGS. 39A-39D present representative data from our photophysical studies. The PL decay profile of the two samples strongly overlaps, as seen in FIG. 39A; they are nearly single exponential and have almost identical PL lifetimes (19.16 ns for heat-up vs.

18.99 ns for injection-based, the order is maintained for the respective comparison of other properties). The emission profiles of these samples are also comparable, as shown in FIG. 39B (FWHM: 24 nm vs. 24 nm, QY: 73% vs. 82%). We then compared the detailed blinking statistics of each sample. FIGS. 50A-50B shows a representative blinking trace of a QD from each sample. The average fraction of time that each QD stays ON during the measurements of the two samples, average ON-time fractions (eon), was extracted from more than 50 blinking traces per sample, each from a different QD (FIGS. 39C-39D). The heat-up and injection samples show similar ON-time distribution, and identical (Don (86%). We also compared the structural quality of the heat-up and injection samples. Analysis of the TEM images reveals that the QDs produced by the heat-up or injection method show similar variations in size (7% vs. 4%) and shape (circularity: 0.79 vs. 0.84). The detailed comparison is summarized in Table 9. These results show that BBN-SH based heat-up method grows shells of comparable quality to those grown with the continuous injection method, while the QDs prepared by the injection method show slightly higher QY.

Purification-free, single vessel synthesis of high-quality core/shell QDs using quantitative nucleation and heat-up-based shell growth: Taking advantage of BBN-SH-based heat-up method, embodiments herein established a simple and economical synthesis scheme to produce high-quality core/shell QDs. This scheme streamlines full-conversion core production and heat-up-based shell growth (FIG. 40A). This new scheme possesses unique benefits over the conventional synthesis scheme for core/shell QDs, which comprises three separate steps (core synthesis, purification, and injection-based shell deposition (FIGS. 51A-51B). Firstly, the quantitative conversion of core precursors eliminates the need for a core purification step, making this scheme less labor-intensive, economical, and highly reproducible. Especially for II-IV QDs, core synthesis often employs precursors that react sluggishly at high temperature for controlled growth. In this case, the size of cores is controlled by terminating the growth; therefore, a purification step is required prior to shell growth to remove unreacted precursors. The purification methods[39,40] are often irreproducible, result in a substantial yield loss, and consume an excessive amount of solvents. Additionally, a purification condition established for small scale reactions is often not applicable for large-scale reactions. Thus, the streamlined core/shell synthesis is more suitable for industry-scale production. Secondly, heat-up-based shell growth reduces production cost, simplifies manufacturing protocols and apparatus, and improves reproducibility. So far, shell growth is achieved by slowly administering shell precursors into a hot reaction solution. This scheme adds complexity in reactor designs and induces uncertainty in heat management during the injection. Furthermore, limited mixing in large reaction vessels can reduce the quality of shells. A preloading of shell precursors will address these limitations. As described, the established scheme is expected to generate QDs of consistent quality even in large-scale reactions; therefore, it will be useful for industrial-scale synthesis.

This new scheme produces core/shell QDs that have comparable structural and optical qualities to those created using the commonly used injection-based method. FIGS. 40B-40C present the evolution of the absorption and emission spectra during CdSe/CdS QD synthesis using the established scheme. For core synthesis, embodiments herein utilized the selenourea-based chemistry because it produces monodisperse QDs at full conversion and also allows controllable modulation of their size by varying the substitute.[13] The completion of nuclei growth is confirmed by a halted evolution of the absorption spectrum. The reaction vessel is then cooled to 60° C. and shell precursors (BBN-SH, 3-chloropyridine, and $Cd(oleate)_2$) are added to the vessel. Subsequent heating of the vessel initiates shell growth. Shell growth is monitored by examining the absorption spectrum of the reaction solution. When the absorption profile stops evolving, which indicates the completion of shell growth, heating is stopped. Both the absorption and emission spectra indicate well-controlled growth of shells without satellite particle formation (FIG. 40B). The progressive decrease of the emission linewidth during shell growth indicates size focusing (FIG. 40C). The TEM images of the final CdSe/CdS QDs (3.6 nm/7 MLs) show that they are monodisperse (6% deviation in size), spherical (circularity: 0.85), and highly crystalline (88% of particles showing clear fringes) (FIG. 40D). These QDs have high optical quality as well (FWHM of PL: 25 nm and QY: 72%). We then compared the structural and optical qualities of these QDs to the QDs prepared using the conventional three-step method. For a fair comparison, the same precursors, ligands, and solvent are used. Table 10 summarizes the optical and structural characteristics of these two QD samples (streamlined vs. 3-step). As expected, the structural and optical qualities of these two samples are highly comparable; they have identical levels of size variation (6% for streamlined vs. 6% for 3-step, the order is maintained for the respective comparison of other properties); They are both highly spherical (circularity: 0.85 vs. 0.82), and crystalline (88% vs. 90%); the FWHM of their emission spectra is also identical (25 nm vs. 25 nm); the QDs produced using the 3-step method have a slightly higher QY (79%) than those synthesized using the streamlined method (72%). Additionally, the comparison between these two samples also proves that the new, streamlined scheme produces heterostructure core/shell QDs. Compared to the conventional scheme, which employs a physically separated shell growth step, the streamlined core/shell synthesis achieves sequential growth of cores and shells in the same reaction vessel. As a result, unreacted core precursors could contribute to the formation of an alloyed interface. However, both schemes produce core/shell QDs having nearly identical emission spectra, proving that the streamlined scheme also produces heterostructure core/shell QDs. These results indicate that the newly established purification-free, single vessel methods can replace the traditional three-step method.

Conclusion for Example 2A: Despite the apparent advantages for large scale production of QDs, heat-up synthesis has not been widely used. Its application has been limited due to a strong overlap between the nucleation and growth stages, which causes satellite particle formation and low-quality QDs. BBN-SH is the first QD precursor that has well-separated reaction paths for nucleation and growth, thereby addressing the inherent limitation of heat-up synthesis. In this chemistry, the growth occurs exclusively on the surface via surface-assisted cleavage of the α-S bond, while nucleation requires the formation of $(BBN-SH-Cd)_4$ in solution. Importantly, nucleation and growth occur at significantly different temperature ranges and the formation of $(BBN-SH-Cd)_4$ is strongly suppressed in the presence of LB. Accordingly, BBN-SH/LB chemistry enables the complete separation of the nucleation and growth stages during heat-up synthesis. Such separation allows extensive tuning of growth conditions to improve shell qualities. Besides, the reactivity of BBN-SH can be controllably tuned by adding different LBs. By independently varying precursor reactivity and reaction temperature, the optimal growth condition can be systematically identified for various cores. Using the optimized condition, we successfully deposited shells that have comparable structural and optical qualities to those produced using the highly controlled, injection-based method. Furthermore, the mitigated sensitivity of BBN-SH-based shell growth to temperature variations render the new precursor highly suitable for large-scale heat-up synthesis. Taking advantage of BBN-SH based heat-up growth, embodiments herein established a new, easily scalable synthesis scheme for core/shell QDs. This scheme streamlines full-conversion core synthesis and heat-up-based shell growth in a single reaction vessel. The absence of a purification step and bulk delivery of shell precursors greatly simplify the reaction protocol and apparatus. These properties also make the method rather resilient to mixing limitations and uncertainties in heat management during large-scale reactions. We show that the streamlined scheme produces QDs of comparable structural and optical qualities to those produced by the conventional three-step scheme. Our study emphasizes the importance of developing new precursors that have separated reaction paths for nucleation and growth. Those precursors drive a new mode of shell growth via surface-limited conversion of precursors. By inhibiting secondary nucleation and inducing well-controlled shell deposition regardless of concentration, they allow high-quality QD synthesis even with the heat-up approach. The chemical insight obtained from BBN-SH/LB chemistry can be further extended to design other new precursors for heat-up synthesis. The new type of precursors will unleash the full potential of heat-up synthesis, enabling a simple, economical, and reliable method that yields high reproducibility in large-scale reactions. In addition, it will inspire the development of a synthesis scheme that yields scale-independent reaction outcomes.

Methods for Example 2A:

Materials: n-tetradecylphosphonic acid (TDPA, 97%), oleylamine (OAm, 70%), 1-octadecene (ODE, 90%), trioctylphosphine oxide (TOPO, 99%), trioctylphosphine (TOP, 97%), oleic acid (OA, 90%), hexadecylamine (HDA), diphenylphosphine (DPP, 98%), 4-(Dimethylamino)pyridine (DMAP, 99%), 4-methylpyridine (picoline, 99%), 1,4-diazabicyclo[2.2.2]octane (DABCO, 99%), 3-chloropyridine (3-ClPy, 99%), hydrogen sulfide solution (0.8 M in tetrahydrofuran), octanethiol (OT, 98.5%), diphenyl ether (99%), triethyl orthoformate (98%), N,N'-diphenyl ethylenediamine (98%), dodecylamine (99%), hexyl isothiocyanate (95%), and 9-borabicyclo[3.3.1]nonane dimer were purchased from Sigma Aldrich. 4-(trifluoromethyl)pyridine (4-CF$_3$Py, 99%) was purchased from Oakwood Chemical. Selenium shot, cadmium oxide (CdO, 99.999%), and Celite Hyflo Supercel (filter aid) were purchased from Alfa Aesar. Bis(trimethylsilyl)sulfide ((TMS)$_2$S) was purchased from Acros Organics. All reagents were used as received unless noted. Toluene was prepared by a solvent purification system (SPS). Other solvents were of reagent grade or higher and were used without further purification. Trioctylphosphine selenide (TOPSe) was prepared by dissolving 0.15 mmol of selenium shot in 100 mL of TOP under inert atmosphere and stirring vigorously overnight, forming a 1.5 M TOPSe solution. 9-mercapto borabicyclo[3.3.1]nonane (BBN-SH), 1,3-diphenylimidazolidine-2-selenone (Se-Im(Ph$_2$)), and N-n-hexyl-N'-dodecylthiourea were synthesized by the previously reported method.[13,14] All air sensitive materials were handled in a glove box under dry nitrogen atmosphere with oxygen levels <0.1 ppm.

TEM measurement: Samples for TEM were prepared by dropping on a TEM grid and drying highly concentrated pure quantum dots (QDs) in the mixture of chloroform and toluene. TEM images were acquired using JEOL 2010 LaB6 operating at 200 kV in the Frederick Seitz Materials Research Laboratory Central Research Facilities at UIUC.

Synthesis of N-n-hexyl-N'-dodecylthiourea: N-n-hexyl-N'-dodecylthiourea was synthesized using a previously reported method.[14] Briefly, 30 mmol (5.56 g) of dodecylamine in 10 mL of toluene and hexyl isothiocyanate (4.30 g, 30 mmol) in another 10 mL of toluene were mixed, resulting in a white powder. Toluene was removed by a rotary evaporator. Residual toluene was removed under vacuum for 2 hours. Yield: 9.39 g (95%). $^1$H NMR (C$_6$D$_6$, 400 MHz): δ=0.86 (t, 3H, —CH$_3$), 0.91 (t, 3H, —CH$_3$), 1.11-1.40 (m, 28H, (CH$_2$)$_{10}$ and (CH$_2$)$_4$), 3.21 (b, 4H, —CH$_2$), 5.42 (b, 2H, NH).

Synthesis of 1,3-diphenylimidazolidine-2-selenone (Se-Im(Ph$_2$)): Se-Im(Ph$_2$) were synthesized using a previously reported method.[13] To summarize, 20 mmol (1.58 g) of selenium, 20 mmol (2.96 g) of triethyl orthoformate, and 20 mmol (4.25 g) of N,N'-diphenyl ethylenediamine were added to a round bottom flask equipped with a distillation apparatus. The reaction mixture was degassed by 4 cycles of freeze-pump-thaw method and then placed under a nitrogen atmosphere. The mixture was heated to 130° C. with stirring for 8 hours. Over this period, the selenium was dissolved and a small amount of liquid condensed in the receiving flask. The reaction mixture was then allowed to cool to room temperature and the triethyl orthoformate was removed by distillation under vacuum. The flask was opened to air and the remaining solid residue was dissolved in dichloromethane. The crude solution was filtered by suction filtration through Celite and filter paper with glass fritted funnel and recrystallized to get pure Se-Im(Ph$_2$). The yield of Se-Im (Ph$_2$) was 2.55 g (42%). $^1$H NMR (400 MHz, CD$_2$Cl$_2$): 4.15 (s, 4H, —CH$_2$), 7.30-7.35 (m, 2H, p-CH), 7.43-7.47 (m, 4H, m-CH), 7.53-7.58 (m, 4H, o-CH).

Quantum yield (QY) measurement: QYs of CdSe/CdS QDs were measured relative to rhodamine 560, rhodamine 640, and cresyl violet 670. Fluorescence spectra of QD and dye were taken under identical spectrometer conditions in triplicate and averaged. The optical density was kept below 0.1 between 300 and 700 nm, and the integrated intensities of the emission spectra, corrected for differences in index of refraction and concentration, were used to calculate the quantum yields using the expression QYQD=QYDye×(absorbance$_{dye}$/absorbance$_{QD}$)×(em. peak area$_{QD}$/em. peak area$_{Dye}$)×(n$_{QD}$ solvent)$^2$/(n$_{Dye}$ solvent)$^2$ (n: refractive index of each solvent).

Core synthesis: CdSe cores with 455 nm first absorption peak (small size) were synthesized using a previously reported method with minor modification.[42] To summarize, 0.44 mmol (60 mg) of CdO, 0.88 mmol (0.2475 g) of TDPA, 5 mL of ODE, and 2 g of HDA were placed in 25 mL round bottom flask. The solution was degassed for 1 hr at 100° C. and heated to 310° C. under nitrogen until the CdO dissolved and formed a clear homogenous solution. 4.5 mL of TOP, 0.3 mmol (55.9 mg) of DPP, and 2 mL of 1.5 M TOPSe solution was rapidly injected. The cores were then grown further at 270° C. to produce cores with 455 nm for the first absorption feature.

CdSe cores with 535 nm first absorption peak (medium size) were synthesized using a previously reported method with minor modification.[30] To summarize, 0.44 mmol (60 mg) of CdO, 0.88 mmol (0.2475 g) of TDPA, 9.56 mmol (3.70 g) of TOPO were placed in 25 mL round bottom flask.

The solution was degassed for 1 hr at 120° C. and heated to 320° C. under nitrogen until the CdO dissolved and formed a clear homogenous solution. 1 mL of TOP was injected and the solution was reheated to 330° C. under nitrogen. 1.5 mL of 1.5 M TOP-Se solution was rapidly injected. The cores were then grown further at 280° C. to produce cores with 535 nm for the first absorption feature.

CdSe cores with 580 nm first absorption peak (big size) were synthesized using a previously reported method with minor modification.[30] To summarize, 0.44 mmol (60 mg) of CdO, 0.88 mmol (0.2475 g) of TDPA, 9.56 mmol (3.70 g) of TOPO were placed in 25 mL round bottom flask. The solution was degassed for 1 hr at 120° C. and heated to 320° C. under nitrogen until the CdO dissolved and formed a clear homogenous solution. 1 mL of TOP was injected and the solution was reheated to 350° C. under nitrogen. 1.5 mL of 1.5 M TOP-Se solution was rapidly injected. The cores were then grown further at 280° C. to produce cores with the 580 nm for the first absorption feature.

Heat-up CdS shell growth on small size CdSe cores (455 nm absorption peak) using BBN-SH: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr and dropped to 60° C. The amount of each Cd or S precursor was calculated for growing 7 ML of CdS shell on the CdSe QD cores. The Cd precursor (0.15 mmol Cd-oleate in ODE) and the S precursor (0.15 mmol of BBN-SH in 0.15 mmol of DMAP, 1 mL of OAm, and 1 mL of TOP) were injected to the CdSe core solution sequentially. The reaction temperature of a mixture of CdSe cores and shell precursors was maintained for 30 min, then increased by 5° C. every 15 minutes up to 130° C. The reaction temperature was kept at 130° C. for another 150 min. The thickness difference between QD cores and resulted core/shell QDs was confirmed by TEM images that the desired number of shell layers were deposited quantitatively. For the suboptimal LB condition, DABCO was used as LB while kept the other experimental conditions. For the suboptimal $T_{growth}$ condition, the reaction temperature was increased by 10° C. every 15 minutes up to 160° C. The reaction temperature was maintained at 160° C. for another 150 min while kept the other experimental conditions.

Heat-up CdS shell growth on medium size CdSe cores (535 nm absorption peak) using BBN-SH: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr and dropped to 60° C. The amount of each Cd or S precursor was calculated for growing 7 ML of CdS shell on the CdSe QD cores. The Cd precursor (0.28 mmol Cd-oleate in ODE) and the S precursor (0.28 mmol of BBN-SH in 0.28 mmol of 3-chloropyridine, 1 mL of OAm, and 1 mL of TOP) were injected to the CdSe core solution sequentially. The reaction temperature of a mixture of CdSe cores and shell precursors was increased to 170° C. and maintained for 30 min. The reaction temperature was increased by 5° C. every 15 minutes up to 200° C. The reaction temperature was kept at 200° C. for another 150 min. The thickness difference between QD cores and resulted core/shell QDs was confirmed by TEM images that the desired number of shell layers were deposited quantitatively. For the suboptimal LB condition, DMAP was used as LB while kept the other experimental conditions. For the suboptimal $T_{growth}$ condition, the reaction temperature was increased by 10° C. every 15 minutes up to 230° C. The reaction temperature was maintained at 230° C. for another 150 min while kept the other experimental conditions.

Heat-up CdS shell growth on big size CdSe cores (580 nm absorption peak) using BBN-SH: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr and dropped to 60° C. The amount of each Cd or S precursor was calculated for growing 7 ML of CdS shell on the CdSe QD cores. The Cd precursor (0.41 mmol Cd-oleate in ODE) and the S precursor (0.41 mmol of BBN-SH in 0.41 mmol of 4-(trifluoromethyl)pyridine, 1 mL of OAm, and 1 mL of TOP) were injected to the CdSe core solution sequentially. The reaction temperature of a mixture of CdSe cores and shell precursors was increased to 200° C. and maintained for 30 min. The reaction temperature was increased by 5° C. every 15 minutes up to 230° C. The reaction temperature was kept at 230° C. for another 150 min. The thickness difference between QD cores and resulted core/shell QDs was confirmed by TEM images that the desired number of shell layers were deposited quantitatively. For the suboptimal LB condition, DMAP was used as LB while kept the other experimental conditions. For the suboptimal $T_{growth}$ condition, The reaction temperature was increased by 10° C. every 15 minutes up to 260° C. The reaction temperature was maintained at 260° C. for another 150 min while kept the other experimental conditions.

Heat-up CdS shell growth on small size CdSe cores (455 nm absorption peak) using (TMS)$_2$S: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr and dropped to r.t. The amount of each Cd or S precursor was calculated for growing 7 ML of CdS shell on the CdSe QD cores. The Cd precursor (0.15 mmol Cd-oleate in ODE) and the S precursor (0.15 mmol of (TMS)$_2$S in 2 mL of TOP) were injected to the CdSe core solution sequentially. The mixture of CdSe cores and shell precursors was heated to 100° C. for 60 min. The reaction temperature was maintained for 30 min, then increased by 5° C. every 60 minutes up to 130° C. The reaction temperature was kept at 130° C. for another 7 hrs.

Heat-up CdS shell growth on small size CdSe cores (455 nm absorption peak) using octanethiol: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr and to 60° C. The amount of each Cd or S precursor was calculated for growing 7 ML of CdS shell on the CdSe QD cores. The Cd precursor (0.15 mmol Cd-oleate in ODE) and the S precursor (0.15 mmol of octanethiol in 2 mL of ODE) were injected to the CdSe core solution sequentially. The mixture of CdSe cores and shell precursors was heated to 240° C. for 60 min. The reaction temperature was maintained for 40 min, then increased by 10° C. every 50 minutes up to 310° C. The reaction temperature was kept at 310° C. for another 7 hrs.

Heat-up CdS shell growth on medium size CdSe cores (535 nm absorption peak) using (TMS)$_2$S: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr and dropped to room temperature. The amount of each Cd or S precursor was calculated for growing 7 ML of CdS shell on the CdSe QD cores. The Cd precursor (0.28 mmol Cd-oleate in ODE) and the S precursor (0.28 mmol of $(TMS)_2S$ in 2 mL of TOP) were injected to the CdSe core solution sequentially. The mixture of CdSe cores and shell precursors was heated to 100° C. for 60 min. The reaction temperature was maintained for 30 min, then increased by 5° C. every 60 minutes up to 130° C. The reaction temperature was kept at 130° C. for another 7 hrs.

Heat-up CdS shell growth on medium size CdSe cores (535 nm absorption peak) using octanethiol: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr and dropped to 60° C. The amount of each Cd or S precursor was calculated for growing 7 ML of CdS shell on the CdSe QD cores. The Cd precursor (0.28 mmol Cd-oleate in ODE) and the S precursor (0.28 mmol of octanethiol in 2 mL of ODE) were injected to the CdSe core solution sequentially. The mixture of CdSe cores and shell precursors was heated to 240° C. for 60 min. The reaction temperature was maintained for 40 min, then increased by 10° C. every 50 minutes up to 310° C. The reaction temperature was kept at 310° C. for another 7 hrs.

Heat-up CdS shell growth on big size CdSe core (580 nm absorption peak) using $(TMS)_2S$: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr and dropped to room temperature. The amount of each Cd or S precursor was calculated for growing 7 ML of CdS shell on the CdSe QD cores. The Cd precursor (0.41 mmol Cd-oleate in ODE) and the S precursor (0.41 mmol of $(TMS)_2S$ in 2 mL of TOP) were injected to the CdSe core solution sequentially. The mixture of CdSe cores and shell precursors was heated to 100° C. for 60 min. The reaction temperature was maintained for 30 min, then increased by 5° C. every 60 minutes up to 130° C. The reaction temperature was kept at 130° C. for another 7 hrs.

Heat-up CdS shell growth on big size CdSe cores (580 nm absorption peak) using octanethiol: 50 nmol of CdSe cores were isolated by repeated precipitations from hexane with acetone. The CdSe QD cores were redispersed in a minimal amount of hexane and loaded in a solvent mixture of 3 mL of OAm and 3 mL of ODE. The reaction solution was degassed under vacuum at 100° C. for 1 hr and dropped to 60° C. The amount of each Cd or S precursor was calculated for growing 7 ML of CdS shell on the CdSe QD cores. The Cd precursor (0.41 mmol Cd-oleate in ODE) and the S precursor (0.41 mmol of octanethiol in 2 mL of ODE) were injected to the CdSe core solution sequentially. The mixture of CdSe cores and shell precursors was heated to 240° C. for 60 min. The reaction temperature was maintained for 40 min, then increased by 10° C. every 50 minutes up to 310° C. The reaction temperature was kept at 310° C. for another 7 hrs.

Purification-free heat-up synthesis of CdSe/CdS core/shell QDs: CdSe cores were synthesized by using a previously reported method with minor modification.[13] Briefly, 0.11 mmol (15 mg) of CdO, 0.19 mmol (52.9 mg) of TDPA, 0.5 g of TOPO, and 3 mL of ODE were degassed under 120° C. for 1 hr. The solution of 0.1 mmol (30 mg) of Se-Im(Ph$_2$) in 300 μL of diphenyl ether was injected at 320° C. CdSe cores with 535 nm for the first absorption feature were obtained. 50 nmol of CdSe cores were directly transferred in 3 mL of OAm and 3 mL of ODE without any purification steps. The CdSe cores were degassed under 100° C. for 30 minutes and dropped the temperature to 60° C. The Cd precursor (0.28 mmol Cd-oleate in ODE) and the S precursor (0.28 mmol of BBN-SH in 0.28 mmol of 3-chloropyridine, 1 mL of OAm, and 1 mL of TOP) were injected to the CdSe core solution sequentially. The reaction temperature of the mixture of CdSe cores and shell precursors was increased to 170° C. and maintained for 30 min. The reaction temperature was increased by 5° C. every 15 minutes up to 200° C. The reaction temperature was kept at 200° C. for another 150 min.

Single QD blinking and life-time measurement: All the single-particle measurements were performed under an ambient environment with a home-built confocal fluorescence microscope coupled with an avalanche photodiode detector and time-correlated single-photon counting module. The samples for the single-particle study were prepared by spin-coating highly diluted QD solutions in hexane on No. 1.5 glass coverslips in order to make the density of QDs on glass low enough to observe isolated QDs. The QD samples were excited with a 450 nm pulsed laser (LDH-P-C-450, Picoquant) with a repetition frequency of 2.5 MHz at an excitation power of 40 nW. The photoluminescence (PL) intensity time trace and time-dependent PL decay data were collected by an avalanche photodiode (τ-SPAD, Picoquant) with a 630±30 nm band-pass filter in front of it. The PL decay was measured by a time-correlated single-photon counting module (Picoharp 300, Picoquant) with a time resolution of 64 ps.

References Associated with Example 2A

1. Choi, M. K.; Yang, J.; Hyeon, T.; Kim, D.-H., Flexible quantum dot light-emitting diodes for next-generation displays. Npj Flexible Electron. 2018, 2, 10.
2. Aharonovich, I.; Englund, D.; Toth, M., Solid-state single-photon emitters. Nat. Photonics 2016, 10, 631-641.
3. Jin, Z.; Hildebrandt, N., Semiconductor quantum dots for in vitro diagnostics and cellular imaging. Trends Biotechnol. 2012, 30, 394-403.
4. Kloeffel, C.; Loss, D., Prospects for Spin-Based Quantum Computing in Quantum Dots. Annu. Rev. Condens. Matter Phys. 2013, 4, 51-81.
5. Kamat, P. V., Boosting the Efficiency of Quantum Dot Sensitized Solar Cells through Modulation of Interfacial Charge Transfer. Acc. Chem. Res. 2012, 45, 1906-1915.
6. Chen, J.; Hardev, V.; Hartlove, J.; Hofler, J.; Lee, E., 66.1: Distinguised Paper: A High-Efficiency Wide-Color-Gamut Solid-State Backlight System for LCDs Using Quantum Dot Enhancement Film. Dig. Tech. Pap.—Soc. Inf. Disp. Int. Symp. 2012, 43, 895-896.
7. Shirasaki, Y.; Supran, G. J.; Bawendi, M. G.; Bulovia, V., Emergence of colloidal quantum-dot light-emitting technologies. Nat. Photonics 2013, 7, 13-23.
8. Luo, Z.; Manders, J.; Yurek, J., Television's Quantum dots will be the next darling of TV manufacturers. IEEE Spectrum 2018, 55, 28-53.

9. Won, Y.-H.; Cho, O.; Kim, T.; Chung, D.-Y.; Kim, T.; Chung, H.; Jang, H.; Lee, J.; Kim, D.; Jang, E., Highly efficient and stable InP/ZnSe/ZnS quantum dot light-emitting diodes. Nature 2019, 575, 634-638.

10. Zhou, Y.; Zhao, H.; Ma, D.; Rosei, F., Harnessing the properties of colloidal quantum dots in luminescent solar concentrators. Chem. Soc. Rev. 2018, 47, 5866-5890.

11. Mora-Seró, I.; Giménez, S.; Fabregat-Santiago, F.; Gómez, R.; Shen, Q.; Toyoda, T.; Bisquert, J., Recombination in Quantum Dot Sensitized Solar Cells. Acc. Chem. Res. 2009, 42, 1848-1857.

12. Pietryga, J. M.; Park, Y.-S.; Lim, J.; Fidler, A. F.; Bae, W. K.; Brovelli, S.; Klimov, V. I., Spectroscopic and Device Aspects of Nanocrystal Quantum Dots. Chem. Rev. 2016, 116, 10513-10622.

13. Hamachi, L. S.; Yang, H.; Jen-La Plante, I.; Saenz, N.; Qian, K.; Campos, M. P.; Cleveland, G. T.; Rreza, I.; Oza, A.; Walravens, W.; Chan, E. M.; Hens, Z.; Crowther, A. C.; Owen, J. S., Precursor reaction kinetics control compositional grading and size of CdSe1-xSx nanocrystal heterostructures. Chem. Sci. 2019, 10, 6539-6552.

14. Hendricks, M. P.; Campos, M. P.; Cleveland, G. T.; Plante, I. J. L.; Owen, J. S., A Tunable library of substituted thiourea precursors to metal sulfide nanocrystals. Science 2015, 348, 1226-1230.

15. Chen, O.; Zhao, J.; Chauhan, V. P.; Cui, J.; Wong, C.; Harris, D. K.; Wei, H.; Han, H.-S.; Fukumura, D.; Jain, R. K.; Bawendi, M. G., Compact high-quality CdSe—CdS core-shell nanocrystals with narrow emission linewidths and suppressed blinking. Nat. Mater. 2013, 12, 445-451.

16. van Embden, J.; Chesman, A. S. R.; Jasieniak, J. J., The Heat-Up Synthesis of Colloidal Nanocrystals. Chem. Mater. 2015, 27, 2246-2285.

17. Huang, Z.; Zhai, G.; Zhang, Z.; Zhang, C.; Xia, Y.; Lian, L.; Fu, X.; Zhang, D.; Zhang, J., Low cost and large scale synthesis of PbS quantum dots with hybrid surface passivation. CrystEngComm 2017, 19, 946-951.

18. Choi, S.-H.; An, K.; Kim, E.-G.; Yu, J. H.; Kim, J. H.; Hyeon, T., Simple and Generalized Synthesis of Semiconducting Metal Sulfide Nanocrystals. Adv. Funct. Mater. 2009, 19, 1645-1649.

19. Zhang, H.; Hyun, B.-R.; Wise, F. W.; Robinson, R. D., A Generic Method for Rational Scalable Synthesis of Monodisperse Metal Sulfide Nanocrystals. Nano Lett. 2012, 12, 5856-5860.

20. Yang, Y. A.; Wu, H.; Williams, K. R.; Cao, Y. C., Synthesis of CdSe and CdTe Nanocrystals without Precursor Injection. Angew. Chem. Int. Ed. 2005, 44, 6712-6715.

21. Hendricks, M. P.; Cossairt, B. M.; Owen, J. S., The Importance of Nanocrystal Precursor Conversion Kinetics: Mechanism of the Reaction between Cadmium Carboxylate and Cadmium Bis(diphenyldithiophosphinate). ACS Nano 2012, 6, 10054-10062.

22. Cao, Y. C.; Wang, J., One-Pot Synthesis of High-Quality Zinc-Blende CdS Nanocrystals. J. Am. Chem. Soc. 2004, 126, 14336-14337.

23. Li, L.; Reiss, P., One-pot Synthesis of Highly Luminescent InP/ZnS Nanocrystals without Precursor Injection. J. Am. Chem. Soc. 2008, 130, 11588-11589.

24. Zhang, W.; Zhang, H.; Feng, Y.; Zhong, X., Scalable Single-Step Noninjection Synthesis of High-Quality Core/Shell Quantum Dots with Emission Tunable from Violet to Near Infrared. ACS Nano 2012, 6, 11066-11073.

25. Salas, G.; Costo, R.; Morales, M. d. P., Chapter 2—Synthesis of Inorganic Nanoparticles. In Frontiers of Nanoscience, de la Fuente, J. M.; Grazu, V., Eds. Elsevier: 2012; Vol. 4, pp 35-79.

26. Thanh, N. T. K.; Maclean, N.; Mahiddine, S., Mechanisms of Nucleation and Growth of Nanoparticles in Solution. Chem. Rev. 2014, 114, 7610-7630.

27. Yang, H.; Hamachi, L. S.; Rreza, I.; Wang, W.; Chan, E. M., Design Rules for One-Step Seeded Growth of Nanocrystals: Threading the Needle between Secondary Nucleation and Ripening. Chem. Mater. 2019, 31, 4173-4183.

28. Park, Y. S.; Lim, J.; Klimov, V. I., Asymmetrically strained quantum dots with non-fluctuating single-dot emission spectra and subthermal room-temperature linewidths. Nat. Mater. 2019, 18, 249-255.

29. Murray, C. B.; Norris, D. J.; Bawendi, M. G., Synthesis and characterization of nearly monodisperse CdE (E=sulfur, selenium, tellurium) semiconductor nanocrystallites. J. Am. Chem. Soc. 1993, 115, 8706-8715.

30. Liu, W.; Howarth, M.; Greytak, A. B.; Zheng, Y.; Nocera, D. G.; Ting, A. Y.; Bawendi, M. G., Compact Biocompatible Quantum Dots Functionalized for Cellular Imaging. J. Am. Chem. Soc. 2008, 130, 1274-1284.

31. Park, J.; Jayaraman, A.; Hwang, G. W.; Han, H. S., Temperature Independent, Chemical Modulation of Precursor Reactivity for High Quality Quantum Dot Synthesis. 2020, Under review.

32. Jiang, P.; Wang, R.; Chen, Z., Thiol-based non-injection synthesis of near-infrared Ag2S/ZnS core/shell quantum dots. RSC Adv. 2015, 5, 56789-56793.

33. Nirmal, M.; Dabbousi, B. O.; Bawendi, M. G.; Macklin, J. J.; Trautman, J. K.; Harris, T. D.; Brus, L. E., Fluorescence intermittency in single cadmium selenide nanocrystals. Nature 1996, 383, 802-804.

34. Nasilowski, M.; Spinicelli, P.; Patriarche, G.; Dubertret, B., Gradient CdSe/CdS Quantum Dots with Room Temperature Biexciton Unity Quantum Yield. Nano Lett. 2015, 15, 3953-3958.

35. Efros, A. L.; Nesbitt, D. J., Origin and control of blinking in quantum dots. Nat. Nanotechnol. 2016, 11, 661-671.

36. Galland, C.; Ghosh, Y.; Steinbrück, A.; Sykora, M.; Hollingsworth, J. A.; Klimov, V. I.; Htoon, H., Two types of luminescence blinking revealed by spectroelectrochemistry of single quantum dots. Nature 2011, 479, 203.

37. Mahler, B.; Spinicelli, P.; Buil, S.; Quelin, X.; Hermier, J.-P.; Dubertret, B., Towards non-blinking colloidal quantum dots. Nat. Mater. 2008, 7, 659.

38. Garcia-Santamaria, F.; Brovelli, S.; Viswanatha, R.; Hollingsworth, J. A.; Htoon, H.; Crooker, S. A.; Klimov, V. I., Breakdown of Volume Scaling in Auger Recombination in CdSe/CdS Heteronanocrystals: The Role of the Core-Shell Interface. Nano Lett. 2011, 11, 687-693.

39. Morris-Cohen, A. J.; Donakowski, M. D.; Knowles, K. E.; Weiss, E. A., The Effect of a Common Purification Procedure on the Chemical Composition of the Surfaces of CdSe Quantum Dots Synthesized with Trioctylphosphine Oxide. J. Phys. Chem. C 2010, 114, 897-906.

40. Shen, Y.; Roberge, A.; Tan, R.; Gee, M. Y.; Gary, D. C.; Huang, Y.; Blom, D. A.; Benicewicz, B. C.; Cossairt, B. M.; Greytak, A. B., Gel permeation chromatography as a multifunctional processor for nanocrystal purification and on-column ligand exchange chemistry. Chem. Sci. 2016, 7, 5671-5679.

41. Köster, R.; Seidel, G.; Siebert, W.; Gangnus, B., In Inorg. Synth., Grimes, R. N., Ed. Wiley: New Jersey, US, 1992; Vol. 29, pp 60-69.

42. Han, H.-S.; Devaraj, N. K.; Lee, J.; Hilderbrand, S. A.; Weissleder, R.; Bawendi, M. G., Development of a Bioorthogonal and Highly Efficient Conjugation Method for Quantum Dots Using Tetrazine-Norbornene Cycloaddition. J. Am. Chem. Soc. 2010, 132, 7838-7839.

Example 2B: Supporting Information for Example 2A (See also FIGS. 41-50B.)

TABLE 8

Summary of the optical properties of CdSe/CdS QDs grown with the different heating rates for heat-up synthesis.

| Precursor type | Heating rate (° C./min) | # of deposited shell | Final core/ shell PL peak (nm) | FWHM (nm) | QY (%) |
|---|---|---|---|---|---|
| BBNSH | 0.5 | 7 MLs | 595 | 25 | 74 |
| (LB: 3-ClPy) | 0.25 | 7 MLs | 595 | 25 | 72 |
| | 0.17 | 7 MLs | 596 | 25 | 73 |

TABLE 9

Summary of the optical and structural properties of CdSe/CdS QDs grown with different shell growing methods (heat-up vs. injection-based) using BBN-SH precursor.

| Core size | Growing method | Core PL peak (nm) | Core/shell PL peak (nm) | FWHM (nm) | QY (%) | Size (±std dev) (nm) | Circularity (±std dev) | Crystallinity (%) |
|---|---|---|---|---|---|---|---|---|
| Small CdSe | Heat-up | 474 | 537 | 25 | 69 | 6.4 (±0.4) | 0.80 (±0.07) | 91 (273/300) |
| | Injection-based | 474 | 536 | 25 | 75 | 6.3 (±0.3) | 0.80 (±0.08) | 92 (276/300) |
| Medium CdSe | Heat-up | 541 | 595 | 25 | 72 | 8.2 (±0.5) | 0.84 (±0.09) | 94 (282/300) |
| | Injection-based | 541 | 597 | 25 | 79 | 8.2 (±0.4) | 0.82 (±0.06) | 90 (270/300) |
| Big CdSe | Heat-up | 590 | 626 | 24 | 73 | 9.1 (±0.6) | 0.79 (±0.10) | 87 (261/300) |
| | Injection-based | 590 | 627 | 24 | 82 | 9.1 (±0.4) | 0.84 (±0.09) | 92 (276/300) |

TABLE 10

Summary of the optical and structural properties of CdSe/CdS QDs synthesized with different methods (new, streamlined heat-up synthesis vs. conventional 3 step QD synthesis) using BBN-SH precursor.

| Growing method | Core PL peak (nm) | Core/shell PL peak (nm) | FWHM (nm) | QY (%) | Size (±std dev) (nm) | Circularity (±std dev) | Crystallinity (%) |
|---|---|---|---|---|---|---|---|
| New, streamlined synthesis | 541 | 598 | 25 | 72 | 8.2 (±0.4) | 0.85 (±0.07) | 88 |
| Conventional 3 step synthesis | 541 | 597 | 25 | 79 | 8.2 (±0.4) | 0.82 (±0.06) | 90 |

Example 3: Exemplary Discussion of Advantages or Improvements with Respect to Certain Art Comments and discussion in this Example 3 are intended to provide some limited degree of discussion and clarification of advantages and unexpected benefits of embodiments disclosed herein and are not intended to be in any way exhaustive, limiting, binding, or disparaging.

With respect to: US Pub. No. 2017/0369779 ("Methods of producing metal sulfides, metal selenides, and metal sulfides/selenides having controlled architectures using kinetic control"), hereinafter Pub '779:

Embodiments included herein are directed to optimizing the reaction temperature and precursor reactivity to grow the high-quality QDs, whereas goal of Pub '779 is that achieving QDs with defined final size via nucleation and growth at once. Our precursor chemistry can be precisely and predictably tuned by changing the coordination power of Lewis base to boron atom in BBN-SH, for example, whereas precursor reactivity in Pub '779 is determined by the specific chemical structure. As a result, final size in Pub '779 cannot be changed once the precursor is fixed.

Regarding Nucleation vs growth: Pub '779 chemistry is more suitable for nucleation of QDs, whereas precursor chemistry presented herein is more suitable for high-quality QD growth. Their precursor reactivity is not ideal for QD growth, while methods herein can independently tuned their reactivity for QD growth depending on the QD growth temperature condition. As shown FIG. 1a, the activation temperature of Pub '779 precursors for QD growth is around 60-110° C. However, the activation temperature of chemistry of embodiments herein is in higher range (100-200° C.). As shown FIG. 1b, since Pub '779 precursor reactivity is preferred in Pub '779 for nucleation and cannot avoid the secondary nucleation, the CdS satellite particle formation is observed during the growth of CdSe/CdS core/shell QDs. See also FIGS. 27A-27B herein.

Regarding difference in a mechanism for precursor reactivity modulation: Pub '779 method mainly suggest that final size of QD is already determined by certain precursors reactivity with defined chemical structure. Pub '779 cannot change the final size or composition of QDs without using different precursors. In contrast, embodiments disclosed herein are directed to growing QDs while maintaining their size distribution and improving the structural quality of QDs. A systematic growth of high-quality QDs requires precise optimization of reaction temperature and precursor reactivity. Reaction temperature determines the particle instability and lattice reconfiguration. If the temperature is too high, undesired alloying or particle dissolution can happen. It it is too low, the growth cannot be efficient enough to grow high-quality QDs. Precursor reactivity govern the reaction kinetics at the surface of QDs. If the precursor reactivity is too high, uncontrolled growth can happen, which generally lower the crystallinity. Embodiments disclosed herein can tune precursor reactivity in temperature-independent manner, so that one can find optimized reaction temperature and precursor reactivity simultaneously. Pub '779 cannot tune the reactivity of precursor temperature independently. In embodiments, precursor chemistry herein is also full-conversion.

Regarding ease of modulating the reactivity: We do not need to synthesize a library of precursors with different reactivity, whereas Pub '779 needs to synthesize every single precursor that have different conversion kinetics. One can simply modulate the bond strength between boron and sulfur (it could be either Se, Te, P, As, Sb) by changing the coordination power of commercially available Lewis bases to the boron atom of our new precursor. One can predictably tune the reactivity of precursor by increasing or decreasing of the coordination power. However, Pub '779 precursor reactivity is fixed by the chemical structure. Moreover, the actual precursor reactivity should be tested after synthesizing precursors in Pub '779, which is labor-intensive and time-consumed process.

With respect to: US Pub. No. 2008/0160306 "Preparation of Nanoparticle Materials" (Pub '306). Pub '306 uses the Lewis base for ligands to passivate the molecular cluster, whereas embodiments herein use Lewis bases as a chemical additive to modulate the reactivity of precursor.

Regarding usage of Lewis base: Usage of Lewis base in embodiments herein is different from Pub '306 methods. Pub '306 uses Lewis bases for the surface passivation ligands on molecular clusters (or resulted QDs). However, embodiments herein use Lewis base as a chemical additive or modification agent to precisely and predictably tune the precursor reactivity to grow high-quality QDs. Pub '306 cannot precisely tuned their precursor reactivity nor the surface instability of molecular cluster, which was used as a seed to grow QDs. Embodiments herein show one can tuned the precursor reactivity and the surface instability to grow high-quality QDs.

With respect to: Polovitsyn, et al. "Synthesis of Air-Stable CdSe/ZnS Core-Shell Nanoplatelets with Tunable Emission Wavelength" Chem. Mater. 2017, 29, 13, 5671-5680 (hereinafter Polovitsyn): Precursor chemistry according to embodiments herein can be applicable in a wide range of QDs with various sizes and materials, whereas Polovitsyn only shows they can achieve ZnS shell on CdSe QD cores.

Regarding reactivity tunable chemistry: Polovitsyn cannot tune their precursor reactivity, which is already determined by their chemical structure. Since their precursor reactivity cannot be tuned, systematic optimization of both reaction temperature and precursor reactivity is almost impossible.

Regarding nucleation vs. growth: Polovitsyn precursor reactivity is much higher than precursors according to certain embodiments herein, which is mostly suitable for nucleation of QDs. As a result, secondary nucleation during Polovitsyn's shell growth process is inevitable. However, embodiments herein are directed to the QD growth by systematic optimization of reaction temperature and precursor reactivity. One can simply tune the precursor reactivity by adding commercially available Lewis base. A systematic optimization for growing of high-quality QDs is beneficial to find a best growth condition for both the reaction temperature and precursor reactivity. Reaction temperature determines the particle instability and lattice reconfiguration. If the temperature is too high, undesired alloying or particle dissolution can happen. It it is too low, the growth cannot be efficient enough to grow high-quality QDs. Precursor reactivity govern the reaction kinetics at the surface of QDs. If the precursor reactivity is too high, uncontrolled growth can happen, which generally lower the crystallinity. Precursors according to embodiments herein can tune their reactivity in temperature-independent manner, so that one can find optimized reaction temperature and precursor reactivity simultaneously. However, Polovitsyn cannot tune their precursor reactivity precisely and predictably.

Regarding versatile usage for other materials: Polovitsyn precursor chemistry only allows to synthesize a specific composition of core/shell structure. However, embodiments provided herein provide precursors for wide range of QD with sizes and materials.

With respect to US Pub. No. 2007/0295266 (Pub '266): Certain embodiments here provide high-quality QDs synthesis in large scale using nucleation-free mechanism, Pub '266 they cannot address the secondary nucleation problem during their heat-up QD synthesis.

In embodiments herein, purification-free QD synthesis is possible. Purification-free QD synthesis is important for an economical QD synthesis in industrial scale. Another important consideration is that the surface assisted QD growth with nucleation-free mechanism are important for high-quality QD synthesis in industrial scale. Embodiments herein provide precursors that can grow the QD via surface-assisted activation of precursor in the presence of Lewis base. As a result, it does not share the active solute for nucleation process of QDs. In embodiments of precursors herein, a formation of cluster with specific molecular structure ((BBN-SH-Cd)$_4$) is needed for accelerating the nucleation. However, we've confirmed this cluster is also not stable in the presence of Lewis base and converted to the original precursor form (BBN-SH) participating in QD growth process. With this unique growth mechanism for QDs, secondary nucleation from precursor, even in high concentration condition, is completely inhibited. Heat-up QD synthesis of Pub '266 cannot avoid the secondary nucleation formation or uncontrolled alloyed core/shell structure in growth temperature. In contrast, certain precursors can avoid those nucleation and control the alloyed core/shell structure. Synthetic methods in Pub '266 cannot be used for different sizes and materials of QDs in contrast to embodiments herein.

With respect to Smith, et al. "Tuning the Synthesis of Ternary Lead Chalcogenide Quantum Dots by Balancing Precursor Reactivity" ACS Nano 2011, 5, 1, 183-190 ("Smith"): Embodiments herein are directed to how one can optimize the reaction temperature and precursor reactivity simultaneously to achieve high-quality QDs. In contrast, Smith focuses on how the precursor reactivity can be competed each other to get ternary alloy QDs.

Regarding precursor reactivity: Smith is concerned with competition between two precursors with different reactivity or concentration being used for tuning of composition in alloyed QDs. In embodiments herein, there is not competition between anion precursors in alloyed ternary QD structures. In embodiments herein, new precursor reactivity can be tuned by changing the coordination power to the boron atom in BBN-SH precursor, so that one can modulate the bond strength between boron and sulfur. This allows one to adjust the precursor reactivity in temperature-independent manner. As a result, one can simultaneously and independently optimize the precursor reactivity and reaction temperature. Smith precursor are not preferably for growing QDs with controllable core/shell interface (abrupt vs alloyed core/shell) but suitable for nucleation of QDs. Smith precursors correspond to the 'conventional precursor' criteria, which is relies on thermal activation mechanism depending on their chemical structure. Smith lacks predictable controllability of precursor reactivity in temperature-independent manner to control the QD growth kinetics. Smith's precursor reactivity is too high and thus the method is not suitable for heat-up QD synthesis by avoiding unexpected secondary nucleation.

With respect to Lian, et al. "In Situ Tuning the Reactivity of Selenium Precursor To Synthesize Wide Range Size, Ultralarge-Scale, and Ultrastable PbSe Quantum Dots" Chem. Mater. 2018, 30, 3, 982-989 ("Lian"): Embodiments herein provide tuning of the precursor reactivity in temperature-independent manner. In contrast, Lian showed a single example of changing their precursor reactivity, which was increased.

Regarding precursor reactivity: Lian cannot tune the reactivity of precursor precisely and wide enough to achieve for growing QD with different sizes and materials. Lian can only increase the precursor reactivity bit higher than a control sample, to achieve bigger QDs. In embodiments herein, the new precursor reactivity can be tuned by changing the coordination power to the boron atom in BBN-SH precursor, to can modulate the bond strength between boron and sulfur. This allows adjusting the precursor reactivity in temperature-independent manner. One can simultaneously optimize both the reaction temperature and precursor reactivity to achieve high-quality QDs with narrow size distribution, regular shapes, and high crystallinity. Also, QD growth mechanisms herein different significantly from those of Lian. In embodiments herein, the precursor is activated at the surface of QDs in the presence of Lewis base. In Lian, the precursor is activated in free-solution, which efficiently accelerate the secondary nucleation. As a result, Lian cannot avoid the secondary nucleation problem to grow QDs.

Regarding conversion yield: Conversion yield of precursors used in Lian is well-known to be low, which means they are not able to fully convert into the active solute. However, precursors disclosed herein, in embodiments, follow full-conversion process.

Additional Discussion:

In embodiments, methods and precursor herein (e.g., modified anion precursor) provide for well-separated reaction paths for nucleation and growth. Nucleation and growth can be effectively separated at a large range of temperature. Conventional precursors share reaction intermediates for two process and the concentration of intermediates determines whether nucleation or growth process is activated. As a result, conventionally, nucleation and growth is inherently coupled in high precursor concentrations such as heat up-based growth. Methods herein provide for an efficient and new mechanism to suppress nucleation during growth. In embodiments herein, precursor conversion for growth only occurs on the QD surface. Precursor conversion for nucleation may occur in solution but then is efficiently suppressed. Due to this reason, herein, growth is well controlled even at high concentration of precursors.

Herein, independent control of reaction T and precursor reactivity allows systematic optimization of growth conditions while keeping the risk of secondary nucleation low.

As a result of precursor chemistry, disclosed herein, having well-separated reaction paths for nucleation and growth, one can systematically prepare core-shell QDs of different dimensions and materials using heat-up-based synthesis. Heat-up method requires the entire chemicals to be loaded upfront. In conventional precursor systems, this upfront loading yields high precursor concentration, high reaction intermediates, simultaneous activation of nucleation and growth, and thus heterogeneous particles.

Example 4: Additional Embodiments and Characteristics

Preferably in any method disclosed herein, the method is a method for making a plurality of high-quality quantum dots (QDs), wherein the resultant plurality of high quality QDs: have a diameter between 1 nm-300 nm; and/or are highly monodisperse (less than or equal to 15%, less than or equal to 10%, less than or equal to 8%, less than or equal to deviation 7%, less than or equal to 6%, preferably less than or equal to 5% polydispersity, or deviation in diameter); and/or have a narrow emission (FWHM of emission curve being less than 150 nm, less than 100 nm, less than 90 nm, less than 80 nm, less than 70 nm, less than 60 nm, less than 50 nm, less than 40 nm, less than 30 nm, preferably less than 25 nm); have a high crystallinity (at least 75%, at least 80%, at least 85%, at least 90%, at least 95%, within 80% to 99%, within 85% to 99%, preferably within 90% to 99%, or within 92% to 95%); and/or are highly spherical (circularity or sphericity greater than or equal to 0.7, greater than or equal to 0.72, greater than or equal to 0.75, greater than or equal to 0.77, greater than or equal to 0.8, greater than or equal to 0.82, preferably greater than or equal to 0.85); and/or have a high quantum yield (QY) (external and/or internal quantum yield being at least 20%, t least 30%, at least 40%, at least 50%, at least 60%, at least 65%, at least 70%, at least 75%, at least 80%, at least 85%, preferably at least 90%, within 50% to 95%, within 70% to 95%, preferably within 75% to 95%, preferably within 80% to 95%, or within 75% to 82%).

Generally, but not necessarily, growth of larger QDs is associated with a greater polydispersity of said larger QDs. For example, according to some embodiments, the polydispersity of a plurality of high-quality QDs grown according to embodiments disclosed herein, is preferably: less than 5% where the plurality of high-quality QDs have a diameter selected from the range of 1-10 nm; less than 8% where the plurality of high-quality QDs have a diameter selected from the range of 10-100 nm; and less than 15% where the plurality of high-quality QDs have a diameter selected from the range of 100-300 nm.

Crystallinity of high-quality QDs are optionally quantified as a fraction of crystallinity. (See, for example, J. Am. Chem. Soc. 2013, 135, 35, 13062-13072, which is incorporated herein by reference in its entirety). Such a quantification, however, is not widely used because crystallinity is difficult to measure in nanoparticles due to its small size and random orientation. Even though nanoparticles are crystalline, they may not show clear fringes in TEM images depending on their orientation. To extract representative numbers from TEM image analysis, samples have to be prepared carefully so that particles are not aligned with a certain orientation and a large number of QDs analyzed to even out the influence of the orientation/zone axis.

One measure of crystallinity quantification includes visual inspection by TEM. TEM images facilitates a visual inspection of the crystal quality of QDs. For TEM, the depth of focus for image plane (S) is >50 cm for 10K magnification. Therefore, if some particles show clear fringes in the image, the entire particles in that image are in focus. Even in the samples that we see a low % of particles showing clear fringes, every image contained at least a few particles in focus. Here, we explain our strategy to extract representative numbers probing the crystal quality of the ensemble samples in an unbiased manner. First, we inspecte >300 random particles from TEM images. We then count the number of particles that show clear fringes throughout the entire particles. To minimize the ambiguity in the decision, we process TEM images and increase the contrast. Figures provided herein illustrate how images are processed step-by-step and the example particles having clear fringes throughout the particles versus not. To indicate the number of particles examined from TEM images, we add the number particles with clear fringes and the total number of particles counted next to the percentage crystallinity data (e.g., 92%, 276/300). The trend of crystallinity deduced from the TEM analysis is consistent with the SAED pattern data, supporting the validity of the approach.

In embodiments, crystallinity of high-quality QDs herein is quantified based on TEM images, such as by counting nanoparticles with clear fringes from approximately 300 nanoparticles in TEM images to calculate a crystallinity corresponding to percentage of particles showing clear fringes throughout the entirety of the particles. The image processing is performed by semi-auto computer-aided method to distinguish between crystalline and non-crystalline nanoparticles.

With respect to quantum yield (QY), it is noted that generally high quality core-only QDs, including those with a high degree of crystallinity, can have lower QY than high-quality core/shell QDs. It is also noted that QY varies based on the composition of the QDs. For example, the QY for: CdSe/CdS core/shell QDs is preferably at least 80% to 99%; InP/ZnSe/ZnS core/shell QDs is preferably at least 80% to 95%; PbS/CdS core/shell QDs is preferably at least 50% to 60%; CuInS$_2$/ZnS core/shell QDs is preferably at least 40% to 60%; and Ag$_2$S/CdS core/shell QDs is preferably at least 20% to 40%.

With respect to growth temperature, a particularly relevant parameter is a difference (relative or absolute) of the at least one add-layer activation growth temperature and/or the modified anion precursor activation temperature ($T_{act}$) versus a melting point of the base-QD onto which the at least one add-layer is grown. This parameter influences the quality (e.g., crystallinity, alloying or lack thereof, defect density, etc.) as well as shape or geometry of the at least one add-layer and resulting high-quality QDs. For example, according to certain embodiments, spherical high-quality QDs may be formed when the $T_{act}$ is 10° C. to 30° C. less than a melting temperature $T_m$ of the base-QD. For example, according to certain embodiments, aspherical or anisotropic high-quality QDs may be formed when the $T_{act}$ is 80° C. to 100° C. less than a melting temperature $T_m$ of the base-QD.

Example 5: Additional Discussion Regarding Nucleation Suppression

An effective approach to suppress secondary nucleation during growth requires reaction pathways for nucleation and growth to be well separated. In contrast, for the conventional precursors, nucleation and growth proceed using the same reaction pathway. The concentration of activated intermediate determines whether growth and/or nucleation occurs. For the methods including a modified anion precursor, such as one including an organoborane, such as one including a α-X bond (X is an anion element), such as BBN-SH, suppression of (secondary) nucleation can occur by inactivating the reaction pathway to form a cation-anion complex, such as Cd-S complex, which is a crucial intermediate for nucleation. For the methods including a modified anion precursor, such as one including an organoborane, such as one including a α-X bond (X is an anion element), such as BBN-SH, nucleation can occur via the formation of a cluster including the cation element such as a (BBNSHCd)$_4$ cluster while growth involves surface-assisted cleavage of a bond such as the α-S bond, for example.

Example 6: Additional Discussion

Aspects of methods disclosed herein can be used to synthesize high quality CdSe cores and graded composition CdSe$_x$S$_{1-x}$ cores, as well as CdS shells, using a simple one-pot procedure without the specialized hot-injection or slow-injection equipment that is normally required in the industry. Aspects of methods disclosed herein provide for large-scale and simple syntheses using commercially available starting materials to yield high quality QDs with lower capital and operational costs. Aspects of methods disclosed herein provide for syntheses of high quality QDs that solve industry problem of low yields as well as time and expense wasted on purification.

Challenges to Industrial-Scale QD Synthesis Using Prior Approaches:

FIG. 52 provides an overview of typical hot-injection QD-core syntheses, prior to this disclosure, and challenges-to-industry associated with these conventional techniques. A challenge, for example, with hot injection core synthesis is slow injection core growth.

There are two general approaches for core-only QD synthesis: hot injection method and full conversion core synthesis. The hot injection method is characterized by low yield (leftover precursors in the reaction mixture), low reproducibility at large scale (requires homogeneous mixing), and requires purification. The full conversion core synthesis is characterized by fast reaction with high yield and reproducibility, but there is no size tenability.

There are two general approaches for QD shell growth: using highly reactive precursors or using low reactive precursors. The approach of using highly reactive precursor is characterized by a broad size distribution, low quantum yield (QY), and poor crystallinity. The approach of low reactive precursors is characterized by high quality core/shell QDs, but it requires temperatures over 300° C., as a result of which this approach can only be used to coat relatively large QDs.

The QD surface stability is dependent on size, where smaller is less stable. To grow QDs, the QD surface must efficiently react with the precursors in the solution. There is, however, a mismatch in their properties, and an ideal temperature cannot always be found for all sizes of QDs, especially smaller QDs. A comparison of these qualities are shown in Table 11.

TABLE 11

| | | | |
|---|---|---|---|
| Comparison of Properties and Results | | | |
| Temperature | Precursor Reactivity | QD Surface Stability | Result |
| High | High | Low | High prevalence of defects Satellite particle formation Broad size distribution Complete QD dissociation |
| Ideal | Ideal | Ideal | Narrow size distribution |
| Low | Low | High | No reaction, or inefficient reaction |

Accordingly, what is needed is a method to decouple precursor reactivity from reaction temperature. Aspects of the methods disclosed herein provide synthesis for core-only, core and shell, and shell-only to produce high quality QDs wherein precursor stability is decoupled from precursor reactivity. As described above, embodiments of methods disclosed herein include organoborane precursors, such as borane sulfides, which as activated via nitrogen-bearing heterocyclic Lewis base compounds, for example. As described above, embodiments of methods disclosed herein include trimethylsilane precursors, such as trimethylsilyl compounds, which are activated via halide anions FIG. 53 summarizes characteristics of the range of aspects and embodiments of method disclosed herein. FIG. 54 illustrates an exemplary synthesis method for core/shell high quality QDs. In general, steps of an exemplary synthesis method for core/shell high quality QDs, as disclosed herein according to certain embodiments, include:

1. Nucleate and grow cores with tunable reactivity precursors;

2. Allow reaction to go to completion;

3. Cool reaction;

4. Add selected shell precursors to the same flask; and

5. Slowly heat to the required reaction temperature until reaction is complete.

Example 7: New Se-Containing Anion Precursor

Disclosed in this Example is an anion precursor useful for methods disclosed herein for making a high-quality quantum dot (QD), such as but not limited to methods including chemically modifying an anion precursor, such but not limited to any "first method" disclosed herein, such as, but not limited to, methods of claim 1 and its dependent claims. For example, an anion precursor disclosed in this Example comprises selenium (Se) as an anion element of the anion precursor and is useful as a source of Se for QD nuclei, base-QD, and/or for add-layer's anion element of a high quality QD formed by a method disclosed herein. For example, for methods of making a high-quality QD using an Se-containing anion precursor, the modification agent is preferably, but not necessarily, a Lewis base, and the method comprises chemically modifying the Se-containing anion precursor by the Lewis base to induce a conversion of the Se-containing anion precursor to a modified Se-containing anion precursor.

The BBN-based chemistry described throughout herein for sulfur-containing anion precursors is adapted for the Se-containing anion precursors. Se-containing anion precursor such as BBN-SeH (formula shown in FIG. 55) are synthesized. Multi-grams of BBN-SeH is prepared with >85% yields. Growth of high-quality ZnSe QDs is performed by combining a cation precursor having Zn, a Se-containing anion precursor such as BBN-SeH, one or more Lewis bases (LBs), and preferably ZnSe base-QDs or nuclei to grow ZnSe ZnSe add-layer. Analogously to sulfur-based methods described throughout herein, the $T_{act}$ of ZnSe growth is controllably tuned by adding LBs having different $BF_3$ affinity (FIG. 56). The extent of modulation can be predicted by the $BF_3$ affinity of LBs. The BBN-SeH chemistry covers the growth temperature range of 130-230° C. for ZnSe growth while maintaining the surface reaction kinetics under control. The melting temperature of ZnSe QDs range 140-250° C.; thus, BBN-SeH can grow high-quality ZnSe QDs of any sizes. Generally, the Se-containing anion precursor can be used instead of or in combination with another anion precursor in any embodiment disclosed herein of method(s) of making a high-quality quantum dot (QD), such as but not limited to methods including chemically modifying an anion precursor, such but not limited to any "first method" disclosed herein, such as, but not limited to, methods of claim 1 and its dependent claims.

STATEMENTS REGARDING INCORPORATION BY REFERENCE AND VARIATIONS

Unless otherwise explained, all technical and scientific terms used herein have the same meaning as commonly understood by one of ordinary skill in the art to which a disclosed disclosure belongs. The singular terms "a," "an," and "the" include plural referents unless context clearly indicates otherwise. Similarly, the word "or" is intended to include "and" unless the context clearly indicates otherwise. "Comprising" means "including"; hence, "comprising A or B" means "including A" or "including B" or "including A and B." All references cited herein are incorporated by reference.

The disclosure may be further understood by the following non-limiting examples. All references cited herein are hereby incorporated by reference to the extent not inconsistent with the disclosure herewith. Although the description herein contains many specificities, these should not be construed as limiting the scope of the disclosure but as merely providing illustrations of some of the presently preferred embodiments of the disclosure. For example, thus the scope of the disclosure should be determined by the appended aspects and their equivalents, rather than by the examples given.

While the present disclosure can take many different forms, for the purpose of promoting an understanding of the principles of the disclosure, reference will now be made to the embodiments illustrated in the drawings and specific language will be used to describe the same. It will nevertheless be understood that no limitation of the scope of the disclosure is thereby intended. Any alterations and further modifications of the described embodiments, and any further applications of the principles of the disclosure as described herein are contemplated as would normally occur to one skilled in the art to which the disclosure relates.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the disclosure. Thus, it should be understood that although the present disclosure has been specifically disclosed by preferred embodiments, exemplary embodiments and optional features, modification and variation of the concepts herein disclosed may be resorted to by those skilled in the art, and that such modifications and variations are considered to be within the scope of this disclosure as defined by the appended aspects. The specific embodiments provided herein are examples of useful embodiments of the present disclosure and it will be apparent to one skilled in the art that the present disclosure may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and sub-combinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

Many of the molecules disclosed herein contain one or more ionizable groups [groups from which a proton can be removed (e.g., —COOH) or added (e.g., amines) or which can be quaternized (e.g., amines)]. All possible ionic forms of such molecules and salts thereof are intended to be included individually in the disclosure herein. With regard to salts of the compounds herein, one of ordinary skill in the art can select from among a wide variety of available counterions those that are appropriate for preparation of salts of this disclosure for a given application. In specific applications, the selection of a given anion or cation for preparation of a salt may result in increased or decreased solubility of that salt.

Every formulation or combination of components described or exemplified herein can be used to practice the disclosure, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the aspects herein.

All patents and publications mentioned in the specification are indicative of the levels of skill of those skilled in the art to which the disclosure pertains. References cited herein are incorporated by reference herein in their entirety to indicate the state of the art as of their publication or filing date and it is intended that this information can be employed herein, if needed, to exclude specific embodiments that are in the prior art. For example, when compositions of matter are disclosed, it should be understood that compounds known and available in the art prior to Applicant's disclosure, including compounds for which an enabling disclosure is provided in the references cited herein, are not intended to be included in the composition of matter aspects herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the aspect element. As used herein, "consisting essentially of" does not exclude materials or steps that do not materially affect the basic and novel characteristics of the aspect. In each instance herein any of the terms "comprising", "consisting essentially of" and "consisting of" may be replaced with either of the other two terms. The disclosure illustratively described herein suitably may be practiced in the absence of any element or elements, limitation or limitations which is not specifically disclosed herein.

The term "and/or" is used herein, in the description and in the claims, to refer to a single element alone or any combination of elements from the list in which the term and/or appears. In other words, a listing of two or more elements having the term "and/or" is intended to cover embodiments having any of the individual elements alone or having any combination of the listed elements. For example, the phrase "element A and/or element B" is intended to cover embodiments having element A alone, having element B alone, or having both elements A and B taken together. For example, the phrase "element A, element B, and/or element C" is intended to cover embodiments having element A alone, having element B alone, having element C alone, having elements A and B taken together, having elements A and C taken together, having elements B and C taken together, or having elements A, B, and C taken together.

One of ordinary skill in the art will appreciate that starting materials, biological materials, reagents, synthetic methods, purification methods, analytical methods, assay methods, and biological methods other than those specifically exemplified can be employed in the practice of the disclosure without resort to undue experimentation. All art-known functional equivalents, of any such materials and methods are intended to be included in this disclosure. The terms and expressions which have been employed are used as terms of description and not of limitation, and there is no intention that in the use of such terms and expressions of excluding any equivalents of the features shown and described or portions thereof, but it is recognized that various modifications are possible within the scope of the disclosure. Thus, it should be understood that although the present disclosure has been specifically disclosed by preferred embodiments and optional features, modification and variation of the concepts herein disclosed may be resorted to by those skilled in the art, and that such modifications and variations are considered to be within the scope of this disclosure as defined by the appended aspects.

Although the present disclosure has been described with reference to certain embodiments thereof, other embodiments are possible without departing from the present disclosure. The spirit and scope of the appended aspects should not be limited, therefore, to the description of the preferred embodiments contained herein. All embodiments that come within the meaning of the aspects, either literally or by equivalence, are intended to be embraced therein. Furthermore, the advantages described above are not necessarily the only advantages of the disclosure, and it is not necessarily expected that all of the described advantages will be achieved with every embodiment of the disclosure.

We claim:

1. A method of making a high-quality quantum dot (QD), the method comprising the steps of:
   providing a base-QD, providing a first anion precursor having a composition comprising an anion element;
   providing a modification agent;
   growing at least one add-layer on the base-QD at a growth temperature, thereby making the high-quality QD comprising the base-QD and the at least one add-layer; wherein:
      the step of growing comprises reacting the first anion precursor and the modification agent;
      the step of growing comprises decomposing the first anion precursor as a result of the reaction between the first anion precursor and the modification agent;
      the growth temperature is equal to or greater than an activation temperature ($T_{act}$) of the growth of the at least one add-layer;
      the at least one add-layer has a composition comprising an add-layer cation element and an add-layer anion element; and wherein the add-layer anion element is identical to the anion element of the first anion precursor; and
   wherein the first anion precursor is an organoboron-based anion precursor; and wherein the modified anion precursor comprises the modification agent coordinated to the boron atom of the organoboron-based anion precursor.

2. The method of claim 1 comprising providing a cation source having a composition comprising a cation element; wherein the add-layer cation element is identical to the cation element of the cation source.

3. The method of claim 2, wherein the cation source is a cation precursor.

4. The method of claim 1, wherein the base-QD has a composition comprising a base-QD cation element and a base-QD anion element; wherein:
   (i) the add-layer cation element is identical to the base-QD cation element and the add-layer anion element is identical to the base-QD anion element;
   (ii) the add-layer cation element is identical to the base-QD cation element and the add-layer anion element is different from the base-QD anion element, such that the at least one add-layer is a shell on the base-QD;
   (iii) the add-layer cation element is different to the base-QD cation element and the add-layer anion element is identical from the base-QD anion element, such that the at least one add-layer is a shell on the base-QD; or
   (iv) the add-layer cation element is different from the base-QD cation element and the add-layer anion element is different from the base-QD anion element, such that the at least one add-layer is a shell on the base-QD.

5. The method of claim 1, wherein the add-layer cation element is Cd, Pb, In, Zn, Cu, Ga, Al, Zn, Cu, Ag, Sn or any combination thereof.

6. The method of claim 1, wherein the add-layer anion element is S, Se, Te, P, N, As, Sb, or any combination of these.

7. The method of claim 1, wherein the modification agent is a Lewis base (LB).

8. A method of making a high-quality quantum dot (QD), the method comprising the steps of:
   providing a base-QD, providing a first anion precursor having a composition comprising an anion element;
   providing a modification agent;
   growing at least one add-layer on the base-QD at a growth temperature, thereby making the high-quality QD comprising the base-QD and the at least one add-layer; wherein:
      the step of growing comprises reacting the first anion precursor and the modification agent;
      the step of growing comprises decomposing the first anion precursor as a result of the reaction between the first anion precursor and the modification agent;
      the growth temperature is equal to or greater than an activation temperature ($T_{act}$) of the growth of the at least one add-layer;
      the at least one add-layer has a composition comprising an add-layer cation element and an add-layer anion element; and wherein the add-layer anion element is identical to the anion element of the first anion precursor;
   wherein the chemically modifying step comprises the modification agent forming a coordination bond with the first anion precursor the modification agent; wherein:
      the first anion precursor is an organoboron-based anion precursor, the modification agent is a Lewis base (LB), and the LB has a desired affinity for the boron atom in the organoboron-based precursors to result in a desired activation temperature.

9. The method of claim 8, wherein the LB comprises an imidazole, a tertiary amine, a pyrollidine, a pyridine derivative, an ether, an aliphatic ketone, an ester, any other LB that can make a coordination bond to the empty orbital of boron, or any combination of these.

10. The method of claim 8, wherein the LB is selected from the group consisting of dimethylaminopyridine (DMAP), picoline ($(CH_3C_5H_4N)$, 3-chloropyridine (3-ClPy), 4-(trimethylfluoro)-pyridine (4-$CF_3$Py), and 4-cyanopyridine (4-CyPy).

11. The method of claim 1, wherein the first anion precursor is characterized by formula FX1, FX2, FX3, or FX3.1:

(FX1)

$$R_1\!\!\diagdown_{\displaystyle B-AH;}\!\!\diagup R_2$$

(FX2)

$$R_1\!\!\diagdown_{\displaystyle B-YH_2;}\!\!\diagup R_2$$

(FX3)

$$R_2\diagdown\!\!\diagup R_1;\ \text{or}$$
$$R_3\diagdown_{\displaystyle B}\!\!-YH$$
$$R_4$$

-continued (FX3.1)

wherein:

each A is independently a S, Se, or Te;

each Y is independently P, As, or Sb; and each $R_1$-$R_6$ is independently selected from the group consisting of: $C_1$-$C_{20}$ alkyl, $C_3$-$C_{10}$ cycloalkyl, $C_5$-$C_{20}$ aryl, $C_5$-$C_{10}$ heteroaryl, $C_1$-$C_{20}$ acyl, $C_1$-$C_{20}$ hydroxyl, $C_1$-$C_{20}$ alkoxy, $C_2$-$C_{20}$ alkenyl, $C_2$-$C_{20}$ alkynyl, $C_5$-$C_{20}$ alkylaryl, —$CO_2R_{10}$, —$CONR_{11}R_{12}$, —$COR_{13}$, —$SOR_{14}$, —$OSR_{15}$, —$SO_2R_{16}$, —$OR_{17}$, —$SR_{18}$, —$NR_{19}R_{20}$, —$NR_{21}COR_{22}$, $C_1$-$C_{20}$ alkyl halide, $C_2$-$C_{20}$ halocarbon chain, and any combination of these; each of $R_{10}$-$R_{22}$ is independently a hydrogen or a $C_1$-$C_{20}$ alkyl; or each $R_1$-B-$R_2$ and $R_3$-B-$R_4$ is independently selected from the group consisting of 3-methyl-1-boracyclopentane, 1-boracyclohexane, 9-borabicyclo [3.3.1] nonane, 9-borabicyclo [3.3.2]decane.

12. The method of claim 11, wherein $R_1$ and $R_2$ are together a single group divalently bonded to B and wherein $R_3$ and $R_4$ are together a single group divalently bonded to B.

13. The method of claim 12, wherein the first anion precursor is: BBN-SH (9-mercapto-9-borabicyclo [3.3.1] nonane) and/or BBN-SeH (9-borabicyclo [3.3.1] nonane-9-selenol).

14. The method of claim 1, wherein the step of reacting the first anion precursor and the modification agent comprises forming a second anion precursor as a result of the reaction; wherein the second anion precursor has a composition comprising the anion element.

15. The method of claim 14, wherein the second anion precursor is a hydrogen chalcogenide or a hydrogen pnictogenide.

16. The method of claim 1, wherein the modification agent is a halide anion.

17. A method of making a high-quality quantum dot (QD), the method comprising the steps of:

providing a base-QD, providing a first anion precursor having a composition comprising an anion element;

providing a modification agent;

growing at least one add-layer on the base-QD at a growth temperature, thereby making the high-quality QD comprising the base-QD and the at least one add-layer; wherein:

the step of growing comprises reacting the first anion precursor and the modification agent;

the step of growing comprises decomposing the first anion precursor as a result of the reaction between the first anion precursor and the modification agent;

the growth temperature is equal to or greater than an activation temperature ($T_{act}$) of the growth of the at least one add-layer;

the at least one add-layer has a composition comprising an add-layer cation element and an add-layer anion element; and wherein the add-layer anion element is identical to the anion element of the first anion precursor;

wherein the first anion precursor is a tri-hydrocarbon-silyl precursor and the modification agent is a halide anion.

18. The method of claim 17, wherein the first anion precursor is characterized by formula FX4B, FX5B, FX6B, FX6.1B, or FX6.2B,:

(FX4B)

(FX5B)

(FX6B)

(FX6.1B)

(FX6.2B)

wherein:

each A is independently a S, Se, or Te;

each Y is independently P, As, or Sb; and each $R_7$-$R_9$ is independently selected from the group consisting of: $C_1$-$C_{20}$ alkyl, $C_3$-$C_{20}$ cycloalkyl, $C_5$-$C_{20}$ aryl, $C_5$-$C_{20}$ heteroaryl, $C_1$-$C_{20}$ acyl, $C_1$-$C_{20}$ hydroxyl, $C_1$-$C_{20}$ alkoxy, $C_2$-$C_{20}$ alkenyl, $C_2$-$C_{20}$ alkynyl, $C_5$-$C_{20}$ alkylaryl, and any combination of these.

19. The method of claim 18, wherein the first anion precursor is: (tri-hydrocarbon-silyl) ethanethiol, (tri-hydrocarbon-silyl) ethaneselenol, (tri-hydrocarbon-silyl) ethanetellurol, (tri-hydrocarbon-silyl) ethanephosphine, any isomer of these, any substituted product of these, any derivative of these, or any combination of these.

20. The method of claim 14, wherein the second anion precursor is characterized by formula FX7A or FX7B:

XH(FX7A); or $XH_2$(FX7B);

wherein X is the anion element of the second anion precursor.

21. The method of claim 1, wherein the modification agent is a fluoride ion, a chloride ion, a bromide ion, and/or an iodide ion.

22. The method of claim 1, wherein the modification agent is a secondary and/or tertiary amine.

\* \* \* \* \*